(12) United States Patent
Watanabe et al.

(10) Patent No.: US 11,670,659 B2
(45) Date of Patent: Jun. 6, 2023

(54) IMAGING ELEMENT, STACKED IMAGING ELEMENT, AND SOLID-STATE IMAGING APPARATUS

(71) Applicant: SONY SEMICONDUCTOR SOLUTIONS CORPORATION, Kanagawa (JP)

(72) Inventors: Taiichiro Watanabe, Kanagawa (JP); Fumihiko Koga, Kanagawa (JP); Kyosuke Ito, Kanagawa (JP); Hideaki Togashi, Nagasaki (JP); Yusaku Sugimori, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 391 days.

(21) Appl. No.: 16/624,205

(22) PCT Filed: Jun. 21, 2018

(86) PCT No.: PCT/JP2018/023598
§ 371 (c)(1),
(2) Date: Dec. 18, 2019

(87) PCT Pub. No.: WO2018/235895
PCT Pub. Date: Dec. 27, 2018

(65) Prior Publication Data
US 2021/0288092 A1 Sep. 16, 2021

(30) Foreign Application Priority Data

Jun. 21, 2017 (JP) .............................. JP2017-121200
Jun. 19, 2018 (JP) .............................. JP2018-115847

(51) Int. Cl.
*H01L 27/146* (2006.01)
*H04N 25/77* (2023.01)

(52) U.S. Cl.
CPC .. *H01L 27/14623* (2013.01); *H01L 27/14621* (2013.01); *H04N 25/77* (2023.01)

(58) Field of Classification Search
CPC ............... H01L 27/14623; H01L 31/10; H01L 27/14621; H01L 27/14667;
(Continued)

(56) References Cited

U.S. PATENT DOCUMENTS 8,704,924 B2 * 4/2014 Watanabe .............. H04N 5/353
257/431
10,468,451 B2 * 11/2019 Togashi ............ H01L 27/14625
(Continued)

FOREIGN PATENT DOCUMENTS

JP 2016-033979 3/2006
JP 2011138927 A 7/2011
(Continued)

OTHER PUBLICATIONS

Merriam-Webster Dictionary Definition of "at". No Date!*
International Search Report for Application No. PCT/JP2018/023598, dated Sep. 4, 2018.

*Primary Examiner* — Hrayr A Sayadian
(74) *Attorney, Agent, or Firm* — K&L Gates LLP

(57) ABSTRACT

An imaging element includes a photoelectric conversion unit including a first electrode 11, a photoelectric conversion layer 13, and a second electrode 12 that are stacked, in which the photoelectric conversion unit further includes a charge storage electrode 14 arranged apart from the first electrode 11 and arranged to face the photoelectric conversion layer 13 through an insulating layer 82, and when photoelectric conversion occurs in the photoelectric conversion layer 13 after light enters the photoelectric conversion layer 13, an absolute value of a potential applied to a part $13_C$ of the photoelectric conversion layer 13 facing the charge storage electrode 14 is a value larger than an absolute value of a
(Continued)

potential applied to a region 13$_B$ of the photoelectric conversion layer 13 positioned between the imaging element and an adjacent imaging element.

7 Claims, 102 Drawing Sheets

(58) Field of Classification Search
CPC ......... H01L 27/14647; H01L 27/14612; H01L 27/14672; H04N 5/3745; H04N 9/04563; H04N 5/3591; H04N 5/374
USPC ........................................................ 257/431
See application file for complete search history.

(56) References Cited

U.S. PATENT DOCUMENTS

| | | | |
|---|---|---|---|
| 11,348,965 B2* | 5/2022 | Togashi | ............... H01L 27/307 |
| 2011/0156104 A1* | 6/2011 | Yamaguchi | ......... H01L 27/1464 |
| | | | 257/222 |
| 2011/0216212 A1* | 9/2011 | Watanabe | ............ H04N 5/3575 |
| | | | 257/292 |
| 2013/0093932 A1 | 4/2013 | Choo et al. | |
| 2015/0048473 A1 | 2/2015 | Takahashi | |
| 2015/0349008 A1* | 12/2015 | Yamaguchi | ............ H04N 5/361 |
| | | | 257/292 |
| 2016/0035768 A1 | 2/2016 | Kawahara et al. | |
| 2016/0037098 A1 | 2/2016 | Lee et al. | |
| 2016/0301882 A1 | 10/2016 | Yamashita | |
| 2017/0294486 A1* | 10/2017 | Yamaguchi | ....... H01L 27/14636 |
| 2018/0076252 A1* | 3/2018 | Togashi | ................ H01L 51/442 |

FOREIGN PATENT DOCUMENTS

| | | |
|---|---|---|
| JP | 2011244010 A | 12/2011 |
| JP | 2015-037154 | 2/2015 |
| JP | 2015037154 A | 2/2015 |
| JP | 2016033979 A | 3/2016 |
| JP | 2016063165 A | 4/2016 |
| JP | 2016127264 A | 7/2016 |
| JP | 2016201449 A | 12/2016 |
| JP | 2017055085 A | 3/2017 |
| JP | 2017108101 A | 6/2017 |

* cited by examiner

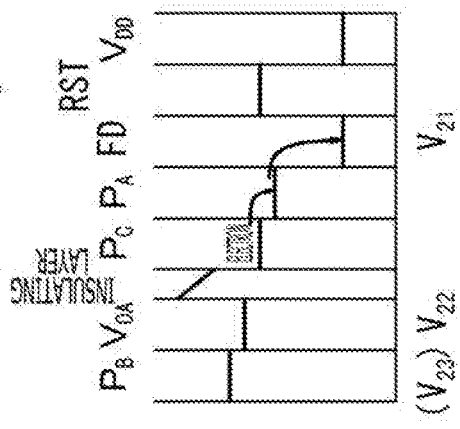
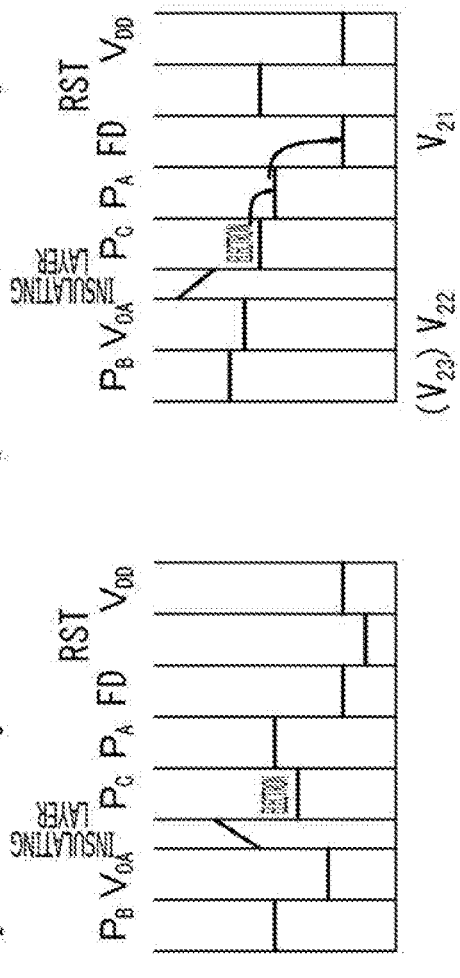
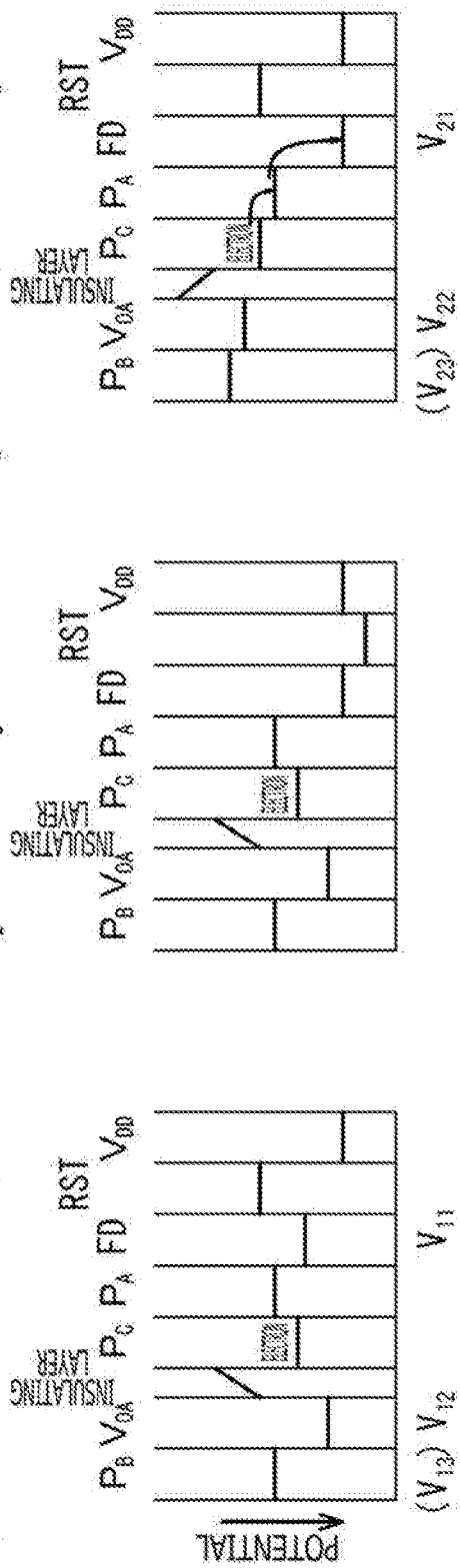
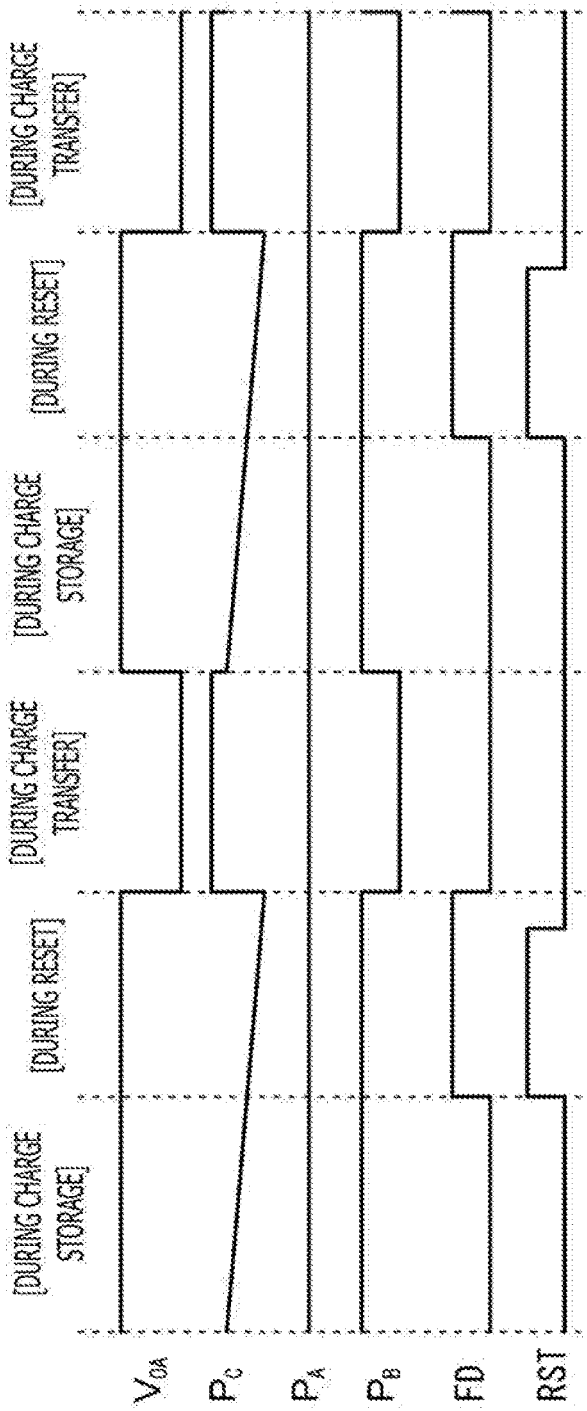

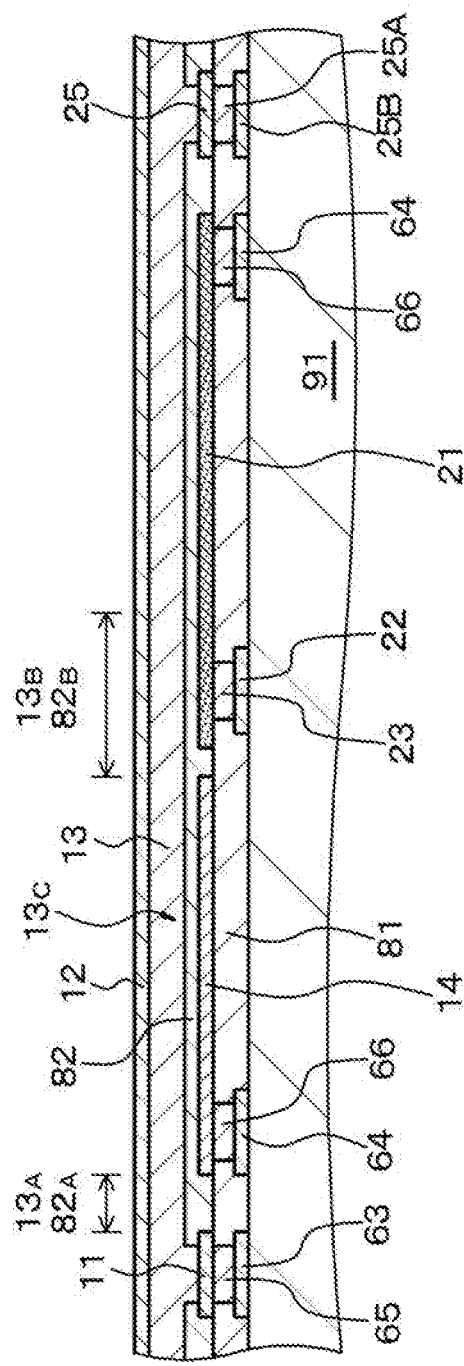
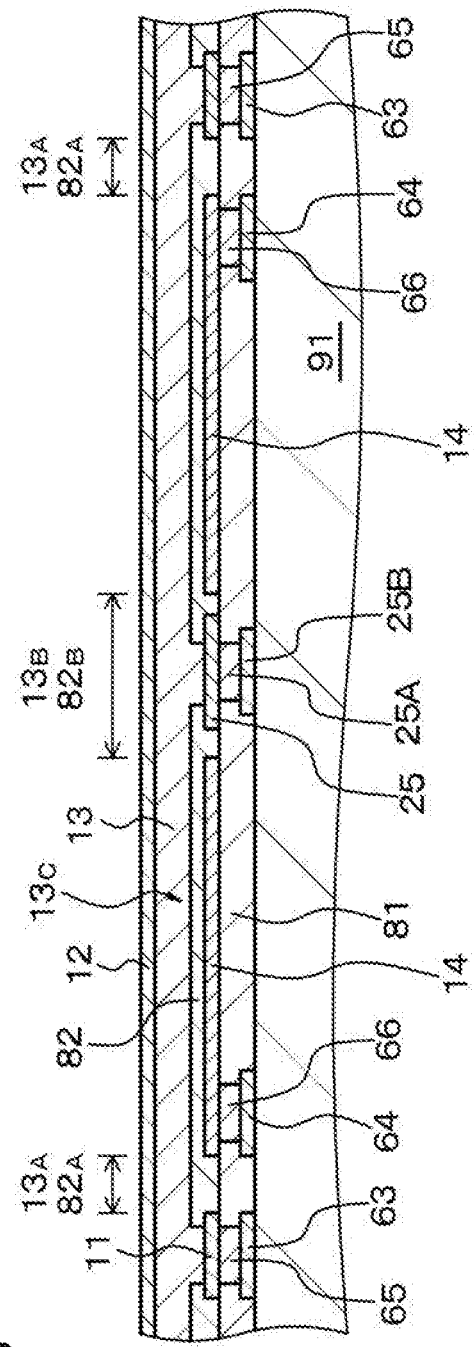
FIG.16A
FIG.16B

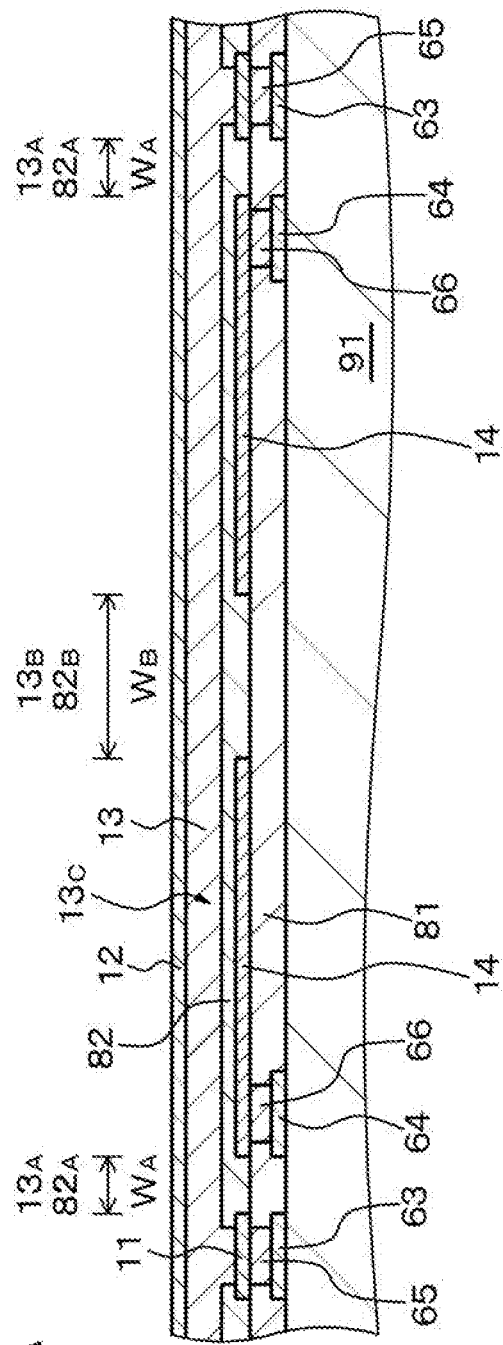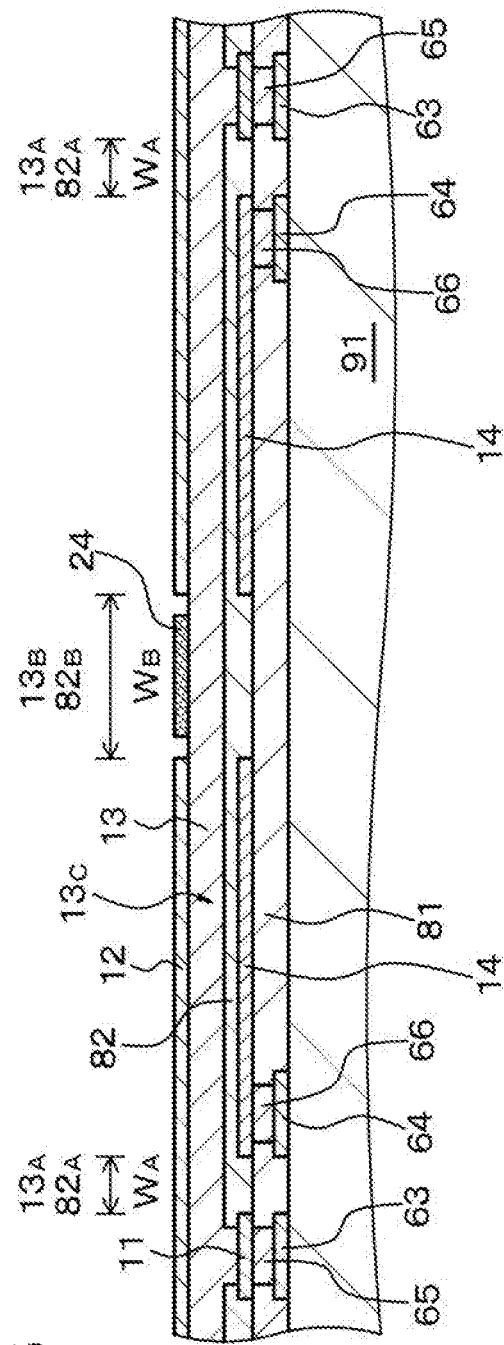

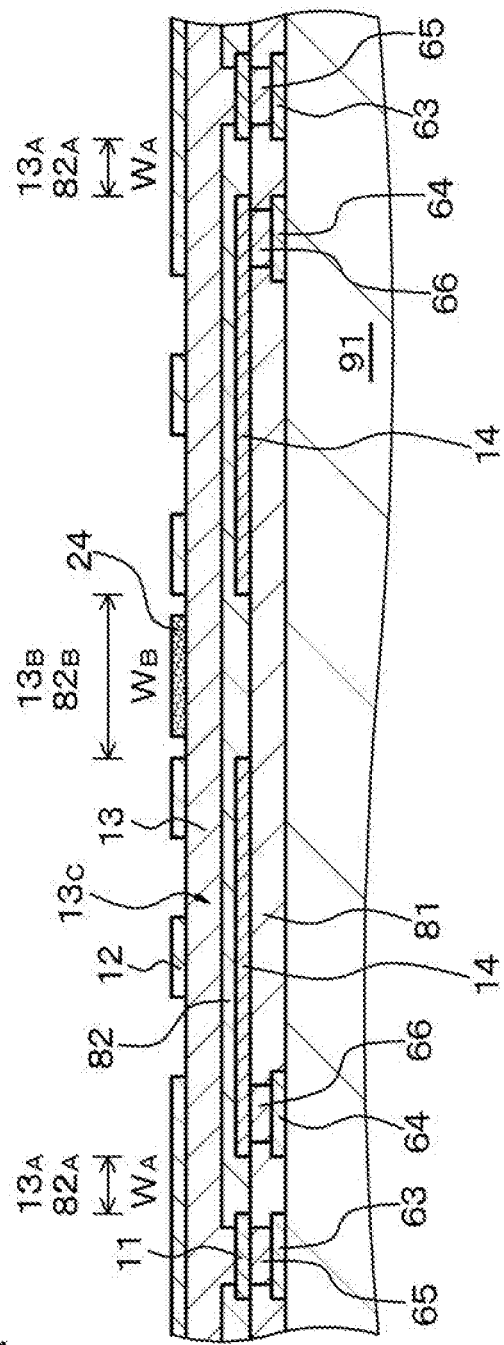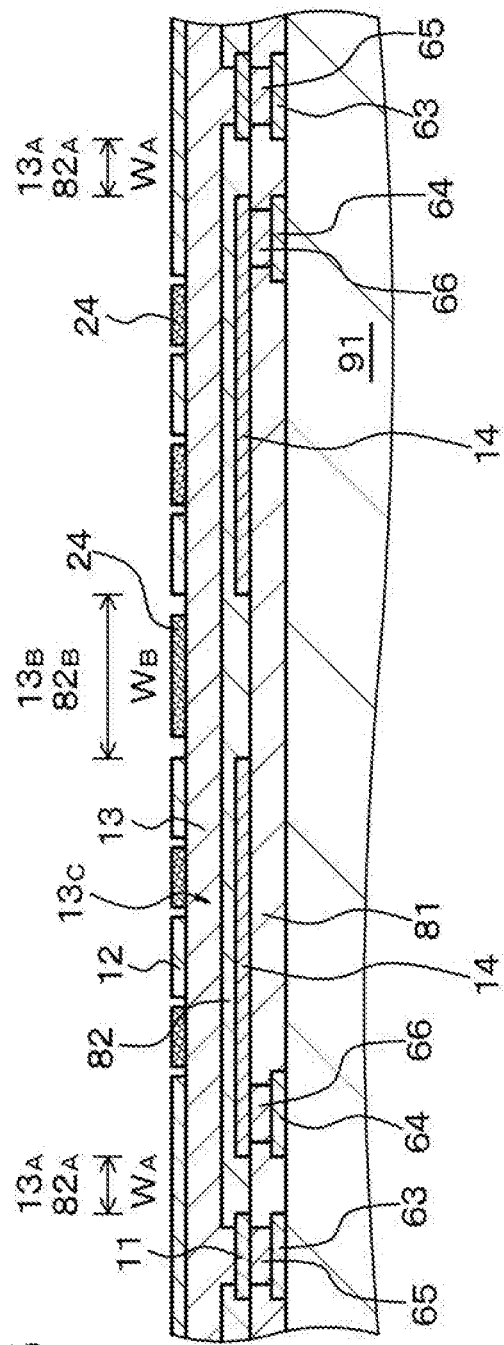

IMAGING ELEMENT, STACKED IMAGING ELEMENT, AND SOLID-STATE IMAGING APPARATUS

TECHNICAL FIELD

The present disclosure relates to an imaging element, a stacked imaging element, and a solid-state imaging apparatus.

BACKGROUND ART

An imaging element including an organic semiconductor material in a photoelectric conversion layer can photoelectrically convert a specific color (wavelength band). Furthermore, in a case of using the imaging element in a solid-state imaging apparatus, such a feature allows to obtain a structure including stacked subpixels (stacked imaging elements) that is impossible in a conventional solid-state imaging apparatus. In the structure, the subpixel includes a combination of an on-chip color filter (OCCF) and the imaging element, and the subpixels are two-dimensionally arrayed (for example, see Japanese Patent Laid-Open No. 2011-138927). There is also an advantage that demosaicing is not necessary, and a false color is not generated. Note that in the following description, an imaging element including a photoelectric conversion unit provided on a semiconductor substrate or on an upper side of the semiconductor substrate may be referred to as an "imaging element of first type" for convenience. A photoelectric conversion element included in the imaging element of first type may be referred to as a "photoelectric conversion unit of first type" for convenience. An imaging element provided in the semiconductor substrate may be referred to as an "imaging element of second type" for convenience. A photoelectric conversion unit included in the imaging element of second type may be referred to as a "photoelectric conversion unit of second type" for convenience.

FIG. 102 illustrates an example of structure of a conventional stacked imaging element (stacked solid-state imaging apparatus). In the example illustrated in FIG. 102, a third photoelectric conversion unit 331 and a second photoelectric conversion unit 321, which are photoelectric conversion units of second type included in a third imaging element 330 and a second imaging element 320 that are imaging elements of second type, are stacked and formed in a semiconductor substrate 370. In addition, a first photoelectric conversion unit 311 that is a photoelectric conversion unit of first type is arranged on the upper side of the semiconductor substrate 370 (specifically, upper side of second imaging element 320). Here, the first photoelectric conversion unit 311 includes a first electrode 311, a photoelectric conversion layer 313 including an organic material, and a second electrode 312. The first photoelectric conversion unit 311 is included in a first imaging element 310 that is an imaging element of first type. The second photoelectric conversion unit 321 and the third photoelectric conversion unit 331 photoelectrically convert, for example, blue light and red light, respectively, based on the difference in absorption coefficients. In addition, the first photoelectric conversion unit 311 photoelectrically converts, for example, green light.

The charge generated by the photoelectric conversion in the second photoelectric conversion unit 321 and the third photoelectric conversion unit 331 is temporarily stored in the second photoelectric conversion unit 321 and the third photoelectric conversion unit 331. Subsequently, a vertical transistor (gate portion 322 is illustrated) and a transfer transistor (gate portion 332 is illustrated) transfer the charge to a second floating diffusion layer (Floating Diffusion) $FD_2$ and a third floating diffusion layer $FD_3$, respectively. The charge is further output to an external reading circuit (not illustrated). The transistors and the floating diffusion layers $FD_2$ and $FD_3$ are also formed on the semiconductor substrate 370.

The charge generated by the photoelectric conversion in the first photoelectric conversion unit 311 is stored in a first floating diffusion layer $FD_1$ formed on the semiconductor substrate 370 through a contact hole portion 361 and a wiring layer 362. In addition, the first photoelectric conversion unit 311 is also connected to a gate portion 318 of an amplification transistor that converts the charge amount into voltage through the contact hole portion 361 and the wiring layer 362. Furthermore, the first floating diffusion layer $FD_1$ includes part of a reset transistor (gate portion 317 is illustrated). Note that reference number 371 denotes an element separation region. Reference number 372 denotes an oxide film formed on the surface of the semiconductor substrate 370. Reference numbers 376 and 381 denote interlayer insulating layers. Reference number 383 denotes a protective layer. Reference number 390 denotes an on-chip micro lens.

CITATION LIST

Patent Literature

[PTL 1]
  Japanese Patent Laid-Open No. 2011-138927

SUMMARY

Technical Problem

Meanwhile, in the imaging element with the configuration and the structure, the charge generated by the photoelectric conversion may flow into an adjacent imaging element. So-called blooming may occur, and the quality of a taken video (image) may be degraded.

Therefore, an object of the present disclosure is to provide an imaging element with a configuration and a structure that are unlikely to cause a degradation of the quality of a taken video (image), a stacked imaging element including the imaging element, and a solid-state imaging apparatus including the imaging element or the stacked imaging element.

Solution to Problem

Each of imaging elements according to first to ninth aspects of the present disclosure for attaining the object includes a photoelectric conversion unit including a first electrode, a photoelectric conversion layer, and a second electrode that are stacked, in which the photoelectric conversion unit further includes a charge storage electrode arranged apart from the first electrode and arranged to face the photoelectric conversion layer through an insulating layer.

Furthermore, in the imaging element according to the first aspect, when photoelectric conversion occurs in the photoelectric conversion layer after light enters the photoelectric conversion layer, an absolute value of a potential applied to a part of the photoelectric conversion layer facing the charge storage electrode is a value larger than an absolute value of a potential applied to a region of the photoelectric conversion layer positioned between the imaging element and an adjacent imaging element.

Furthermore, in the imaging element according to the second aspect of the present disclosure, a width of a region of the photoelectric conversion layer positioned between the first electrode and the charge storage electrode is narrower than a width of a region of the photoelectric conversion layer positioned between the imaging element and an adjacent imaging element.

Furthermore, in the imaging element according to the third aspect of the present disclosure, a charge movement control electrode is formed in a region facing, through the insulating layer, a region of the photoelectric conversion layer positioned between the imaging element and an adjacent imaging element.

Furthermore, in the imaging element according to the fourth aspect of the present disclosure, a charge movement control electrode is formed, in place of the second electrode, over a region of the photoelectric conversion layer positioned between the imaging element and an adjacent imaging element.

Furthermore, in the imaging element according to the fifth aspect of the present disclosure, a value of a dielectric constant of an insulating material included in a region between the first electrode and the charge storage electrode is higher than a value of a dielectric constant of an insulating material included in a region between the imaging element and an adjacent imaging element.

Furthermore, in the imaging element according to the sixth aspect of the present disclosure, a thickness of a region of the insulating layer positioned between the first electrode and the charge storage electrode is thinner than a thickness of a region of the insulating layer positioned between the imaging element and an adjacent imaging element.

Furthermore, in the imaging element according to the seventh aspect of the present disclosure, a thickness of a region of the photoelectric conversion layer positioned between the first electrode and the charge storage electrode is thicker than a thickness of a region of the photoelectric conversion layer positioned between the imaging element and an adjacent imaging element.

Furthermore, in the imaging element according to the eighth aspect of the present disclosure, a fixed charge amount in a region of an interface between the photoelectric conversion layer and the insulating layer positioned between the first electrode and the charge storage electrode is less than a fixed charge amount in a region of an interface between the photoelectric conversion layer and the insulating layer positioned between the imaging element and an adjacent imaging element.

Furthermore, in the imaging element according to the ninth aspect of the present disclosure, a value of charge mobility in a region of the photoelectric conversion layer positioned between the first electrode and the charge storage electrode is larger than a value of charge mobility in a region of the photoelectric conversion layer positioned between the imaging element and an adjacent imaging element.

A stacked imaging element of the present disclosure for attaining the object includes at least one of the imaging elements according to the first to ninth aspects of the present disclosure.

A solid-state imaging apparatus according to a first aspect of the present disclosure for attaining the object includes a plurality of imaging elements according to the first to ninth aspects of the present disclosure. In addition, a solid-state imaging apparatus according to a second aspect of the present disclosure for attaining the object includes a plurality of stacked imaging elements according to the present disclosure.

Advantageous Effects of Invention

In each of the imaging elements according to the first to ninth aspects of the present disclosure, the imaging elements according to the first to ninth aspects of the present disclosure included in the stacked imaging elements, and the imaging elements according to the first to ninth aspects of the present disclosure included in the solid-state imaging apparatuses according to the first and second aspects of the present disclosure (hereinafter, the imaging elements will be collectively referred to as "imaging element and the like of the present disclosure" in some cases), the charge storage electrode arranged apart from the first electrode and arranged to face the photoelectric conversion layer through the insulating layer is provided, and the charge can be stored in the photoelectric conversion layer when the light is applied to the photoelectric conversion unit and photoelectrically converted by the photoelectric conversion unit. Therefore, the charge storage portion can be fully depleted to delete the charge at the start of exposure. This can suppress the phenomenon of reduction in imaging quality caused by the degradation of random noise due to an increase in kTC noise.

Furthermore, in each of the imaging element according to the first aspect of the present disclosure, the imaging element according to the first aspect of the present disclosure included in the stacked imaging element, and the imaging element according to the first aspect of the present disclosure included in the solid-state imaging apparatuses according to the first and second aspects of the present disclosure (hereinafter, the imaging elements will be collectively referred to as "imaging element and the like according to the first aspect of the present disclosure" in some cases), the absolute value of the potential applied to the part of the photoelectric conversion layer facing the charge storage electrode is a value larger than the absolute value of the potential applied to the region of the photoelectric conversion layer positioned between the imaging element and the adjacent imaging element when the photoelectric conversion occurs in the photoelectric conversion layer after the light enters the photoelectric conversion layer. Therefore, the charge generated by the photoelectric conversion is strongly attracted to the part of the photoelectric conversion layer facing the charge storage electrode. This can prevent the charge generated by the photoelectric conversion from flowing into the adjacent imaging element, and the quality of the taken video (image) is not degraded Furthermore, in each of the imaging element according to the second aspect of the present disclosure, the imaging element according to the second aspect of the disclosure included in the stacked imaging element, and the imaging element of the second aspect of the present disclosure included in the solid-state imaging apparatuses according to the first and second aspects of the present disclosure (hereinafter, the imaging elements will be collectively referred to as "imaging element and the like according to the second aspect of the present disclosure" in some cases), the width of the region of the photoelectric conversion layer positioned between the first electrode and the charge storage electrode is narrower than the width of the region of the photoelectric conversion layer positioned between the imaging element and the adjacent imaging element. Furthermore, in this case, the region between the first electrode and the charge storage electrode is unlikely to be affected by the voltage of the second electrode (upper electrode), compared to the part positioned between the imaging element and the adjacent imaging element. Therefore, the potential becomes large, and this can prevent the charge generated by the photoelectric conversion from flowing into the adjacent imaging element, and the quality of the taken video (image) is not degraded.

Furthermore, in each of the imaging element according to the third aspect of the present disclosure, the imaging element according to the third aspect of the present disclosure included in the stacked imaging element, and the imaging element according to the third aspect of the present disclosure included in the solid-state imaging apparatuses according to the first and second aspects of the present disclosure (hereinafter, the imaging elements will be collectively referred to as "imaging element and the like according to the third aspect of the present disclosure" in some cases), the charge movement control electrode is formed in the region facing, through the insulating layer, the region of the photoelectric conversion layer positioned between the imaging element and the adjacent imaging element. This can control the electric field and the potential of the region of the photoelectric conversion layer positioned on the upper side of the charge movement control electrode. As a result, the charge movement control electrode can prevent the charge generated by the photoelectric conversion from flowing into the adjacent imaging element, and the quality of the taken video (image) is not degraded.

Furthermore, in each of the imaging element according to the fourth aspect of the present disclosure, the imaging element according to the fourth aspect of the present disclosure included in the stacked imaging element, and the imaging element according to the fourth aspect of the present disclosure included in the solid-state imaging apparatuses according to the first and second aspects of the present disclosure (hereinafter, the imaging elements will be collectively referred to as "imaging element and the like according to the fourth aspect of the present disclosure" in some cases), the charge movement control electrode is formed, in place of the second electrode, over the region of the photoelectric conversion layer positioned between the imaging element and the adjacent imaging element. Therefore, the charge movement control electrode can prevent the charge generated by the photoelectric conversion from flowing into the adjacent imaging element, and the quality of the taken video (image) is not degraded.

Furthermore, in each of the imaging element according to the fifth aspect of the present disclosure, the imaging element according to the fifth aspect of the present disclosure included in the stacked imaging element, and the imaging element according to the fifth aspect of the present disclosure included in the solid-state imaging apparatuses according to the first and second aspects of the present disclosure (hereinafter, the imaging elements will be collectively referred to as "imaging element and the like according to the fifth aspect of the present disclosure" in some cases), the value of the dielectric constant of the insulating material included in the region between the first electrode and the charge storage electrode is higher than the value of the dielectric constant of the insulating material included in the region between the imaging element and the adjacent imaging element. Therefore, the capacity of a kind of capacitor (referred to as "capacitor-A" for convenience) formed in the region of the charge storage electrode positioned between the first electrode and the charge storage electrode is larger than the capacity of a kind of capacitor (referred to as "capacitor-B" for convenience) formed in the region of the charge storage electrode positioned between the imaging element and the adjacent imaging element. The charge is more attracted toward the region between the first electrode and the charge storage electrode than toward the region between the imaging element and the adjacent imaging element. This can prevent the charge generated by the photoelectric conversion from flowing into the adjacent imaging element, and the quality of the taken video (image) is not degraded.

Furthermore, in each of the imaging element according to the sixth aspect of the present disclosure, the imaging element according to the sixth aspect of the present disclosure included in the stacked imaging element, and the imaging element according to the sixth aspect of the present disclosure included in the solid-state imaging apparatuses according to the first and second aspects of the present disclosure (hereinafter, the imaging elements will be collectively referred to as "imaging element and the like according to the sixth aspect of the present disclosure" in some cases), the thickness of the region of the insulating layer positioned between the first electrode and the charge storage electrode is thinner than the thickness of the region of the insulating layer positioned between the imaging element and the adjacent imaging element. Therefore, the capacity of the capacitor-A is larger than the capacity of the capacitor-B, and the charge is more attracted toward the region of the insulating layer positioned between the first electrode and the charge storage electrode than toward the region of the insulating layer positioned between the imaging element and the adjacent imaging element. This can prevent the charge generated by the photoelectric conversion from flowing into the adjacent imaging element, and the quality of the taken video (image) is not degraded.

Furthermore, in each of the imaging element according to the seventh aspect of the present disclosure, the imaging element according to the seventh aspect of the present disclosure included in the stacked imaging element, and the imaging element according to the seventh aspect of the present disclosure included in the solid-state imaging apparatuses according to the first and second aspects of the present disclosure (hereinafter, the imaging elements will be collectively referred to as "imaging element and the like according to the seventh aspect of the present disclosure" in some cases), the thickness of the region of the photoelectric conversion layer positioned between the first electrode and the charge storage electrode is thicker than the thickness of the region of the photoelectric conversion layer positioned between the imaging element and the adjacent imaging element. Furthermore, in this case, the region of the photoelectric conversion layer positioned between the imaging element and the adjacent imaging element is more affected by the voltage of the second electrode (upper electrode), and the potential becomes small. This can prevent the charge generated by the photoelectric conversion from flowing into the adjacent imaging element, and the quality of the taken video (image) is not degraded.

Furthermore, in each of the imaging element according to the eighth aspect of the present disclosure, the imaging element according to the eighth aspect of the present disclosure included in the stacked imaging element, and the imaging element according to the eighth aspect of the present disclosure included in the solid-state imaging apparatuses according to the first and second aspects of the present disclosure (hereinafter, the imaging elements will be collectively referred to as "imaging element and the like according to the eighth aspect of the present disclosure" in some cases), the fixed charge amount in the region of the interface between the photoelectric conversion layer and the insulating layer positioned between the first electrode and the charge storage electrode is less than the fixed charge amount in the region of the interface between the photoelectric conversion layer and the insulating layer positioned between the imaging element and the adjacent imaging element. Furthermore, furthermore, in this case, the potential of the region of the photoelectric conversion layer positioned between the imaging element and the adjacent imaging element changes more in accordance with the amount of fixed charge. This can prevent the charge generated by the photoelectric conversion from flowing into the adjacent imaging element, and the quality of the taken video (image) is not degraded.

Furthermore, in each of the imaging element according to the ninth aspect of the present disclosure, the imaging element according to the ninth aspect of the present disclosure included in the stacked imaging element, and the imaging element according to the ninth aspect of the present disclosure included in the solid-state imaging apparatuses according to the first and second aspects of the present disclosure (hereinafter, the imaging elements will be collectively referred to as "imaging element and the like according to the ninth aspect of the present disclosure" in some cases), the value of the charge mobility in the region of the photoelectric conversion layer positioned between the first electrode and the charge storage electrode is larger than the value of the charge mobility in the region of the photoelectric conversion layer positioned between the imaging element and the adjacent imaging element. In this case, the charge more easily flows toward the first electrode than toward the direction of the adjacent imaging element. This can prevent the charge generated by the photoelectric conversion from flowing into the adjacent imaging element, and the quality of the taken video (image) is not degraded.

Note that the advantageous effects described in the present specification are illustrative only and are not limited. In addition, there may also be additional advantageous effects.

BRIEF DESCRIPTION OF DRAWINGS

FIG. 8 is a diagram schematically illustrating a state of potential in each section during operation of the imaging element of Embodiment 1.

FIG. 16A is a schematic cross-sectional view taken along a one-dot chain line B-B of FIG. 15B in Modified Example 5 of Embodiment 1 illustrated in FIG. 15B, and FIG. 16B is a schematic cross-sectional view taken along a one-dot chain line A-A of FIG. 15A when a charge movement control electrode is replaced with a discharge electrode in Modified Example 5 of Embodiment 1 illustrated in FIG. 15A.

FIGS. 17A and 17B are schematic cross-sectional views of part of imaging elements of Embodiment 2 (two imaging elements arranged side by side).

FIGS. 18A and 18B are schematic cross-sectional views of part of imaging elements of Embodiment 3 (two imaging elements arranged side by side).

DESCRIPTION OF EMBODIMENTS

Figure 1A:
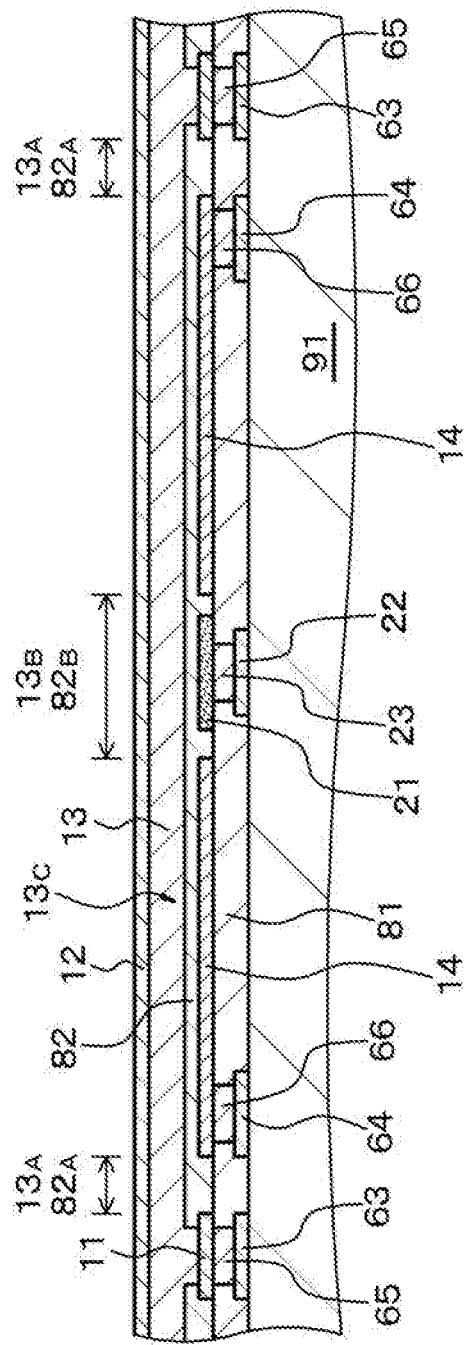
FIGS. 1A and 1B are a schematic cross-sectional view of part of imaging elements of Embodiment 1 (two imaging elements arranged side by side) and a schematic cross-sectional view of a modified example (modified example 6 of Embodiment 1) of the imaging elements of Embodiment 1 (two imaging elements arranged side by side), respectively.

Hereinafter, the present disclosure will be described based on Embodiments with reference to the drawings. However, the present disclosure is not limited to Embodiments, and various values and materials in Embodiments are illustrative. Note that the present disclosure will be described in the following order.

1. Description in General Regarding Imaging Elements and Stacked Imaging Elements According to First to Ninth Aspects of Present Disclosure and Solid-State Imaging Apparatuses According to First and Second Aspects of Present Disclosure
2. Embodiment 1 (Imaging Elements According to First to Third Aspects of Present Disclosure, Stacked Imaging Element of Present Disclosure, and Solid-State Imaging Apparatus According to Second Aspect of Present Disclosure)
3. Embodiment 2 (Imaging Element According to Second Aspect of Present Disclosure)
4. Embodiment 3 (Imaging Element According to Fourth Aspect of Present Disclosure)
5. Embodiment 4 (Imaging Element According to Fifth Aspect of Present Disclosure)
6. Embodiment 5 (Imaging Element According to Sixth Aspect of Present disclosure)
7. Embodiment 6 (Imaging Element According to Seventh Aspect of Present Disclosure)
8. Embodiment 7 (Imaging Element According to Eighth Aspect of Present Disclosure)
9. Embodiment 8 (Imaging Element According to Ninth Aspect of Present Disclosure)
10. Embodiment 9 (Modification of Imaging Elements of Embodiments 1 to 8)
11. Embodiment 10 (Modification of Embodiments 1 to 9, Solid-State Imaging Apparatus According to First Aspect of Present Disclosure)
12. Embodiment 11 (Modification of Embodiments 1 to 10, Imaging Element Including Transfer Control Electrode)
13. Embodiment 12 (Modification of Embodiments 1 to 11, Imaging Element Including a Plurality of Charge Storage Electrode Segments)
14. Embodiment 13 (Imaging Elements of First Configuration and Sixth Configuration)
15. Embodiment 14 (Imaging Elements of Second configuration and Sixth configuration of Present Disclosure)
16. Embodiment 15 (Imaging Element of Third Configuration)
17. Embodiment 16 (Imaging Element of Fourth Configuration)
18. Embodiment 17 (Imaging Element of Fifth Configuration)
19. Embodiment 18 (Imaging Element of Sixth Configuration)
20. Embodiment 19 (Solid-State Imaging Apparatuses of First and Second Configurations)
21. Embodiment 20 (Modification of Embodiment 19)
22. Others <Description in General Regarding Imaging Elements and Stacked Imaging Elements According to First to Ninth Aspects of Present Disclosure and Solid-State Imaging Apparatuses According to First and Second Aspects of Present Disclosure>

In the following description, a "region of photoelectric conversion layer positioned between first electrode and charge storage electrode" will be referred to as a "region-A of photoelectric conversion layer" for convenience, and a "region of photoelectric conversion layer positioned between imaging element and adjacent imaging element" will be referred to as a "region-B of photoelectric conversion layer" for convenience. In addition, a "region of insulating layer positioned between first electrode and charge storage electrode" will be referred to as a "region-A of insulating layer" for convenience, and a "region of insulating layer positioned between imaging element and adjacent imaging element" will be referred to as a "region-B of insulating layer" for convenience. The region-B of the photoelectric conversion layer corresponds to the region-B of the insulating layer. Furthermore, a "region between first electrode and charge storage electrode" will be referred to as a "region-a" for convenience, and a "region between imaging element and adjacent imaging element" will be referred to as a "region-b" for convenience. In the region-a, the region-A of the photoelectric conversion layer corresponds to the region-A of the insulating layer. In the region-b, the region-B of the photoelectric conversion layer corresponds to the region-B of the insulating layer.

In the imaging element and the like according to the first and second aspects of the present disclosure, the region-B of the photoelectric conversion layer denotes, in other words, the part of the photoelectric conversion layer positioned above the part of the insulating layer (region-B of insulating layer) in the region (region-b) between the charge storage electrode and the charge storage electrode included in adjacent imaging elements.

In the imaging element and the like according to the third aspect of the present disclosure, the charge movement control electrode is formed in the region facing the region-B of the photoelectric conversion layer through the insulating layer. In other words, the charge movement control electrode is formed below the part of the insulating layer (region-B of insulating layer) in the region (region-b) between the charge storage electrode and the charge storage electrode included in adjacent imaging elements. The charge movement control electrode is provided apart from the charge storage electrodes. Alternatively, in other words, the charge movement control electrode is provided around the charge storage electrode and apart from the charge storage electrode, and the charge movement control electrode is arranged to face the region-B of the photoelectric conversion layer through the insulating layer.

In the imaging element and the like according to the fourth aspect of the present disclosure, the charge movement control electrode is formed, in place of the second electrode, over the region of the photoelectric conversion layer positioned between the imaging element and the adjacent imaging element. The charge movement control electrode is provided apart from the second electrode. In other words,

[A] the second electrode may be provided for each imaging element, and the charge movement control electrode may be provided around at least part of the second electrode, apart from the second electrode, over the region-B of the photoelectric conversion layer,

[B] the second electrode may be provided for each imaging element, the charge movement control electrode may be provided around at least part of the second electrode or apart from the second electrode, and part of the charge storage electrode may exist on the lower side of the charge movement control electrode, or

[C] the second electrode may be provided for each imaging element, the charge movement control electrode may be provided around at least part of the second electrode or apart from the second electrode, part of the charge storage electrode may exist on the lower side of the charge movement control electrode, and furthermore, the charge movement control electrode in the imaging element and the like according to the third aspect may be formed on the lower side of the charge movement control electrode. The potential generated by coupling of the charge movement control electrode and the second electrode is applied in some cases to the region of the photoelectric conversion layer positioned below the region between the charge movement control electrode and the second electrode.

In the imaging element and the like according to the fifth aspect of the present disclosure, an insulating material included in the region-a (referred to as "insulating material-A" for convenience) may planarly fill all of the region-a, may fill part of the region-a, may include the region-a to above an edge portion of the charge storage electrode (edge portion facing the region-a), or may be formed over part or all of the charge storage electrode. Alternatively, the insulating material may fill all of the region-a in the thickness direction of the insulating layer or may fill part of the region-a. An insulating material (referred to as "insulating material-B" for convenience) included in the region-B of the insulating layer (region-b) may planarly fill all of the region-B of the insulating layer (region-b), may fill part of the region-B of the insulating layer (region-b), or may include the region-B of the insulating layer (region-b) to an edge portion of the charge storage electrode (edge portion facing the region-B of the insulating layer (region-b)). Alternatively, the insulating material may fill all of the region-B of the insulating layer (region-b) in the thickness direction of the insulating layer or may fill part of the region-B of the insulating layer (region-b).

In the imaging element and the like according to the sixth aspect of the present disclosure, the thickness of the region-A of the insulating layer is thinner than the thickness of the region-B of the insulating layer. All of the regions of the region-A of the insulating layer and the region-B of the insulating layer may satisfy the requirement, or part of the regions may satisfy the requirement.

In the imaging element and the like according to the seventh aspect of the present disclosure, the thickness of the region-A of the photoelectric conversion layer is thicker than the thickness of the region-B of the photoelectric conversion layer. All of the regions of the region-A of the photoelectric conversion layer and the region-B of the photoelectric conversion layer may satisfy the requirement, or part of the regions may satisfy the requirement. The thickness of the region-B of the photoelectric conversion layer may be "0." That is, the region of the photoelectric conversion layer positioned between the imaging element and the adjacent imaging element may not exist depending on the case.

In the imaging element and the like according to the eighth aspect of the present disclosure, the fixed charge amount in the region of the interface between the region-A of the photoelectric conversion layer and the region-A of the insulating layer is less than the fixed charge amount in the region of the interface between the region-B of the photoelectric conversion layer and the region-B of the insulating layer. All of the region of the interface between the region-A of the photoelectric conversion layer and the region-A of the insulating layer and the region of the interface between the region-B of the photoelectric conversion layer and the region-B of the insulating layer may satisfy the requirement, or part of the regions may satisfy the requirement.

In the imaging element and the like according to the ninth aspect of the present disclosure, the value of the charge mobility in the region-A of the photoelectric conversion layer (referred to as "charge mobility-A" for convenience) is larger than the value of the charge mobility in the region-B of the photoelectric conversion layer (referred to as "charge mobility-B" for convenience). All of the regions of the region-A of the photoelectric conversion layer and the region-B of the photoelectric conversion layer may satisfy the requirement, or part of the regions may satisfy the requirement. Alternatively, the region of the photoelectric conversion layer with charge mobility-A may extend over part or all of the charge storage electrode.

The imaging element and the like according to the third aspect of the present disclosure may further include a control unit provided on a semiconductor substrate and including a drive circuit, in which the first electrode, the second electrode, the charge storage electrode, and the charge movement control electrode are connected to the drive circuit, in a charge storage period, the drive circuit applies a potential $V_{11}$ to the first electrode, applies a potential $V_{12}$ to the charge storage electrode, and applies a potential $V_{13}$ to the charge movement control electrode, and charge is stored in the photoelectric conversion layer, and in a charge transfer period, the drive circuit applies a potential $V_{21}$ to the first electrode, applies a potential $V_{22}$ to the charge storage electrode, and applies a potential $V_{23}$ to the charge movement control electrode, and the charge stored in the photoelectric conversion layer is read out to the control unit through the first electrode, where in a case where the potential of the first electrode is higher than the potential of the second electrode, $V_{12} \geq V_{11}, V_{12} > V_{13}$, and $V_{21} > V_{22} > V_{23}$ hold, and in a case where the potential of the first electrode is lower than the potential of the second electrode, $V_{12} \leq V_{11}, V_{12} < V_{13}$, and $V_{21} < V_{22} < V_{23}$ hold.

The charge movement control electrode may be formed in the same level as the first electrode or the charge storage electrode or may be formed in a different level.

The imaging element and the like according to the fourth aspect of the present disclosure may further include a control unit provided on a semiconductor substrate and including a drive circuit, in which the first electrode, the second electrode, the charge storage electrode, and the charge movement control electrode are connected to the drive circuit, in a charge storage period, the drive circuit applies a potential $V_2'$ to the second electrode and applies a potential $V_{13}'$ to the charge movement control electrode, and charge is stored in the photoelectric conversion layer, and in a charge transfer period, the drive circuit applies a potential $V_2''$ to the second electrode and applies a potential $V_{23}''$ to the charge movement control electrode, and the charge stored in the photoelectric conversion layer is read out to the control unit through the first electrode, where in a case where the potential of the first electrode is higher than the potential of the second electrode, $V_2' \geq V_{13}'$ and $V_2'' \geq V_{23}''$ hold, and in a case where the potential of the first electrode is lower than the potential of the second electrode, $V_2' \leq V_{13}'$ and $V_2'' \leq V_{23}''$ hold.

The charge movement control electrode is formed in the same level as the second electrode.

Each of the imaging elements and the like of the present disclosure including the preferred modes described above may further include a semiconductor substrate, in which the photoelectric conversion unit is arranged on an upper side of the semiconductor substrate. Note that the first electrode, the charge storage electrode, the second electrode, and various electrodes are connected to a drive circuit described later.

Furthermore, each of the imaging elements and the like of the present disclosure including various preferred modes described above may further include a transfer control electrode (charge transfer electrode) arranged between the first electrode and the charge storage electrode, arranged apart from the first electrode and the charge storage electrode, and arranged to face the photoelectric conversion layer through the insulating layer. Note that the imaging element and the like of the present disclosure in the mode will be referred to as an "imaging element and the like of the present disclosure including the transfer control electrode" for convenience in some cases. In addition, the imaging element and the like of the present disclosure including the transfer control electrode may further include a control unit provided on the semiconductor substrate and including the drive circuit, in which the first electrode, the charge storage electrode, and the transfer control electrode are connected to the drive circuit, in the charge storage period, the drive circuit applies a potential $V_{11}$ to the first electrode, applies a potential $V_{12}$ to the charge storage electrode, and applies a potential $V_{14}$ to the transfer control electrode, and charge is stored in the photoelectric conversion layer, and in the charge transfer period, the drive circuit applies a potential $V_{21}$ to the first electrode, applies a potential $V_{22}$ to the charge storage electrode, and applies a potential $V_{24}$ to the transfer control electrode, and the charge stored in the photoelectric conversion layer is read out to the control unit through the first electrode, where in a case where the potential of the first electrode is higher than the potential of the second electrode, $V_{12} > V_{14}$ and $V_{22} \leq V_{24} \leq V_{21}$ hold, and in a case where the potential of the first electrode is lower than the potential of the second electrode, $V_{12} < V_{14}$ and $V_{22} \geq V_{24} \geq V_{21}$ hold.

Furthermore, in each of the imaging elements and the like of the present disclosure including various preferred modes described above, the charge storage electrode may include a plurality of charge storage electrode segments. Note that the imaging element and the like of the present disclosure in the mode will be referred to as an "imaging element and the like of the present disclosure including the plurality of charge storage electrode segments" for convenience in some cases. The number of charge storage electrode segments can be equal to or greater than two. Furthermore, in a case where a different potential is applied to each of N charge storage electrode segments in the imaging element and the like of the present disclosure including the plurality of charge storage electrode segments, the potential applied to a charge storage electrode segment (first photoelectric conversion unit segment) positioned at a place closest to the first electrode may be higher than the potential applied to a charge storage electrode segment (Nth photoelectric conversion unit segment) positioned at a place farthest from the first electrode in the charge transfer period in a case where the potential of the first electrode is higher than the potential of the second electrode, and the potential applied to the charge storage electrode segment (first photoelectric conversion unit segment) positioned at a place closest to the first electrode may be lower than the potential applied to the charge storage electrode segment (Nth photoelectric conversion unit segment) positioned at a place farthest from the first electrode in the charge transfer period in a case where the potential of the first electrode is lower than the potential of the second electrode.

Furthermore, in each of the imaging elements and the like of the present disclosure including various preferred modes described above, the size of the charge storage electrode may be larger than the size of the first electrode. Although not limited, it is preferable to satisfy $4 \leq S_1'/S_1$, where $S_1'$ is the area of the charge storage electrode, and $S_1$ is the area of the first electrode.

In the imaging element according to the second aspect of the present disclosure, a width $W_A$ of the region-A of the photoelectric conversion layer is narrower than a width $W_B$ of the region-B of the photoelectric conversion layer, and an example of the value of $(W_A/W_B)$ includes $\frac{1}{2} \leq (W_A/W_B) < 1$.

In the imaging element according to the fifth aspect of the present disclosure, a specific example of the insulating material-A includes SiN, and a specific example of the insulating material-B includes $SiO_2$.

In the imaging element according to the sixth aspect of the present disclosure, a thickness $t_{In-A}$ of the region-A of the insulating layer is thinner than a thickness $t_{In-B}$ of the region-B of the insulating layer, and an example of the value of $(t_{In-A}/t_{In-B})$ includes $\frac{1}{2} < (t_{In-A}/t_{In-B}) < 1$.

In the imaging element according to the seventh aspect of the present disclosure, a thickness $t_{Pc-A}$ of the region-A of the photoelectric conversion layer is thicker than a thickness $t_{Pc-B}$ of the region-B of the photoelectric conversion layer, and an example of the value of $(t_{Pc-A}/t_{Pc-B})$ includes $1 < (t_{Pc-A}/t_{Pc-B}) \leq 2$.

In the imaging element according to the eighth aspect of the present disclosure, a fixed charge amount $FC_A$ in the region of the interface between the region-A of the photoelectric conversion layer and the region-A of the insulating layer is less than a fixed charge amount $FC_B$ in the region of the interface between the region-B of the photoelectric conversion layer and the region-B of the insulating layer. An example of the value of $(FC_A/FC_B)$ includes $\frac{1}{10} \leq (FC_A/FC_B) < 1$.

Here, the fixed charge amount in the region of the interface between the photoelectric conversion layer and the insulating layer can be controlled based on a method of, for example, depositing a thin film with fixed charge.

In the imaging element according to the ninth aspect of the present disclosure, a value $CT_A$ of the charge mobility in the region-A of the photoelectric layer is larger than a value $CT_B$ of the charge mobility in the region-B of the photoelectric conversion layer. An example of the value of $(CT_A/CT_B)$ includes $1 < (CT_A/CT_B) \leq 1 \times 10^2$.

The material included in the region-A of the photoelectric conversion layer and the material included in the region-B of the photoelectric conversion layer can be appropriately selected from the materials included in the photoelectric conversion layer. Alternatively, part of the photoelectric conversion layer may have a two-layer configuration of an upper layer/a lower layer. The upper layer of the region-A of the photoelectric conversion layer and the upper layer of the region-B of the photoelectric conversion layer and the part of the photoelectric conversion layer positioned on the upper side of the charge storage electrode may contain the same material (referred to as "upper layer constituent material" for convenience). The lower layer of the region-A of the photoelectric conversion layer and the lower layer of the part of the photoelectric conversion layer positioned on the upper side of the charge storage electrode may contain the same material (referred to as "lower layer constituent material" for convenience). The upper layer constituent material and the lower layer constituent material may be different.

In this way, the lower layer of the photoelectric conversion layer (will be referred to as "lower semiconductor layer" in some cases) can be provided to prevent, for example, recombination during charge storage. This can also increase the charge transfer efficiency of the charge stored in the photoelectric conversion layer to the first electrode. Furthermore, the charge generated in the photoelectric conversion layer can be temporarily held to control the timing and the like of the transfer. In addition, the generation of dark current can be suppressed. Note that the upper layer of the photoelectric conversion layer will be referred to as an "upper photoelectric conversion layer" in some cases.

The second electrode positioned on the light incident side may be shared by a plurality of imaging elements except for the imaging element and the like according to the fourth aspect of the present disclosure. That is, the second electrode can be a so-called solid electrode. In the imaging element and the like of the present disclosure, the photoelectric conversion layer is shared by a plurality of imaging elements. That is, one photoelectric conversion layer is formed in a plurality of imaging elements.

Furthermore, in the imaging elements and the like of the present disclosure including various preferred modes described above, the first electrode may extend in an opening portion provided in the insulating layer and may be connected to the photoelectric conversion layer. Alternatively, the photoelectric conversion layer may extend in an opening portion provided in the insulating layer and may be connected to the first electrode. In this case, an edge portion of a top surface of the first electrode may be covered by the insulating layer, the first electrode may be exposed on a bottom surface of the opening portion, and a side surface of the opening portion may be sloped to extend from a first surface toward a second surface, where the first surface is a surface of the insulating layer in contact with the top surface of the first electrode, and the second surface is a surface of the insulating layer in contact with a part of the photoelectric conversion layer facing the charge storage electrode. Furthermore, the side surface of the opening portion sloped to extend from the first surface toward the second surface may be positioned on a charge storage electrode side. Note that another layer may also be formed between the photoelectric conversion layer and the first electrode (for example, a material layer suitable for charge storage may be formed between the photoelectric conversion layer and the first electrode).

Furthermore, in the imaging elements and the like of the present disclosure including various preferred modes described above, at least a floating diffusion layer and an amplification transistor included in the control unit may be provided on the semiconductor substrate, and the first electrode may be connected to the floating diffusion layer and a gate portion of the amplification transistor. In addition, in this case, furthermore, a reset transistor and a selection transistor included in the control unit may be further provided on the semiconductor substrate, the floating diffusion layer may be connected to one source/drain region of the reset transistor, one source/drain region of the amplification transistor may be connected to one source/drain region of the selection transistor, and another source/drain region of the selection transistor may be connected to a signal line.

Alternatively, modified examples of the imaging elements and the like of the present disclosure including various preferred modes described above include imaging elements of first to sixth configurations described below. That is, in each of the imaging elements of the first to sixth configurations in the imaging elements and the like of the present disclosure including various preferred modes described above, the photoelectric conversion unit includes N (where N≥2) photoelectric conversion unit segments, the photoelectric conversion layer includes N photoelectric conversion layer segments, the insulating layer includes N insulating layer segments, in each of the imaging elements of the first to third configurations, the charge storage electrode includes N charge storage electrode segments, in each of the imaging elements of the fourth and fifth configurations, the charge storage electrode includes N charge storage electrode segments arranged apart from each other, an nth (where n=1, 2, 3, . . . N) photoelectric conversion unit segment includes an nth charge storage electrode segment, an nth insulating layer segment, and an nth photoelectric conversion layer segment, and the larger the value of n of the photoelectric conversion unit segment, the farther the position of the photoelectric conversion unit segment from the first electrode.

Furthermore, in the imaging element of the first configuration, the thicknesses of the photoelectric conversion layer segments gradually change from the first photoelectric conversion unit segment to the Nth photoelectric conversion unit segment. Furthermore, in the imaging element of the second configuration, the thicknesses of the photoelectric conversion layer segments gradually change from the first photoelectric conversion unit segment to the Nth photoelectric conversion unit segment. Furthermore, in the imaging element of the third configuration, materials included in the insulating layer segments vary between adjacent photoelectric conversion unit segments. Furthermore, in the imaging element of the fourth configuration, materials included in the charge storage electrode segments vary between adjacent photoelectric conversion unit segments. Furthermore, in the imaging element of the fifth configuration, the areas of the charge storage electrode segments gradually decrease from the first photoelectric conversion unit segment to the Nth photoelectric conversion unit segment. Note that the areas may continuously decrease or may decrease step-wise.

Alternatively, in the imaging element of the sixth configuration in the imaging elements and the like of the present disclosure including various preferred modes described above, a cross-sectional area of a stacked part of the charge storage electrode, the insulating layer, and the photoelectric conversion layer when the stacked part is cut in a YZ virtual plane changes in accordance with the distance from the first electrode, where a Z direction is a stacking direction of the charge storage electrode, the insulating layer, and the photoelectric conversion layer, and an X direction is a direction away from the first electrode. Note that the change in the cross-sectional area may be a continuous change or a step-wise change.

In each of the imaging elements of the first and second configurations, the N photoelectric conversion layer segments are continuously provided, the N insulating layer segments are also continuous provided, and the N charge storage electrode segments are also continuously provided. In each of the imaging elements of the third to fifth configurations, the N photoelectric conversion layer segments are continuously provided. Furthermore, in each of the imaging elements of the fourth and fifth configurations, the N insulating layer segments are continuously provided. On the other hand, in the imaging element of the third configuration, the N insulating layer segments are provided to correspond to the photoelectric conversion unit segments, respectively. Furthermore, in each of the imaging elements of the fourth and fifth configurations and in the imaging element of the third configuration depending on the case, the N charge storage electrode segments are provided to correspond to the photoelectric conversion unit segments, respectively. Furthermore, in each of the imaging elements of the first to sixth configurations, the same potential is applied to all of the charge storage electrode segments. Alternatively, in each of the imaging elements of the fourth and fifth configurations and in the imaging element of the third configuration depending on the case, a different potential may be applied to each of the N charge storage electrode segments.

In each of the imaging elements of the first to sixth configurations and the stacked imaging elements and the solid-state imaging apparatuses of the present disclosure applying the imaging elements, the thicknesses of the insulating layer segments are defined, the thicknesses of the photoelectric conversion layer segments are defined, the materials included in the insulating layer segments are different, the materials included in the charge storage electrode segments are different, the areas of the charge storage electrode segments are defined, or the cross-sectional areas of the stacked parts are defined. Therefore, a kind of charge transfer gradient is formed, and the charge generated by the photoelectric conversion can be more easily and certainly transferred to the first electrode. In addition, as a result, generation of residual image or charge transfer leftover can be prevented.

A modified example of the stacked imaging element of the present disclosure includes a stacked imaging element including at least one of the imaging elements of the first to sixth configurations. In addition, a modified example of the solid-state imaging apparatus according to the first aspect of the present disclosure includes a solid-state imaging apparatus including a plurality of imaging elements of the first to sixth configurations. A modified example of the solid-state imaging apparatus according to the second aspect of the present disclosure includes a solid-state imaging apparatus including a plurality of stacked imaging elements each including at least one of the imaging elements of the first to sixth configurations.

In each of the imaging elements of the first to fifth configurations, the larger the value of n of the photoelectric conversion unit segment, the farther the position of the photoelectric conversion unit segment from the first electrode. Whether the photoelectric conversion unit segment is positioned away from the first electrode is determined on the basis of an X direction. Furthermore, in the imaging element of the sixth configuration, the direction away from the first electrode is the X direction, and the "X direction" is defined as follows. That is, the pixel region including a plurality of arrayed imaging elements or stacked imaging elements includes a plurality of pixels arranged in a two-dimensional array, that is, systematically arranged in the X direction and the Y direction. In a case where the plane shape of the pixels is rectangle, the extending direction of the side closest to the first electrode is the Y direction, and the direction orthogonal to the Y direction is the X direction. Alternatively, in a case where the plane shape of the pixels is an arbitrary shape, the overall direction including the line segment or curve closest to the first electrode is the Y direction, and the direction orthogonal to the Y direction is the X direction.

Hereinafter, the case where the potential of the first electrode is higher than the potential of the second electrode will be described regarding the imaging elements of the first to sixth configurations. In the case where the potential of the first electrode is lower than the potential of the second electrode, it is only necessary to reverse the high and low of the potentials.

In the imaging element of the first configuration, the thicknesses of the insulating layer segments gradually change from the first photoelectric conversion unit segment to the Nth photoelectric conversion unit segment. The thicknesses of the insulating layer segments may gradually increase or gradually decrease. As a result, a kind of charge transfer gradient is formed.

The thicknesses of the insulating layer segments can be gradually increased in a case where the charge to be stored is electrons. The thicknesses of the insulating layer segments can be gradually reduced in a case where the charge to be stored is electron holes. Furthermore, in these cases, the nth photoelectric conversion unit segment can store more charge than the (n+1)th photoelectric conversion unit segment when the state shifts to $|V_{12}| \geq |V_{11}|$ in the charge storage period. A strong electric field is applied, and this can certainly prevent the flow of charge from the first photoelectric conversion unit segment to the first electrode. Furthermore, when the state shifts to $|V_{22}| < |V_{21}|$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

In the imaging element of the second configuration, the thicknesses of the photoelectric conversion layer segments gradually change from the first photoelectric conversion unit segment to the Nth photoelectric conversion unit segment. The thicknesses of the photoelectric conversion layer segments may gradually increase or gradually decrease. As a result, a kind of charge transfer gradient is formed.

In the case where the charge to be stored is electrons, the thicknesses of the photoelectric conversion layer segments can be gradually increased. In the case where the charge to be stored is electron holes, the thicknesses of the photoelectric conversion layer segments can be gradually reduced. Furthermore, when the state shifts to $V_{12} \geq V_{11}$ in the charge storage period in the case where the thicknesses of the photoelectric conversion layer segments gradually increase, or when the state shifts to $V_{12} \leq V_{11}$ in the charge storage period in the case where the thicknesses of the photoelectric conversion layer segments gradually decrease, a stronger electric field is applied to the nth photoelectric conversion unit segment than to the (n+1)th photoelectric conversion unit segment. This can certainly prevent the flow of charge from the first photoelectric conversion unit segment to the first electrode. Furthermore, when the state shifts to $V_{22} < V_{21}$ in the charge transfer period in the case where the thicknesses of the photoelectric conversion layer segments gradually increase, or when the state shifts to $V_{22}>V_{21}$ in the case where the thicknesses of the photoelectric conversion layer segments gradually decrease, the flow of charge from the first photoelectric conversion unit segment to the first electrode and the flow of charge from the (n+1)th photoelectric conversion unit segment to the nth photoelectric conversion unit segment can be certainly secured.

In the imaging element of the third configuration, the materials included in the insulating layer segments are different in adjacent photoelectric conversion unit segments, and as a result, a kind of charge transfer gradient is formed. It is preferable that the values of the dielectric constants of the materials included in the insulating layer segments gradually decrease from the first photoelectric conversion unit segment to the Nth photoelectric conversion unit segment. Furthermore, by adopting the configuration, the nth photoelectric conversion unit segment can store more charge than the (n+1)th photoelectric conversion unit segment when the state shifts to $V_{12} \geq V_{11}$ in the charge storage period. Furthermore, when the state shifts to $V_{22}<V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

In the imaging element of the fourth configuration, the materials included in the charge storage electrode segments are different in adjacent photoelectric conversion unit segments. As a result, a kind of charge transfer gradient is formed. It is preferable that the values of the work functions of the materials included in the insulating layer segments gradually increase from the first photoelectric conversion unit segment to the Nth photoelectric conversion unit segment. Furthermore, by adopting the configuration, a potential gradient advantageous for the signal charge transfer can be formed regardless of whether or not the voltage is positive or negative.

In the imaging element of the fifth configuration, the areas of the charge storage electrode segments gradually decrease from the first photoelectric conversion unit segment to the Nth photoelectric conversion unit segment. As a result, a kind of charge transfer gradient is formed. Therefore, when the state shifts to $V_{12} \geq V_{11}$ in the charge storage period, the nth photoelectric conversion unit segment can store more charge than the (n+1)th photoelectric conversion unit segment. In addition, when the state shifts to $V_{22}<V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

In the imaging element of the sixth configuration, the cross-sectional areas of the stacked parts change according to the distance from the first electrode. As a result, a kind of charge transfer gradient is formed. Specifically, the thicknesses of the cross sections of the stacked parts can be constant, and the widths of the cross sections of the stacked parts can be reduced with an increase in the distance from the first electrode. By adopting the configuration, as described in the imaging element of the fifth configuration, a region close to the first electrode can store more charge than a region far from the first electrode when the state shifts to $V_{12} \geq V_{11}$ in the charge storage period. Therefore, when the state shifts to $V_{22}<V_{21}$ in the charge transfer period, the flow of charge from the region close to the first electrode to the first electrode and the flow of charge from the region far from the first electrode to the region close to the first electrode can be certainly secured. On the other hand, the widths of the cross sections of the stacked parts can be constant, and the thicknesses of the cross sections of the stacked parts, specifically, the thicknesses of the insulating layer segments, can be gradually increased. By adopting the configuration, as described in the imaging element of the first configuration, the region close to the first electrode can store more charge than the region far from the first electrode when the state shifts to $V_{12} \geq V_{11}$ in the charge storage period as described in the imaging element of the first configuration. A strong electric field is applied, and the flow of charge from the region close to the first electrode to the first electrode can be certainly prevented. Furthermore, when the state shifts to $V_{22}<V_{21}$ in the charge transfer period, the flow of charge from the region close to the first electrode to the first electrode and the flow of charge from the region far from the first electrode to the region close to the first electrode can be certainly secured. In addition, the thicknesses of the photoelectric conversion layer segments can be gradually increased. By adopting the configuration, as described in the imaging element of the second configuration, a stronger electric field is applied to the region close to the first electrode than to the region far from the first electrode when the state shifts to $V_{12} \geq V_{11}$ in the charge storage period. This can certainly prevent the flow of charge from the region close to the first electrode to the first electrode. Furthermore, when the state shifts to $V_{22}<V_{21}$ in the charge transfer period, the flow of charge from the region close to the first electrode to the first electrode and the flow of charge from the region far from the first electrode to the region close to the first electrode can be certainly secured.

Another modified example of the solid-state imaging apparatus according to the first aspect of the present disclosure includes a solid-state imaging apparatus including a plurality of imaging elements according to the first to ninth aspects of the present disclosure or imaging elements according to the first to sixth configurations, in which a plurality of imaging elements are included in an imaging element block, and the first electrode is shared by the plurality of imaging elements included in the imaging element block. Note that the solid-state imaging apparatus configured in this way will be referred to as a "solid-state imaging apparatus of first configuration" for convenience. Alternatively, another modified example of the solid-state imaging apparatus according to the second aspect of the present disclosure includes a solid-state imaging apparatus including a plurality of stacked imaging elements each including at least one of the imaging elements according to the first to ninth aspects of the present disclosure or the imaging elements according to the first to sixth configurations, in which a plurality of stacked imaging elements are included in an imaging element block, and the first electrode is shared by the plurality of stacked imaging elements included in the imaging element block. Note that the solid-state imaging apparatus configured in this way will be referred to as a "solid-state imaging apparatus of second configuration" for convenience. Furthermore, in this way, the first electrode can be shared by the plurality of imaging elements included in the imaging element block to simplify and miniaturize the configuration and the structure in the pixel region including a plurality of arrayed imaging elements.

In each of the solid-state imaging apparatuses of the first and second configurations, one floating diffusion layer is provided for a plurality of imaging elements (one imaging element block). Here, the plurality of imaging elements provided for one floating diffusion layer may include a plurality of imaging elements of first type described later or may include at least one imaging element of first type and one or two or more of imaging elements of second type described later. In addition, the timing of the charge transfer period can be appropriately controlled to allow the plurality of imaging elements to share one floating diffusion layer. The plurality of imaging elements are operated together and connected as an imaging element block to a drive circuit described later. That is, the plurality of imaging elements included in the imaging element block are connected to one drive circuit. However, the charge storage electrode is controlled for each imaging element. In addition, the plurality of imaging elements can share one contact hole portion. As for the arrangement relationship between the first electrode shared by the plurality of imaging elements and the charge storage electrode of each imaging element, the first electrode may be arranged adjacent to the charge storage electrode of each imaging element. Alternatively, the first electrode may be arranged adjacent to the charge storage electrodes of part of the plurality of imaging elements and not arranged adjacent to the charge storage electrodes of the rest of the plurality of imaging elements. In this case, the movement of charge from the rest of the plurality of imaging elements to the first electrode is movement through the part of the plurality of imaging elements. It is preferable that the distance between the charge storage electrode included in the imaging element and the charge storage electrode included in the imaging element (referred to as "distance A" for convenience) be longer than the distance between the first electrode and the charge storage electrode in the imaging element adjacent to the first electrode (referred to as "distance B" for convenience) in order to certainly move the charge from each imaging element to the first electrode. In addition, it is preferable that the farther the position of the imaging element from the first electrode, the larger the value of the distance A.

Furthermore, in each of the imaging elements and the like of the present disclosure including various preferred modes described above, the light may be incident from the second electrode side, and a light shielding layer may be formed on the light incident side closer to the second electrode. Alternatively, the light may be incident from the second electrode side, and the light may not be incident on the first electrode (first electrode and transfer control electrode depending on the case). Furthermore, in this case, the light shielding layer may be formed on the light incident side closer to the second electrode and on the upper side of the first electrode (first electrode and transfer control electrode depending on the case). Alternatively, an on-chip micro lens may be provided on the upper side of the charge storage electrode and the second electrode, and the light incident on the on-chip micro lens may be collected by the charge storage electrode. Here, the light shielding layer may be arranged on the upper side of the surface on the light incident side of the second electrode or may be arranged on the surface on the light incident side of the second electrode. The light shielding layer may be formed on the second electrode depending on the case. Examples of the materials included in the light shielding layer include chromium (Cr), copper (Cu), aluminum (Al), tungsten (W), and a light-proof resin (for example, polyimide resin).

Specific examples of the imaging element of the present disclosure include: an imaging element (referred to as "blue light imaging element of first type" for convenience) sensitive to blue light including a photoelectric conversion layer (referred to as "blue light photoelectric conversion layer of first type" for convenience) that absorbs blue light (light at 425 to 495 nm); an imaging element (referred to as "green light imaging element of first type" for convenience) sensitive to green light including a photoelectric conversion layer ("referred to as green light photoelectric conversion layer of first type" for convenience) that absorbs green light (light at 495 to 570 nm); and an imaging element (referred to as "red light imaging element of first type" for convenience) sensitive to red light including a photoelectric conversion layer (referred to as "red light photoelectric conversion layer of first type" for convenience) that absorbs red light (light at 620 to 750 nm). In addition, an imaging element sensitive to blue light that is a conventional imaging element not including the charge storage electrode will be referred to as a "blue light imaging element of second type" for convenience. A conventional imaging element sensitive to green light will be referred to as a "green light imaging element of second type" for convenience. A conventional imaging element sensitive to red light will be referred to as a "red light imaging element of second type" for convenience. A photoelectric conversion layer included in the blue light imaging element of second type will be referred to as a "blue light photoelectric conversion layer of second type" for convenience. A photoelectric conversion layer included in the green light imaging element of second type will be referred to as a "green light photoelectric conversion layer of second type" for convenience. A photoelectric conversion layer included in the red light imaging element of second type will be referred to as a "red light photoelectric conversion layer of second type" for convenience.

The stacked imaging element of the present disclosure includes at least one imaging element (photoelectric conversion element) of the present disclosure, and specific examples of the configuration and the structure include:

[A] a configuration and a structure in which the blue light photoelectric conversion unit of first type, the green light photoelectric conversion unit of first type, and the red light photoelectric conversion unit of first type are stacked in the vertical direction, and control units of the blue light imaging element of first type, the green light imaging element of first type, and the red light imaging element of first type are provided on the semiconductor substrate;

[B] a configuration and a structure in which the blue light photoelectric conversion unit of first type and the green light photoelectric conversion unit of first type are stacked in the vertical direction, the red light photoelectric conversion unit of second type is arranged on the lower side of these two layers of photoelectric conversion units of first type, and control units of the blue light imaging element of first type, the green light imaging element of first type, and the red light imaging element of second type are provided on the semiconductor substrate;

[C] a configuration and a structure in which the blue light photoelectric conversion unit of second type and the red light photoelectric conversion unit of second type are arranged on the lower side of the green light photoelectric conversion unit of first type, and control units of the green light imaging element of first type, the blue light imaging element of second type, and the red light imaging element of second type are provided on the semiconductor substrate; and

[D] a configuration and a structure in which the green light photoelectric conversion unit of second type and the red light photoelectric conversion unit of second type are arranged on the lower side of the blue light photoelectric conversion unit of first type, and control units of the blue light imaging element of first type, the green light imaging element of second type, and the red light imaging element of second type are provided on the semiconductor substrate. Note that it is preferable that the arrangement order of the photoelectric conversion units of the imaging elements in the vertical direction be the blue light photoelectric conversion unit, the green light photoelectric conversion unit, and the red light photoelectric conversion unit from the light incident direction or the green light photoelectric conversion unit, the blue light photoelectric conversion unit, and the red light photoelectric conversion unit from the light incident direction. This is because the light at a shorter wavelength is efficiently absorbed on the incident surface side. Red has the longest wavelength among the three colors, and it is preferable to position the red light photoelectric conversion unit in the lowest layer as viewed from the light incident surface. The stacked structure of the imaging elements provides one pixel. In addition, an infrared photoelectric conversion unit of first type may also be included. Here, it is preferable that the photoelectric conversion layer of the infrared photoelectric conversion unit of first type include, for example, organic materials and be arranged in the lowest layer of the stacked structure of the imaging elements of first type, above the imaging element of second type. Alternatively, an infrared photoelectric conversion unit of second type may also be included on the lower side of the photoelectric conversion units of first type.

In the imaging element of first type, the first electrode is formed on, for example, an interlayer insulating layer provided on the semiconductor substrate. The imaging element formed on the semiconductor substrate may be a back illuminated type or may be a front illuminated type.

In the case where the photoelectric conversion layer includes organic materials, the photoelectric conversion layer can be in one of the following four modes.

(1) The photoelectric conversion layer includes a p-type organic semiconductor.

(2) The photoelectric conversion layer includes an n-type organic semiconductor.

(3) The photoelectric conversion layer includes a stacked structure of p-type organic semiconductor layer/n-type organic semiconductor layer. The photoelectric conversion layer includes a stacked structure of p-type organic semiconductor layer/mixed layer (bulk hetero structure) of p-type organic semiconductor and n-type organic semiconductor/n-type organic semiconductor layer. The photoelectric conversion layer includes a stacked structure of p-type organic semiconductor layer/mixed layer (bulk hetero structure) of p-type organic semiconductor and n-type organic semiconductor. The photoelectric conversion layer includes a stacked structure of n-type organic semiconductor layer/mixed layer (bulk hetero structure) of p-type organic semiconductor and n-type organic semiconductor.

(4) The photoelectric conversion layer includes a mixture (bulk hetero structure) of p-type organic semiconductor and n-type organic semiconductor.

Here, the order of stacking can be arbitrarily switched.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex including heterocyclic compounds as ligands, a polythiophene derivative, a polybenzothiadiazole derivative, and a polyfluorene derivative. Examples of the n-type organic semiconductor include a fullerene and a fullerene derivative <for example, fullerene (higher fullerene), such as C60, C70, and C74, endohedral fullerene, or the like) or fullerene derivative (for example, fullerene fluoride, PCBM fullerene compound, fullerene multimer, or the like)>, an organic semiconductor with larger (deeper) HOMO and LUMO than the p-type organic semiconductor, and transparent inorganic metal oxide. Specific examples of the n-type organic semiconductor include organic molecules including, as part of molecular framework, a heterocyclic compound containing nitrogen atoms, oxygen atoms, and sulfur atoms, such as a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylene vinylene derivative, a polybenzothiadiazole derivative, and a polyfluorene derivative, an organic metal complex, and a subphthalocyanine derivative. Examples of groups and the like included in the fullerene derivative include: halogen atoms; a straight-chain, branched, or cyclic alkyl group or phenyl group; a group including a straight-chain or condensed aromatic compound; a group including halide; a partial fluoroalkyl group; a perfluoroalkyl group; a silylalkyl group; a silylalkoxy group; an arylsilyl group; an arylsulfanyl group; an alkylsulfanyl group; an arylsulfonyl group; an alkylsulfonyl group; an arylsulfide group; an alkylsulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group including chalcogenide; a phosphine group; a phosphon group; and derivatives of these. Although the thickness of the photoelectric conversion layer including the organic materials (referred to as "organic photoelectric conversion layer" in some cases) is not limited, the thickness can be, for example, $1 \times 10^{-8}$ m to $5 \times 10^{-7}$ m, preferably, $2.5 \times 10^{-8}$ m to $3 \times 10^{-7}$ m, more preferably, $2.5 \times 10^{-8}$ m to $2 \times 10^{-7}$ m, further preferably, $1 \times 10^{-7}$ m to $1.8 \times 10^{-7}$ m. Note that the organic semiconductors are often classified into p-type and n-type. The p-type denotes that the electron holes can be easily transported, and the n-type denotes that the electrons can be easily transported. The organic semiconductor is not limited to the interpretation that the electron holes or the electrons are included as thermally excited majority carriers as in an inorganic semiconductor.

Alternatively, examples of the materials included in the organic photoelectric conversion layer for photoelectric conversion of green light include a rhodamine dye, a merocyanine dye, a quinacridone derivative, and a subphthalocyanine dye (subphthalocyanine derivative). Examples of the materials included in the organic photoelectric conversion layer for photoelectric conversion of blue light include a coumaric acid dye, tris (8-hydroxyquinolinato) aluminum (Alq3), and a merocyanine dye. Examples of the materials included in the organic photoelectric conversion layer for photoelectric conversion of red light include a phthalocyanine dye and a subphthalocyanine dye (subphthalocyanine derivative).

Alternatively, examples of the inorganic materials included in the photoelectric conversion layer include crystalline silicon, amorphous silicon, microcrystalline silicone, crystalline selenium, amorphous selenium, chalcopyrite compounds, such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, group III-V compounds, such as GaAs, InP, AlGaAs, InGaP, AlGaInP, and InGaAsP, and compound semiconductors of CdSe, CdS, In$_2$Se$_3$, In$_2$S$_3$, Bi$_2$Se$_3$, Bi$_2$S$_3$, ZnSe, ZnS, PbSe, PbS, and the like. In addition, quantum dots including these materials can also be used for the photoelectric conversion layer.

Alternatively, the photoelectric conversion layer can have a stacked structure of a lower semiconductor layer and an upper photoelectric conversion layer as described above. The lower semiconductor layer can be provided in this way to prevent, for example, recombination during charge storage. In addition, the charge transfer efficiency of the charge stored in the photoelectric conversion layer to the first electrode can be increased. Furthermore, the charge generated in the photoelectric conversion layer can be temporarily held to control the timing and the like of the transfer. In addition, the generation of dark current can be suppressed. The material included in the upper photoelectric conversion layer can be appropriately selected from various materials included in the photoelectric conversion layer. On the other hand, it is preferable that the material used for the lower semiconductor layer be a material with a large value of band-gap energy (for example, band-gap energy with a value equal to or greater than 3.0 eV) and with mobility higher than the mobility of the material included in the photoelectric conversion layer. Specific examples of the material include: an oxide semiconductor material such as IGZO; transition metal dichalcogenide; silicon carbide; diamond; graphene; a carbon nano-tube; and an organic semiconductor material such as a fused polycyclic hydrocarbon compound and a fused heterocyclic compound. Alternatively, other examples of the material included in the lower semiconductor layer include: a material with ionization potential larger than the ionization potential of the material included in the photoelectric conversion layer in the case where the charge to be stored is electrons; and a material with electron affinity smaller than the electron affinity of the material included in the photoelectric conversion layer in the case where the charge to be stored is electron holes. Alternatively, it is preferable that the impurity concentration of the material included in the lower semiconductor layer be equal to or smaller than $1 \times 10^{18}$ cm$^{-3}$. The lower semiconductor layer may have a single-layer configuration or may have a multi-layer configuration. In addition, the material included in the lower semiconductor layer positioned on the upper side of the charge storage electrode and the material included in the lower semiconductor layer positioned on the upper side of the first electrode may be different.

The solid-state imaging apparatuses according to the first and second aspects of the present disclosure and the solid-state imaging apparatuses of the first and second configurations can provide single-plate color solid-state imaging apparatuses.

In the solid-state imaging apparatus according to the second aspect of the present disclosure or the solid-state imaging apparatus of the second configuration including the stacked imaging elements, the imaging elements sensitive to light at a plurality of types of wavelengths in the light incident direction within the same pixel are stacked to provide one pixel, unlike in the solid-state imaging apparatus including imaging elements of Bayer array (that is, not using a color filter to separate blue, green, and red). Therefore, the sensitivity can be improved, and the pixel density per unit volume can be improved. In addition, the absorption coefficients of the organic materials are high, and the film thickness of the organic photoelectric conversion layer can be thinner than a conventional Si-based photoelectric conversion layer. This reduces light leakage from adjacent pixels and alleviates restrictions on light incident angle. Furthermore, in the conventional Si-based imaging elements, an interpolation process is executed for the pixels of three colors to create color signals, and therefore, false colors are generated. In the solid-state imaging apparatus according to the second aspect of the present disclosure or the solid-state imaging apparatus of the second configuration including the stacked imaging elements, the generation of the false colors is suppressed. The organic photoelectric conversion layer also functions as a color filter, and the colors can be separated without arranging the color filter.

On the other hand, in the solid-state imaging apparatus according to the first aspect of the present disclosure or the solid-state imaging apparatus of the first configuration, the color filter can be used to alleviate the requirements for the spectral characteristics of blue, green, and red, and the mass productivity is high. Examples of the array of the imaging elements in the solid-state imaging apparatus according to the first aspect of the present disclosure or the solid-state imaging apparatus of the first configuration include the Bayer array, as well as an interline array, a G stripe RB checkered array, a G stripe RB full checkered array, a checkered complementary color array, a stripe array, a diagonal stripe array, a primary color difference array, a field color difference sequential array, a frame color difference sequential array, a MOS array, an improved MOS array, a frame interleave array, and a field interleave array. Here, one imaging element provides one pixel (or subpixel).

The pixel region provided with a plurality of arrayed imaging elements of the present disclosure or a plurality of arrayed stacked imaging elements of the present disclosure includes a plurality of pixels systematically arranged in a two-dimensional array. The pixel region usually includes: an effective pixel region in which the light is actually received to generate signal charge through photoelectric conversion, and the signal charge is amplified and read out to the drive circuit; and a black reference pixel region for outputting optical black as a standard for black level. The black reference pixel region is usually arranged on the periphery of the effective pixel region.

In the imaging element and the like of the present disclosure including various preferred modes and configurations described above, the light is applied, and photoelectric conversion occurs in the photoelectric conversion layer. Carrier separation of electron holes (holes) and electrons is conducted. In addition, the electrode from which the electron holes are extracted is an anode, and the electrode from which the electrons are extracted is a cathode. There is a mode in which the first electrode provides the anode, and the second electrode provides the cathode. Conversely, there is also a mode in which the first electrode provides the cathode, and the second electrode provides the anode.

In a case of providing the stacked imaging element, the first electrode, the charge storage electrode, the charge movement control electrode, the transfer control electrode, and the second electrode can include transparent conductive materials. Note that the first electrode, the charge storage electrode, the charge movement control electrode, and the transfer control electrode will be collectively referred to as "first electrode and the like" in some cases. Alternatively, in a case where the imaging element and the like of the present disclosure are arranged on a plane as in, for example, a Bayer array, the second electrode can include a transparent conductive material, and the first electrode and the like can include a metal material. In this case, specifically, the second electrode positioned on the light incident side can include a transparent conductive material, and the first electrode and the like can include, for example, Al—Nd (alloy of aluminum and neodymium) or ASC (alloy of aluminum, samarium, and copper). Note that an electrode including a transparent conductive material will be referred to as a "transparent electrode" in some cases. Here, it is desirable that the band-gap energy of the transparent conductive material be equal to or greater than 2.5 eV, preferably, equal to or greater than 3.1 eV. An example of the transparent conductive material included in the transparent electrode includes conductive metal oxide. Specifically, examples of the transparent conductive material include indium oxide, indium-tin oxide (including ITO, Indium Tin Oxide, Sn-doped $In_2O_3$, crystalline ITO, and amorphous ITO), indium-zinc oxide (IZO, Indium Zinc Oxide) obtained by adding indium as a dopant to zinc oxide, indium-gallium oxide (IGO) obtained by adding indium as a dopant to gallium oxide, indium-gallium-zinc oxide (IGZO, In—$GaZnO_4$) obtained by adding indium and gallium as dopants to zinc oxide, indium-tin-zinc oxide (ITZO) obtained by adding indium and tin as dopants to zinc oxide, IFO (F-doped $In_2O_3$), tin oxide ($SnO_2$), ATO (Sb-doped $SnO_2$), FTO (F-doped $SnO_2$), zinc oxide (including ZnO doped with other elements), aluminum-zinc oxide (AZO) obtained by adding aluminum as a dopant to zinc oxide, gallium-zinc oxide (GZO) obtained by adding gallium as a dopant to zinc oxide, titanium oxide ($TiO_2$), niobium-titanium oxide (TNO) obtained by adding niobium as a dopant to titanium oxide, antimony oxide, spinel oxide, and oxide with $YbFe_2O_4$ structure. Alternatively, the transparent electrode can include gallium oxide, titanium oxide, niobium oxide, nickel oxide or the like as a mother layer. An example of the thickness of the transparent electrode includes $2 \times 10^{-8}$ m to $2 \times 10^{-7}$ m, preferably, $3 \times 10^{-1}$ m to $1 \times 10^{-7}$ m. In a case where the first electrode needs to be transparent, it is preferable that the other electrodes also include transparent conductive materials from the viewpoint of simplification of the manufacturing process.

Alternatively, in a case where the transparency is not necessary, it is preferable to use a conductive material with a high work function (for example, $\varphi=4.5$ eV to 5.5 eV) as a conductive material included in the anode with a function of an electrode for extracting the electron holes. Specifically, examples of the conductive material include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, it is preferable to use a conductive material with a low work function (for example, $\varphi=3.5$ eV to 4.5 eV) as a conductive material included in the cathode with a function of an electrode for extracting the electrons. Specifically, examples of the conductive material include alkali metal (for example, Li, Na, K, or the like) and fluoride or oxide of the alkali metal, alkaline earth metal (for example, Mg, Ca, or the like) and fluoride or oxide of the alkaline earth metal, aluminum (Al), zinc (Zn), tin (Sn), thallium (Tl), a sodium-potassium alloy, an aluminum-lithium alloy, a magnesium-silver alloy, indium, rare earth metal such as ytterbium, and alloys of these. Alternatively, examples of the material included in the anode or the cathode include metal, such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), alloys containing these metal elements, conductive particles including these metals, conductive particles of alloys containing these metals, polysilicon containing impurities, a carbon material, an oxide semiconductor material, a carbon nanotube, and a conductive material such as graphene. The anode or cathode can also have a stacked structure of layers containing these elements. Furthermore, examples of the material included in the anode or the cathode also include organic materials (conductive polymers) such as poly (3,4-ethylenedioxythiophene-poly (styrenesulfonate) [PEDOT/PSS]. In addition, these conductive materials may be mixed with a binder (polymer) to obtain a paste or an ink, and the paste or the ink may be cured and used as an electrode.

A dry method or a wet method can be used as a deposition method of the first electrode and the like or the second electrode (cathode or anode). Examples of the dry method include a physical vapor deposition method (PVD method) and a chemical vapor deposition method (CVD method). Examples of the deposition method using the principle of PVD method include a vacuum evaporation method using resistance heating or radio frequency heating, an EB (electron beam) evaporation method, various sputtering methods (magnetron sputtering method, RF-DC coupled bias sputtering method, ECR sputtering method, facing target sputtering method, and RF sputtering method), an ion plating method, a laser ablation method, a molecular beam epitaxy method, and a laser transfer method. In addition, examples of the CVD method include a plasma CVD method, a thermal CVD method, an organic metal (MO) CVD method, and an optical CVD method. On the other hand, examples of the wet method include methods, such as an electroplating method, an electroless plating method, a spin coating method, an inkjet method, a spray coating method, a stamping method, a microcontact printing method, a flexographic printing method, an offset printing method, a gravure printing method, and a dipping method. Examples of a patterning method include chemical etching, such as a shadow mask, laser transfer, and photolithography, and physical etching using ultraviolet light, laser, or the like. Examples of a planarization method of the first electrode and the like and the second electrode include a laser planarization method, a reflow method, and a CMP (Chemical Mechanical Polishing) method.

Except for the insulating layer in the imaging element and the like according to the fifth aspect of the present disclosure, examples of the material included in the insulating layer include not only inorganic insulating materials like metal oxide high dielectric insulating materials such as: a silicon oxide material; a silicon nitride ($SiN_y$); and aluminum oxide ($Al_2O_3$), but also organic insulating materials (organic polymers) such as: polymethyl methacrylate (PMMA); polyvinyl phenol (PVP); polyvinyl alcohol (PVA); polyimide; polycarbonate (PC); polyethylene terephthalate (PET); polystyrene; a silanol derivative (silane coupling agent) such as N-(2-aminoethyl)-3-aminopropyltrimethoxysilane (AEAPTMS), 3-mercaptopropyltrimethoxysilane (MPTMS), and octadecyltrichlorosilane (OTS); a novolac phenolic resin; a fluororesin; and straight chain hydrocarbons, such as octadecanethiol and dodecyl isocyanate, including, on one end, a functional group that can be combined with a control electrode. A combination of these can also be used. Note that examples of the silicon oxide material include silicon oxide (SiOx), BPSQ PSQ BSQ AsSQ PbSQ silicon oxynitride (SiON), SOG (spin on glass), and low dielectric insulating materials (for example, polyarylether, cycloperfluorocarbon polymer, benzocyclobutene, cyclic fluororesin, polytetrafluoroethylene, fluorinated aryl ether, fluorinated polyimide, amorphous carbon, and organic SOG). These materials can also be appropriately selected for the materials included in various interlayer insulating layers and insulating films.

The configurations and the structures of the floating diffusion layer, the amplification transistor, the reset transistor, and the selection transistor included in the control unit can be similar to the configurations and the structures of the conventional floating diffusion layer, amplification transistor, reset transistor, and selection transistor. The drive circuit can also have well-known configuration and structure.

The first electrode is connected to the floating diffusion layer and a gate portion of the amplification transistor, and a contact hole portion can be formed for the connection of the first electrode to the floating diffusion layer and the gate portion of the amplification transistor. Examples of the materials included in the contact hole portion include polysilicon doped with impurities, high melting point metal and metal silicide, such as tungsten, Ti, Pt, Pd, Cu, TiW, TiN, TiNW, $WSi_2$, and $MoSi_2$, and a stacked structure of layers including these materials (for example, Ti/TiN/W).

A first carrier blocking layer may be provided between the organic photoelectric conversion layer and the first electrode, and a second carrier blocking layer may be provided between the organic photoelectric conversion layer and the second electrode. In addition, a first charge injection layer may be provided between the first carrier blocking layer and the first electrode, and a second charge injection layer may be provided between the second carrier blocking layer and the second electrode. For example, examples of the materials included in the electron injection layer include alkali metal, such as lithium (Li), sodium (Na), and potassium (K), fluoride or oxide of the alkali metal, alkaline earth metal, such as magnesium (Mg) and calcium (Ca), and fluoride or oxide of the alkaline earth metal.

Examples of the deposition method of various organic layers include a dry deposition method and a wet deposition method. Examples of the dry deposition method include a vacuum evaporation method using resistance heating, radio frequency heating, or electron beam heating, a flash evaporation method, a plasma deposition method, an EB evaporation method, various sputtering methods (bipolar sputtering method, DC sputtering method, DC magnetron sputtering method, RF sputtering method, magnetron sputtering method, RF-DC coupled bias sputtering method, ECR sputtering method, facing target sputtering method, RF sputtering method, and ion beam sputtering method), a DC (Direct Current) method, an RF method, a multi-cathode method, an activation reaction method, an electric field evaporation method, various ion plating methods, such as an RF ion plating method and a reactive ion plating method, a laser ablation method, a molecular beam epitaxy method, a laser transfer method, and a molecular beam epitaxy method (MBE method). In addition, examples of the CVD method include a plasma CVD method, a thermal CVD method, an MOCVD method, and an optical CVD method. On the other hand, specific examples of the wet method include: a spin coating method; a dipping method; a casting method; a microcontact printing method; a drop casting method; various printing methods, such as a screen printing method, an inkjet printing method, an offset printing method, a gravure printing method, and a flexographic printing method; a stamping method; a spraying method; and various coating methods, such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Note that in the coating method, examples of the solvent include nonpolar or low-polarity organic solvents, such as toluene, chloroform, hexane, and ethanol. Examples of the patterning method include chemical etching, such as a shadow mask, laser transfer, and photolithography, and physical etching using ultraviolet light, laser, or the like. A laser planarization method, a reflow method, and the like can be used as planarization techniques of various organic layers.

Two or more types of imaging elements and the like according to the first to ninth aspects of the present disclosure and imaging elements of the first to sixth configurations including the preferred modes and configurations described above can be appropriately combined as necessary.

As described above, the on-chip micro lens and the light shielding layer may be provided on the imaging element or the solid-state imaging apparatus as necessary, and the drive circuit and the wire for driving the imaging element are provided. A shutter for controlling the light incident on the imaging element may be arranged as necessary, and an optical cut filter may be provided according to the purpose of the solid-state imaging apparatus.

In addition, the solid-state imaging apparatuses of the first and second configurations can be in a mode where one on-chip micro lens is arranged on the upper side of one imaging element. Alternatively, two imaging elements can be included in the imaging element block, and one on-chip micro lens can be arranged on the upper side of the imaging element block.

For example, in a case of stacking the solid-state imaging apparatus and a readout integrated circuit (ROIC), a drive substrate, which is provided with the readout integrated circuit and a connection portion containing copper (Cu), and the imaging element, which is provided with a connection portion, can be placed on top of each other so that the connection portions come in contact with each other. The connection portions can be bonded to stack the solid-state imaging apparatus and the readout integrated circuit, and solder bumps or the like can also be used to bond the connection portions.

Furthermore, a driving method for driving the solid-state imaging apparatuses according to the first and second aspects of the present disclosure can be a driving method of the solid-state imaging apparatus repeating the steps of:

releasing the charge in the first electrodes all at once to the outside the system while storing the charge in the photoelectric conversion layers in all of the imaging elements; and subsequently, transferring the charge stored in the photoelectric conversion layers all at once to the first electrodes in all of the imaging elements, and after the completion of the transfer, sequentially reading the charge transferred to the first electrodes in the imaging elements.

In the driving method of the solid-state imaging apparatus, the light incident from the second electrode side is not incident on the first electrode in each imaging element. The charge in the first electrodes is released to the outside the system all at once while the charge is stored in the photoelectric conversion layers in all of the imaging elements. Therefore, the first electrodes can be certainly reset at the same time in all of the imaging elements. In addition, subsequently, the charge stored in the photoelectric conversion layers is transferred all at once to the first electrodes in all of the imaging elements. After the completion of the transfer, the imaging elements sequentially read the charge transferred to the first electrodes. Therefore, a so-called global shutter function can be easily realized.

Embodiment 1

Embodiment 1 relates to the imaging element and the like according to the first aspect of the present disclosure, the imaging element and the like according to the third aspect of the present disclosure, the stacked imaging element of the present disclosure, and the solid-state imaging apparatus according to the second aspect of the present disclosure.

Figure 2:
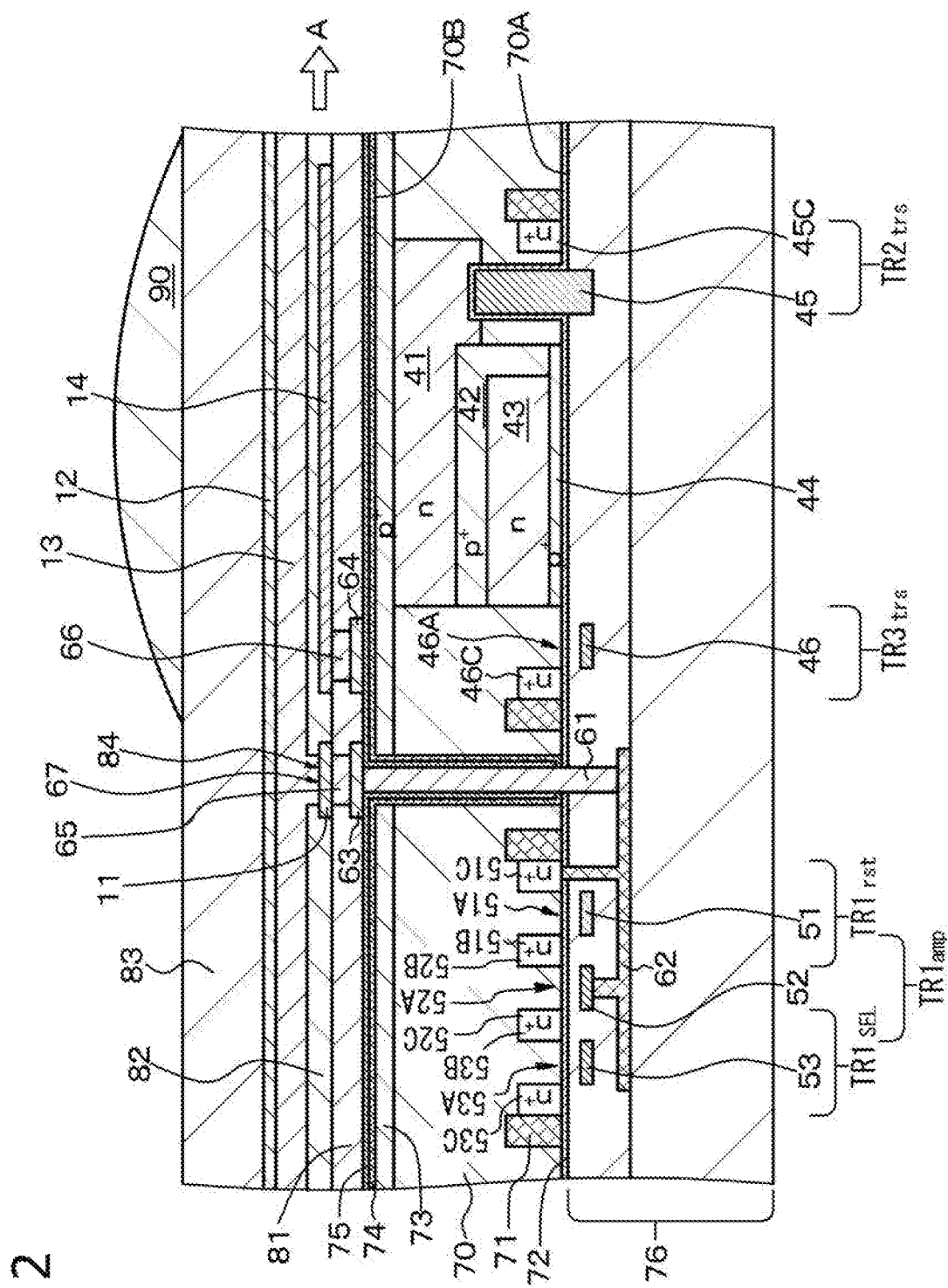
FIG. 2 is a schematic partial cross-sectional view of the imaging element and a stacked imaging element of Embodiment 1.
Figure 3:
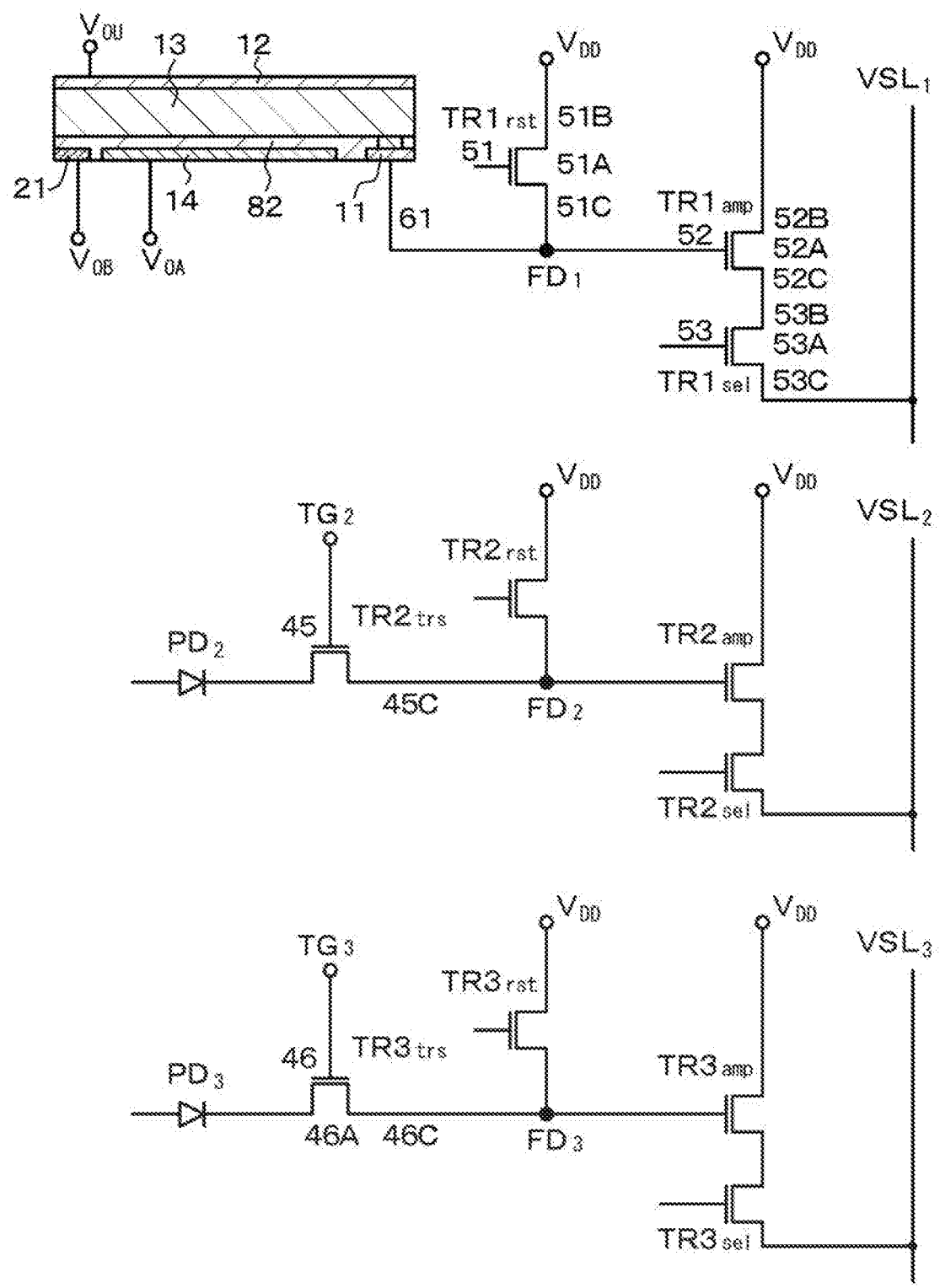
FIG. 3 is an equivalent circuit diagram of the imaging element and the stacked imaging element of Embodiment 1.
Figure 4:
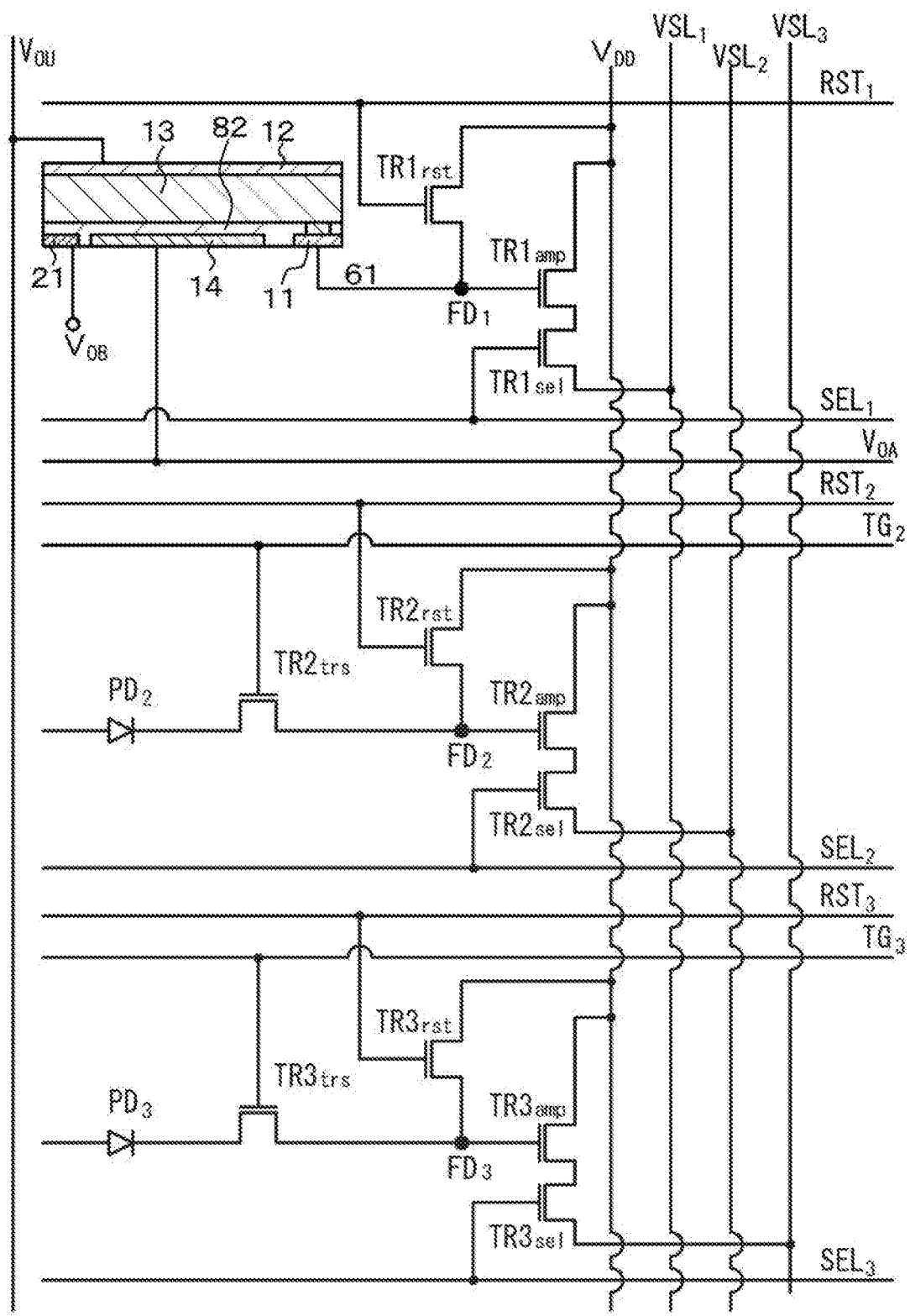
FIG. 4 is an equivalent circuit diagram of the imaging element and the stacked imaging element of Embodiment 1.
Figure 5:
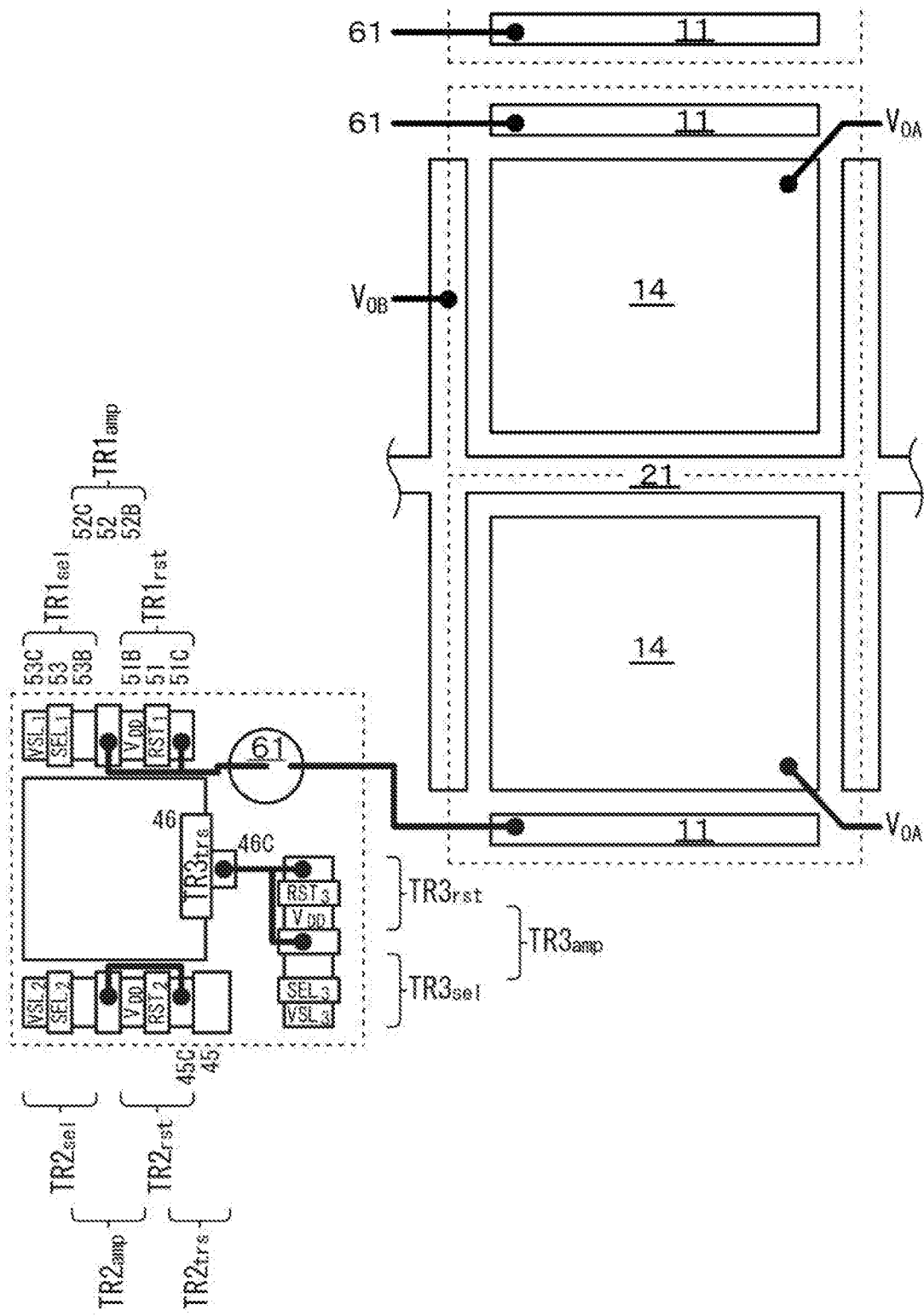
FIG. 5 is a schematic layout drawing of first electrodes, charge storage electrodes, and transistors of control units included in the imaging elements of Embodiment 1.
Figure 6:
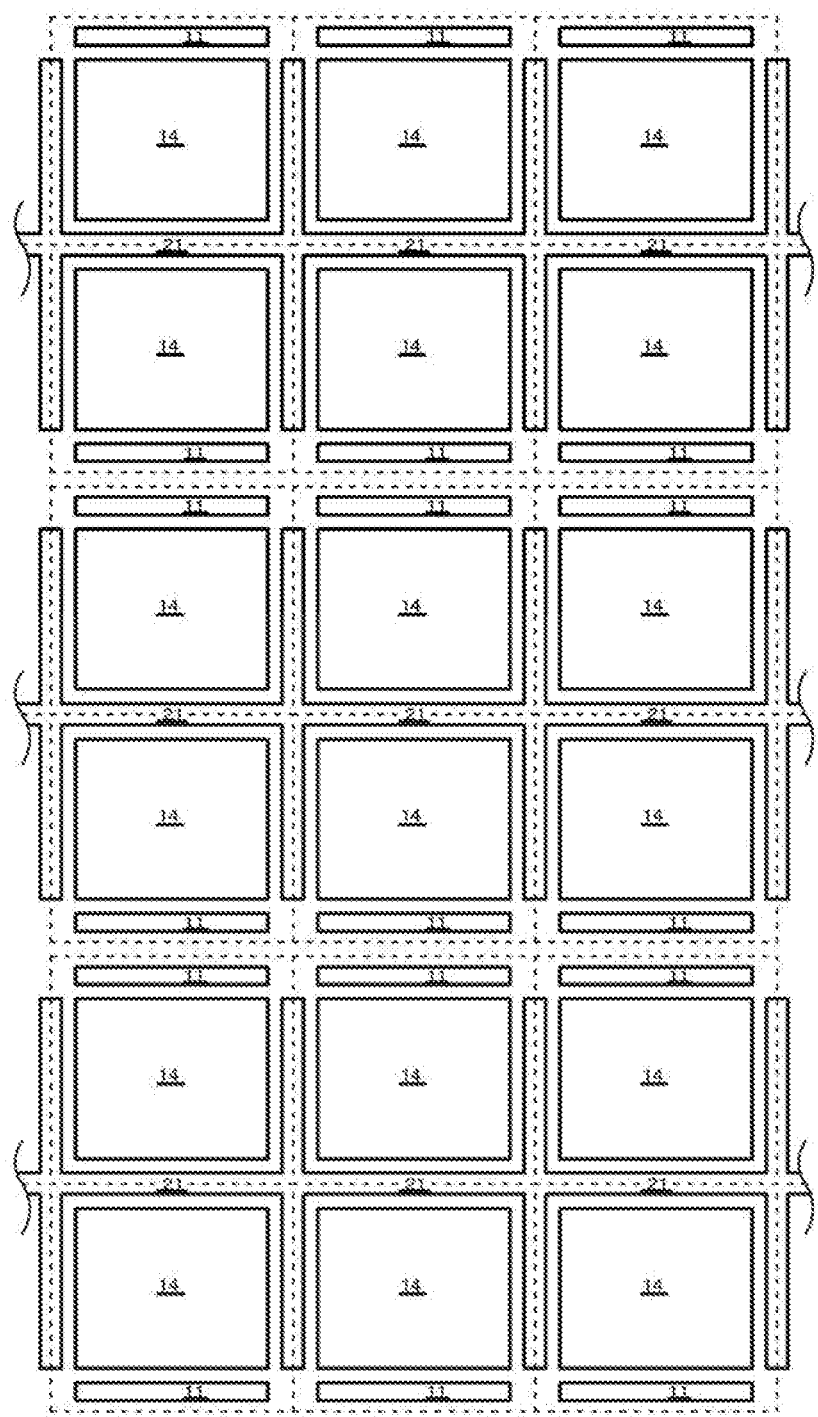
FIG. 6 is a schematic layout drawing of the first electrodes and the charge storage electrodes included in the imaging elements of Embodiment 1.
Figure 7:
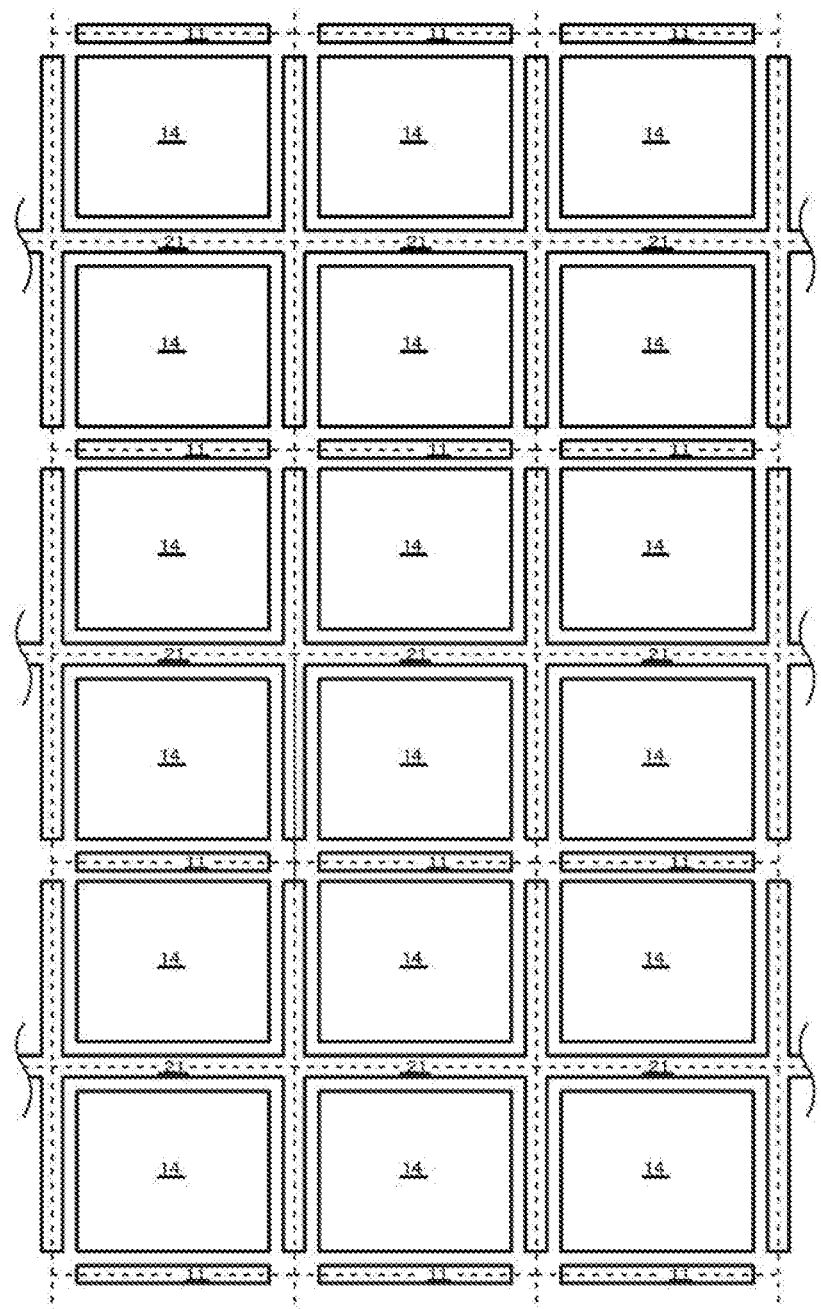
FIG. 7 is a schematic layout drawing of a modified example (Modified Example 1 of Embodiment 1) of the first electrodes and the charge storage electrodes included in the imaging elements of Embodiment 1.
Figure 9A:
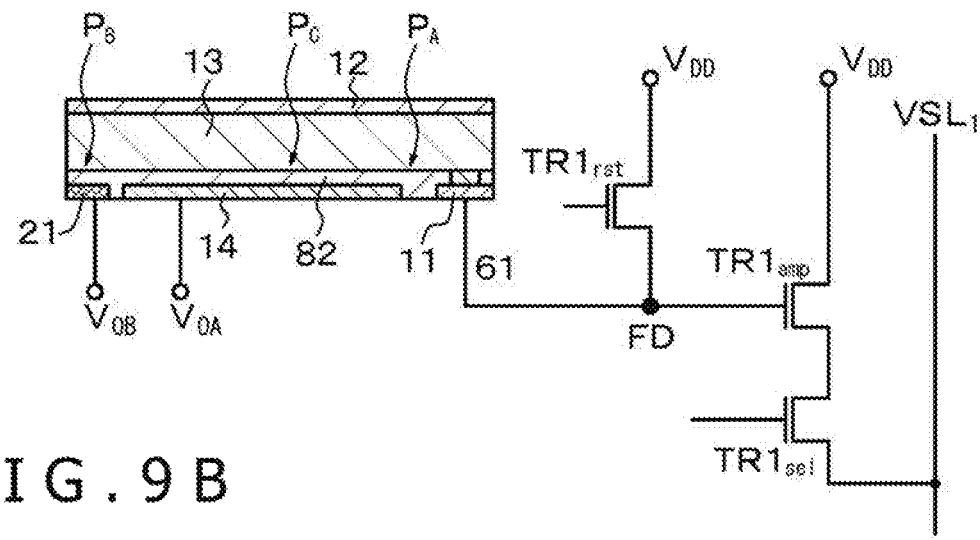
FIGS. 9A, 9B, and 9C are equivalent circuit diagrams of imaging elements and stacked imaging elements of Embodiment 1, Embodiment 11, and Embodiment 12 for describing each section of FIG. 8 (Embodiment 1), FIG. 51 (Embodiment 11), and FIG. 58 (Embodiment 12).
Figure 10:
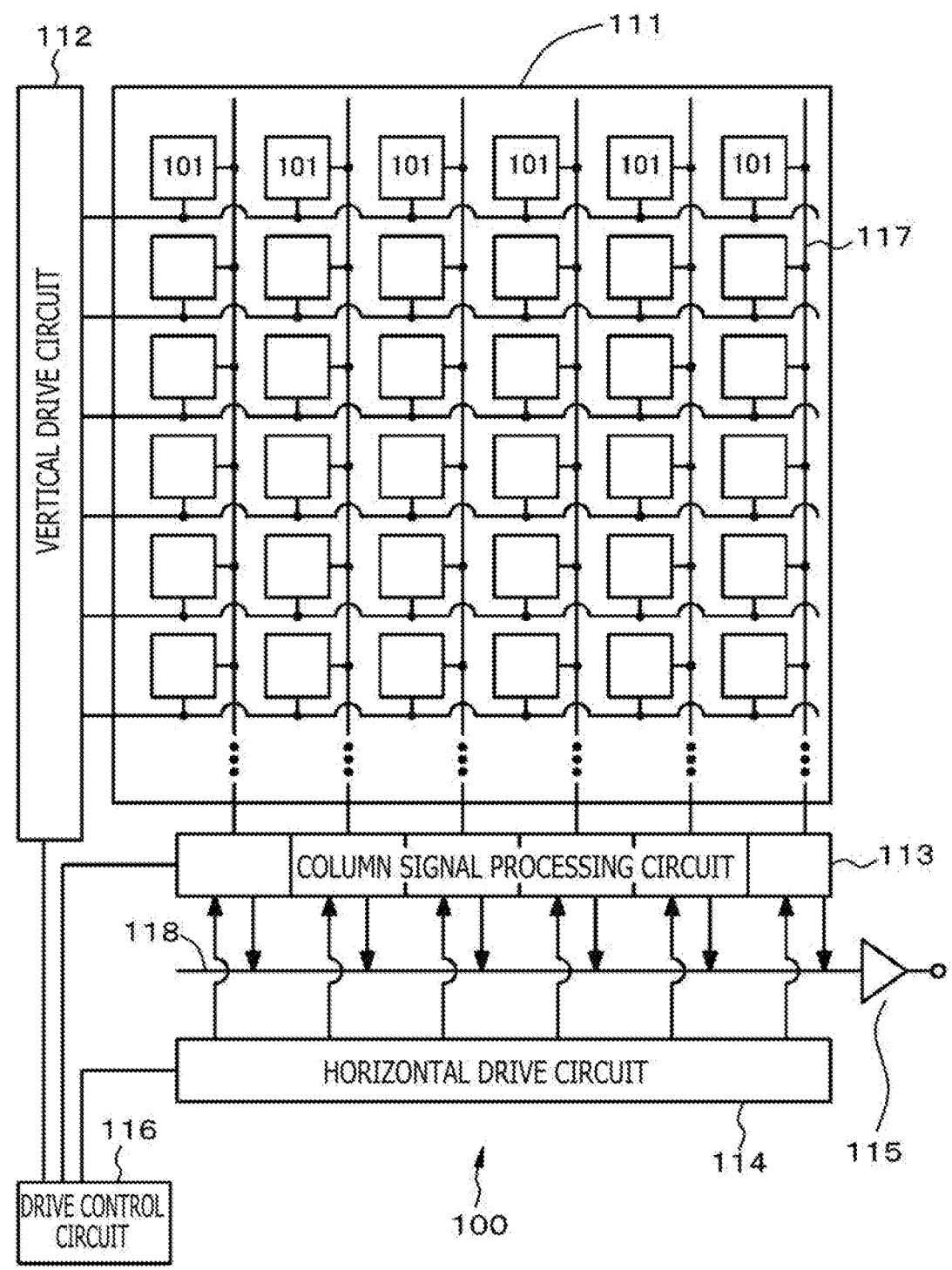
FIG. 10 is a conceptual diagram of a solid-state imaging apparatus of Embodiment 1.

FIG. 1A illustrates a schematic cross-sectional view of part of the imaging elements of Embodiment 1 (two imaging elements arranged side by side). Note that the schematic cross-sectional view of FIG. 1A or FIG. 1B described later is similar to, for example, a schematic cross-sectional view taken along one-dot chain line A-A of FIG. 15A. In addition, FIG. 2 illustrates a schematic partial cross-sectional view of the imaging element and the stacked imaging element of Embodiment 1. FIGS. 3 and 4 illustrate equivalent circuit diagrams of the imaging element and the stacked imaging element of Embodiment 1. FIG. 5 illustrates a schematic layout drawing of first electrodes, charge storage electrodes, and transistors of control units included in the imaging elements of Embodiment 1. Furthermore, FIGS. 6 and 7 illustrate schematic layout drawings of the first electrodes and the charge storage electrodes included in the imaging elements of Embodiment 1. FIG. 8 schematically illustrates a state of potential in each section during operation of the imaging element of Embodiment 1. FIG. 9A illustrates an equivalent circuit diagram of the imaging element and the stacked imaging element of Embodiment 1 for describing each section of FIG. 8. FIG. 10 illustrates a conceptual diagram of the solid-state imaging apparatus of Embodiment 1. Note that various constituent elements of the imaging element positioned on the lower side of an interlayer insulating layer 81 may be collectively indicated by reference number 91 for convenience in order to simplify the drawings.

Each of the imaging element of Embodiment 1 (for example, green light imaging element described later) and the imaging elements of Embodiments 2 to 8 described later includes a photoelectric conversion unit including a first electrode 11, a photoelectric conversion layer 13, and a second electrode 12 that are stacked. The photoelectric conversion unit further includes a charge storage electrode 14 arranged apart from the first electrode 11 and arranged to face the photoelectric conversion layer 13 through an insulating layer 82.

Note that in the example illustrated in FIG. 6, one imaging element is provided with one charge storage electrode 14 corresponding to one first electrode 11. On the other hand, in an example illustrated in FIG. 7 (Modified Example 1 of Embodiment 1), two imaging elements are provided with one common first electrode 11 corresponding to two charge storage electrodes 14. The schematic cross-sectional view of part of the imaging elements of Embodiment 1 (two imaging elements arranged side by side) illustrated in FIG. 1A corresponds to FIG. 7.

The second electrode 12 positioned on the light incident side is shared by a plurality of imaging elements except for the imaging element and the like of Embodiment 3 described later. That is, the second electrode 12 is a so-called solid electrode. The photoelectric conversion layer 13 is shared by a plurality of imaging elements. That is, one photoelectric conversion layer 13 is formed in a plurality of imaging elements.

The stacked imaging element of Embodiment 1 includes at least one of the imaging element of Embodiment 1 or the imaging elements of Embodiments 2 to 8 described later. In Embodiment 1, the stacked imaging element includes one of the imaging element of Embodiment 1 and the imaging elements of Embodiments 2 to 8 described later.

Furthermore, the solid-state imaging apparatus of Embodiment 1 includes a plurality of stacked imaging elements of the imaging elements of Embodiment 1 and Embodiments 2 to 8 described later.

In addition, when the light is incident on the photoelectric conversion layer 13, and photoelectric conversion occurs in the photoelectric conversion layer 13 in the imaging element of Embodiment 1, an absolute value of the potential applied to a part $13_C$ of the photoelectric conversion layer 13 facing the charge storage electrode 14 is a value larger than an absolute value of the potential applied to a region $13_B$ of the photoelectric conversion layer 13 (region-B of photoelectric conversion layer) positioned between the imaging element and the adjacent imaging element.

Alternatively, in the imaging element of Embodiment 1, a charge movement control electrode 21 is formed in a region facing, through the insulating layer 82, the region $13_B$ of the photoelectric conversion layer 13 (region-B of photoelectric conversion layer) positioned between the imaging element and the adjacent imaging element. In other words, the charge movement control electrode 21 is formed below a part $82_B$ of the insulating layer 82 (region-B of insulating layer 82) in a region (region-b) between the charge storage electrode 14 and the charge storage electrode 14 of the adjacent imaging elements. The charge movement control electrode 21 is provided apart from the charge storage electrode 14. Alternatively, in other words, the charge movement control electrode 21 is provided around the charge storage electrode 14 and apart from the charge storage electrode 14, and the charge movement control electrode 21 is arranged to face the region-B ($13_B$) of the photoelectric conversion layer through the insulating layer 82. Note that although the charge movement control electrode 21 is not illustrated in FIG. 2, the charge movement control electrode 21 is formed in a direction of an arrow "A." The charge movement control electrode 21 is shared by the imaging elements arranged in the left and right direction of FIG. 5 and is shared by a pair of imaging elements arranged in the up and down direction of FIG. 5.

The imaging element without the illustration of the charge movement control electrode 21 as well as a connection hole 23, a pad portion 22, and a wire $V_{OB}$ described later will be referred to as an "imaging element with basic structure of the present disclosure" for convenience. FIG. 2 is a schematic partial cross-sectional view of the imaging element with basic structure of the present disclosure. FIGS. 42, 43, 44, 45, 46, 47, 54, 61, 62, 64, 65, 66, 71, 88, 89, 91, 92, 93, 94, 95, 96, 97, and 98 are schematic partial cross-sectional views of various modified examples of the imaging element with basic structure of the present disclosure illustrated in FIG. 2, and the charge movement control electrode 21 and the like are not illustrated.

Furthermore, a semiconductor substrate (more specifically, silicon semiconductor layer) 70 is further included, and the photoelectric conversion unit is arranged on the upper side of the semiconductor substrate 70. In addition, a control unit provided on the semiconductor substrate 70 and including a drive circuit connected to the first electrode 11 and the second electrode 12 is further included. Here, the light incident surface in the semiconductor substrate 70 is the upper side, and the opposite side of the semiconductor substrate 70 is the lower side. A wiring layer 62 including a plurality of wires is provided on the lower side of the semiconductor substrate 70.

The semiconductor substrate 70 is provided with at least a floating diffusion layer $FD_1$ and an amplification transistor $TR1_{amp}$ included in the control unit, and the first electrode 11 is connected to the floating diffusion layer $FD_1$ and a gate portion of the amplification transistor $TR1_{amp}$. The semiconductor substrate 70 is further provided with a reset transistor $TR1_{rst}$ and a selection transistor $TR1_{sel}$ included in the control unit. The floating diffusion layer $FD_1$ is connected to one source/drain region of the reset transistor $TR1_{rst}$. The other source/drain region of the amplification transistor $TR1_{amp}$ is connected to one source/drain region of the selection transistor $TR1_{sel}$. The other source/drain region of the selection transistor $TR1_{sel}$ is connected to a signal line $VSL_1$. The amplification transistor $TR1_{amp}$, the reset transistor $TR1_{rst}$, and the selection transistor $TR1_{sel}$ are included in the drive circuit.

Specifically, the imaging element and the stacked imaging element of Embodiment 1 are a back illuminated type imaging element and a back illuminated type stacked imaging element. The imaging element and the stacked imaging element have a stacked structure of three imaging elements including: a green light imaging element of first type in Embodiment 1 (hereinafter, referred to as "first imaging element") sensitive to green light, the green light imaging element including a green light photoelectric conversion layer of first type for absorbing green light; a conventional blue light imaging element of second type (hereinafter, referred to as "second imaging element") sensitive to blue light, the blue light imaging element including a blue light photoelectric conversion layer of second type for absorbing blue light; and a conventional red light imaging element of second type (hereinafter, referred to as "third imaging element") sensitive to red light, the red light imaging element including a red light photoelectric conversion layer of second type for absorbing red light. Here, the red light imaging element (third imaging element) and the blue light imaging element (second imaging element) are provided in the semiconductor substrate 70, and the second imaging element is positioned on the light incident side with respect to the third imaging element. In addition, the green light imaging element (first imaging element) is provided on the upper side of the blue light imaging element (second imaging element). The stacked structure of the first imaging element, the second imaging element, and the third imaging element is included in one pixel. Color filters are not provided.

In the first imaging element, the first electrode 11 and a charge storage electrode 14 are formed apart from each other on the interlayer insulating layer 81. In addition, the charge movement control electrode 21 is formed apart from the charge storage electrode 14 on the interlayer insulating layer 81. The interlayer insulating layer 81, the charge storage electrode 14, and the charge movement control electrode 21 are covered by the insulating layer 82. The photoelectric conversion layer 13 is formed on the insulating layer 82, and the second electrode 12 is formed on the photoelectric conversion layer 13. A protective layer 83 is formed over the entire surface including the second electrode 12, and an on-chip micro lens 90 is provided on the protective layer 83. The first electrode 11, the charge storage electrode 14, the charge movement control electrode 21, and the second electrode 12 include, for example, transparent electrodes containing ITO (work function: approximately 4.4 eV). The photoelectric conversion layer 13 includes a layer containing a well-known organic photoelectric conversion material sensitive to at least green light (for example, organic material such as rhodamine dye, merocyanine dye, and quinacridone). In addition, the photoelectric conversion layer 13 may further include a material layer suitable for charge storage. That is, a material layer suitable for charge storage may be further formed between the photoelectric conversion layer 13 and the first electrode 11 (for example, in a connection portion 67). The interlayer insulating layer 81, the insulating layer 82, and the protective layer 83 include a well-known insulating material (for example, $SiO_2$ or SiN). The photoelectric conversion layer 13 and the first electrode 11 are connected through the connection portion 67 provided on the insulating layer 82. The photoelectric conversion layer 13 extends in the connection portion 67. That is, the photoelectric conversion layer 13 extends in an opening portion 84 provided on the insulating layer 82 and is connected to the first electrode 11.

The charge storage electrode 14 is connected to the drive circuit. Specifically, the charge storage electrode 14 is connected to a vertical drive circuit 112 included in the drive circuit through a connection hole 66, a pad portion 64, and a wire VOA provided in the interlayer insulating layer 81.

The charge movement control electrode 21 is also connected to the drive circuit. Specifically, the charge movement control electrode 21 is connected to the vertical drive circuit 112 included in the drive circuit through the connection hole 23, the pad portion 22, and the wire $V_{OB}$ provided in the interlayer insulating layer 81. More specifically, the charge movement control electrode 21 is formed in the region (region-B ($82_B$) of insulating layer) facing the region-B ($13_B$) of the photoelectric conversion layer 13 through the insulating layer 82. In other words, the charge movement control electrode 21 is formed below the part $82_B$ of the insulating layer 82 in the region (region-b) between the charge storage electrode 14 and the charge storage electrode 14 included in adjacent imaging elements. The charge movement control electrode 21 is provided apart from the charge storage electrode 14. Alternatively, in other words, the charge movement control electrode 21 is provided around the charge storage electrode 14 and apart from the charge storage electrode 14, and the charge movement control electrode 21 is arranged to face the region-B ($13_B$) of the photoelectric conversion layer 13 through the insulating layer 82.

The size of the charge storage electrode 14 is larger than the first electrode 11. Although not limited, it is preferable to satisfy $$4 \leq S_1'/S_1,$$

where $S_1'$ is an area of the charge storage electrode 14, and $S_1$ is an area of the first electrode 11. Although not limited, for example, $$S_1'/S_1 = 8$$

is set in the imaging element of Embodiment 1 or Embodiments 2 to 8 described later.

Note that in Embodiments 13 to 16 described later, the sizes of three photoelectric conversion unit segments $10_1$, $10_2$, and $10_3$) are the same size, and the plane shapes are also the same.

An element separation region 71 is formed on the side of a first surface (front surface) 70A of the semiconductor substrate 70, and an oxide film 72 is formed on the first surface 70A of the semiconductor substrate 70. Furthermore, the reset transistor $TR1_{rst}$, the amplification transistor $TR1_{amp}$, and the selection transistor $TR1_{sel}$ included in the control unit of the first imaging element are provided on the first surface side of the semiconductor substrate 70, and the first floating diffusion layer $FD_1$ is further provided.

The reset transistor $TR1_{rst}$ includes a gate portion 51, a channel formation region 51A, and source/drain regions 51B and 51C. The gate portion 51 of the reset transistor $TR1_{rst}$ is connected to a reset line $RST_1$. One source/drain region 51C of the reset transistor $TR1_{rst}$ also serves as the first floating diffusion layer $FD_1$, and the other source/drain region 51B is connected to a power source $V_{DD}$.

The first electrode 11 is connected to one source/drain region 51C (first floating diffusion layer $FD_1$) of the reset transistor $TR1_{rst}$ through a connection hole 65 and a pad portion 63 provided in the interlayer insulating layer 81, through a contact hole portion 61 formed on the semiconductor substrate 70 and an interlayer insulating layer 76, and through the wiring layer 62 formed on the interlayer insulating layer 76.

The amplification transistor $TR1_{amp}$ includes a gate portion 52, a channel formation region 52A, and source/drain regions 52B and 52C. The gate portion 52 is connected to the first electrode 11 and one source/drain region 51C (first floating diffusion layer $FD_1$) of the reset transistor $TR1_{rst}$ through the wiring layer 62. In addition, one source/drain region 52B is connected to the power source $V_{DD}$.

The selection transistor $TR1_{sel}$ includes a gate portion 53, a channel formation region 53A, and source/drain regions 53B and 53C. The gate portion 53 is connected to a selection line $SEL_1$. In addition, one source/drain region 53B shares the region with the other source/drain region 52C included in the amplification transistor $TR1_{amp}$, and the other source/drain region 53C is connected to the signal line (data output line) $VSL_1$ (117).

The second imaging element includes an n-type semiconductor region 41 as a photoelectric conversion layer provided on the semiconductor substrate 70. A gate portion 45 of a transfer transistor $TR2_{trs}$ including a vertical transistor extends to the n-type semiconductor region 41 and is connected to a transfer gate line $TG_2$. In addition, a second floating diffusion layer $FD_2$ is provided in a region 45C of the semiconductor substrate 70 near the gate portion 45 of the transfer transistor $TR2_{trs}$. The charge stored in the n-type semiconductor region 41 is read out to the second floating diffusion layer $FD_2$ through a transfer channel formed along the gate portion 45.

The second imaging element is further provided with a reset transistor $TR2_{rst}$, an amplification transistor $TR2_{amp}$, and a selection transistor $TR2_{sel}$ included in the control unit of the second imaging element, on the first surface side of the semiconductor substrate 70.

The reset transistor $TR2_{rst}$ includes a gate portion, a channel formation region, and source/drain regions. The gate portion of the reset transistor $TR2_{rst}$ is connected to a reset line $RST_2$. One source/drain region of the reset transistor $TR2_{rst}$ is connected to the power source $V_{DD}$. The other source/drain region also serves as the second floating diffusion layer $FD_2$.

The amplification transistor $TR2_{amp}$ includes a gate portion, a channel formation region, and source/drain regions. The gate portion is connected to the other source/drain region (second floating diffusion layer $FD_2$) of the reset transistor $TR2_{rst}$. In addition, one source/drain region is connected to the power source $V_{DD}$.

The selection transistor $TR2_{sel}$ includes a gate portion, a channel formation region, and source/drain regions. The gate portion is connected to a selection line $SEL_2$. In addition, one source/drain region shares the region with the other source/drain region included in the amplification transistor $TR2_{amp}$, and the other source/drain region is connected to a signal line (data output line) $VSL_2$.

The third imaging element includes an n-type semiconductor region 43 as a photoelectric conversion layer provided on the semiconductor substrate 70. A gate portion 46 of a transfer transistor $TR3_{trs}$ is connected to a transfer gate line $TG_3$. In addition, a third floating diffusion layer $FD_3$ is provided in a region 46C of the semiconductor substrate 70 near the gate portion 46 of the transfer transistor $TR3_{trs}$. The charge stored in the n-type semiconductor region 43 is read out to the third floating diffusion layer $FD_3$ through a transfer channel 46A formed along the gate portion 46.

In the third imaging element, a reset transistor $TR3_{rst}$, an amplification transistor $TR3_{amp}$, and a selection transistor $TR3_{sel}$ included in the control unit of the third imaging element are further provided on the first surface side of the semiconductor substrate 70.

The reset transistor $TR3_{rst}$ includes a gate portion, a channel formation region, and source/drain regions. The gate portion of the reset transistor $TR3_{rst}$ is connected to a reset line $RST_3$. One source/drain region of the reset transistor $TR3_{rst}$ is connected to the power source $V_{DD}$. The other source/drain region also serves as the third floating diffusion layer $FD_3$.

The amplification transistor $TR3_{amp}$ includes a gate portion, a channel formation region, and source/drain regions. The gate portion is connected to the other source/drain region (third floating diffusion layer $FD_3$) of the reset transistor $TR3_{rst}$. In addition, one source/drain region is connected to the power source $V_{DD}$.

The selection transistor $TR3_{sel}$ includes a gate portion, a channel formation region, and source/drain regions. The gate portion is connected to a selection line $SEL_3$. In addition, one source/drain region shares the region with the other source/drain region included in the amplification transistor $TR3_{amp}$, and the other source/drain region is connected to a signal line (data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical drive circuit 112 included in the drive circuit. The signal lines (data output lines) $VSL_1$, $VSL_2$, and $VSL_3$ are connected to a column signal processing circuit 113 included in the drive circuit.

A $p^+$ layer 44 is provided between the n-type semiconductor region 43 and the front surface 70A of the semiconductor substrate 70 to suppress generation of dark current. A $p^+$ layer 42 is formed between the n-type semiconductor region 41 and the n-type semiconductor region 43, and furthermore, part of the side surface of the n-type semiconductor region 43 is surrounded by the $p^+$ layer 42. A $p^+$ layer 73 is formed on the side of a back surface 70B of the semiconductor substrate 70, and a $HfO_2$ film 74 and an insulating film 75 include the $p^+$ layer 73 to a part where the contact hole portion 61 inside the semiconductor substrate 70 is to be formed. In the interlayer insulating layer 76, wires are formed across a plurality of layers, but the wires are not illustrated.

The HfO$_2$ film 74 is a film with negative fixed charge, and the film can be provided to suppress the generation of dark current. Note that in place of the HfO$_2$ film, an aluminum oxide (Al$_2$O$_3$) film, a zirconium oxide (ZrO$_2$) film, a tantalum oxide (Ta$_2$O$_5$) film, a titanium oxide (TiO$_2$) film, a lanthanum oxide (La$_2$O$_3$) film, a praseodymium oxide (Pr$_2$O$_3$) film, a cerium oxide (CeO$_2$) film, a neodymium oxide (Nd$_2$O$_3$) film, a promethium oxide (Pm$_2$O$_3$) film, a samarium oxide (Sm$_2$O$_3$) film, an europium oxide (Eu$_2$O$_3$) film, a gadolinium oxide ((Gd$_{203}$) film, a terbium oxide (Tb$_2$O$_3$) film, a dysprosium oxide (Dy$_2$O$_3$) film, a holmium oxide (HO$_2$O$_3$) film, a thulium oxide (Tm$_2$O$_3$) film, an ytterbium oxide (Yb$_2$O$_3$) film, a lutetium oxide (Lu$_2$O$_3$) film, an yttrium oxide (Y$_2$O$_3$) film, a hafnium nitride film, an aluminum nitride film, a hafnium oxynitride film, or an aluminum oxynitride film can also be used. Examples of a deposition method of these films include a CVD method, a PVD method, and an ALD method.

Hereinafter, an operation of the imaging element (first imaging element) of Embodiment 1 will be described with reference to FIGS. 8 and 9A. The imaging element of Embodiment 1 further includes a control unit provided on the semiconductor substrate 70 and including a drive circuit, and the first electrode 11, the second electrode 12, the charge storage electrode 14, and the charge movement control electrode 21 are connected to the drive circuit. Here, the potential of the first electrode 11 is higher than the potential of the second electrode 12. That is, for example, the first electrode 11 is set to a positive potential, and the second electrode 12 is set to a negative potential. Electros generated by the photoelectric conversion in the photoelectric conversion layer 13 are read out to the floating diffusion layer. This similarly applies to other Embodiments. Note that in a mode in which the first electrode 11 is set to a negative potential, the second electrode is set to a positive potential, and electron holes generated based on the photoelectric conversion in the photoelectric conversion layer 13 are read out to the floating diffusion layer, it is only necessary to reverse the high and low of the potentials described below.

Figure 9B:
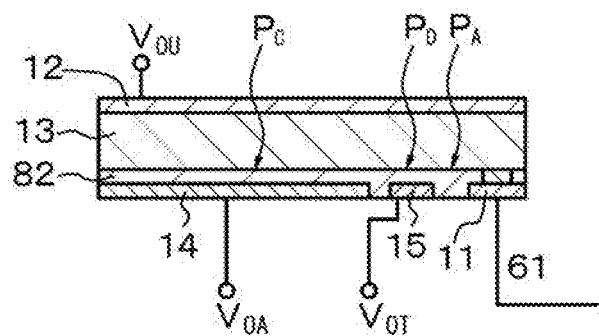
Figure 9C:
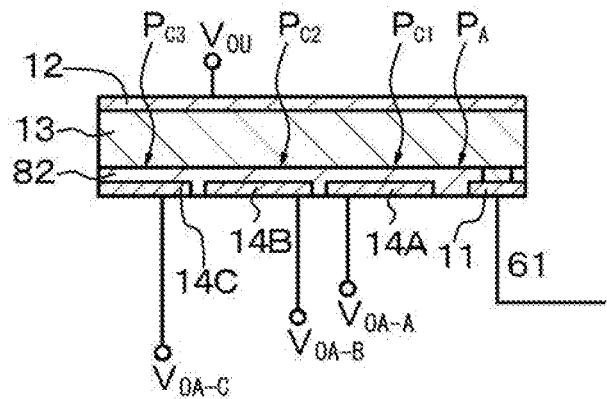
Figure 51:
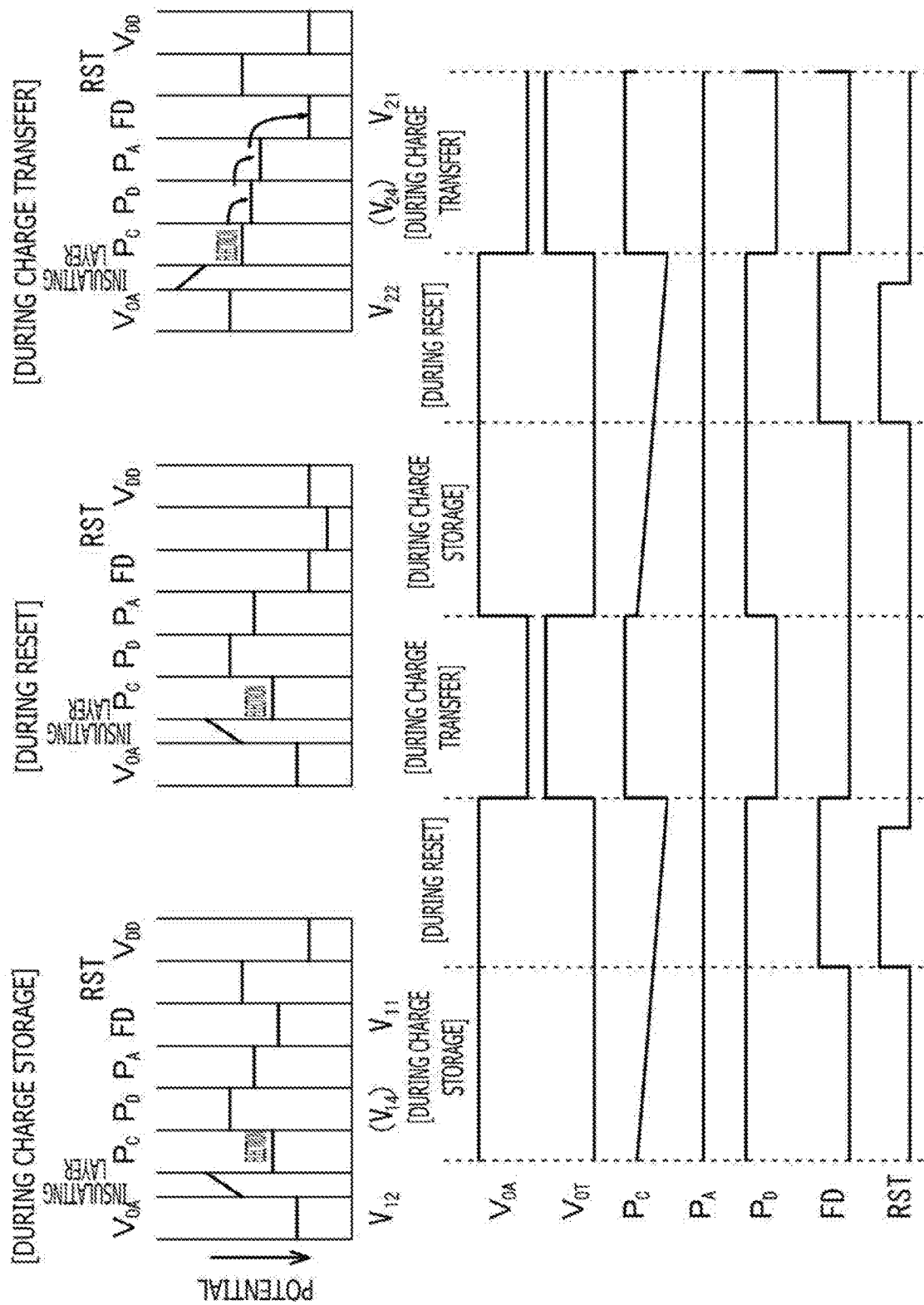
FIG. 51 is a diagram schematically illustrating a state of potential in each section during operation of the imaging element of Embodiment 11.
Figure 52:
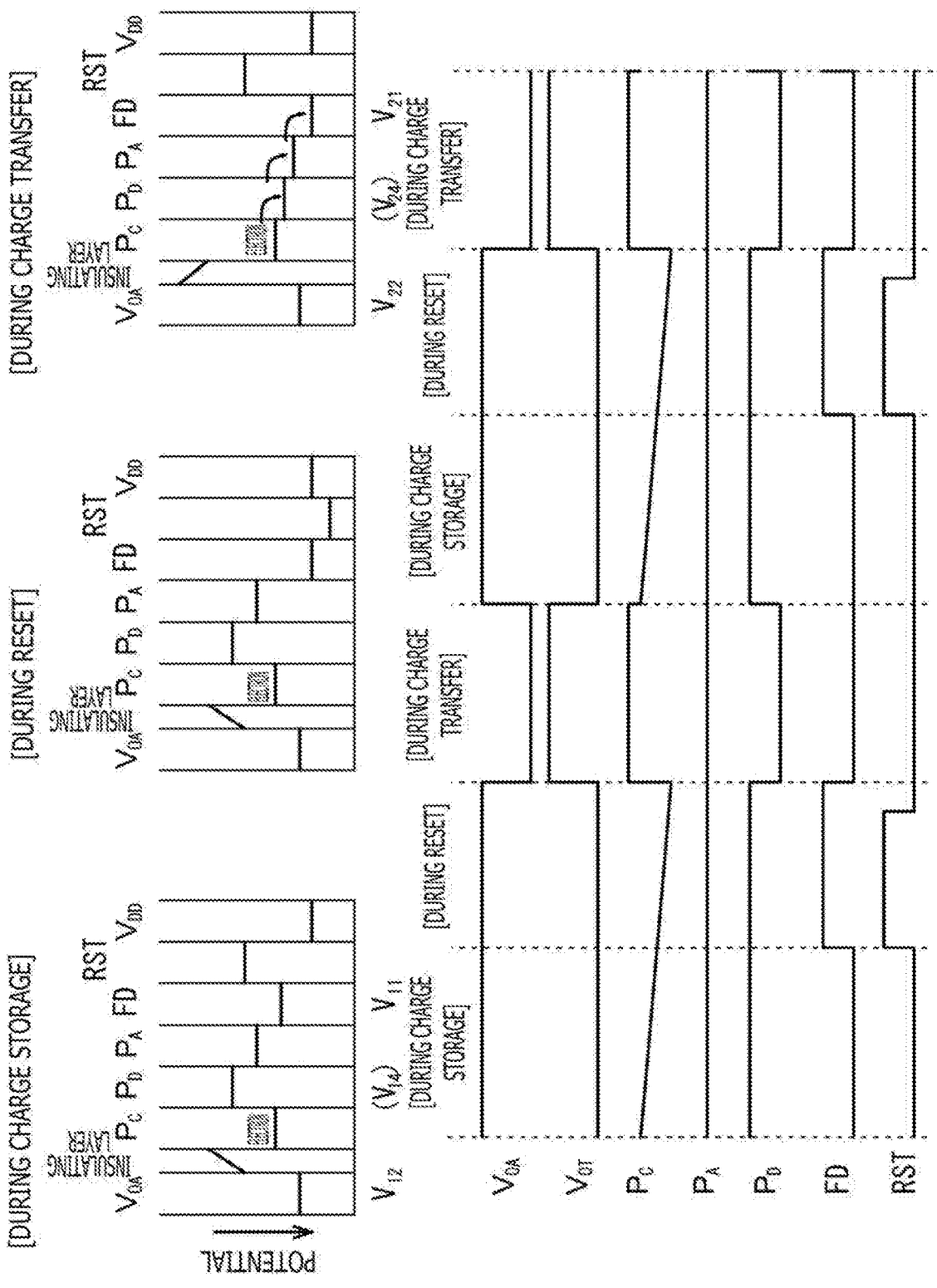
FIG. 52 is a diagram schematically illustrating a state of potential in each section during another operation of the imaging element of Embodiment 11.

The signs used in FIG. 8, FIGS. 51 and 52 in Embodiment 11 described later, and FIGS. 58 and 59 in Embodiment 12 are as follows. Note that FIGS. 9A, 9B, and 9C are equivalent circuit diagrams of the imaging elements and the stacked imaging elements of Embodiment 1, Embodiment 11, and Embodiment 12 for describing each section of FIG. 8 (Embodiment 1), FIG. 51 (Embodiment 11), and FIG. 58 (Embodiment 12).

$P_A$ . . . Potential at a point $P_A$ of the region of the photoelectric conversion layer 13 facing the region positioned in the middle of the charge storage electrode 14 and the first electrode 11 or in the middle of a transfer control electrode (charge transfer electrode) 15 and the first electrode 11

$P_B$ . . . Potential at a point $P_B$ of the region of the photoelectric conversion layer 13 facing the charge movement control electrode 21

$P_C$ . . . Potential at a point $P_C$ of the region of the photoelectric conversion layer 13 facing the charge storage electrode 14

$P_{C1}$ . . . Potential at a point $P_{C1}$ of the region of the photoelectric conversion layer 13 facing a charge storage electrode segment 14A $P_{C2}$ . . . Potential at a point $P_{C2}$ of the region of the photoelectric conversion layer 13 facing a charge storage electrode segment 14B $P_{C3}$ . . . Potential at a point $P_{C3}$ of the region of the photoelectric conversion layer 13 facing a charge storage electrode segment 14C $P_D$ . . . Potential at a point $P_D$ of the region of the photoelectric conversion layer 13 facing the transfer control electrode (charge transfer electrode) 15

FD . . . Potential of the first floating diffusion layer FD$_1$ $V_{OA}$ . . . Potential of the charge storage electrode 14

$V_{OA-A}$ . . . Potential of the charge storage electrode segment 14A $V_{OA-B}$ . . . Potential of the charge storage electrode segment 14B $V_{OA-C}$ . . . Potential of the charge storage electrode segment 14C $V_{OT}$ . . . Potential of the transfer control electrode (charge transfer electrode) 15

RST . . . Potential of the gate portion 51 of the reset transistor TR1$_{rst}$ $V_{DD}$ . . . Potential of the power source VSL$_1$ . . . Signal line (data output line) VSL$_1$ TR1$_{rst}$ . . . Reset transistor TR1$_{rst}$ TR1$_{amp}$ . . . Amplification transistor TR1$_{amp}$ TR1$_{sel}$ . . . Selection transistor TR1$_{sel}$ In a charge storage period, the drive circuit applies a potential $V_{11}$ to the first electrode 11, applies a potential $V_{12}$ to the charge storage electrode 14, and applies a potential $V_{13}$ to the charge movement control electrode 21. The light incident on the photoelectric conversion layer 13 causes photoelectric conversion in the photoelectric conversion layer 13. Electron holes generated by the photoelectric conversion are sent from the second electrode 12 to the drive circuit through a wire Vou. On the other hand, the potential of the first electrode 11 is higher than the potential of the second electrode 12. That is, for example, a positive potential is applied to the first electrode 11, and a negative potential is applied to the second electrode 12. Therefore, the potentials are set so that $V_{12} \geq V_{11}$, preferably, $V_{12} > V_{11}$, holds, and $V_{12} > V_{13}$ holds. As a result, the electrons generated by the photoelectric conversion are attracted to the charge storage electrode 14, and the electrons stop at the region 13c of the photoelectric conversion layer 13 facing the charge storage electrode 14. That is, the charge is stored in the photoelectric conversion layer 13. $V_{12}$ is greater than $V_{11}$, and therefore, the electrons generated inside the photoelectric conversion layer 13 do not move toward the first electrode 11. In addition, $V_{12}$ is greater than $V_{13}$, and therefore, the electrodes generated inside the photoelectric conversion layer 13 do not move toward the charge movement control electrode 21, either. That is, this can prevent the charge generated by the photoelectric conversion from flowing into the adjacent imaging element. In the time course of the photoelectric conversion, the potential in the region of the photoelectric conversion layer 13 facing the charge storage electrode 14 becomes a more negative value.

A reset operation is performed later in the charge storage period. This resets the potential of the first floating diffusion layer FD$_1$, and the potential of the first floating diffusion layer FD$_1$ shifts to the potential $V_{DD}$ of the power source.

After the completion of the reset operation, the charge is read out. That is, in a charge transfer period, the drive circuit applies a potential $V_{21}$ to the first electrode 11, applies a potential $V_{22}$ to the charge storage electrode 14, and applies a potential $V_{23}$ to the charge movement control electrode 21. Here, the potentials are set so that $V_{21} > V_{22} > V_{23}$ holds. As a result, the electrons stopped in the region of the photoelectric conversion layer 13 facing the charge storage electrode 14 are read out to the first electrode 11 and further to the first floating diffusion layer $FD_1$. That is, the charge stored in the photoelectric conversion layer 13 is read out to the control unit. In addition, $V_{22}$ is greater than $V_{23}$, and therefore, the electrons generated inside the photoelectric conversion layer 13 do not move toward the charge movement control electrode 21. That is, this can prevent the charge generated by the photoelectric conversion from flowing into the adjacent imaging element.

This completes the series of operations including the charge storage, the reset operation, and the charge transfer.

The operations of the amplification transistor $TR1_{amp}$ and the selection transistor $TR1_{sel}$ after the electrons are read out to the first floating diffusion layer $FD_1$ are the same as the operations of conventional transistors. In addition, the series of operations including the charge storage, the reset operation, and the charge transfer of the second imaging element and the third imaging element are similar to the conventional series of operations including the charge storage, the reset operation, and the charge transfer. In addition, the reset noise of the first floating diffusion layer $FD_1$ can be removed in a correlated double sampling (CDS) process as in a conventional technique.

As described, the charge storage electrode arranged apart from the first electrode and arranged to face the photoelectric conversion layer through the insulating layer is provided in the imaging element of Embodiment 1 or Embodiments 2 to 8 described later. Therefore, in the photoelectric conversion in the photoelectric conversion unit after the light is applied to the photoelectric conversion unit, a kind of capacitor is formed by the photoelectric conversion layer, the insulating layer, and the charge storage electrode. The charge can be stored in the photoelectric conversion layer. Therefore, the charge storage portion can be fully depleted to delete the charge at the start of exposure. This can suppress the phenomenon of reduction in imaging quality caused by the degradation of random noise due to an increase in kTC noise. In addition, all pixels can be reset at once, and a so-called global shutter function can be realized.

Moreover, when the photoelectric conversion occurs in the photoelectric conversion layer after the light enters the photoelectric conversion layer in the imaging element of Embodiment 1, the absolute value of the potential applied to the part of the photoelectric conversion layer facing the charge storage electrode is a value larger than the absolute value of the potential applied to the region-B of the photoelectric conversion layer. Therefore, the charge generated by the photoelectric conversion is strongly attracted to the part of the photoelectric conversion layer facing the charge storage electrode. This can prevent the charge generated by the photoelectric conversion from flowing into the adjacent imaging element, and the quality of the taken video (image) is not degraded. Alternatively, the charge movement control electrode is formed in the region facing the region-B of the photoelectric conversion layer through the insulating layer, and the electric field and the potential of the region-B of the photoelectric conversion layer positioned on the upper side of the charge movement control electrode can be controlled. As a result, the charge movement control electrode can prevent the charge generated by the photoelectric conversion from flowing into the adjacent imaging element, and the quality of the taken video (image) is not degraded.

FIG. 10 illustrates a conceptual diagram of the solid-state imaging apparatus of Embodiment 1. A solid-state imaging apparatus 100 of Embodiment 1 includes an imaging region 111 including stacked imaging elements 101 arranged in a two-dimensional array, the vertical drive circuit 112 as a drive circuit (peripheral circuit) of the stacked imaging elements 101, the column signal processing circuit 113, a horizontal drive circuit 114, an output circuit 115, a drive control circuit 116, and the like. Note that the circuits can include well-known circuits, or other circuit configurations (for example, various circuits used in a conventional CCD solid-state imaging apparatus or CMOS solid-state imaging apparatus) can be obviously used to provide the circuits. Note that in FIG. 10, reference number "101" is displayed in only one line of the stacked imaging elements 101.

The drive control circuit 116 generates a clock signal and a control signal as references for operation of the vertical drive circuit 112, the column signal processing circuit 113, and the horizontal drive circuit 114 based on a vertical synchronization signal, a horizontal synchronization signal, and a master clock. In addition, the generated clock signal and control signal are input to the vertical drive circuit 112, the column signal processing circuit 113, and the horizontal drive circuit 114.

The vertical drive circuit 112 includes, for example, a shift register and sequentially selects and scans the stacked imaging elements 101 of the imaging region 111 row by row in the vertical direction. In addition, a pixel signal (image signal) based on a current (signal) generated according to an amount of light reception in each stacked imaging element 101 is transmitted to the column signal processing circuit 113 through the signal line (data output line) 117, VSL.

The column signal processing circuit 113 is arranged for, for example, each column of the stacked imaging elements 101 and is configured to use signals from black reference pixels (although not illustrated, formed around effective pixel regions) to apply, for each imaging element, signal processing, such as noise removal and signal amplification, to the image signals output from the stacked imaging elements 101 of one line. A horizontal selection switch (not illustrated) is connected and provided between an output stage of the column signal processing circuit 113 and a horizontal signal line 118.

The horizontal drive circuit 114 includes, for example, a shift register and sequentially outputs horizontal scan pulses to sequentially select the column signal processing circuits 113.

The horizontal drive circuit 114 outputs the signal from each column signal processing circuit 113 to the horizontal signal line 118.

The output circuit 115 applies signal processing to the signals sequentially supplied from the column signal processing circuits 113 through the horizontal signal line 118 and outputs the signals.

Figure 11:
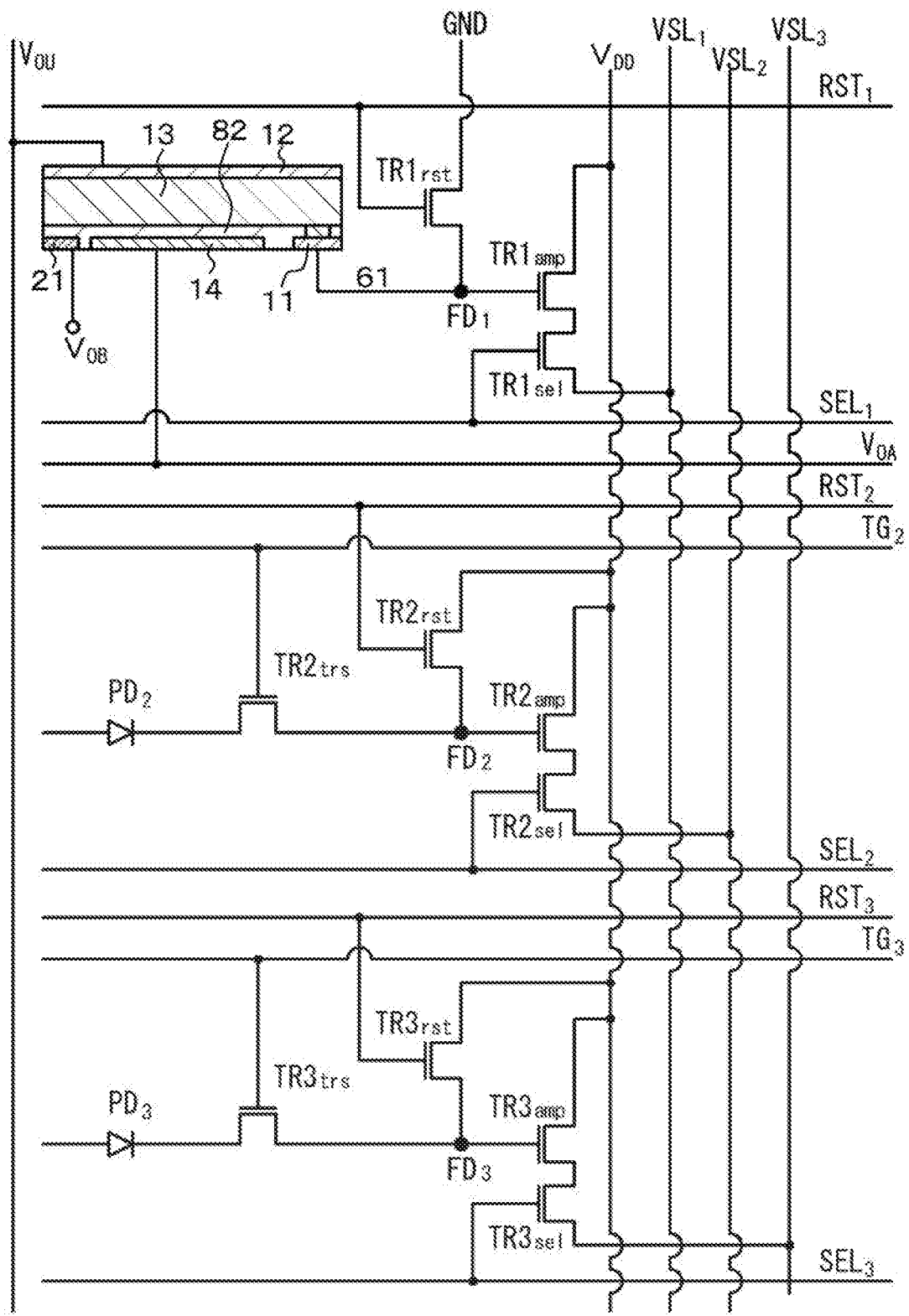
FIG. 11 is an equivalent circuit diagram of a modified example (Modified Example 2 of Embodiment 1) of the imaging element and the stacked imaging element of Embodiment 1.
Figure 12:
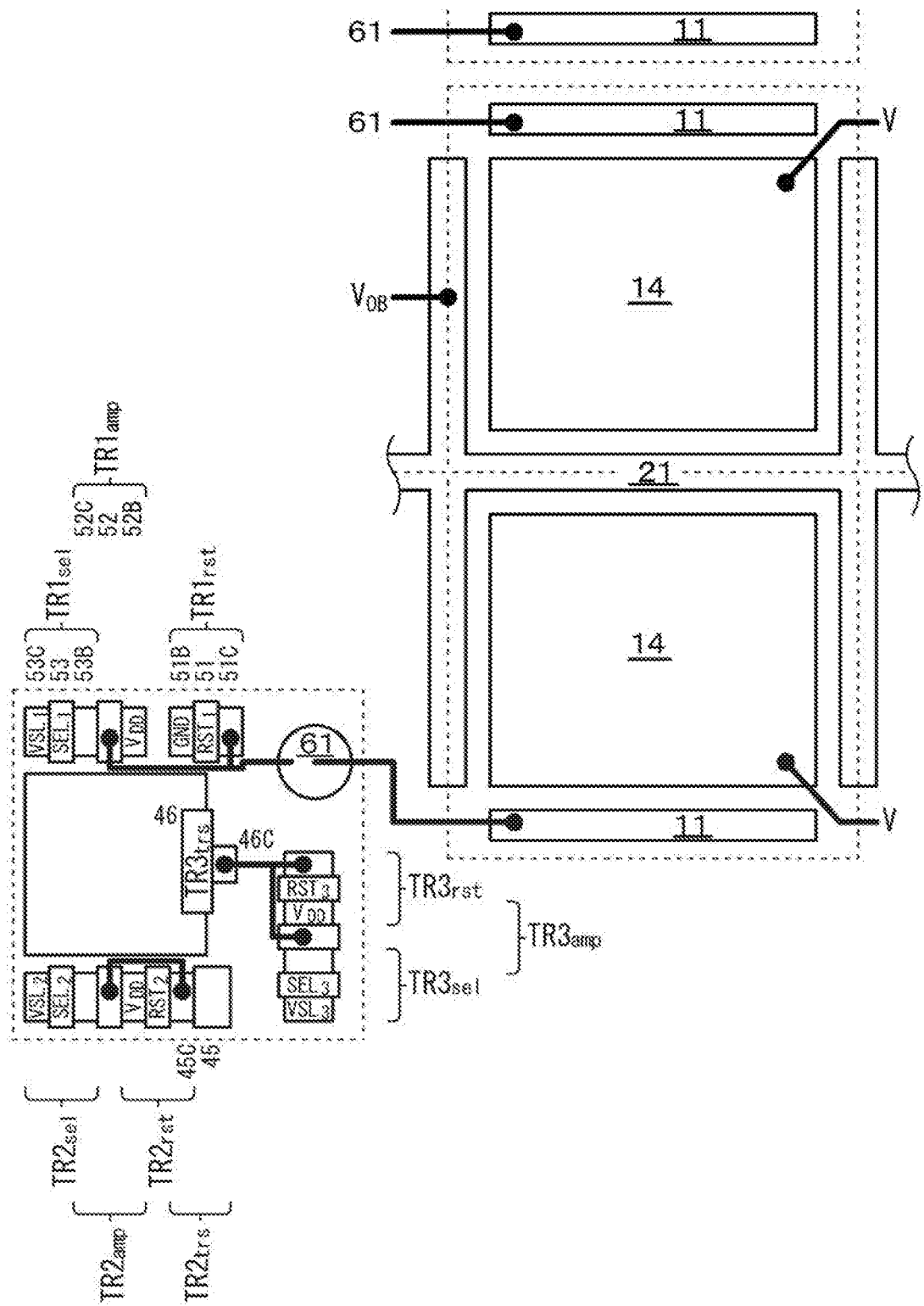
FIG. 12 is a schematic layout drawing of the first electrodes, the charge storage electrodes, and the transistors of the control units included in the modified example (Modified Example 2 of Embodiment 1) of the imaging elements of Embodiment 1 illustrated in FIG. 11.

FIG. 11 illustrates an equivalent circuit diagram of a modified example of the imaging element and the stacked imaging element of Embodiment 1 (Modified Example 2 of Embodiment 1), and FIG. 12 illustrates a schematic layout drawing of the first electrodes, the charge storage electrodes, and the transistors of the control units included in the modified example of the imaging elements of Embodiment 1 (Modified Example 2 of Embodiment 1).

In this way, the other source/drain region 51B of the reset transistor $TR1_{rst}$ may be grounded, instead of connecting the other source/drain region 51B to the power source $V_{DD}$.

The imaging element and the stacked imaging element of Embodiment 1 can be produced by, for example, the following method. That is, an SOI substrate is first prepared. A first silicon layer is then formed on the surface of the SOI substrate based on an epitaxial growth method, and the $p^+$ layer 73 and the n-type semiconductor region 41 are formed on the first silicon layer. Next, a second silicon layer is formed on the first silicon layer based on the epitaxial growth method, and the element separation region 71, the oxide film 72, the p$^+$ layer 42, the n-type semiconductor region 43, and the p$^+$ layer 44 are formed on the second silicon layer. In addition, various transistors and the like included in the control unit of the imaging element are formed on the second silicon layer, and the wiring layer 62, the interlayer insulating layer 76, and various wires are further formed on top of that. The interlayer insulating layer 76 and a support substrate (not illustrated) are then pasted together. Subsequently, the SOI substrate is removed to expose the first silicon layer. Note that the surface of the second silicon layer corresponds to the front surface 70A of the semiconductor substrate 70, and the surface of the first silicon layer corresponds to the back surface 70B of the semiconductor substrate 70. In addition, the first silicon layer and the second silicon layer are collectively expressed as the semiconductor substrate 70. Next, an opening portion for forming the contact hole portion 61 is formed on the back surface 70B side of the semiconductor substrate 70, and the HfO$_2$ film 74, the insulating film 75, and the contact hole portion 61 are formed. Furthermore, the pad portions 63, 64, and 22, the interlayer insulating layer 81, the connection holes 65, 66, and 23, the first electrode 11, the charge storage electrode 14, the charge movement control electrode 21, and the insulating layer 82 are formed. Next, the connection portion 67 is opened, and the photoelectric conversion layer 13, the second electrode 12, the protective layer 83, and the on-chip microlens 90 are formed. In this way, the imaging element and the stacked imaging element of Embodiment 1 can be obtained.

Figure 13:
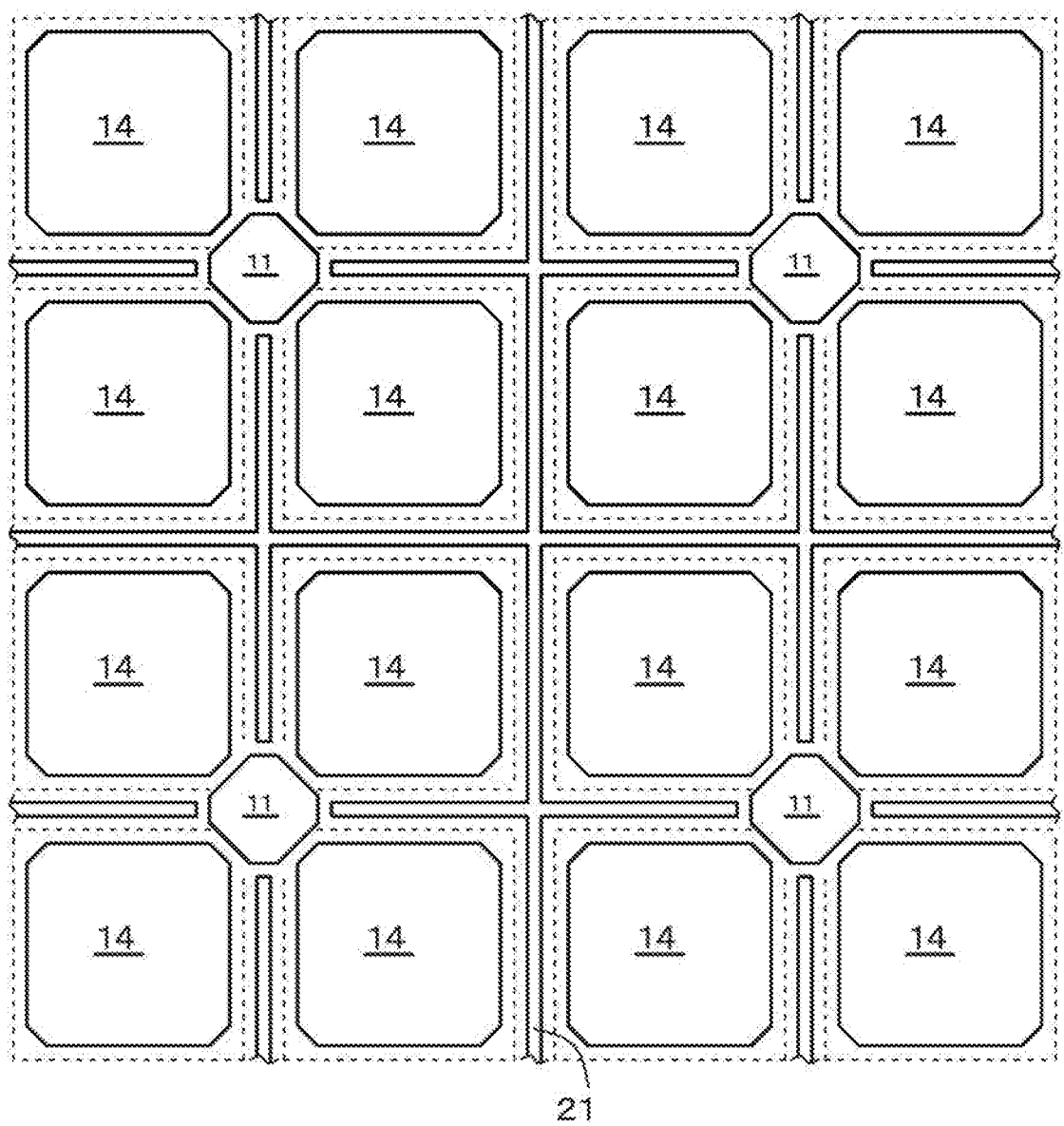
FIG. 13 is a schematic layout drawing of a modified example (Modified Example 3 of Embodiment 1) of the first electrodes and the charge storage electrodes included in the imaging elements of Embodiment 1.
Figure 14A:
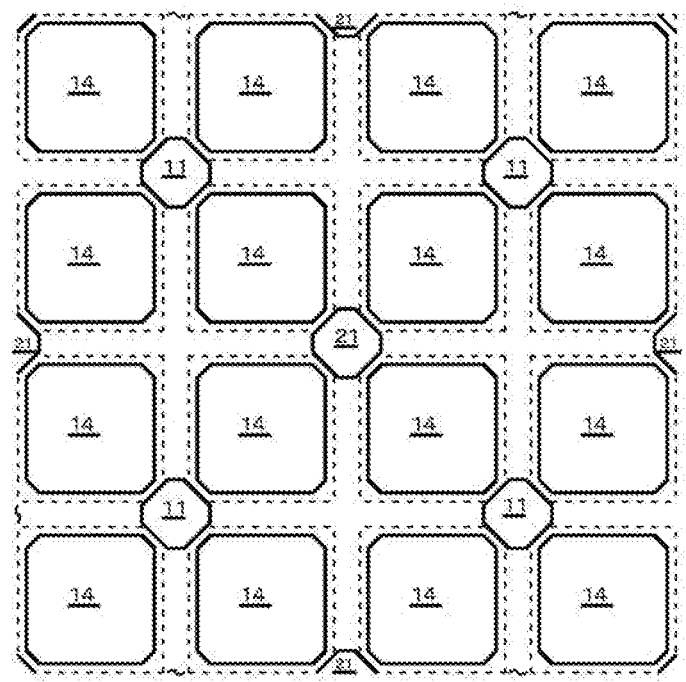
FIGS. 14A and 14B are schematic layout drawings of a modified example (Modified Example 4 of Embodiment 1) of the first electrodes and the charge storage electrodes included in the imaging elements of Embodiment 1.
Figure 14B:
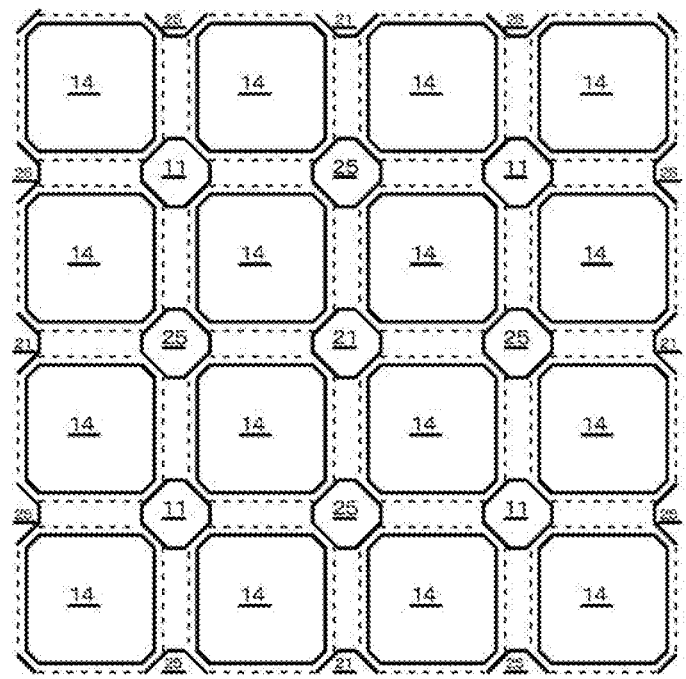
Figure 15A:
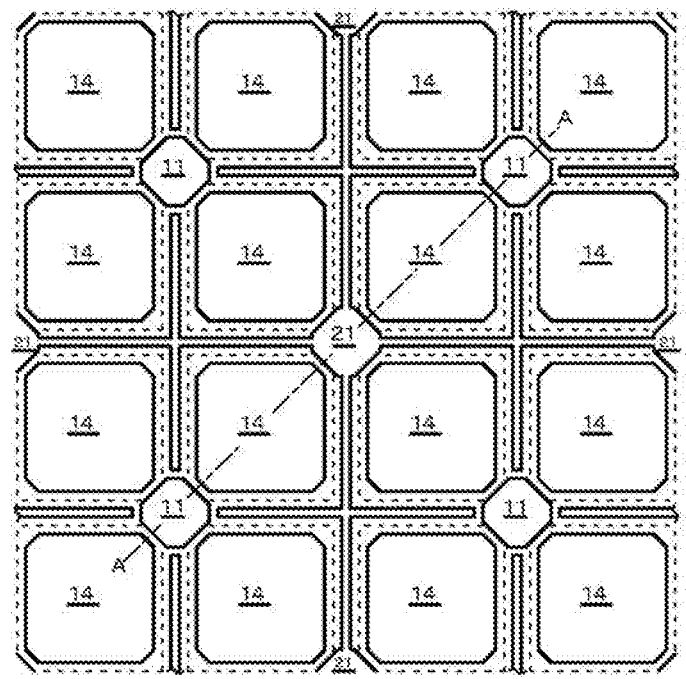
FIGS. 15A and 15B are schematic layout drawings of a modified example (Modified Example 5 of Embodiment 1) of the first electrodes and the charge storage electrodes included in the imaging elements of Embodiment 1.
Figure 15B:
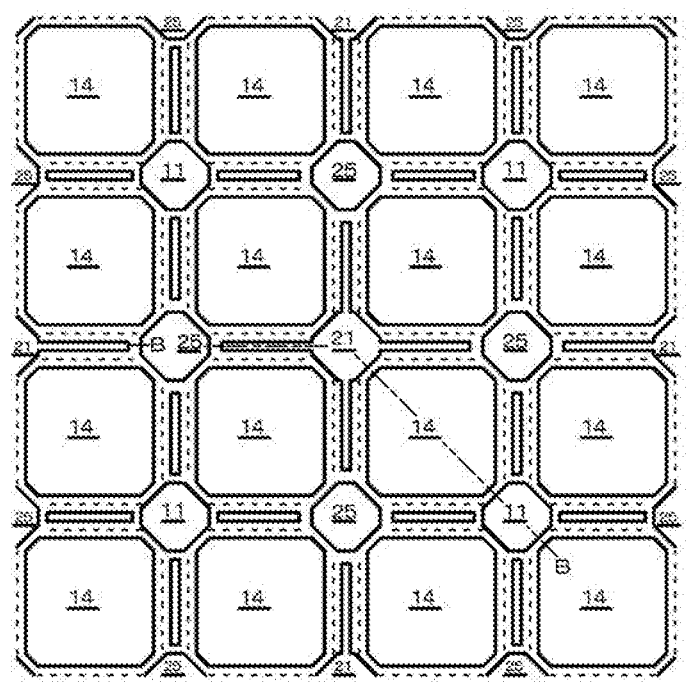

FIG. 13 (Modified Example 3 of Embodiment 1), FIG. 14A (Modified Example 4 of Embodiment 1), FIG. 14B, FIG. 15A (Modified Example 5 of Embodiment 1), and FIG. 15B illustrate schematic layout drawings of other modified examples of the first electrodes and the charge storage electrodes included in the imaging elements of Embodiment 1. In the examples illustrated in these drawings, one common first electrode 11 is provided to correspond to four charge storage electrodes 14 in four imaging elements. Furthermore, in the example illustrated in FIG. 13, the charge movement control electrode 21 is formed below the part 82$_B$ of the insulating layer 82 in the region (region-b) between the charge storage electrode 14 and the charge storage electrode 14. On the other hand, in the example illustrated in FIG. 14A, the charge movement control electrode 21 is formed below the part of the insulating layer 82 in the region surrounded by four charge storage electrodes 14. The example illustrated in FIG. 15A is a combination of the examples illustrated in FIGS. 13 and 14A, and the example illustrated in FIG. 15B is a combination of the examples illustrated in FIGS. 14B and 15A. Note that the examples illustrated in FIGS. 13, 14A, 14B, 15A, and 15B also represent the solid-state imaging apparatuses of the first configuration and the second configuration.

In the example illustrated in FIG. 14B, one common first electrode 11 is provided to correspond to four charge storage electrodes 14 in four imaging elements, and the charge movement control electrode 21 is formed below the part of the insulating layer 82 in the region surrounded by the four charge storage electrodes 14. Furthermore, a discharge electrode 25 is formed below the part of the insulating layer 82 in the region surrounded by the four charge storage electrodes 14. The discharge electrode 25 can be used as, for example, a floating diffusion or an overflow drain of the photoelectric conversion layer 13. The discharge electrode 25 and the photoelectric conversion layer 13 are connected through the opening portion provided on the insulating layer 82. That is, similar to the relationship between the photoelectric conversion layer 13 and the first electrode 11, the photoelectric conversion layer 13 extends in the opening portion provided on the insulating layer 82, and the extended part of the photoelectric conversion layer 13 is in contact with the discharge electrode 25. The discharge electrode 25 is connected to the vertical drive circuit 112 included in the drive circuit through the connection hole 25A, the pad portion 25B, and a wire (not illustrated) provided in the interlayer insulating layer 81. The discharge electrode 25 can also be applied to other Embodiments. Note that, for reference, FIG. 16B illustrates a schematic cross-sectional view taken along a one-dot chain line A-A of FIG. 15A when the charge movement control electrode 21 is replaced with the discharge electrode 25 in Modified Example 5 of Embodiment 1 illustrated in FIG. 15A.

Alternatively, in the example illustrated in FIG. 15B, one common first electrode 11 is provided to correspond to four charge storage electrodes 14 in four imaging elements, and the charge movement control electrode 21 is formed below the part of the insulating layer in the region positioned between the charge storage electrodes 14. Furthermore, the discharge electrode 25 is formed below the part of the insulating layer 82 in the region surrounded by the four charge storage electrodes 14. The discharge electrode 25 and the photoelectric conversion layer 13 are connected through the opening portion provided on the insulating layer 82. That is, similar to the relationship between the photoelectric conversion layer 13 and the first electrode 11, the photoelectric conversion layer 13 extends in the opening portion provided on the insulating layer 82, and the extended part of the photoelectric conversion layer 13 is in contact with the discharge electrode 25. FIG. 16A illustrates a schematic cross-sectional view taken along a one-dot chain line B-B of FIG. 15B in Modified Example 5 of Embodiment 1 illustrated in FIG. 15B.

Figure 1B:
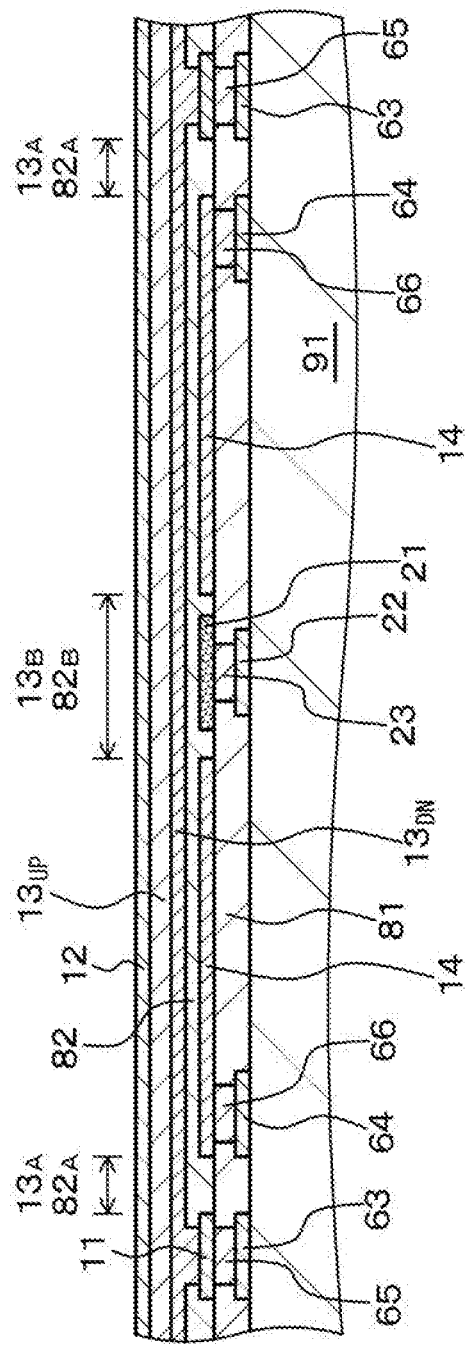

Alternatively, FIG. 1B illustrates a schematic cross-sectional view of part of a modified example (Modified Example 6 of Embodiment 1) of the imaging elements of Embodiment 1 (two imaging elements arranged side by side), and the photoelectric conversion layer can have a stacked structure of a lower semiconductor layer 13$_{DN}$ and an upper photoelectric conversion layer 13$_{UP}$. The upper photoelectric conversion layer 13$_{UP}$ and the lower semiconductor layer 13$_{DN}$ are shared by a plurality of imaging elements. That is, one upper photoelectric conversion layer 13$_{UP}$ and one lower semiconductor layer 13$_{DN}$ are formed in a plurality of imaging elements. The lower semiconductor layer 13$_{DN}$ can be provided in this way to prevent, for example, recombination during charge storage. This can also increase the charge transfer efficiency of the charge stored in the photoelectric conversion layer 13 to the first electrode 11. Furthermore, the charge generated in the photoelectric conversion layer 13 can be temporarily held to control the timing and the like of the transfer. In addition, the generation of dark current can be suppressed. The material included in the upper photoelectric conversion layer 13$_{UP}$ can be appropriately selected from various materials included in the photoelectric conversion layer 13. On the other hand, it is preferable that the material included in the lower semiconductor layer 13$_{DN}$ be a material with a large value of band-gap energy (for example, band-gap energy with a value equal to or greater than 3.0 eV) and with mobility higher than the material included in the photoelectric conversion layer, and specifically, an example of the material includes an oxide semiconductor material such as IGZO. Alternatively, another example of the material included in the lower semiconductor layer $13_{DN}$ includes a material with ionization potential larger than the ionization potential of the material included in the photoelectric conversion layer in the case where the charge to be stored is electrons. Alternatively, it is preferable that the impurity concentration of the material included in the lower semiconductor layer be equal to or smaller than $1 \times 10^{18}$ cm$^{-3}$. Note that the configuration and the structure of Modified Example 6 of Embodiment 1 can be applied to other Embodiments.

Embodiment 2

Embodiment 2 relates to the imaging element and the like according to the second aspect of the present disclosure. FIG. 17A illustrates a schematic cross-sectional view of part of the imaging elements of Embodiment 2 (two imaging elements arranged side by side). In the imaging element of Embodiment 2, a width $W_A$ of a region 13A of the photoelectric conversion layer 13 (region-A of photoelectric conversion layer) positioned between the first electrode 11 and the charge storage electrode 14 is narrower than a width $W_B$ of the region $13_B$ of the photoelectric conversion layer 13 (region-B of photoelectric conversion layer) positioned between the imaging element and the adjacent imaging element. An example of the value of $(W_A/W_B)$ includes $$\tfrac{1}{2} \le (W_A/W_B) < 1,$$

and specifically, the value is $$(W_A/W_B) = \tfrac{2}{3}$$

in Embodiment 2.

Except for this, the configuration and the structure in the imaging element of Embodiment 2 can be similar to the imaging element with basic structure of the present disclosure, and the details will not be described.

In this way, the width of the region of the photoelectric conversion layer positioned between the first electrode and the charge storage electrode is narrower than the width $W_B$ of the region of the photoelectric conversion layer positioned between the imaging element and the adjacent imaging element in the imaging element of Embodiment 2. This can prevent the charge generated by the photoelectric conversion from flowing into the adjacent imaging element, and the quality of the taken video (image) is not degraded.

Embodiment 3

Figure 19:
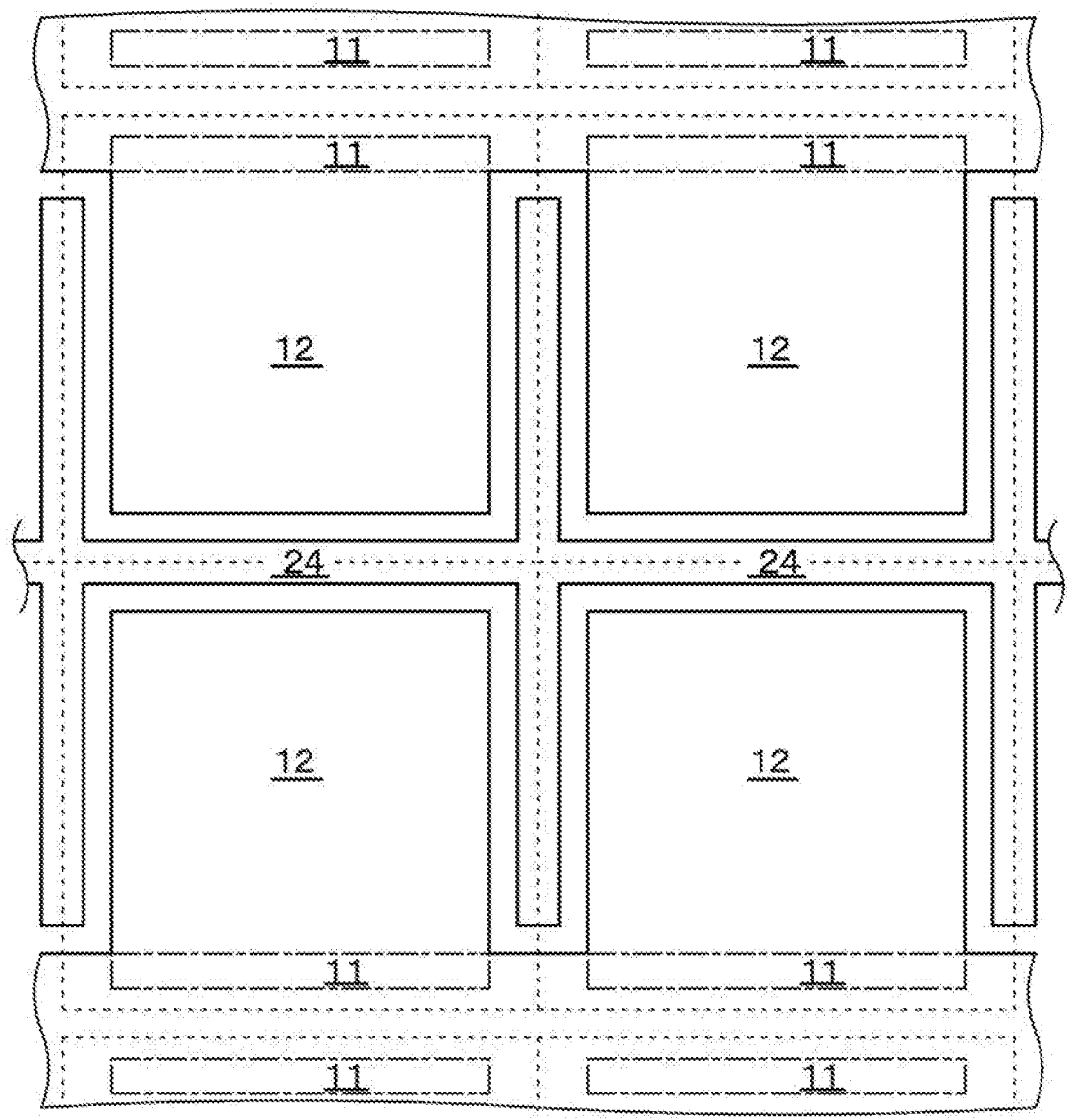
FIG. 19 is a schematic plan view of part of the imaging elements of Embodiment 3 (2×2 imaging elements arranged side by side).
Figure 20:
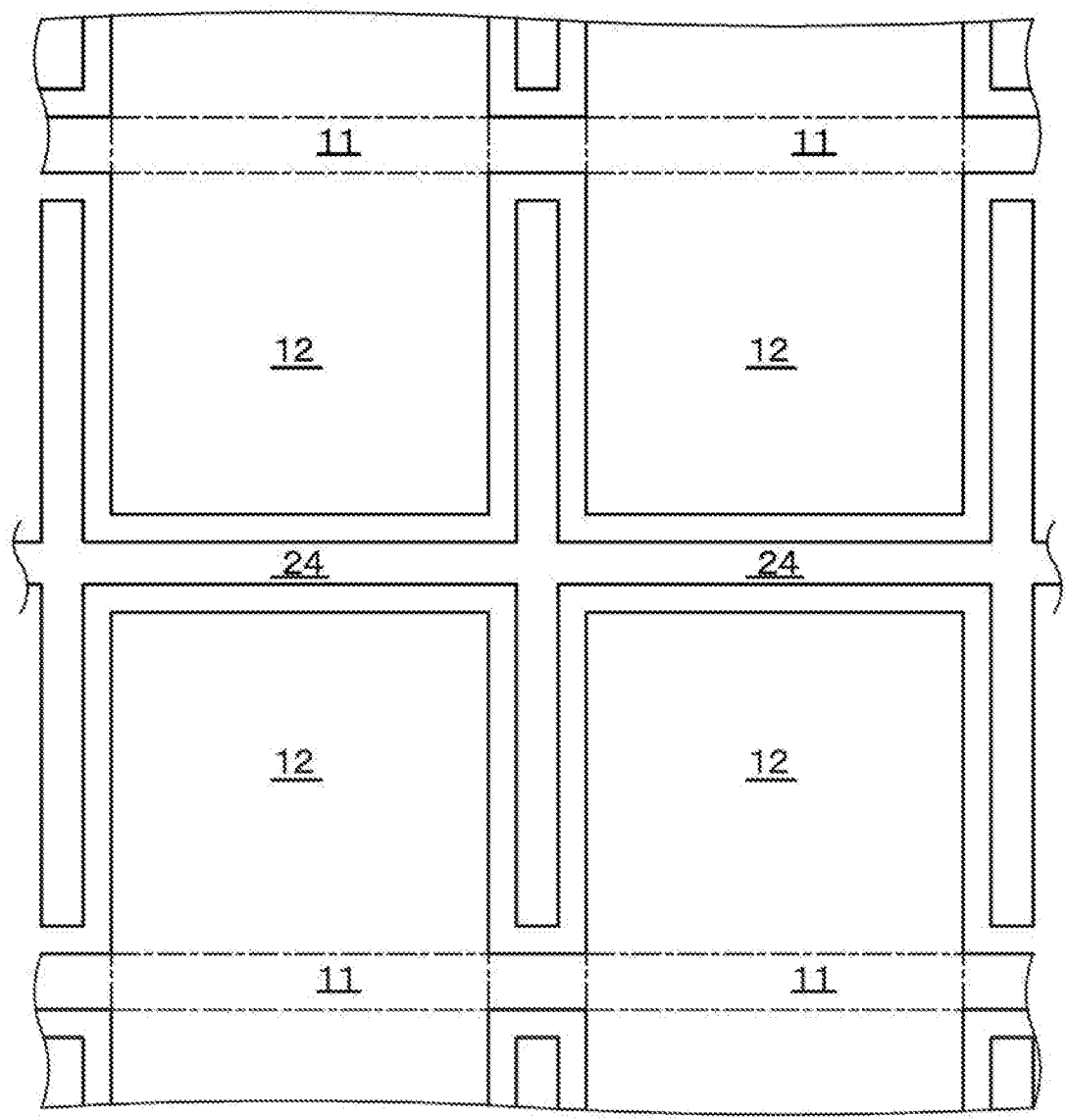
FIG. 20 is a schematic plan view of part of a modified example (Modified Example 1 of Embodiment 3) of the imaging elements of Embodiment 3 (2×2 imaging elements arranged side by side).

Embodiment 3 relates to the imaging element and the like according to the fourth aspect of the present disclosure. FIG. 17B illustrates a schematic cross-sectional view of part of the imaging elements of Embodiment 3 (two imaging elements arranged side by side), and FIGS. 19 and 20 illustrate schematic plan views of part of the imaging elements of Embodiment 3 (2×2 imaging elements arranged side by side). In the imaging element of Embodiment 3, the charge movement control electrode 24 is formed, in place of the second electrode 12, over the region $13_B$ of the photoelectric conversion layer 13 positioned between the imaging element and the adjacent imaging element. The charge movement control electrode 24 is provided apart from the second electrode 12. In other words, the second electrode 12 is provided for each imaging element, and the charge movement control electrode 24 is provided around at least part of the second electrode 12, apart from the second electrode 12, over the region-B of the photoelectric conversion layer 13. The charge movement control electrode 24 is formed in the same level as the second electrode 12.

In addition, as in FIG. 18A illustrating a schematic cross-sectional view of part of the imaging elements of Embodiment 3 (two imaging elements arranged side by side), the second electrode 12 may be divided into a plurality of second electrodes 12, and different potentials may be separately applied to the divided second electrodes 12. Furthermore, as illustrated in FIG. 18B, the charge movement control electrode 24 may be provided between the divided second electrode 12 and second electrode 12.

Note that in an example illustrated in FIG. 19, one charge storage electrode 14 is provided to correspond to one first electrode 11 in one imaging element. On the other hand, in an example illustrated in FIG. 20 (Modified Example 1 of Embodiment 3), one common first electrode 11 is provided to correspond to two charge storage electrodes 14 in two imaging elements. The schematic cross-sectional view of part of the imaging elements of Embodiment 3 (two imaging elements arranged side by side) illustrated in FIG. 17B corresponds to FIG. 20.

In Embodiment 3, the second electrode 12 positioned on the light incident side is shared by the imaging elements arranged in the left and right direction of FIG. 19 and is shared by a pair of imaging elements arranged in the up and down direction of FIG. 19. In addition, the charge movement control electrode 24 is also shared by the imaging elements arranged in the left and right direction of FIG. 19 and is shared by a pair of imaging elements arranged in the up and down direction of FIG. 19. The second electrode 12 and the charge movement control electrode 24 can be obtained by depositing a material layer of the second electrode 12 and the charge movement control electrode 24 on the photoelectric conversion layer 13 and then patterning the material layer. The second electrode 12 and the charge movement control electrode 24 are separately connected to wires (not illustrated), and the wires are connected to the drive circuit. The wire connected to the second electrode 12 is shared by a plurality of imaging elements. The wire connected to the charge movement control electrode 24 is also shared by a plurality of imaging elements.

In the imaging element of Embodiment 3, the drive circuit applies a potential $V_2'$ to the second electrode 12 and applies a potential $V_{13}'$ to the charge movement control electrode 24, and the charge is stored in the photoelectric conversion layer 13 in the charge storage period. In the charge transfer period, the drive circuit applies a potential $V_2''$ to the second electrode 12 and applies a potential $V_{23}''$ to the charge movement control electrode 24, and the charge stored in the photoelectric conversion layer 13 is read out to the control unit through the first electrode 11.

Here, the potential of the first electrode 11 is higher than the potential of the second electrode 12, and therefore, $$V_2' \ge V_{13}' \text{ and } V_2'' \ge V_{23}''$$

hold.

Figure 21A:
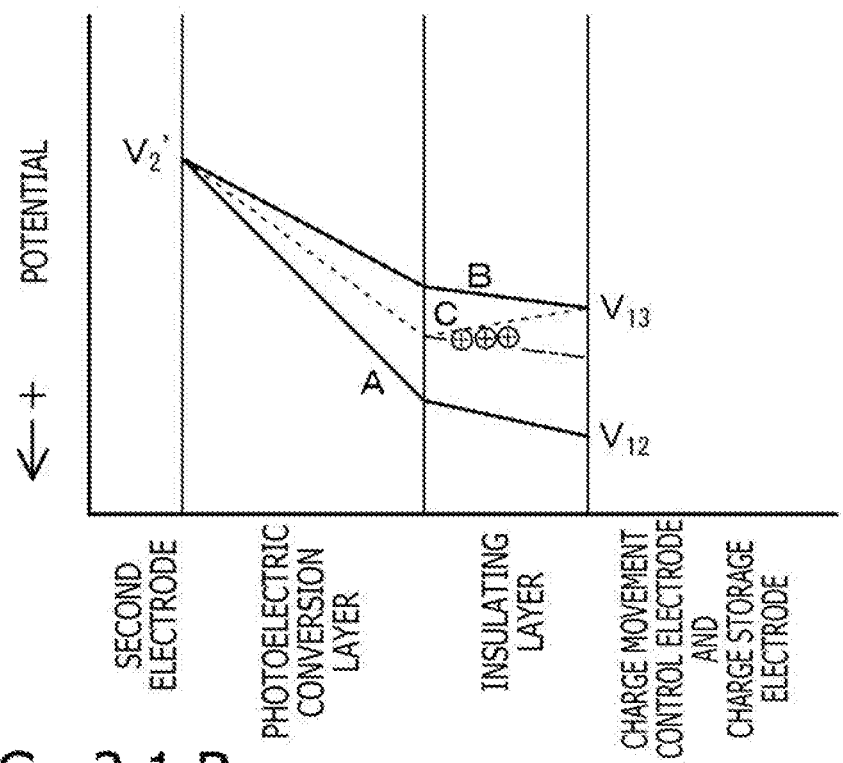
FIGS. 21A and 21B are diagrams schematically illustrating a change in the potential inside a photoelectric conversion layer in the imaging element of Embodiment 1 provided with the charge storage electrode on the lower side of the photoelectric conversion layer and a change in the potential inside the photoelectric conversion layer in the imaging element of Embodiment 3 provided with the charge storage electrode on the upper side of the photoelectric conversion layer.
Figure 21B:
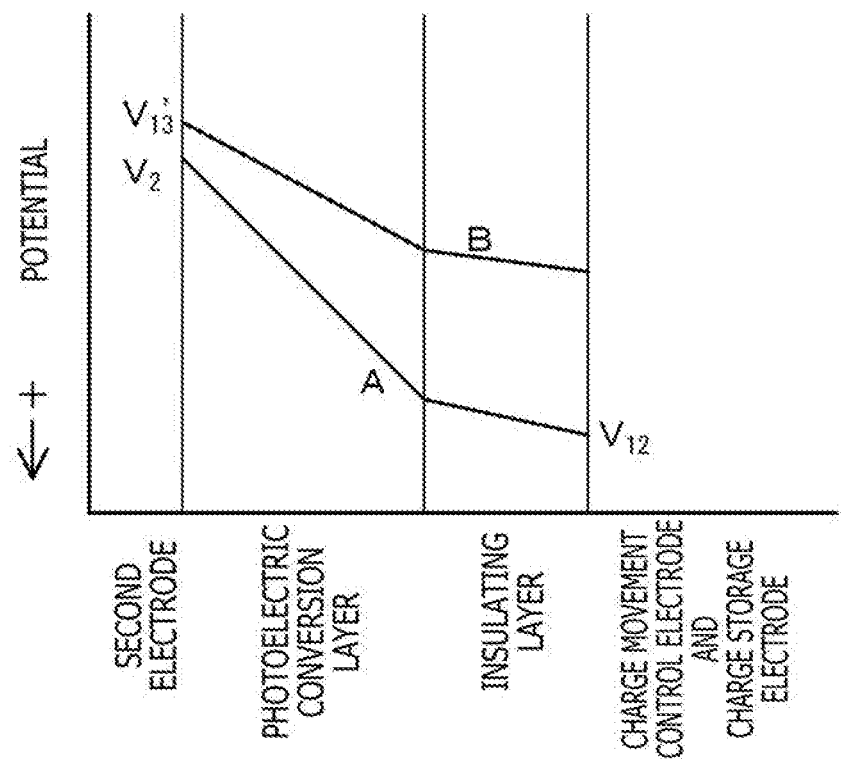

Meanwhile, the following problem may occur in the structure provided with the charge movement control electrode 21 adjacent to the first electrode 11 as illustrated in FIG. 1. That is, in the charge storage period, the drive circuit applies the potential $V_{11}$ to the first electrode 11, applies the potential $V_{12}$ to the charge storage electrode 14, applies the potential $V_{13}$ to the charge movement control electrode 21, and applies a potential $V_2$ to the second electrode 12. Here, for example, $V_{12} > V_{11} > V_2$ and $V_{12} > V_{13} > V_2$ hold. The potential inside the photoelectric conversion layer 13 positioned on the upper side of the first electrode 11 is indicated by "A" in FIGS. 21A and 21B. On the other hand, the potential inside the photoelectric conversion layer 13 positioned on the upper side of the charge movement control electrode 21 would simply change as indicated by "B" in FIG. 21A in a case where the potential $V_{13}$ is applied to the charge movement control electrode 21 and the potential is not applied to the charge storage electrode 14. However, the potential $V_{12}$ is applied to the charge storage electrode 14, and the potential changes as indicated by "C" in FIG. 21A due to the influence of the charge storage electrode 14. That is, inside the insulating layer 82, the potential decreases toward the charge movement control electrode 21. As a result, the electron holes are stored in the region of the insulating layer 82 on the upper side of the charge storage electrode 14 in the charge storage period, and the charge generated by the photoelectric conversion may be weakly attracted to the part of the photoelectric conversion layer facing the charge storage electrode.

On the other hand, in Embodiment 3, the charge movement control electrode 24 is formed in the same level as the second electrode 12, and the potential $V_{13}'$ is applied to the charge movement control electrode 24. Therefore, the potential inside the photoelectric conversion layer 13 positioned on the lower side of the charge movement control electrode 24 simply increases as indicated by "B" in FIG. 21B. In addition, there is no charge movement control electrode 21 on the lower side of the photoelectric conversion layer 13 positioned on the lower side of the charge movement control electrode 24, and the potential further simply increases inside the insulating layer 82. As a result, the electron holes are not stored in the region of the insulating layer 82 on the lower side of the charge movement control electrode 24 in the charge storage period, and this can prevent the phenomenon that the charge generated by the photoelectric conversion is weakly attracted to the part of the photoelectric conversion layer facing the charge storage electrode. This can more certainly prevent the degradation in the quality of the taken video (image).

In this way, the charge movement control electrode is formed, in place of the second electrode, over the region of the photoelectric conversion layer positioned between the imaging element and the adjacent imaging element in the imaging element of Embodiment 3. Therefore, the charge movement control electrode can prevent the charge generated by the photoelectric conversion from flowing into the adjacent imaging element, and the quality of the taken video (image) is not degraded.

Figure 22A:
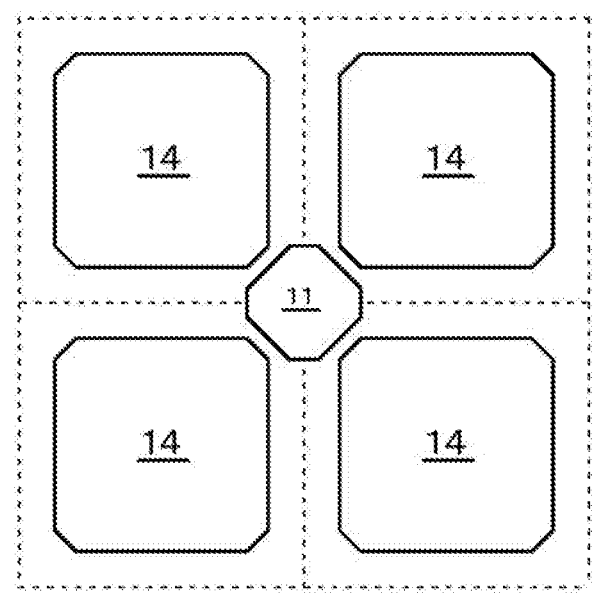
FIGS. 22A and 22B are schematic plan views of part of a modified example (Modified Example 2 of Embodiment 3) of the imaging elements of Embodiment 3.
Figure 22B:
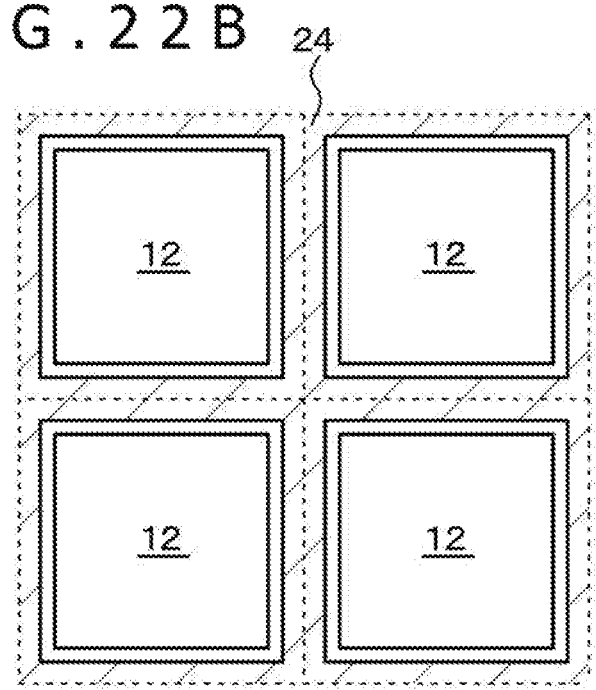

FIGS. 22A and 22B illustrate schematic plan views of part of a modified example of the imaging element of Embodiment 3 (Modified Example 2 of Embodiment 3). Note that FIGS. 22A, 23A, 25A, 26A, 27A, and 28A illustrate examples in which one common first electrode 11 is provided to correspond to four charge storage electrodes 14 in four imaging elements. In addition, as illustrated in FIG. 22B, the second electrode 12 is provided on the upper side of the charge storage electrode 14, in substantially the same size as the charge storage electrode 14. The second electrode 12 is surrounded by the charge movement control electrode 24. The charge movement control electrode 24 is shared by the imaging elements. An insulating film (not illustrated) is formed over the photoelectric conversion layer 13 including the second electrode 12 and the charge movement control electrode 24, and a contact hole (not illustrated) connected to the second electrode 12 is formed on the insulating film on the upper side of the second electrode 12. A wire $V_{Ou}$ (not illustrated) connected to the contact hole is provided on the insulating film. Note that the configurations and the structures of the second electrode 12, the insulating film, the contact hole, and the wire Vou are similar in the following modified examples. In addition, the examples illustrated in FIGS. 22A, 22B, 23A, 23B, 23C, 25A, 25B, 26A, 26B, 27A, 27B, 28A, and 28 also represent the solid-state imaging apparatuses of the first and second configurations.

Figure 23A:
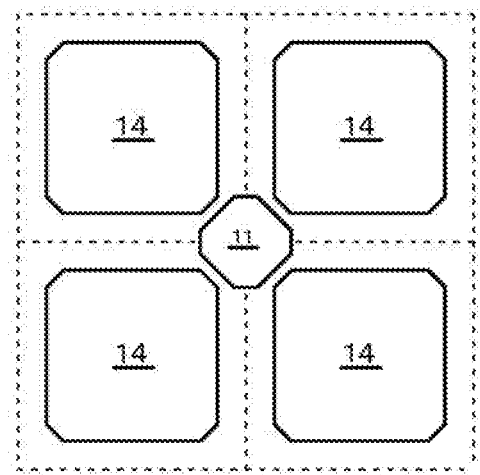
FIGS. 23A, 23B, and 23C are schematic plan views of part of a modified example (Modified Example 3 of Embodiment 3) of the imaging elements of Embodiment 3.
Figure 23B:
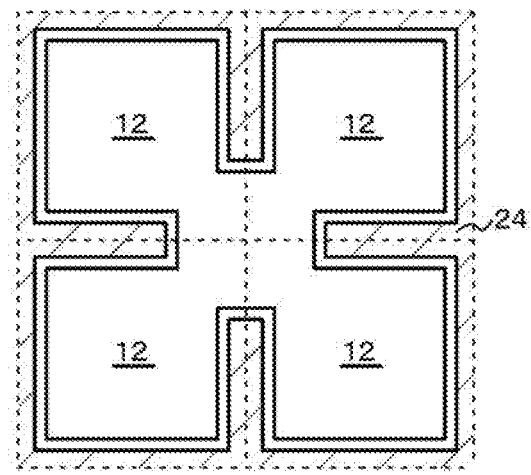
Figure 23C:
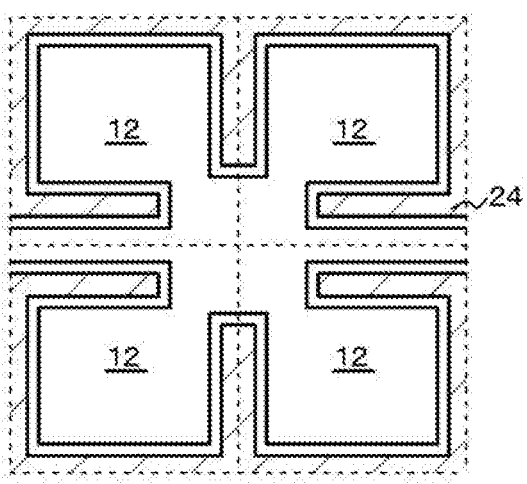

FIGS. 23A, 23B, and 23C illustrate schematic plan views of part of Modified Example 3 of Embodiment 3. As illustrated in FIGS. 23B and 23C, the second electrode 12 is provided on the upper side of the charge storage electrode 14, in substantially the same size as the charge storage electrode 14. The second electrode 12 is surrounded by the charge movement control electrode 24. The charge movement control electrode 24 is shared by four imaging elements. The shared part is formed on the photoelectric conversion layer 13. Note that in the example illustrated in FIG. 23C, the second electrode 12 extends to the second electrode of the adjacent imaging element.

Figure 24A:
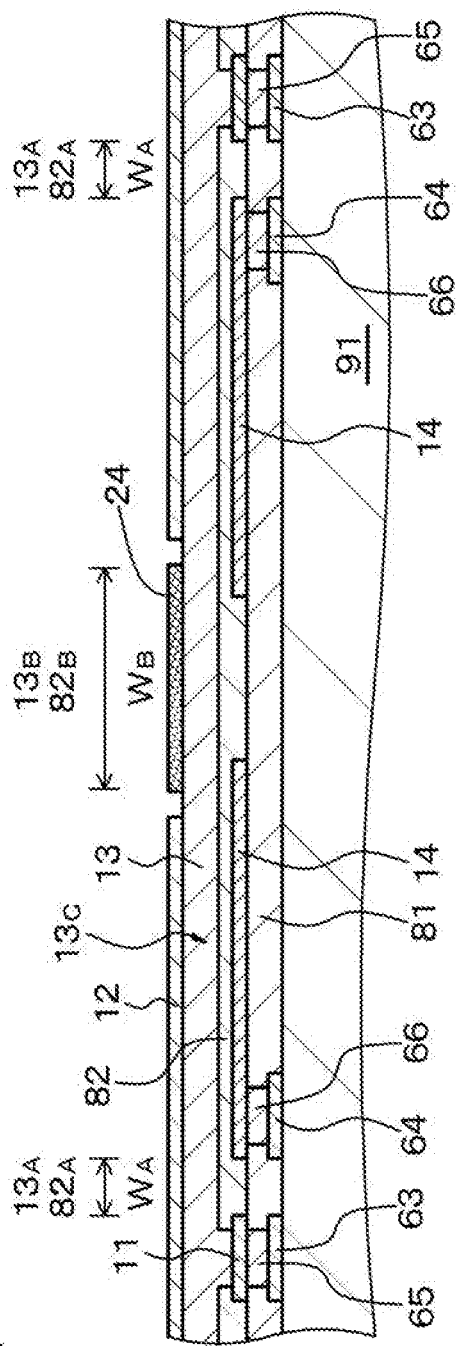
FIGS. 24A and 24B are schematic cross-sectional views of part of modified examples (Modified Example 4A and Modified Example 4B of Embodiment 3) of the imaging elements of Embodiment 3 (two imaging elements arranged side by side).
Figure 25A:
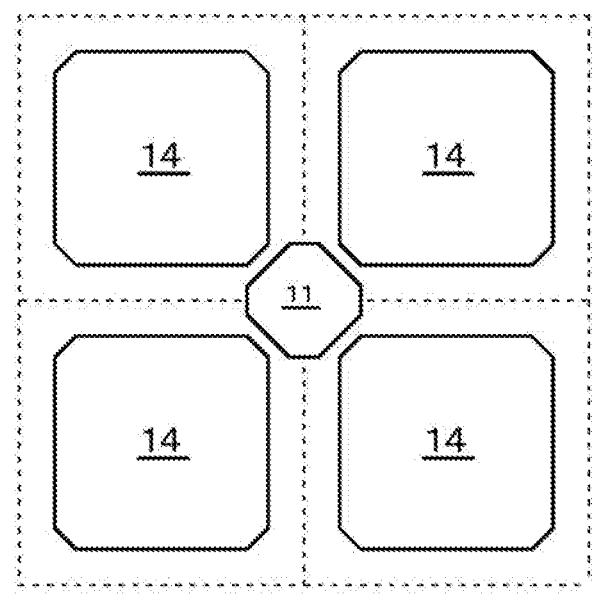
FIGS. 25A and 25B are schematic plan views of part of the modified example (Modified Example 4A of Embodiment 3) of the imaging elements of Embodiment 3.
Figure 25B:
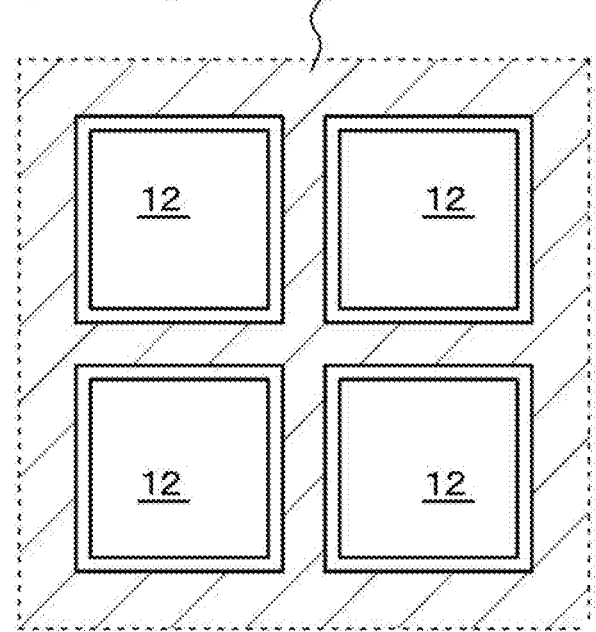

FIG. 24A illustrates a schematic cross-sectional view of part of a modified example (Modified Example 4A of Embodiment 3) of the imaging elements of Embodiment 3 (two imaging elements arranged side by side), and FIGS. 25A and 25B illustrate schematic plan views of the part. In Modified Example 4A of Embodiment 3, the second electrode 12 is provided for each imaging element, and the charge movement control electrode 24 is provided around at least part of the second electrode 12 or apart from the second electrode 12. Part of the charge storage electrode 14 exists on the lower side of the charge movement control electrode 24. The second electrode 12 is provided on the upper side of the charge storage electrode 14, in a size smaller than the charge storage electrode 14.

Figure 24B:
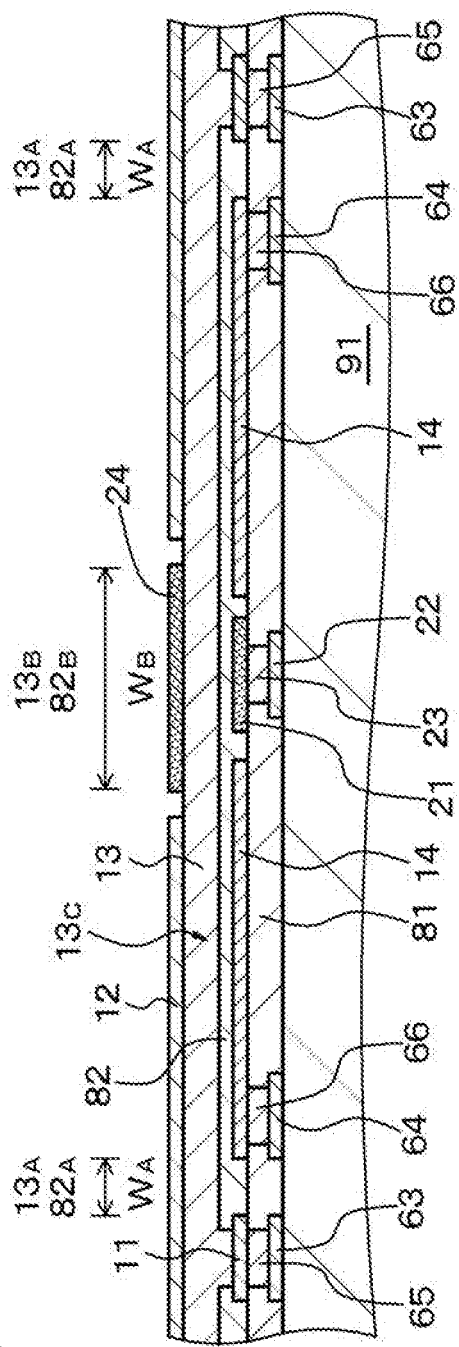
Figure 26A:
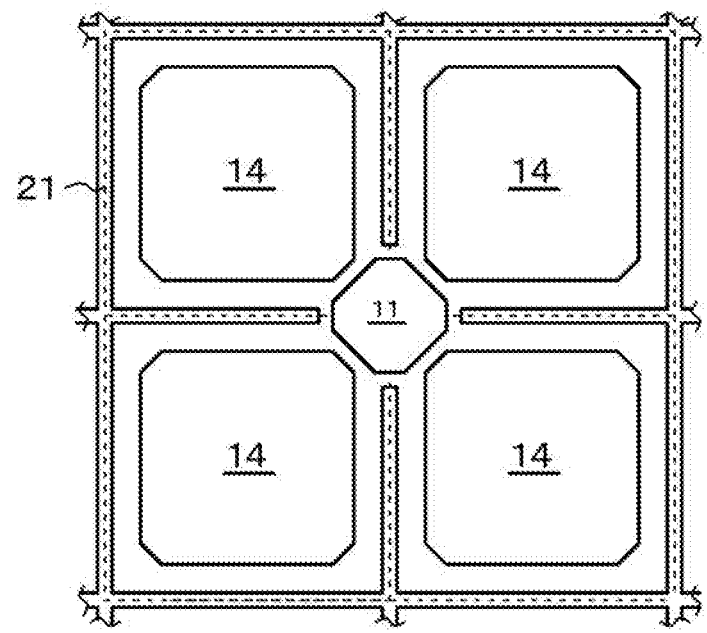
FIGS. 26A and 26B are schematic plan views of part of the modified example (Modified Example 4B of Embodiment 3) of the imaging elements of Embodiment 3.
Figure 26B:
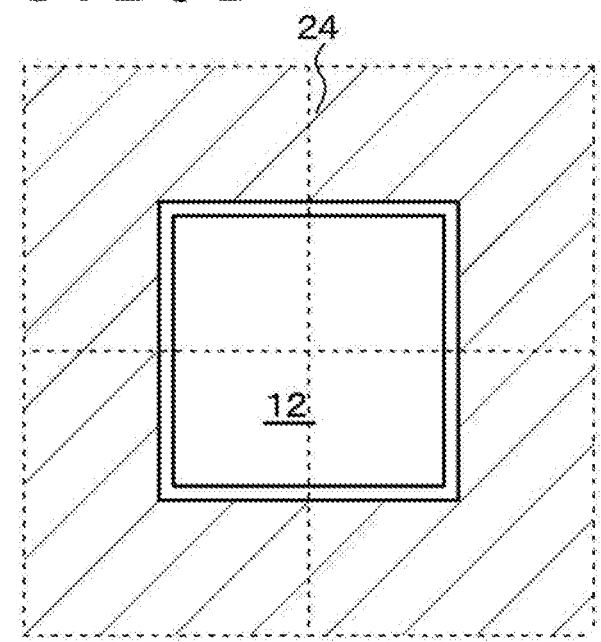

FIG. 24B illustrates a schematic cross-sectional view of part of a modified example (Modified Example 4B of Embodiment 3) of the imaging elements of Embodiment 3 (two imaging elements arranged side by side), and FIGS. 26A and 26B illustrate schematic plan views of the part. In Modified Example 4B, the second electrode 12 is provided for each imaging element, and the charge movement control electrode 24 is provided around at least part of the second electrode 12 or apart from the second electrode 12. Part of the charge storage electrode 14 exists on the lower side of the charge movement control electrode 24, and furthermore, the charge movement control electrode (lower charge movement control electrode) 21 is provided on the lower side of the charge movement control electrode (upper charge movement control electrode 24). The size of the second electrode 12 is smaller than in Modified Example 4A. That is, the region of the second electrode 12 facing the charge movement control electrode 24 is positioned closer to the first electrode 11 compared to the region of the second electrode 12 facing the charge movement control electrode 24 in Modified Example 4A. The charge storage electrode 14 is surrounded by the charge movement control electrode 21.

Figure 27A:
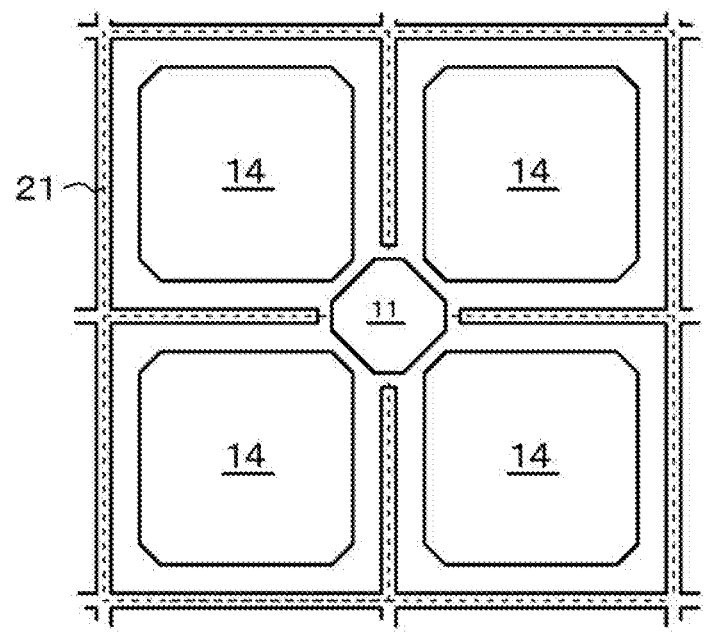
FIGS. 27A and 27B are schematic plan views of part of a modified example (Modified Example 4C of Embodiment 3) of the imaging elements of Embodiment 3.
Figure 27B:
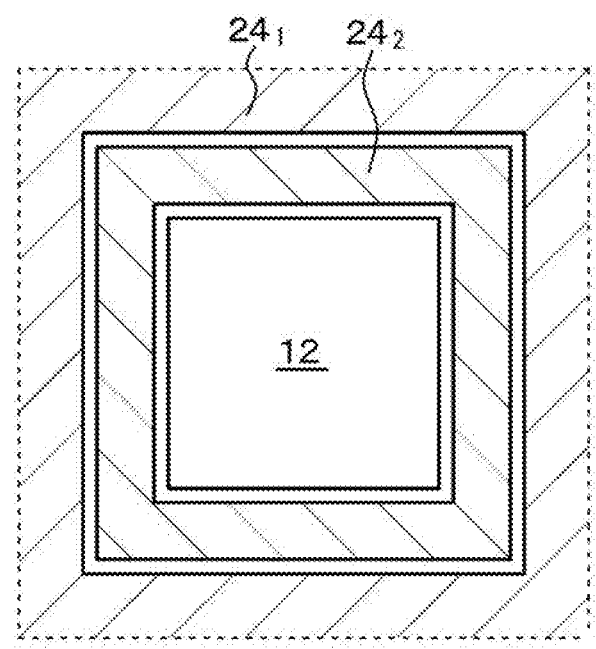

FIGS. 27A and 27B illustrate schematic plan views of part of a modified example of the imaging element of Embodiment 3 (Modified Example 4C of Embodiment 3). In Modified Example 4C, part of the charge storage electrode 14 exists on the lower side of the charge movement control electrode 24 as in Modified Example 4B of Embodiment 3. The size of the second electrode 12 is smaller than in Modified Example 4A. That is, the region of the second electrode 12 facing the charge movement control electrode 24 is positioned closer to the first electrode 11 compared to the region of the second electrode 12 facing the charge movement control electrode 24 in Modified Example 4A. In addition, the charge movement control electrode 24 includes an outer charge movement control electrode $24_1$ and an inner charge movement control electrode $24_2$ provided between the outer charge movement control electrode $24_1$ and the second electrode 12. The charge storage electrode 14 is surrounded by the charge movement control electrode 21. In the charge transfer period, a relationship (potential applied to outer charge movement control electrode $24_1$)<(potential applied to inner charge movement control electrode $24_2$)< (potential applied to second electrode 11) can be satisfied to more effectively transfer the charge.

Figure 28A:
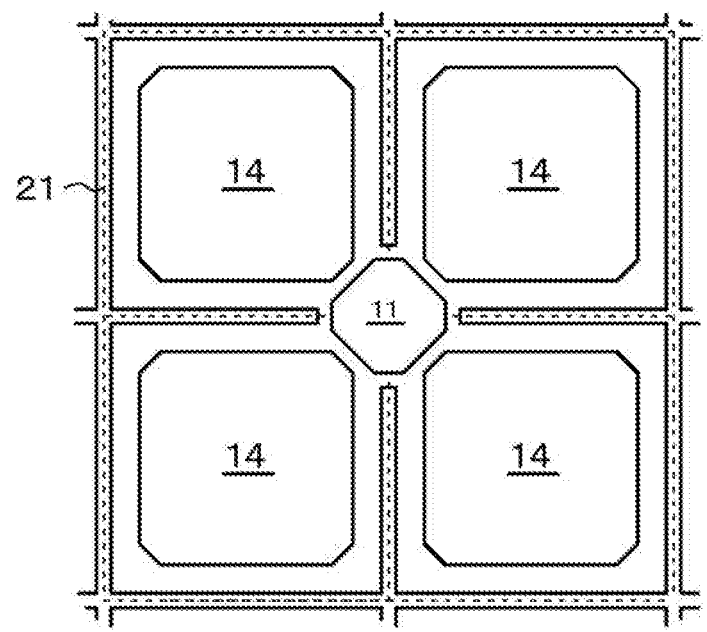
FIGS. 28A and 28B are schematic plan views of part of a modified example (Modified Example 4D of Embodiment 3) of the imaging elements of Embodiment 3.
Figure 28B:
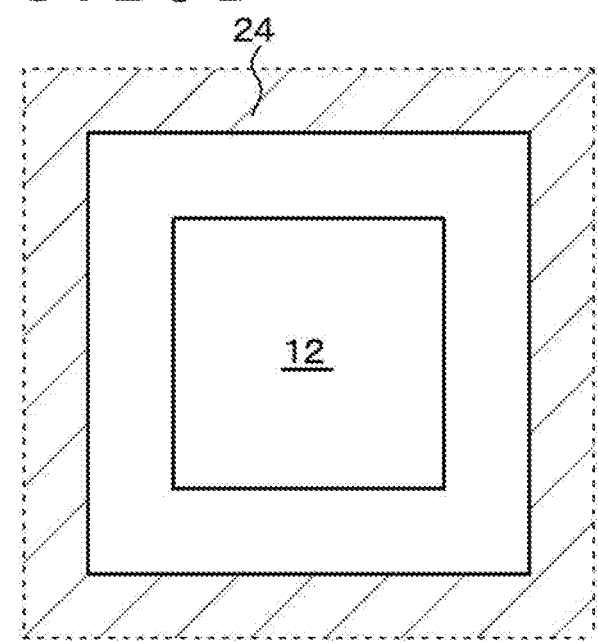

FIGS. 28A and 28B illustrate schematic plan views of part of a modified example of the imaging element of Embodiment 3 (Modified Example 4D of Embodiment 3). In Modified Example 4D, the charge movement control electrode (lower charge movement control electrode) 21 is provided on the lower side of the charge movement control electrode (upper charge movement control electrode) 24 as in Modified Example 4B of Embodiment 3. The size of the second electrode 12 is smaller than in Modified Example 4B. That is, the region of the second electrode 12 facing the charge movement control electrode 24 is positioned closer to the first electrode 11 compared to the region of the second electrode 12 facing the charge movement control electrode 24 in Modified Example 4B. In addition, the interval between the charge movement control electrode 24 and the second electrode 12 is wider than in Modified Example 4B. The charge storage electrode 14 is surrounded by the charge movement control electrode 21. The potential generated by coupling of the charge movement control electrode 24 and the second electrode 12 is applied to the region of the photoelectric conversion layer 13 positioned below the region between the charge movement control electrode 24 and the second electrode 12.

Figure 29A:
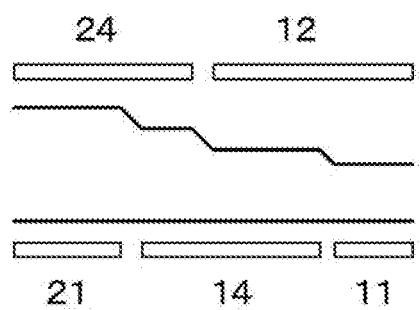
FIGS. 29A, 29B, and 29C are diagrams schematically illustrating states of the potential in each section (during charge transfer) in Modified Example 4B of Embodiment 3, Modified Example 4C of Embodiment 3, and Modified Example 4D of Embodiment 3, respectively.
Figure 29B:
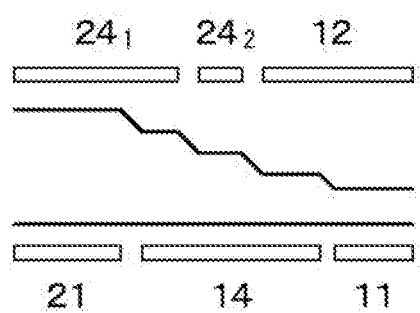
Figure 29C:
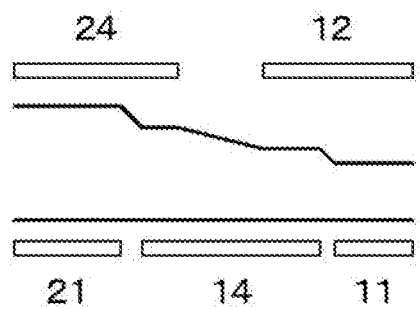

FIGS. 29A, 29B, and 29C schematically illustrate states of the potential in each section (during charge transfer) in Modified Example 4B of Embodiment 3, Modified Example 4C of Embodiment 3, and Modified Example 4D of Embodiment 3, respectively.

Embodiment 4

Figure 30:
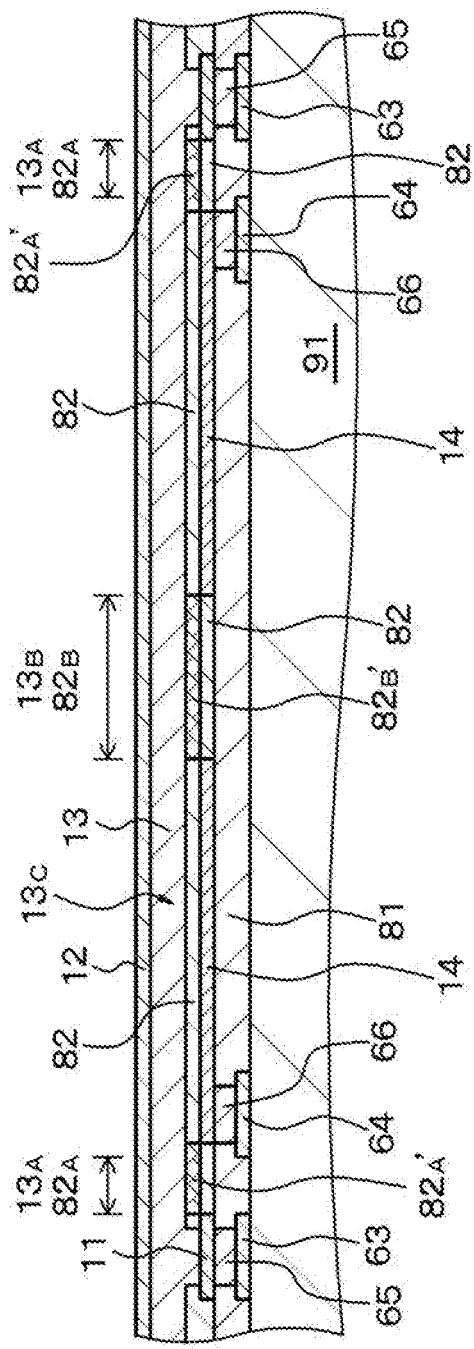
FIG. 30 is a schematic cross-sectional view of part of imaging elements of Embodiment 4 (two imaging elements arranged side by side).

Embodiment 4 relates to the imaging element and the like according to the fifth aspect of the present disclosure. FIG. 30 illustrates a schematic cross-sectional view of part of the imaging elements of Embodiment 4 (two imaging elements arranged side by side). In the imaging element of Embodiment 4, a value $\varepsilon_A$ of the dielectric constant of an insulating material (insulating material-A) $82_A'$ included in a region (region-a) $82_A$ between the first electrode 11 and the charge storage electrode 14 [specifically, region $82_A$ of the insulating layer 82 positioned between the first electrode 11 and the charge storage electrode 14] is higher than a value $\varepsilon_E$ of the dielectric constant of an insulating material (insulating material-B) $82_B'$ included in the region (region-b) $82_B$ between the imaging element and the adjacent imaging element [specifically, region $82_B$ of the insulating layer 82 positioned between the imaging element and the adjacent imaging element]. The insulating material-A ($82_A'$) and the insulating material-B ($82_B'$) are formed in the level of the insulating layer 82 covering the charge storage electrode 14. That is, when the insulating layer 82 is expressed by two layers including a lower insulating layer filling the gap between the charge storage electrode 14 and the charge storage electrode 14 and an upper layer insulating layer covering the charge storage electrode 14 and formed over the lower insulating layer, the insulating material-A ($82_A'$) and the insulating material-B ($82_B'$) fill part of the upper insulating layer [specifically, part of the upper insulating layer in the region $82_A$ of the insulating layer 82 positioned between the first electrode 11 and the charge storage electrode 14 and part of the upper insulating layer in the region (region-b) $82_B$ between the imaging element and the adjacent imaging element].

The imaging element and the stacked imaging element of Embodiment 4 can be obtained by also forming the regions $82_A$ and $82_B$ of the insulating layer 82 containing the insulating material-A ($82_A'$) and the insulating material-B ($82_B'$) when forming the insulating layer 82 in the manufacturing process of the imaging element and the stacked imaging element of Embodiment 1.

In the imaging element of Embodiment 4, the value of the dielectric constant of the insulating material included in the region between the first electrode and the charge storage electrode is higher than the value of the dielectric constant of the insulating material included in the region between the imaging element and the adjacent imaging element. Therefore, the capacity of a capacitor-A is larger than the capacity of a capacitor-B, and the charge is more attracted toward the region between the first electrode and the charge storage electrode than toward the region between the imaging element and the adjacent imaging element. This can prevent the charge generated by the photoelectric conversion from flowing into the adjacent imaging element, and the quality of the taken video (image) is not degraded.

Figure 31:
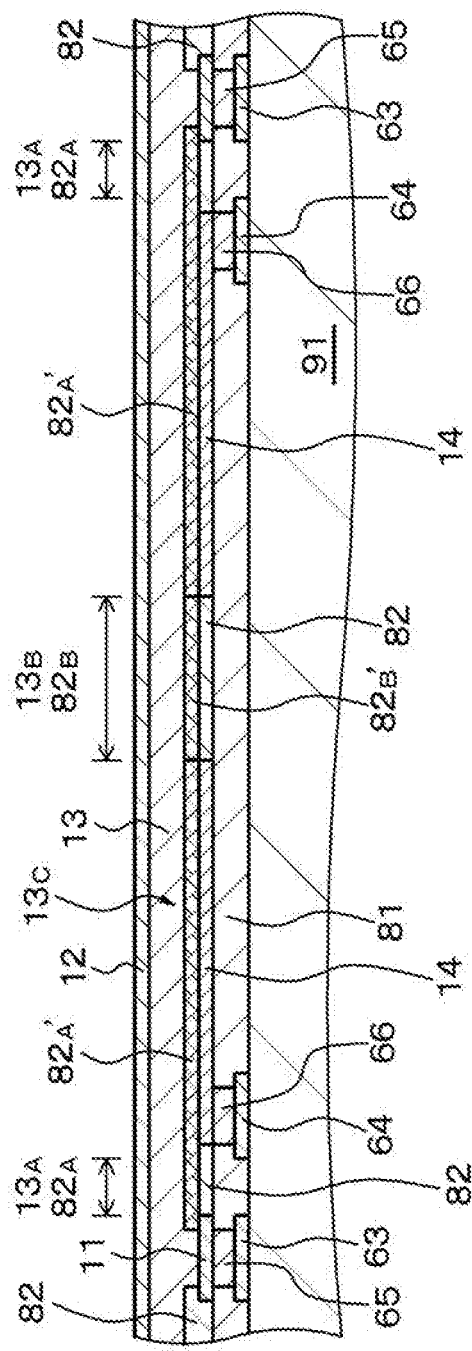
FIG. 31 is a schematic cross-sectional view of part of a modified example of the imaging elements of Embodiment 4 (two imaging elements arranged side by side).
Figure 32:
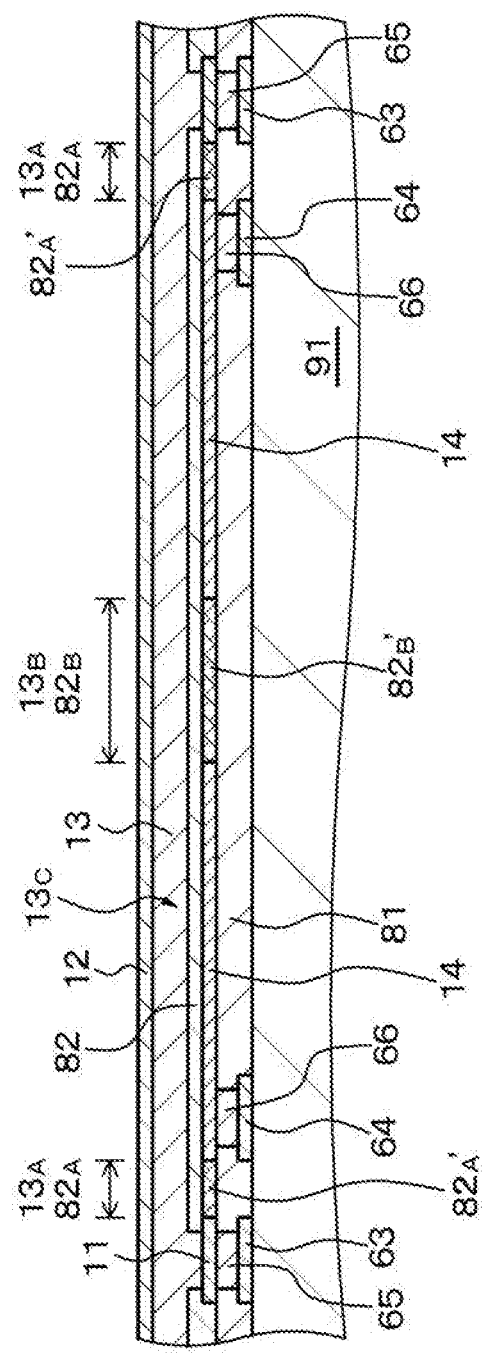
FIG. 32 is a schematic cross-sectional view of part of another modified example of the imaging elements of Embodiment 4 (two imaging elements arranged side by side).
Figure 33:
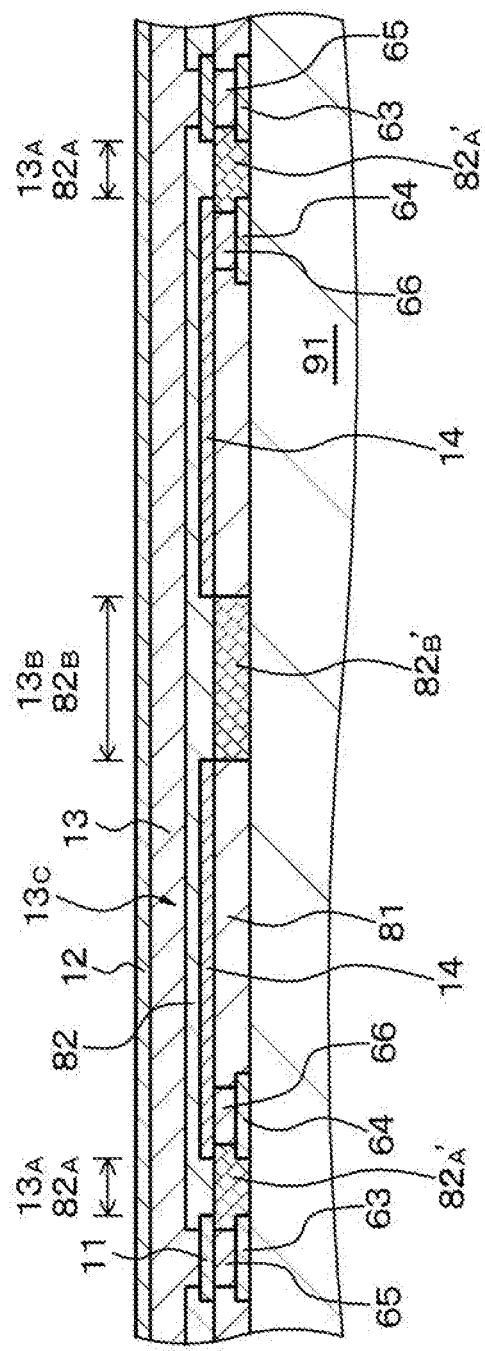
FIG. 33 is a schematic cross-sectional view of part of yet another modified example of the imaging elements of Embodiment 4 (two imaging elements arranged side by side).

FIG. 31 illustrates a schematic cross-sectional view of part of a modified example of the imaging elements of Embodiment 4 (two imaging elements arranged side by side), and FIGS. 32 and 33 illustrate schematic cross-sectional views of part of other modified examples. Note that the formation positions of the insulating material-A ($82_A'$) and the insulating material-B ($82_B'$) illustrated in FIGS. 30, 31, 32, and 33 can be appropriately combined.

In the example illustrated in FIG. 31, the insulating material-A ($82_A'$) fills the part of the upper insulating layer on the charge storage electrode 14 from the region $82_A$ of the insulating layer 82 positioned between the first electrode 11 and the charge storage electrode 14, and the insulating material-B ($82_B'$) fills the part of the upper insulating layer in the region (region-b) $82_B$ between the imaging element and the adjacent imaging element.

In the example illustrated in FIG. 32, the insulating material-A ($82_A'$) fills the part of the lower insulating layer in the region $82_A$ of the insulating layer 82 positioned between the first electrode 11 and the charge storage electrode 14, and the insulating material-B ($82_B'$) fills the part of the lower insulating layer in the region (region-b) $82_B$ between the imaging element and the adjacent imaging element.

In the example illustrated in FIG. 33, the insulating material-A ($82_A'$) fills the part of the interlayer insulating layer 81 positioned below the region $82_A$ of the insulating layer 82 positioned between the first electrode 11 and the charge storage electrode 14, and the insulating material-B ($82_B'$) fills the part of the interlayer insulating layer 81 positioned below the region (region-b) $82_B$ between the imaging element and the adjacent imaging element.

Embodiment 5

Figure 34:
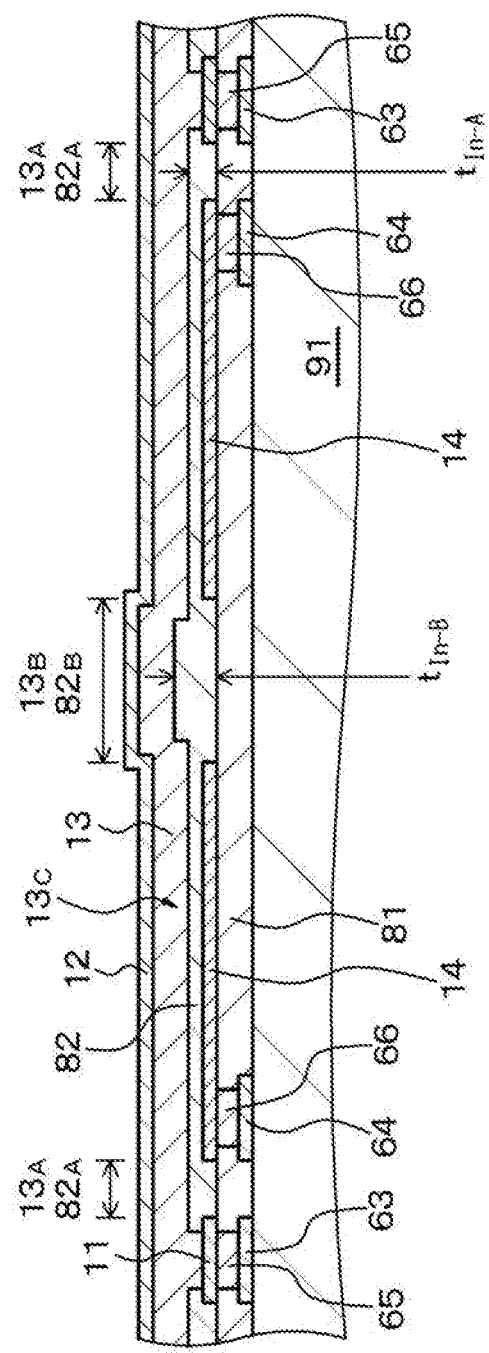
FIG. 34 is a schematic cross-sectional view of part of imaging elements of Embodiment 5 (two imaging elements arranged side by side).

Embodiment 5 relates to the imaging element and the like according to the sixth aspect of the present disclosure. FIG. 34 illustrates a schematic cross-sectional view of part of the imaging elements of Embodiment 5 (two imaging elements arranged side by side). In the imaging element of Embodiment 5, a thickness $t_{In-A}$ of the region $82_A$ of the insulating layer 82 (region-A of insulating layer) positioned between the first electrode 11 and the charge storage electrode 14 is thinner than a thickness $t_{In-B}$ of the region $82_B$ of the insulating layer 82 (region-B of insulating layer) positioned between the imaging element and the adjacent imaging element.

An example of the value of ($t_{In-A}/t_{In-B}$) includes $\frac{1}{2} \leq (t_{In-A}/t_{In-B}) < 1$, and specifically, the value is $(t_{In-A}/t_{In-B}) = 0.9$.

The imaging element and the stacked imaging element of Embodiment 5 can be obtained by controlling the thickness in the regions $82_A$ and $82_B$ of the insulating layer 82 (for example, controlling the thickness based on etching) when forming the insulating layer 82 in the manufacturing process of the imaging element and the stacked imaging element of Embodiment 1.

In the imaging element of Embodiment 5, the thickness of the region of the insulating layer positioned between the first electrode and the charge storage electrode is thinner than the thickness of the region of the insulating layer positioned between the imaging element and the adjacent imaging element. Therefore, the capacity of the capacitor-A is larger than the capacity of the capacitor-B, and the charge is more attracted toward the region of the insulating layer positioned between the first electrode and the charge storage electrode than toward the region of the insulating layer positioned between the imaging element and the adjacent imaging element. This can prevent the charge generated by the photoelectric conversion from flowing into the adjacent imaging element, and the quality of the taken video (image) is not degraded.

Figure 35:
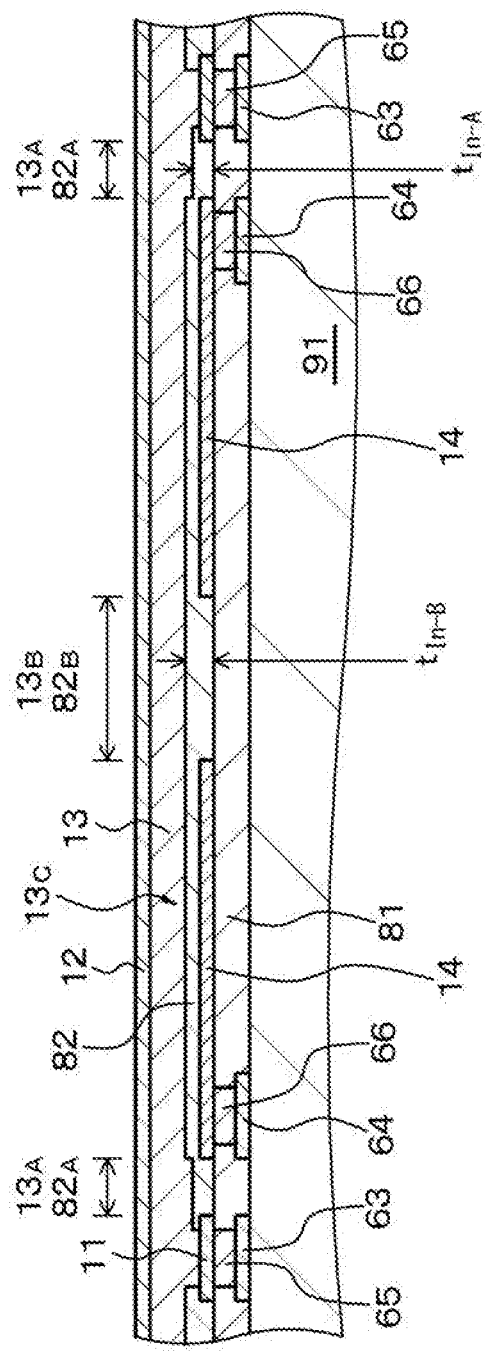
FIG. 35 is a schematic cross-sectional view of part of a modified example of the imaging elements of Embodiment 5 (two imaging elements arranged side by side).
Figure 36:
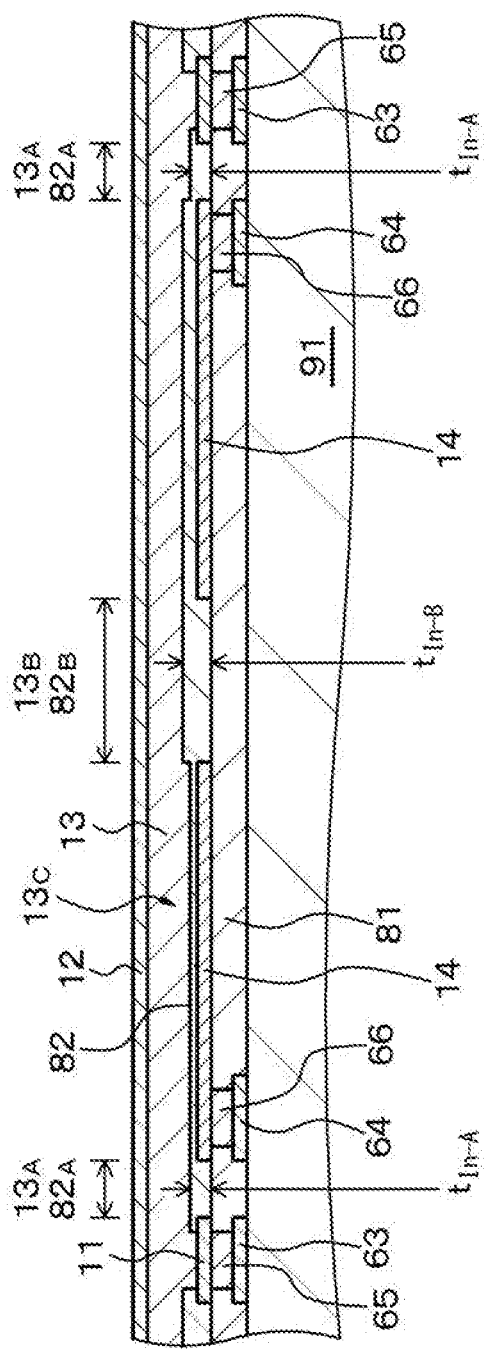
FIG. 36 is a schematic cross-sectional view of part of another modified example of the imaging elements of Embodiment 5 (two imaging elements arranged side by side).

FIG. 35 illustrates a schematic cross-sectional view of part of a modified example of the imaging elements of Embodiment 5 (two imaging elements arranged side by side), and FIG. 36 illustrates a schematic cross-sectional view of part of another modified example.

In the modified example illustrated in FIG. 35, the thickness $t_{In-A}$ of the region $82_A$ of the insulating layer 82 (region-A of insulating layer) positioned between the first electrode 11 and the charge storage electrode 14 is thinner than the thickness $t_{In-B}$ of the region $82_B$ of the insulating layer 82 (region-B of insulating layer) positioned between the imaging element and the adjacent imaging element. However, the level of the top surface of the insulating layer 82 above the charge storage electrode 14 is the same level as the level of the top surface of the insulating layer 82 in the region-B of the insulating layer.

In the modified example illustrated in FIG. 36, the level of the top surface of the insulating layer 82 in the region-B of the insulating layer is the same level as the level of the top surface of the insulating layer 82 above the charge storage electrode 14 included in one of the imaging elements (imaging element positioned on the right in FIG. 36). However, the top surface is in a level higher than the level of the top surface of the insulating layer 82 above the charge storage electrode 14 included in the other imaging element (imaging element positioned on the left in FIG. 36). In addition, the level of the top surface of the insulating layer 82 in the region-A of the insulating layer is the same level as the level of the top surface of the insulating layer 82 above the charge storage electrode 14 included in the other imaging element. However, the top surface is in a level lower than the level of the top surface of the insulating layer 82 above the charge storage electrode 14 included in the one of the imaging elements.

Embodiment 6

Figure 37:
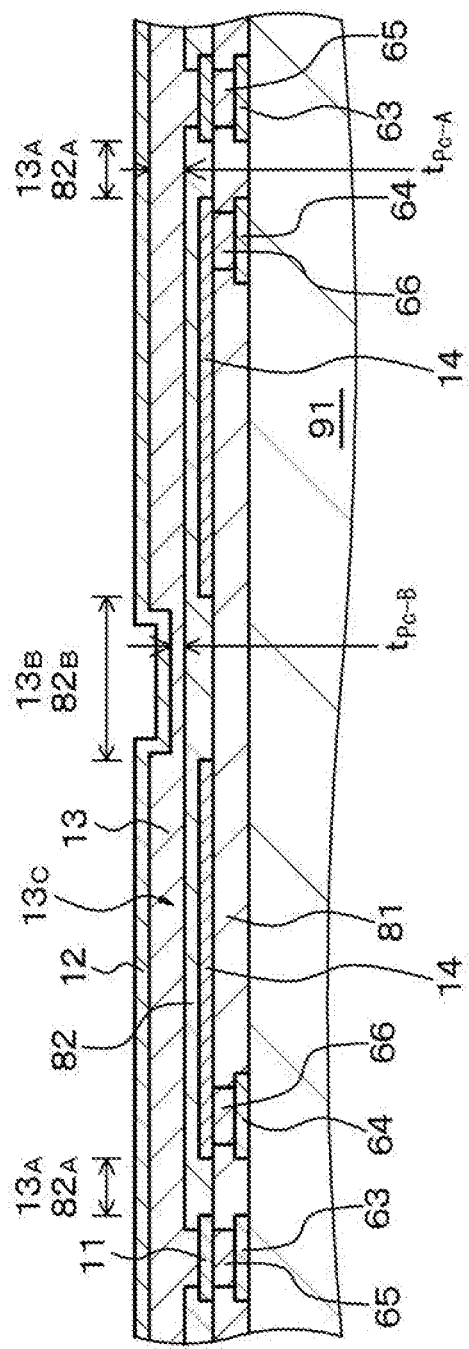
FIG. 37 is a schematic cross-sectional view of part of imaging elements of Embodiment 6 (two imaging elements arranged side by side).

Embodiment 6 relates to the imaging element and the like according to the seventh aspect of the present disclosure. FIG. 37 illustrates a schematic cross-sectional view of part of the imaging elements of Embodiment 6 (two imaging elements arranged side by side). In the imaging element of Embodiment 6, a thickness $t_{Pc-A}$ of the region $13_A$ of the photoelectric conversion layer 13 (region-A of photoelectric conversion layer 13) positioned between the first electrode 11 and the charge storage electrode 14 is thicker than a thickness $t_{Pc-B}$ of the region $13B$ of the photoelectric conversion layer 13 (region-B of photoelectric conversion layer 13) positioned between the imaging element and the adjacent imaging element. An example of the value of ($t_{Pc-A}/t_{Pc-B}$) includes $1 < (t_{Pc-A}/t_{Pc-B}) \leq 2$, and specifically, the value is $(t_{Pc-A}/t_{Pc-B}) = 1.25$.

The imaging element and the stacked imaging element of Embodiment 6 can be obtained by controlling the thickness in the regions $13_A$ and $13_B$ of the photoelectric conversion layer 13 (for example, controlling the thickness based on etching) when forming the photoelectric conversion layer 13 in the manufacturing process of the imaging element and the stacked imaging element of Embodiment 1.

In the imaging element of Embodiment 6, the thickness of the region of the photoelectric conversion layer positioned between the first electrode and the charge storage electrode is thicker than the thickness of the region of the photoelectric conversion layer positioned between the imaging element and the adjacent imaging element. This can prevent the charge generated by the photoelectric conversion from flowing into the adjacent imaging element, and the quality of the taken video (image) is not degraded.

Figure 38:
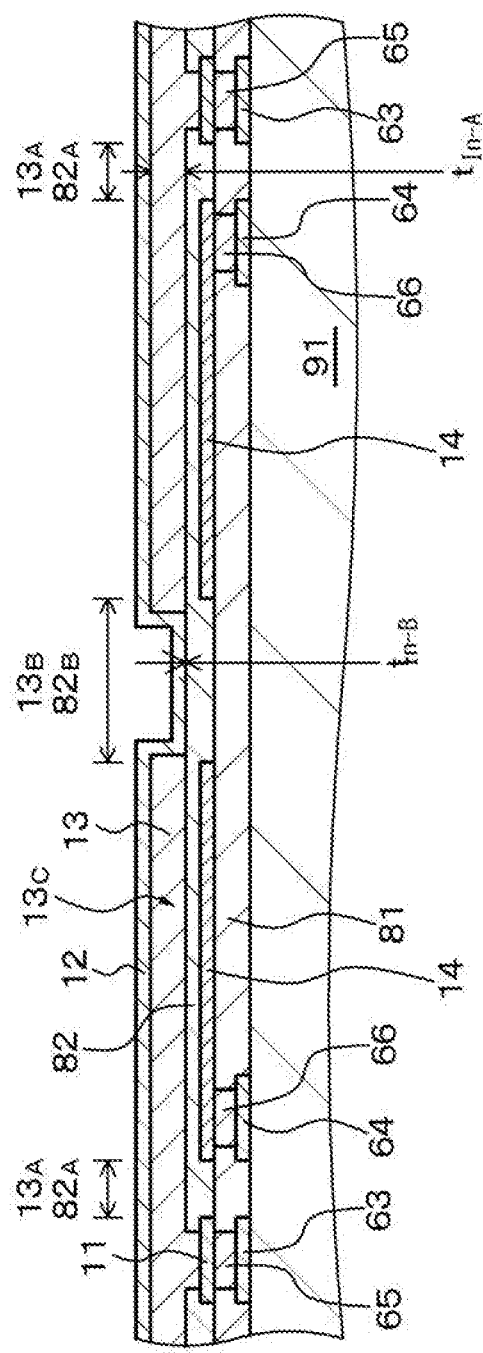
FIG. 38 is a schematic cross-sectional view of part of a modified example of the imaging elements of Embodiment 6 (two imaging elements arranged side by side).

FIG. 38 illustrates a schematic cross-sectional view of part of a modified example of the imaging elements of Embodiment 6 (two imaging elements arranged side by side), and the value of $t_{Pc-B}$ may be 0 depending on the case. That is, the region of the photoelectric conversion layer 13 positioned between the imaging element and the adjacent imaging element may not exist depending on the case.

Embodiment 7

Figure 39:
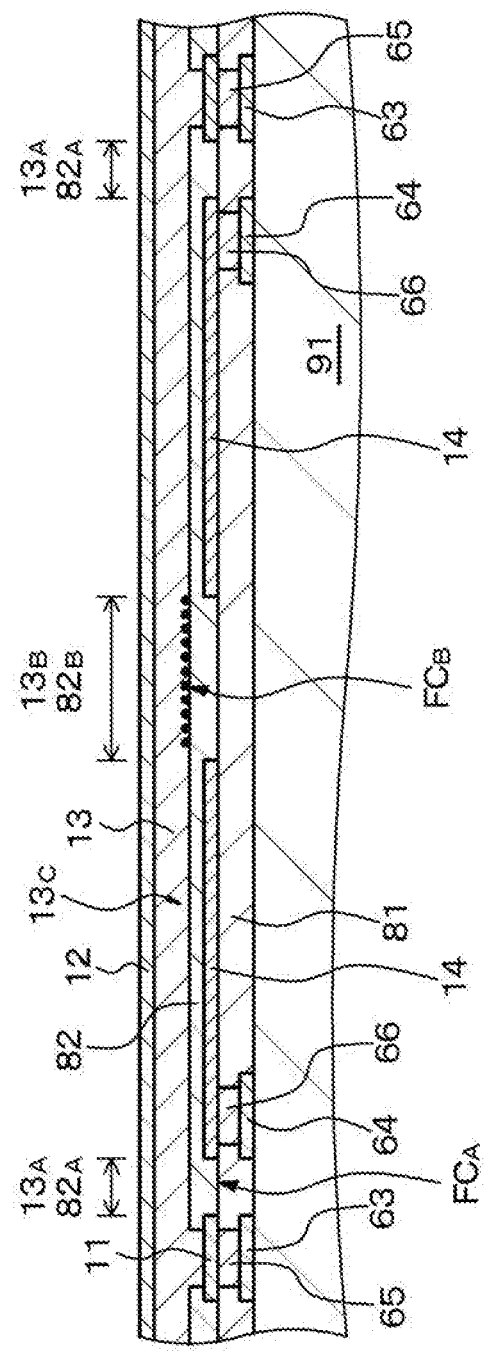
FIG. 39 is a schematic cross-sectional view of part of imaging elements of Embodiment 7 (two imaging elements arranged side by side).

Embodiment 7 relates to the imaging element and the like according to the eighth aspect of the present disclosure. FIG. 39 illustrates a schematic cross-sectional view of part of the imaging elements of Embodiment 7 (two imaging elements arranged side by side). In the imaging element of Embodiment 7, a fixed charge amount $FC_A$ in the region of the interface between the photoelectric conversion layer $13_A$ (region-A of photoelectric conversion layer 13) and the insulating layer $82_A$ (region-A of insulating layer 82) positioned between the first electrode 11 and the charge storage electrode 14 is less than a fixed charge amount $FC_B$ in the region of the interface between the photoelectric conversion layer $13_B$ (region-B of photoelectric conversion layer 13)

and the insulating layer $82_B$ (region-B of insulating layer 82) positioned between the imaging element and the adjacent imaging element. An example of the value of ($FC_A/FC_B$) includes $$1/10 \le (FC_A/FC_B) < 1.$$

In FIG. 39, black circles indicate the charge (electron holes) generated at the interface of the insulating layer. The fixed charge amount in the region of the interface between the photoelectric conversion layer 13 and the insulating layer 82 can be controlled based on, for example, a method of depositing a thin film with fixed charge.

In the imaging element of Embodiment 7, the fixed charge amount in the region of the interface between the photoelectric conversion layer and the insulating layer positioned between the first electrode and the charge storage electrode is less than the fixed charge amount in the region of the interface between the photoelectric conversion layer and the insulating layer positioned between the imaging element and the adjacent imaging element. This can prevent the charge generated by the photoelectric conversion from flowing into the adjacent imaging element, and the quality of the taken video (image) is not degraded.

Embodiment 8

Figure 40:
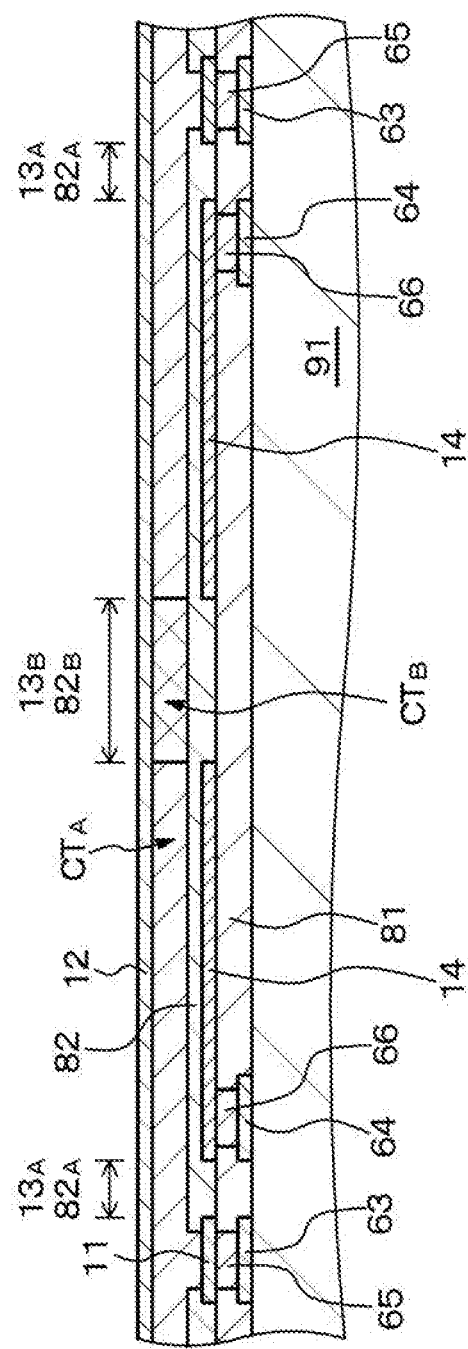
FIG. 40 is a schematic cross-sectional view of part of imaging elements of Embodiment 8 (two imaging elements arranged side by side).

Embodiment 8 relates to the imaging element and the like according to the ninth aspect of the present disclosure. FIG. 40 illustrates a schematic cross-sectional view of part of the imaging elements of Embodiment 8 (two imaging elements arranged side by side). In the imaging element of Embodiment 8, the value of charge mobility $CT_A$ in the region of the photoelectric conversion layer $13_A$ (region-A of photoelectric conversion layer 13) positioned between the first electrode 11 and the charge storage electrode 14 is larger than the value of charge mobility $CT_B$ in the region $13_B$ of the photoelectric conversion layer 13 (region-B of photoelectric conversion layer 13) positioned between the imaging element and the adjacent imaging element. An example of the value of ($CT_A/CT_B$) includes $$1 < (CT_A/CT_B) \le 1 \times 10^2.$$

Specifically, the value is $$(CT_A/CT_B) = 2.$$

The imaging element and the stacked imaging element of Embodiment 8 can be obtained by forming the regions $13_A$ and $13_B$ of the photoelectric conversion layer 13 by using a material with the relationship of the charge mobility $CT_A$ and the charge mobility $CT_B$ described above as a material included in the regions $13_A$ and $13_B$ of the photoelectric conversion layer 13 in forming the photoelectric conversion layer 13 in the manufacturing process of the imaging element and the stacked imaging element of Embodiment 1.

In the imaging element of Embodiment 8, the value of the charge mobility in the region of the photoelectric conversion layer positioned between the first electrode and the charge storage electrode is larger than the value of the charge mobility in the region of the photoelectric conversion layer positioned between the imaging element and the adjacent imaging element. This can prevent the charge generated by the photoelectric conversion from flowing into the adjacent imaging element, and the quality of the taken video (image) is not degraded.

Figure 41:
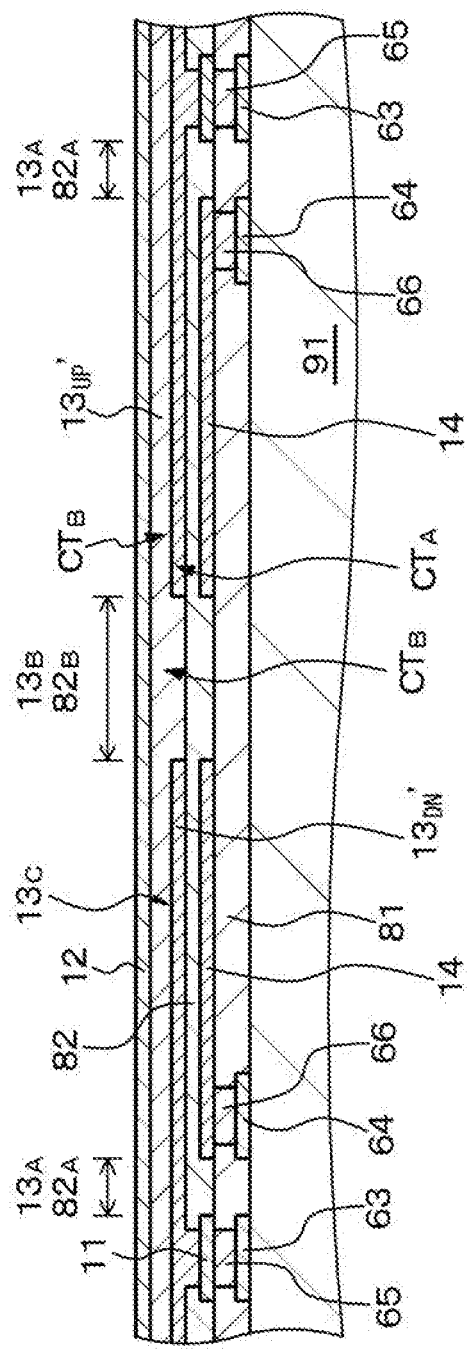
FIG. 41 is a schematic cross-sectional view of part of a modified example of the imaging elements of Embodiment 8 (two imaging elements arranged side by side).

FIG. 41 illustrates a schematic cross-sectional view of part of a modified example of the imaging elements of Embodiment 8 (two imaging elements arranged side by side). In the modified example illustrated in FIG. 41, part of the photoelectric conversion layer 13 has a two-layer configuration of an upper layer (upper photoelectric conversion layer) $13_{UP}'$/a lower layer (lower semiconductor layer) $13_{DN}'$. The upper layer of the region-A ($13_A$) of the photoelectric conversion layer 13 and the upper layer $13_{UP}'$ of the region-B ($13_B$) of the photoelectric conversion layer and the part of the photoelectric conversion layer 13 positioned on the upper side of the charge storage electrode 14 contain the same material (upper layer constituent material). In addition, the lower layer $13_{DN}'$ of the region-A ($13_A$) of the photoelectric conversion layer and the lower layer $13_{DN}'$ of the part of the photoelectric conversion layer 13 positioned on the upper side of the charge storage electrode 14 contain the same material (lower layer constituent material). However, the upper layer constituent material and the lower layer constituent material are different. The lower layer $13_{DN}'$ can be provided in this way to prevent, for example, recombination during charge storage. This can also increase the charge transfer efficiency of the charge stored in the photoelectric conversion layer 13 to the first electrode 11. Furthermore, the charge generated in the photoelectric conversion layer 13 can be temporarily held to control the timing and the like of the transfer. In addition, the generation of dark current can be suppressed.

Embodiment 9

Figure 42:
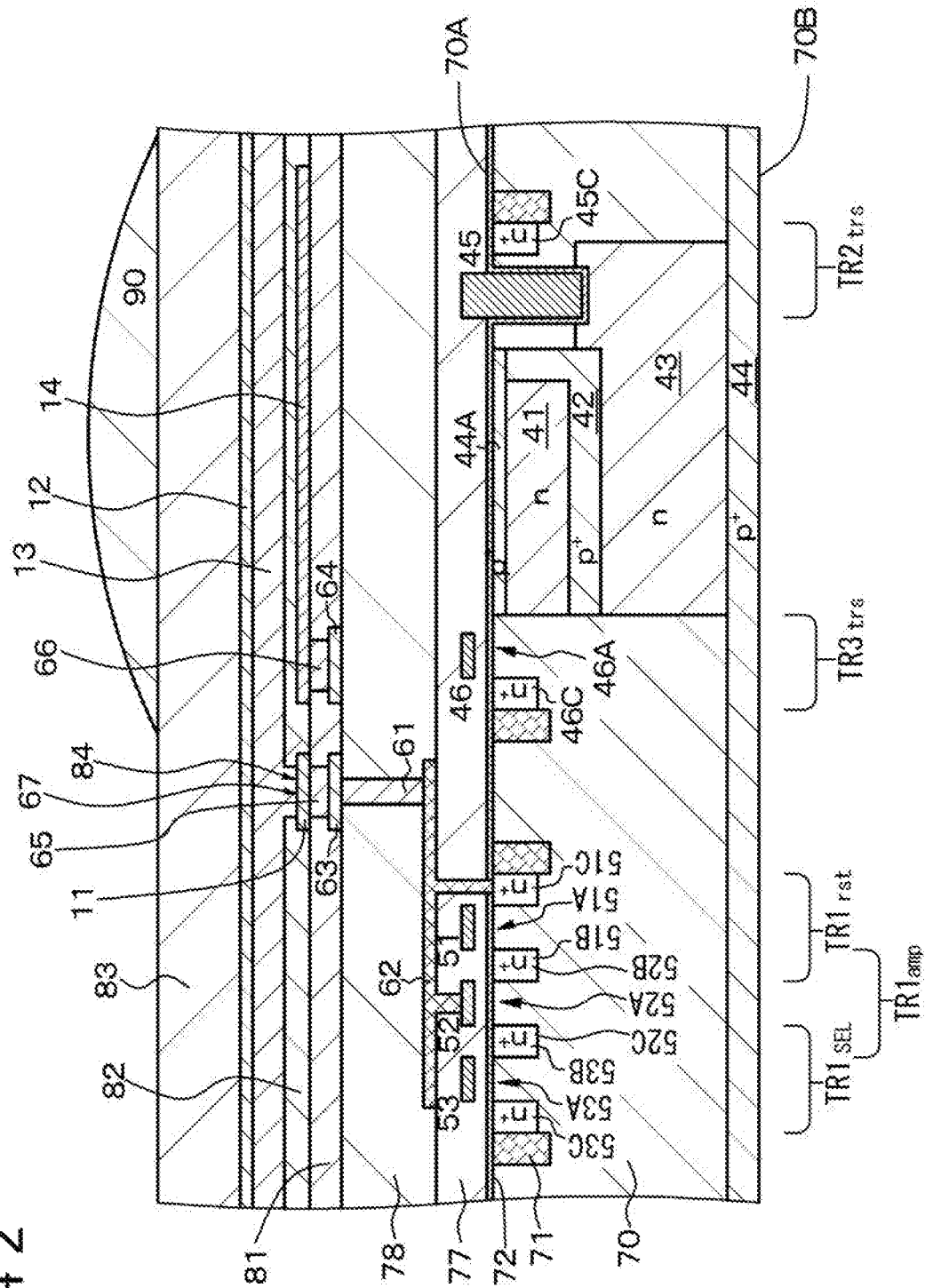
FIG. 42 is a schematic partial cross-sectional view of an imaging element and a stacked imaging element of Embodiment 9.

Embodiment 9 is a modification of Embodiments 1 to 8. An imaging element and a stacked imaging element of Embodiment 9 illustrated in a schematic partial cross-sectional view of FIG. 42 are front illuminated type imaging element and stacked imaging element. The imaging element and the stacked imaging element have a stacked structure of three imaging elements including: a green light imaging element of first type in Embodiment 1 (first imaging element) sensitive to green light, the green light imaging element including a green light photoelectric conversion layer of first type for absorbing green light; a conventional blue light imaging element of second type (second imaging element) sensitive to blue light, the blue light imaging element including a blue light photoelectric conversion layer of second type for absorbing blue light; and a conventional red light imaging element of second type (third imaging element) sensitive to red light, the red light imaging element including a red light photoelectric conversion layer of second type for absorbing red light. Here, the red light imaging element (third imaging element) and the blue light imaging element (second imaging element) are provided in the semiconductor substrate 70, and the second imaging element is positioned on the light incident side with respect to the third imaging element. In addition, the green light imaging element (first imaging element) is provided on the upper side of the blue light imaging element (second imaging element).

Various transistors included in the control unit are provided on the front surface 70A side of the semiconductor substrate 70 as in Embodiment 1. The transistors can have configurations and structures substantially similar to the transistors described in Embodiment 1. In addition, the second imaging element and the third imaging element are provided on the semiconductor substrate 70, and the imaging elements can also have configurations and structures substantially similar to the second imaging element and the third imaging element described in Embodiment 1.

Interlayer insulating layers 77 and 78 are formed on the front surface 70A of the semiconductor substrate 70, and the photoelectric conversion unit (first electrode 11, photoelectric conversion layer 13, and second electrode 12), the charge storage electrode 14, and the like included in the imaging element of Embodiment 1 are provided on the interlayer insulating layer 78.

In this way, the configurations and the structures of the imaging element and the stacked imaging element of Embodiment 9 can be similar to the configurations and the structures of the imaging element and the stacked imaging element of Embodiment 1 except that the imaging element and the stacked imaging element are front illuminated type imaging element and stacked imaging element, and the details will not be described.

Embodiment 10

Embodiment 10 is a modification of Embodiments 1 to 9.

Figure 43:
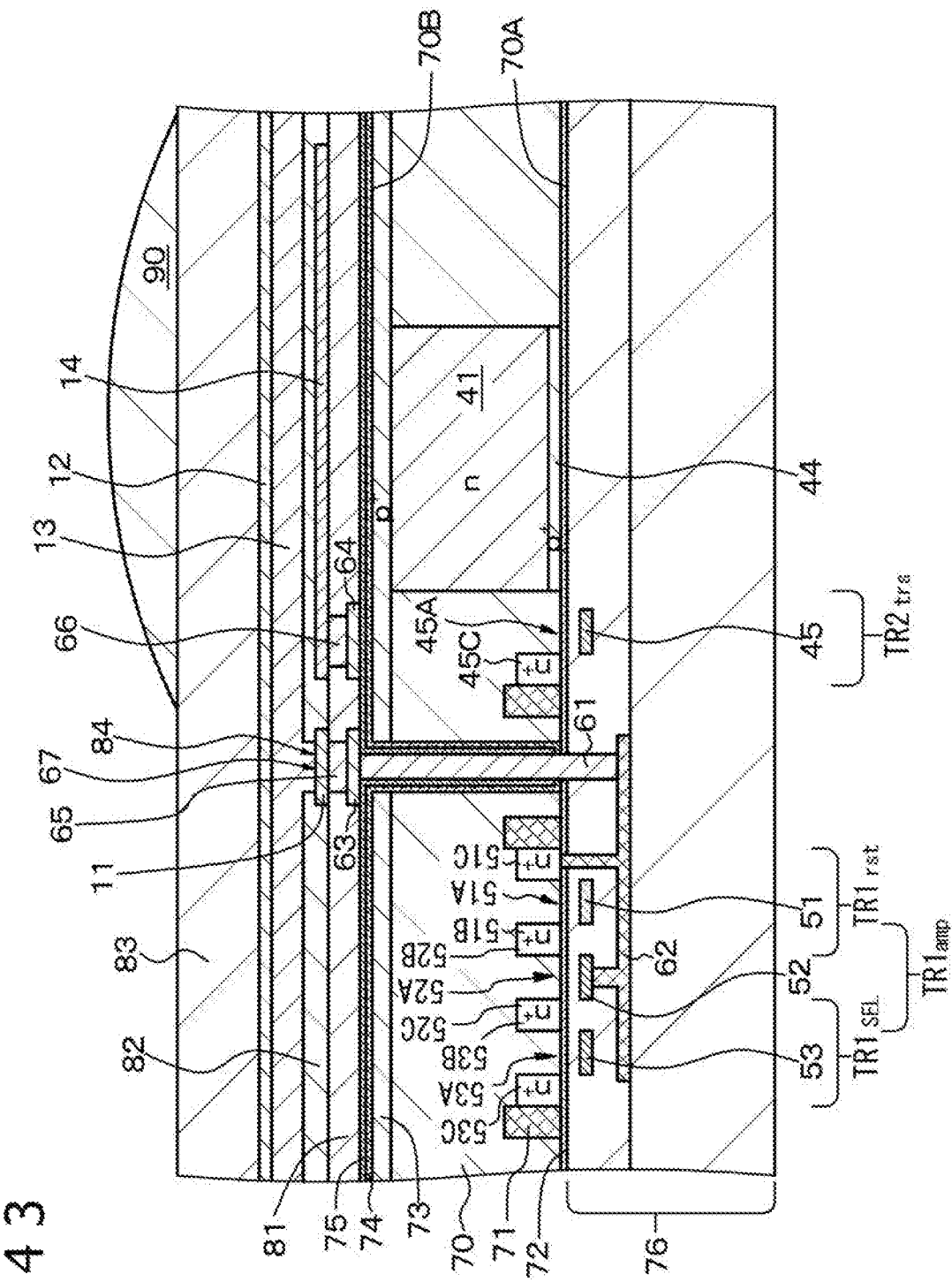
FIG. 43 is a schematic partial cross-sectional view of an imaging element and a stacked imaging element of Embodiment 10.
Figure 44:
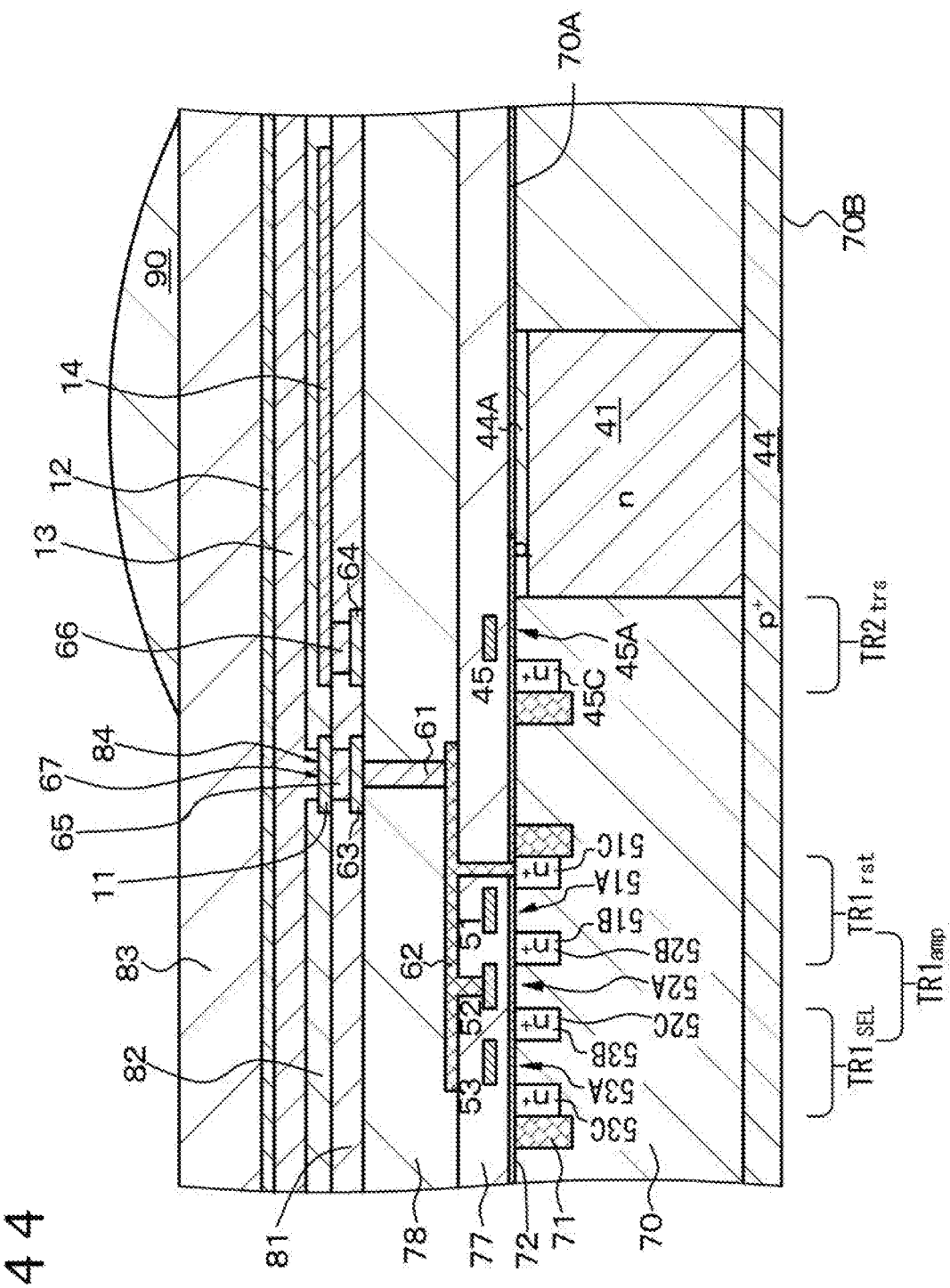
FIG. 44 is a schematic partial cross-sectional view of a modified example of the imaging element and the stacked imaging element of Embodiment 10.

An imaging element and a stacked imaging element of Embodiment 10 illustrated in a schematic partial cross-sectional view of FIG. 43 is back illuminated type imaging element and stacked imaging element. The imaging element and the stacked imaging element have a stacked structure of two imaging elements including the first imaging element of first type in Embodiment 1 and the second imaging element of second type. In addition, a modified example of the imaging element and the stacked imaging element of Embodiment 10 illustrated in a schematic partial cross-sectional view of FIG. 44 provides front illuminated type imaging element and stacked imaging element. The imaging element and the stacked imaging element have a stacked structure of two imaging elements including the first imaging element of first type in Embodiment 1 and the second imaging element of second type. Here, the first imaging element absorbs light of primary colors, and the second imaging element absorbs light of complementary colors. Alternatively, the first imaging element absorbs white light, and the second imaging element absorbs infrared rays.

Figure 45:
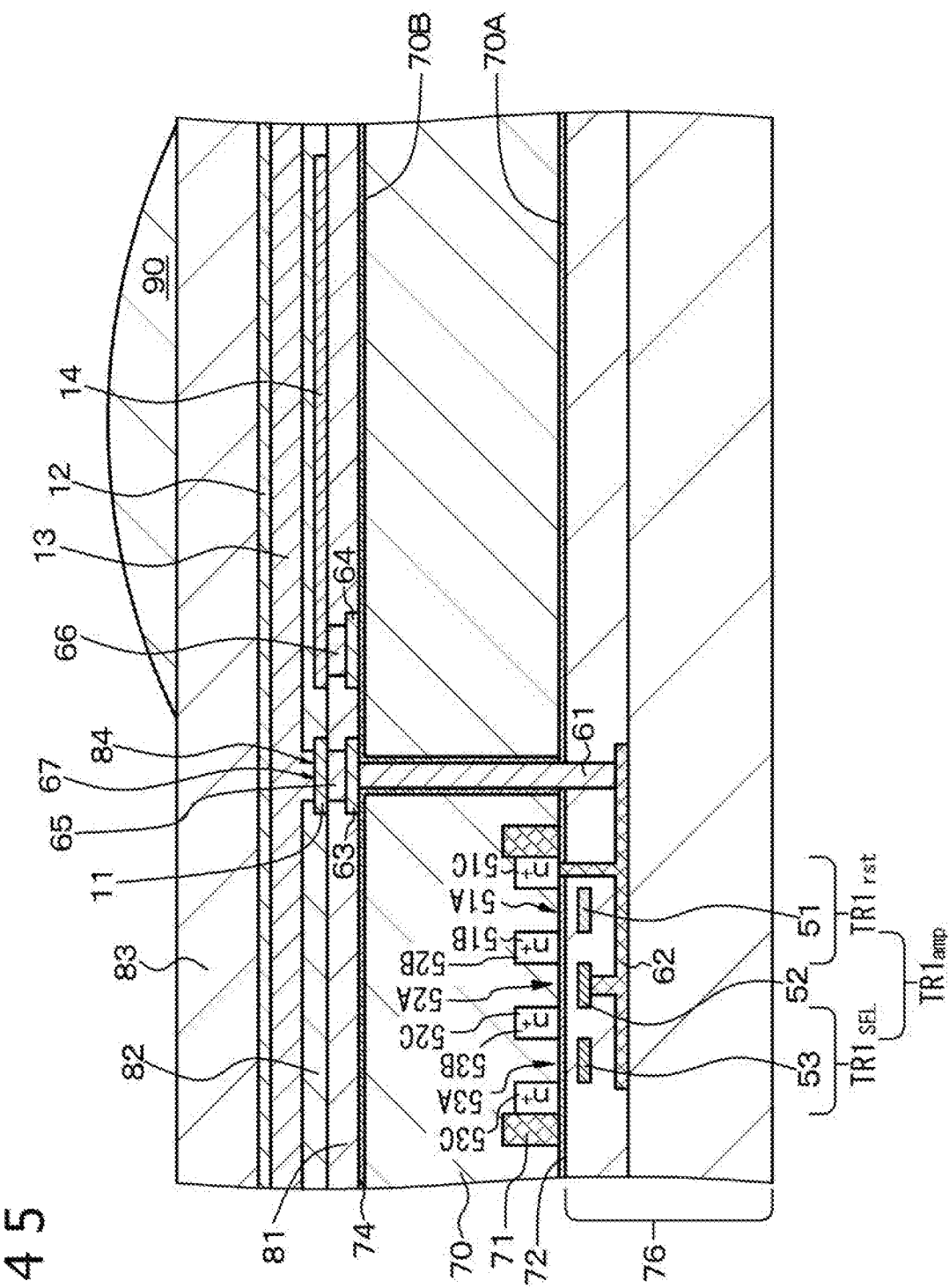
FIG. 45 is a schematic partial cross-sectional view of another modified example of the imaging element of Embodiment 10.
Figure 46:
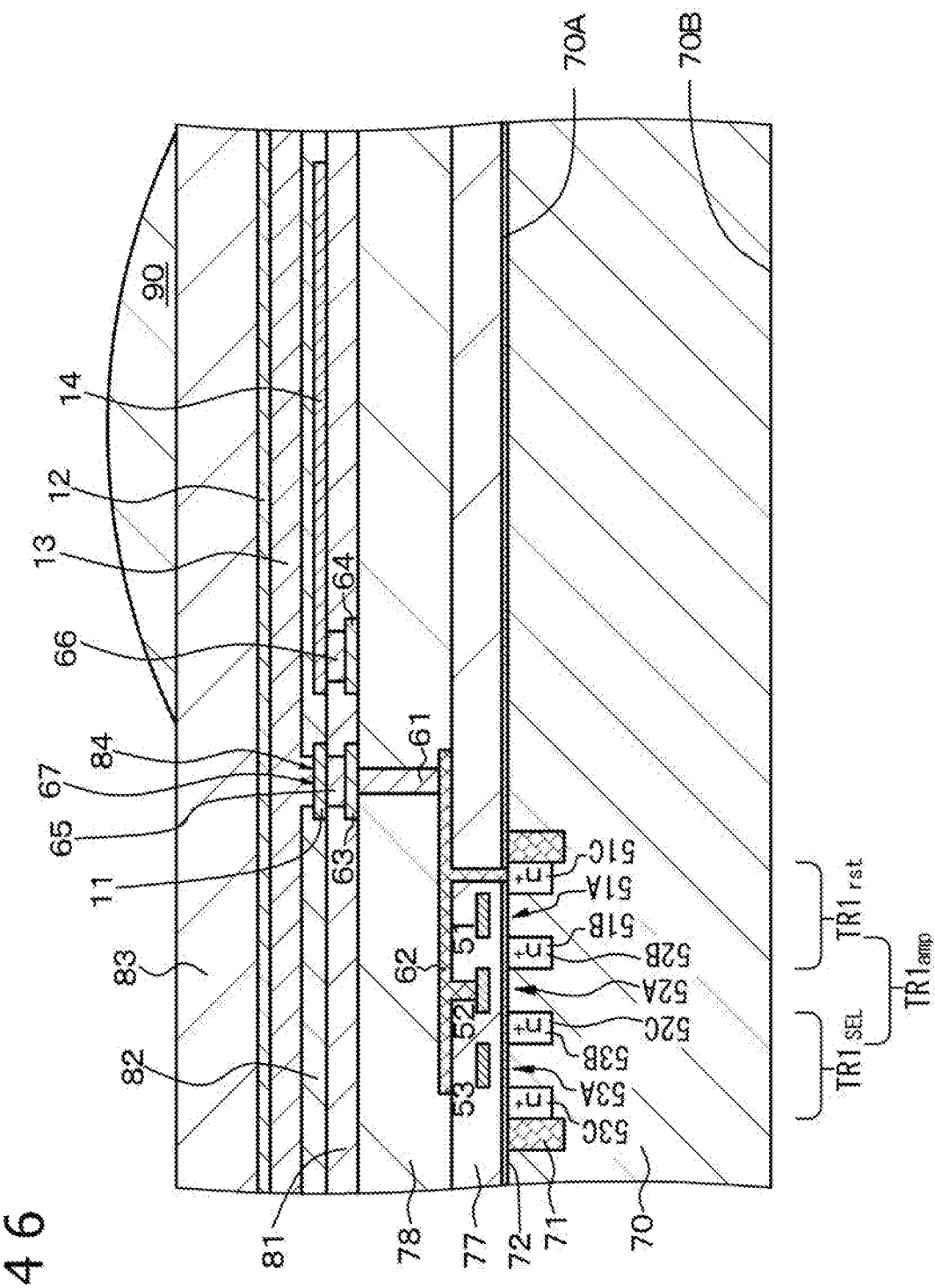
FIG. 46 is a schematic partial cross-sectional view of yet another modified example of the imaging element of Embodiment 10.

A modified example of the imaging element of Embodiment 10 illustrated in a schematic partial cross-sectional view of FIG. 45 is a back illuminated type imaging element. The imaging element includes the first imaging element of first type in Embodiment 1. In addition, a modified example of the imaging element of Embodiment 10 illustrated in a schematic partial cross-sectional view of FIG. 46 is a front illuminated type imagining element. The imaging element includes the first imaging element of first type in Embodiment 1. Here, the first imaging element includes three types of imaging elements including an imaging element that absorbs red light, an imaging element that absorbs green light, and an imaging element that absorbs blue light.

Furthermore, the plurality of imaging elements are included in the solid-state imaging apparatus according to the first aspect of the present disclosure. An example of the arrangement of the plurality of imaging elements includes a Bayer array. Color filters for separating blue, green, and red are arranged on the light incident side of the imaging elements as necessary.

Note that instead of providing one imaging element of first type in Embodiment 1, two imaging elements can be stacked (that is, two photoelectric conversion units are stacked, and a control unit of two imaging elements is provided on the semiconductor substrate), or three imaging elements can be stacked (that is, three photoelectric conversion units are stacked, and a control unit of three imaging elements is provided on the semiconductor substrate). The following table illustrates examples of the stacked structures of the imaging elements of first type and the imaging elements of second type.

| | First Type | Second Type |
|---|---|---|
| Back Illuminated Type and Front Illuminated Type | 1<br>Green<br>1<br>Primary Color<br>1<br>White<br>1<br>Blue, Green, or Red<br>2<br>Green + Infrared<br>2<br>Green + Blue<br>2<br>White + Infrared<br>3<br>Green + Blue + Red<br>3<br>Green + Blue + Red<br>3<br>Blue + Green + Red | 2<br>Blue + Red<br>1<br>Complementary Color<br>1<br>Infrared<br>0<br><br>2<br>Blue + Red<br>1<br>Red<br>0<br><br>2<br>Blue-Green (Emerald) + Infrared<br>1<br>Infrared<br>0 |

Embodiment 11

Figure 47:
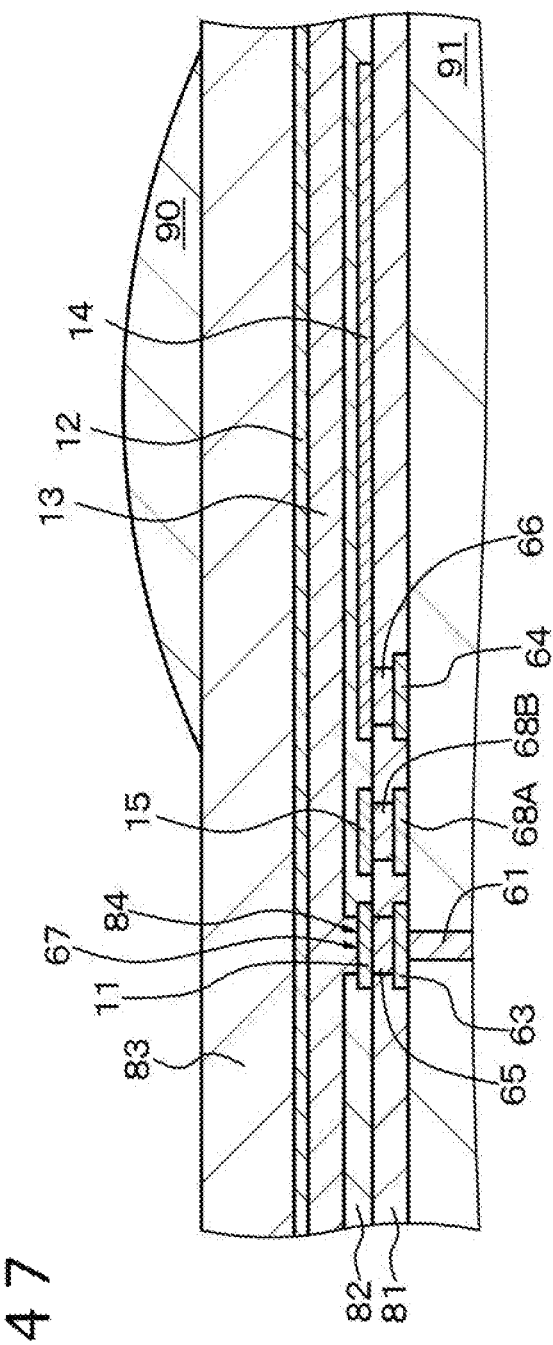
FIG. 47 is a schematic partial cross-sectional view of part of an imaging element and a stacked imaging element of Embodiment 11.
Figure 48:
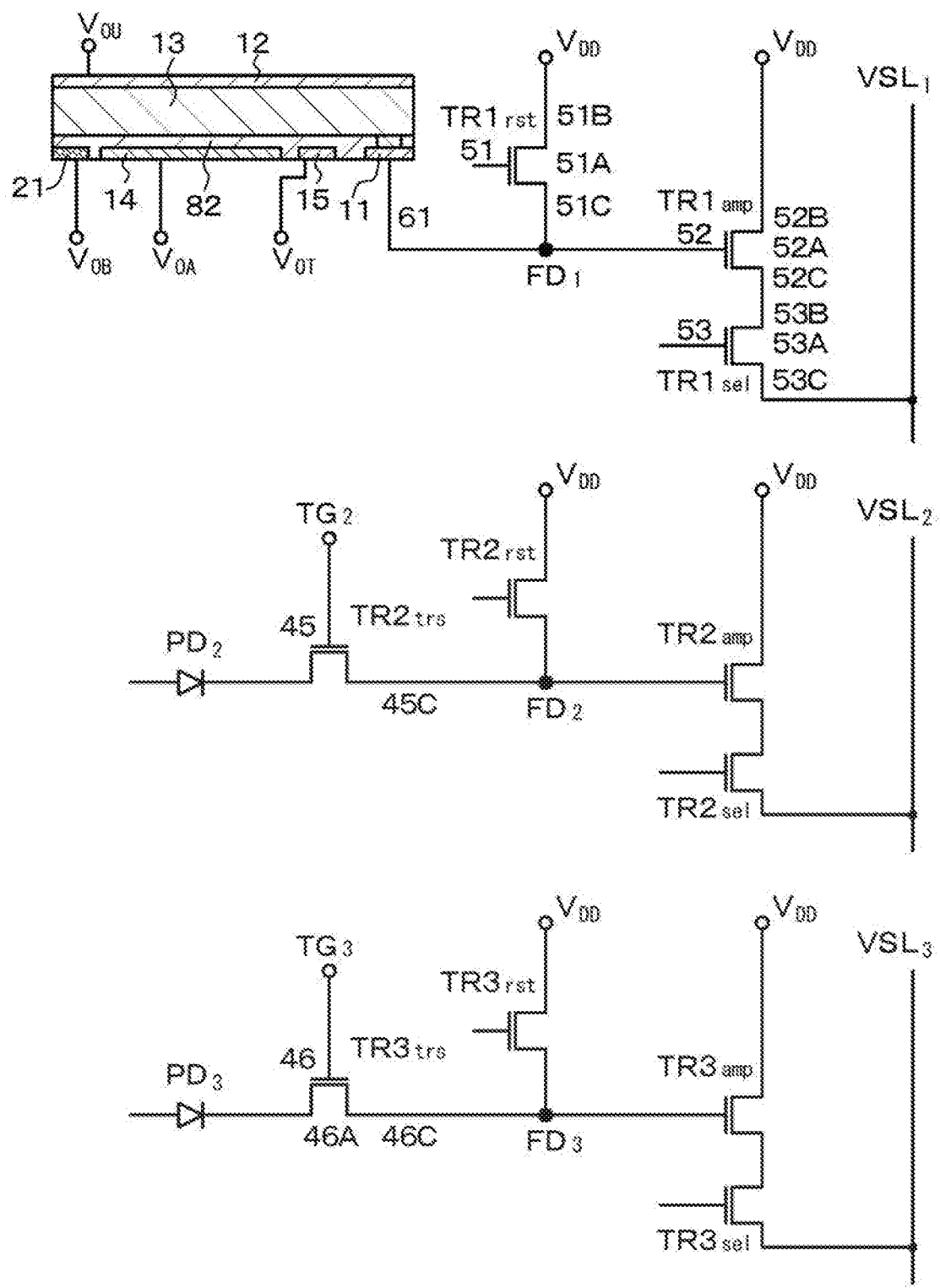
FIG. 48 is an equivalent circuit diagram of the imaging element and the stacked imaging element of Embodiment 11.
Figure 49:
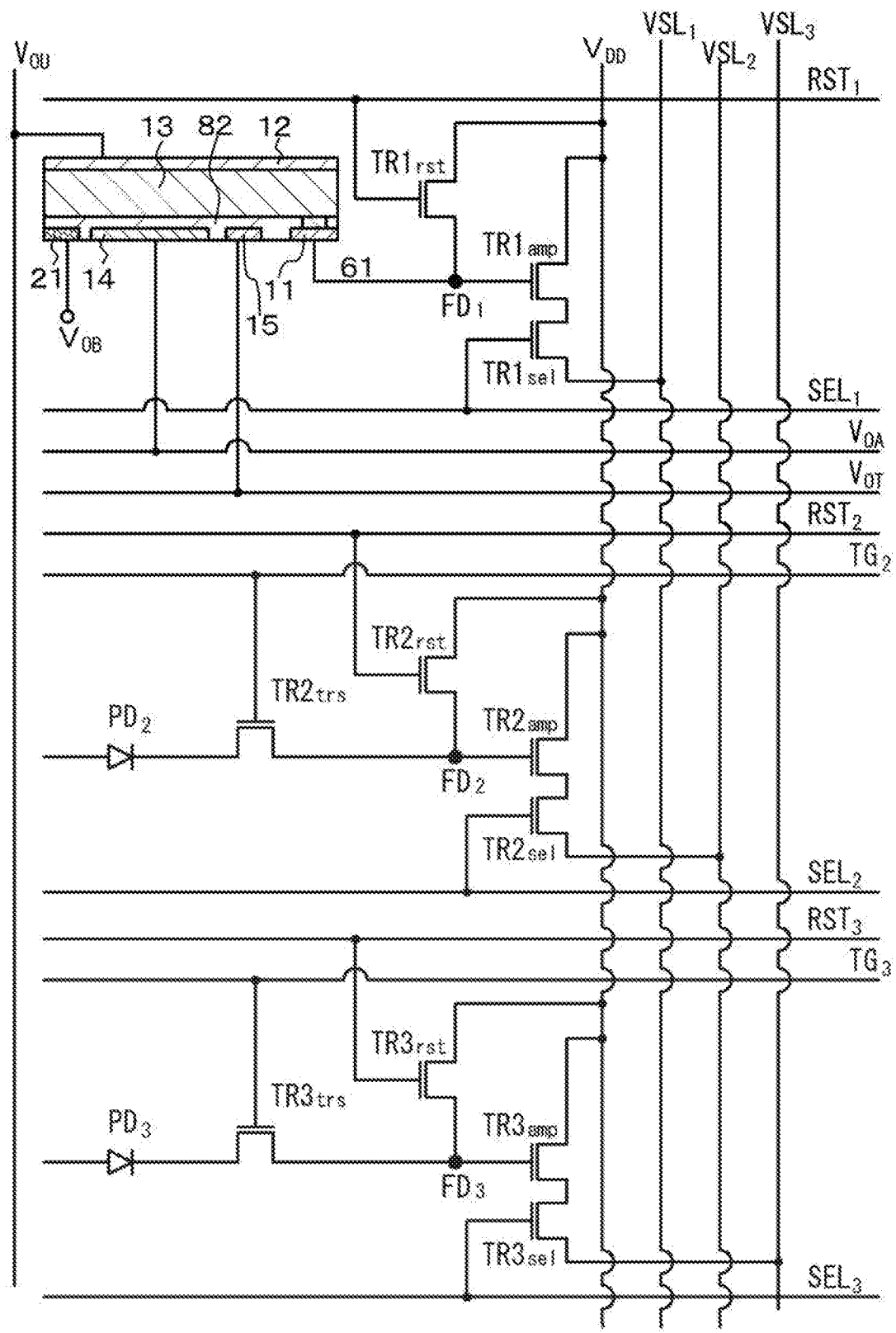
FIG. 49 is an equivalent circuit diagram of the imaging element and the stacked imaging element of Embodiment 11.
Figure 50:
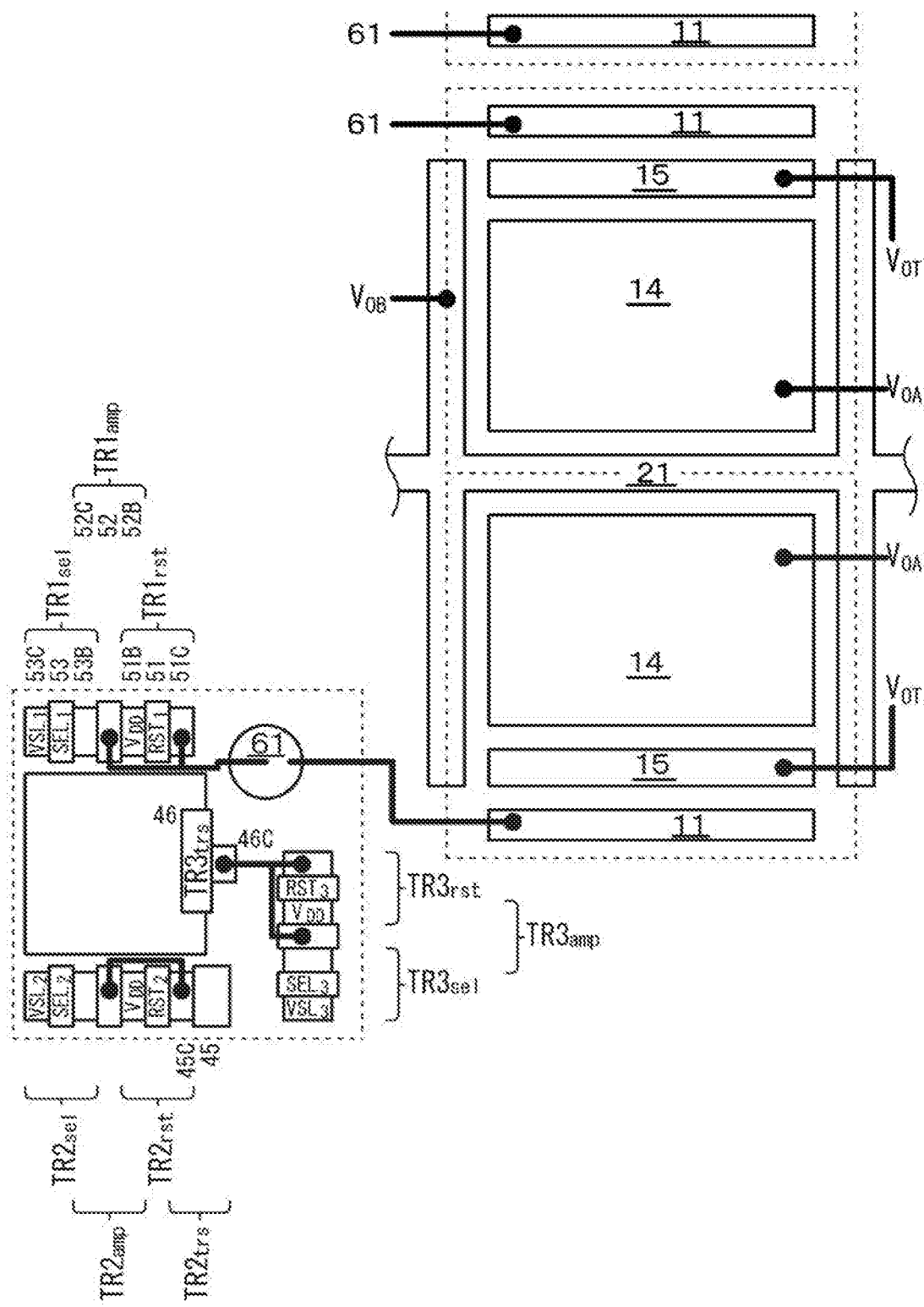
FIG. 50 is a schematic layout drawing of the first electrodes, transfer control electrodes, the charge storage electrodes, and the transistors of the control units included in the imaging elements of Embodiment 11.
Figure 53:
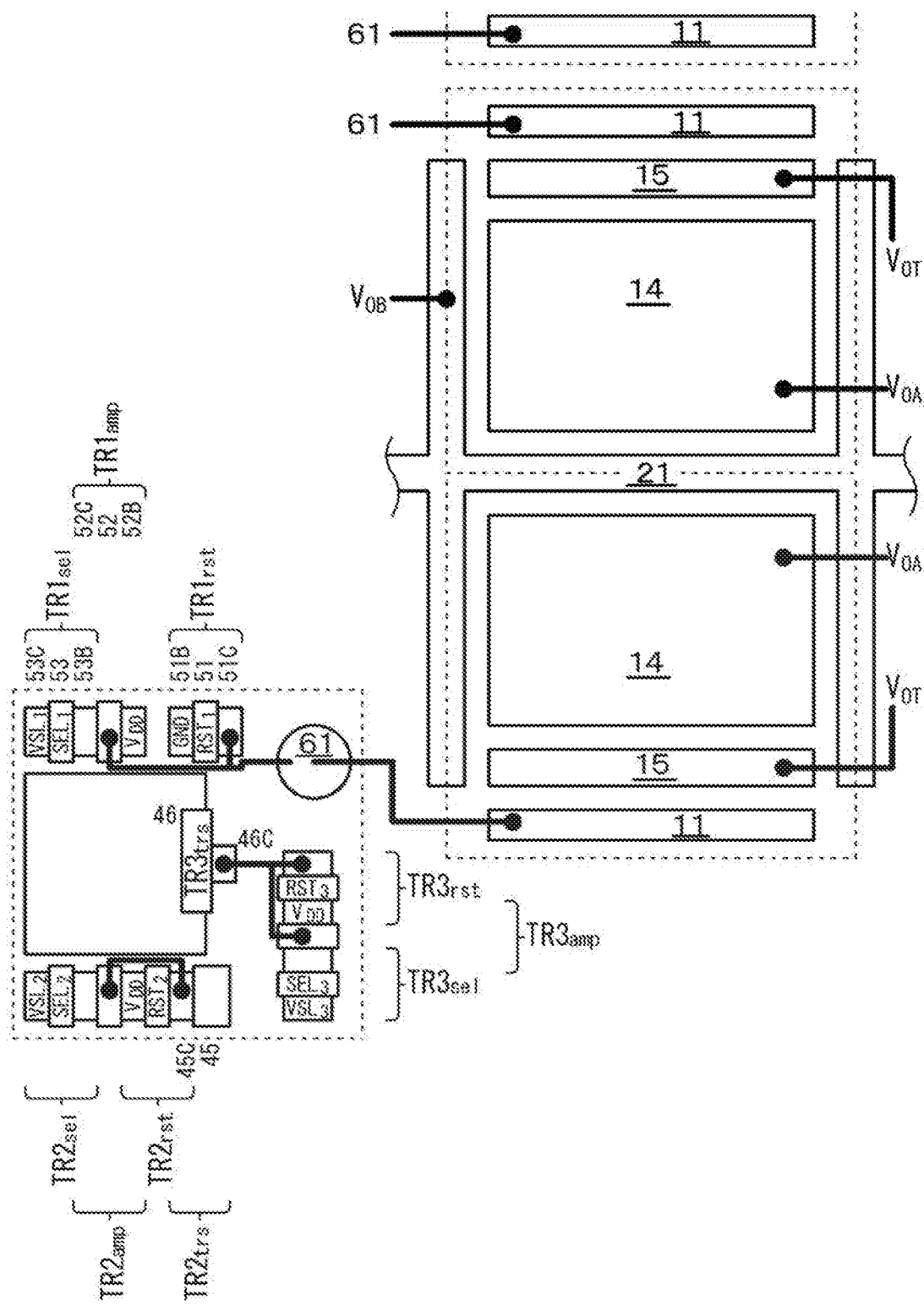
FIG. 53 is a schematic layout drawing of the first electrodes, the transfer control electrodes, the charge storage electrodes, and the transistors of the control units included in a modified example of the imaging elements of Embodiment 11.

Embodiment 11 is a modification of Embodiments 1 to 10, and Embodiment 11 relates to an imaging element and the like of the present disclosure including a transfer control electrode (charge transfer electrode). FIG. 47 illustrates a schematic partial cross-sectional view of part of the imaging element and the stacked imaging element of Embodiment 11. FIGS. 48 and 49 illustrate equivalent circuit diagrams of the imaging element and the stacked imaging element of Embodiment 11. FIG. 50 illustrates a schematic layout drawing of the first electrodes, the transfer control electrodes, the charge storage electrodes, and the transistors of the control units included in the imaging elements of Embodiment 11. FIGS. 51 and 52 schematically illustrate the state of potential in each section during operation of the imaging element of Embodiment 11. In addition, FIG. 53 illustrates a schematic layout drawing of the first electrodes, the transfer control electrodes, and the charge storage electrodes included in the imaging elements of Embodiment 11. FIG. 9B illustrates an equivalent circuit diagram of the imaging element and the stacked imaging element of Embodiment 11 for describing each section of FIGS. 51 and 52.

The imaging element and the stacked imaging element of Embodiment 11 further include a transfer control electrode (charge transfer electrode) 15 arranged between the first electrode 11 and the charge storage electrode 14, arranged apart from the first electrode 11 and the charge storage electrode 14, and arranged to face the photoelectric conversion layer 13 through the insulating layer 82. The transfer control electrode 15 is connected to the pixel drive circuit included in the drive circuit through a connection hole 68B and a pad portion 68A provided in the interlayer insulating layer 81 and through the wire $V_{OT}$.

Hereinafter, an operation of the imaging element (first imaging element) of Embodiment 11 will be described with reference to FIGS. 51 and 52. Note that the values of the potential applied to the charge storage electrode 14 and the potential at the point $P_D$ particularly vary between FIGS. 51 and 52.

In the charge storage period, the drive circuit applies the potential $V_{11}$ to the first electrode 11, applies the potential $V_{12}$ to the charge storage electrode 14, and applies a potential $V_{14}$ to the transfer control electrode 15. The light incident on the photoelectric conversion layer 13 causes photoelectric conversion in the photoelectric conversion layer 13. The electron holes generated by the photoelectric conversion are sent from the second electrode 12 to the drive circuit through the wire $V_{OU}$. On the other hand, the potential of the first electrode 11 is higher than the potential of the second electrode 12. That is, for example, a positive potential is applied to the first electrode 11, and a negative potential is applied to the second electrode 12. Therefore, the potentials are set so that $V_{12} > V_{14}$ (for example, $V_{12} > V_{11} > V_{14}$ or $V_{11} > V_{12} > V_{14}$) holds. As a result, the electrons generated by the photoelectric conversion are attracted to the charge storage electrode 14, and the electrons stop in the region of the photoelectric conversion layer 13 facing the charge storage electrode 14. That is, the charge is stored in the photoelectric conversion layer 13. $V_{12}$ is greater than $V_{14}$, and this can certainly prevent the movement of the electrons generated inside the photoelectric conversion layer 13 toward the first electrode 11. In the time course of the photoelectric conversion, the potential in the region of the photoelectric conversion layer 13 facing the charge storage electrode 14 becomes a more negative value.

The reset operation is performed later in the charge storage period. This resets the potential of the first floating diffusion layer $FD_1$, and the potential of the first floating diffusion layer $FD_1$ shifts to the potential $V_{DD}$ of the power source.

After the completion of the reset operation, the charge is read out. That is, in the charge transfer period, the drive circuit applies the potential $V_{21}$ to the first electrode 11, applies the potential $V_{22}$ to the charge storage electrode 14, and applies a potential $V_{24}$ to the transfer control electrode 15. Here, the potentials are set so that $V_{22} \leq V_{24} \leq V_{21}$ holds. As a result, the electrons stopped in the region of the photoelectric conversion layer 13 facing the charge storage electrode 14 are certainly read out to the first electrode 11 and further to the first floating diffusion layer $FD_1$. That is, the charge stored in the photoelectric conversion layer 13 is read out to the control unit.

This completes the series of operations including the charge storage, the reset operation, and the charge transfer.

The operations of the amplification transistor $TR1_{amp}$ and the selection transistor $TR1_{sel}$ after the electrons are read out to the first floating diffusion layer $FD_1$ are the same as the operations of conventional transistors. In addition, for example, the series of operations including the charge storage, the reset operation, and the charge transfer of the second imaging element and the third imaging element are similar to the conventional series of operations including the charge storage, the reset operation, and the charge transfer.

As in FIG. 53 illustrating a schematic layout drawing of the first electrodes, the charge storage electrodes, and the transistors of the control units included in a modified example of the imaging elements of Embodiment 11, the other source/drain region 51B of the reset transistor $TR1_{rst}$ may be grounded, instead of connecting the other source/drain region 51B to the power source $V_{DD}$.

Embodiment 12

Embodiment 12 is a modification of Embodiments 1 to 11, and Embodiment 12 relates to an imaging element and the like of the present disclosure including a plurality of charge storage electrode segments.

Figure 54:
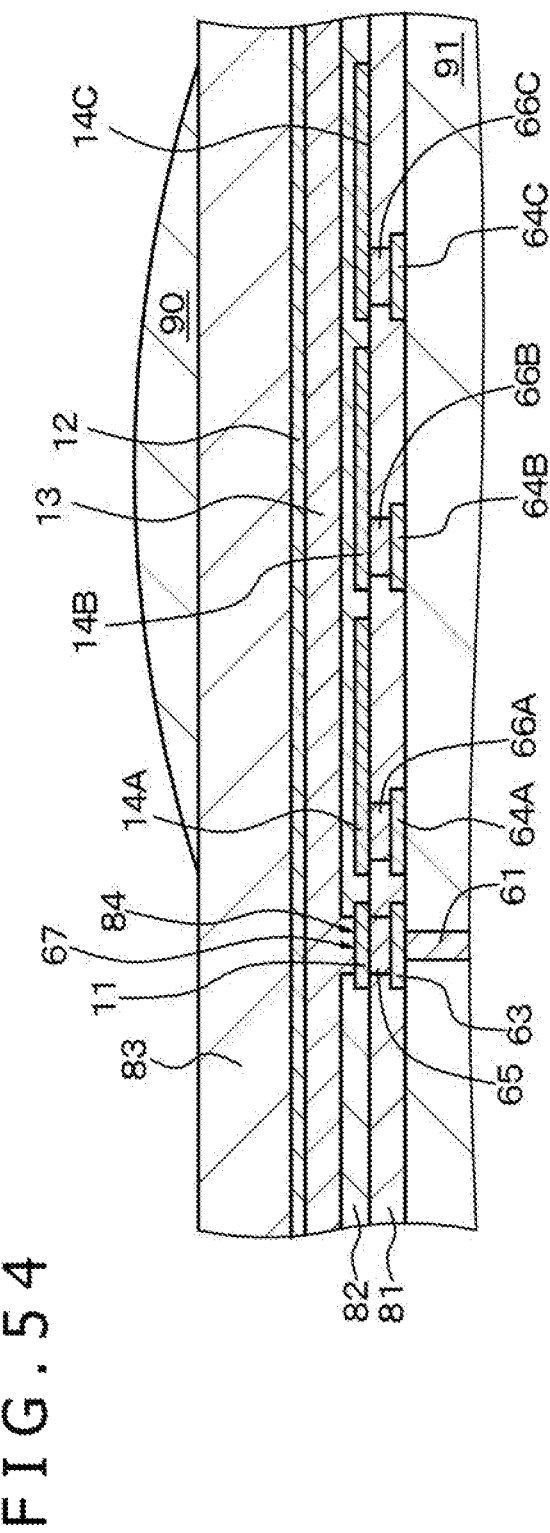
FIG. 54 is a schematic partial cross-sectional view of part of an imaging element and a stacked imaging element of Embodiment 12.
Figure 55:
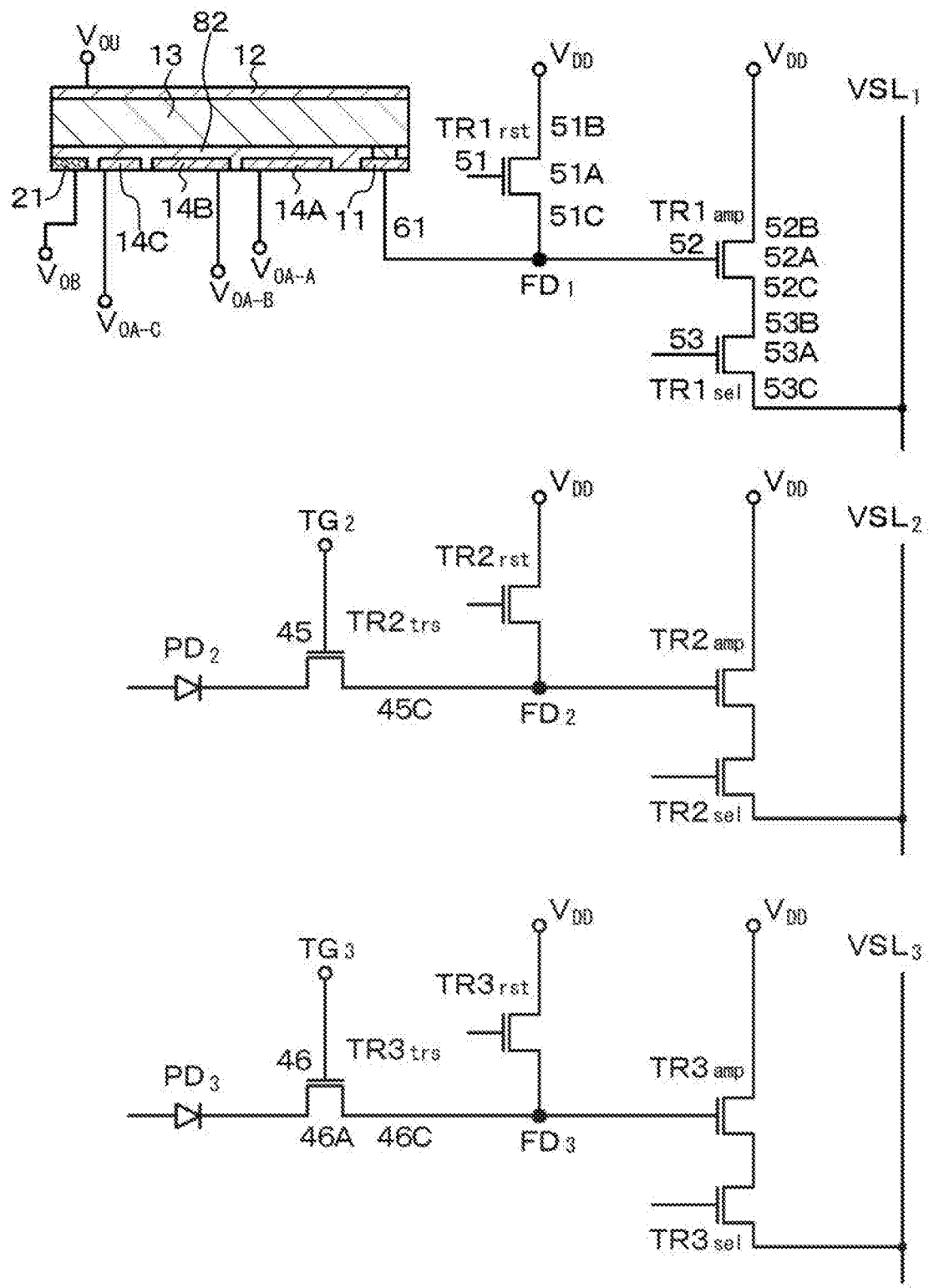
FIG. 55 is an equivalent circuit diagram of the imaging element and the stacked imaging element of Embodiment 12.
Figure 56:
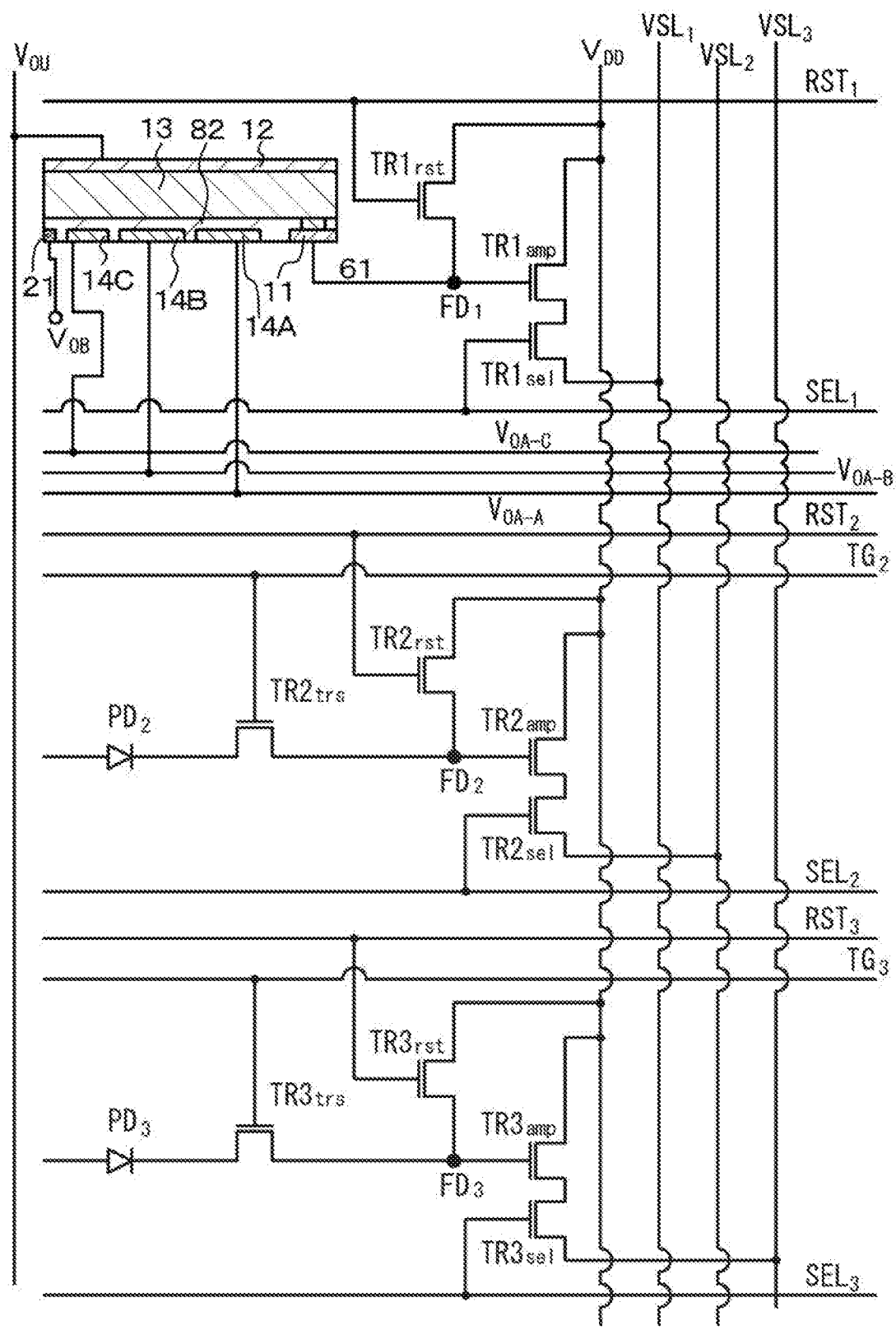
FIG. 56 is an equivalent circuit diagram of the imaging element and the stacked imaging element of Embodiment 12.
Figure 57:
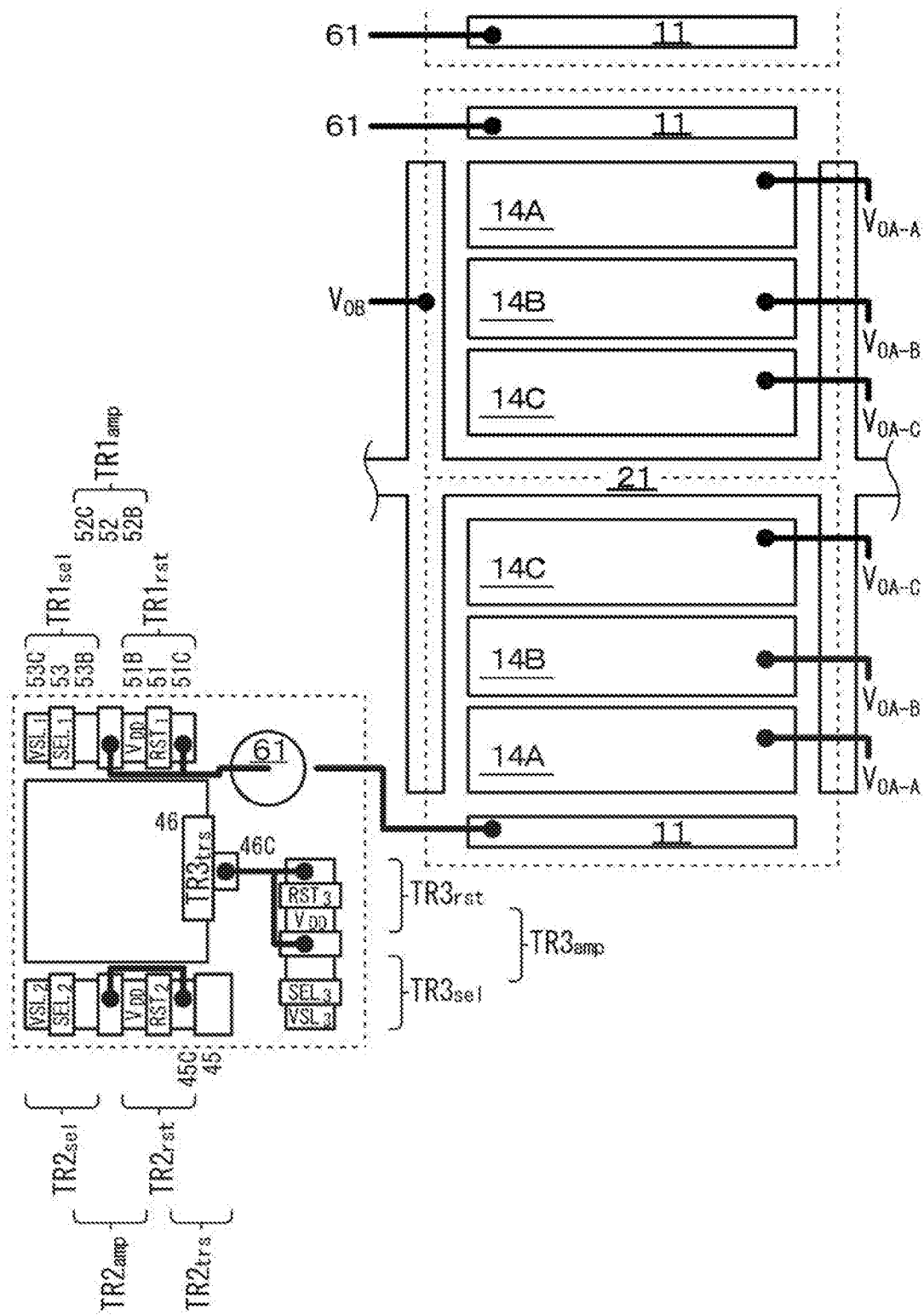
FIG. 57 is a schematic layout drawing of the first electrodes, the charge storage electrodes, and the transistors of the control units included in the imaging elements of Embodiment 12.

FIG. 54 illustrates a schematic partial cross-sectional view of part of the imaging element of Embodiment 12. FIGS. 55 and 56 illustrate equivalent circuit diagrams of the imaging element and the stacked imaging element of Embodiment 12. FIG. 57 illustrates a schematic layout drawing of the first electrodes, the charge storage electrodes, and the transistors of the control units included in the imaging elements of Embodiment 12. FIGS. 58 and 59 schematically illustrate the state of potential in each section during operation of the imaging element of Embodiment 12. In addition, FIG. 9C illustrates an equivalent circuit diagram of the imaging element and the stacked imaging element of Embodiment 12 for describing each section in FIG. 58.

In Embodiment 12, the charge storage electrode 14 includes the plurality of charge storage electrode segments 14A, 14B, and 14C. The number of charge storage electrode segments can be equal to or greater than 2, and the number is "3" in embodiment 12. In addition, a different potential is applied to each of N charge storage electrode segments in the imaging element and the stacked imaging element of Embodiment 12. The potential of the first electrode 11 is higher than the potential of the second electrode 12. That is, for example, a positive potential is applied to the first electrode 11, and a negative potential is applied to the second electrode 12. Therefore, in the charge transfer period, the potential applied to the charge storage electrode segment (first photoelectric conversion unit segment) 14A positioned at a place closest to the first electrode 11 is higher than the potential applied to the charge storage electrode segment (Nth photoelectric conversion unit segment) 14C positioned at a place farthest from the first electrode 11. In this way, a potential gradient is provided to the charge storage electrode 14. Therefore, the electrons stopped in the region of the photoelectric conversion layer 13 facing the charge storage electrode 14 are more certainly read out to the first electrode 11 and further to the first floating diffusion layer $FD_1$. That is, the charge stored in the photoelectric conversion layer 13 is read out to the control unit.

Figure 58:
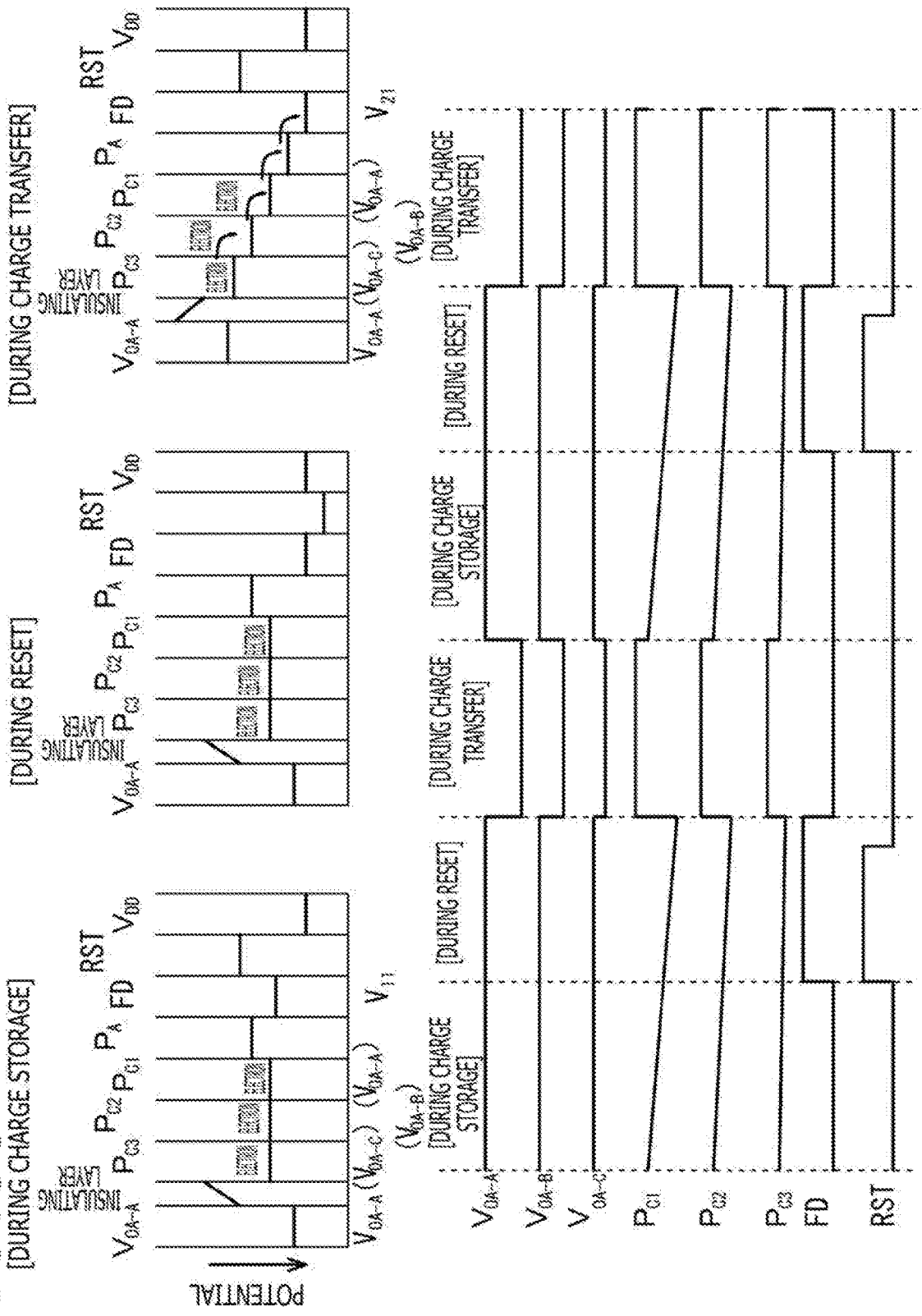
FIG. 58 is a diagram schematically illustrating a state of potential in each section during operation of the imaging element of Embodiment 12.
Figure 59:
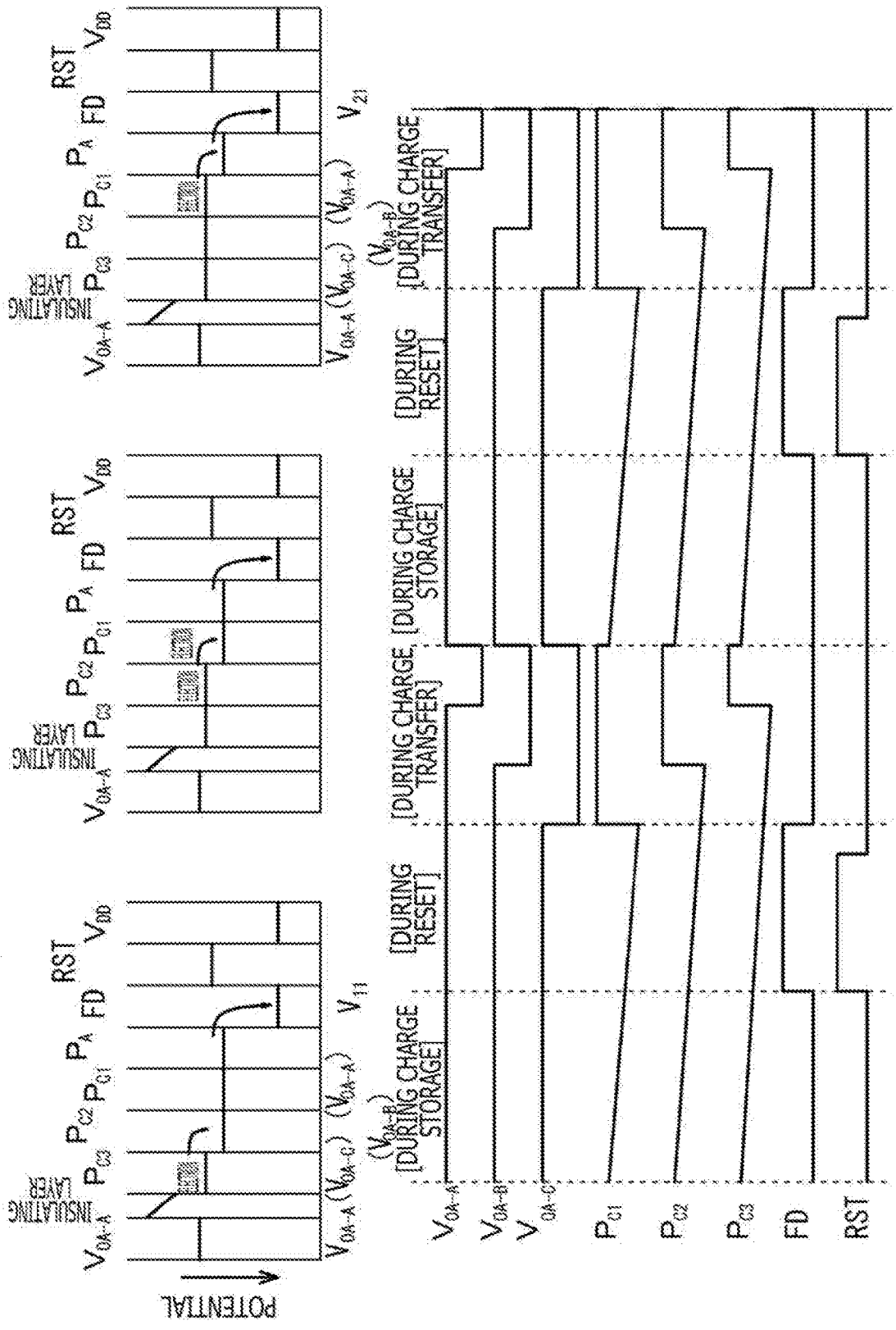
FIG. 59 is a diagram schematically illustrating a state of potential in each section during another operation (during charge transfer) of the imaging element of Embodiment 12.

In the example illustrated in FIG. 58, the potential of the charge storage electrode segment 14C<the potential of the charge storage electrode segment 14B<the potential of the charge storage electrode segment 14A holds in the charge transfer period. In this way, the electrons stopped in the region of the photoelectric conversion layer 13 are read out to the first floating diffusion layer $FD_1$ all at once. On the other hand, in the example illustrated in FIG. 59, the potential of the charge storage electrode segment 14C, the potential of the charge storage electrode segment 14B, and the potential of the charge storage electrode segment 14A are gradually changed (that is, changed step-wise or in a slope shape) in the charge transfer period. In this way, the electrons stopped in the region of the photoelectric conversion layer 13 facing the charge storage electrode segment 14C are moved to the region of the photoelectric conversion layer 13 facing the charge storage electrode segment 14B. Next, the electrons stopped in the region of the photoelectric conversion layer 13 facing the charge storage electrode segment 14B are moved to the region of the photoelectric conversion layer 13 facing the charge storage electrode segment 14A. Next, the electros stopped in the region of the photoelectric conversion layer 13 facing the charge storage electrode segment 14A are certainly read out to the first floating diffusion layer $FD_1$.

Figure 60:
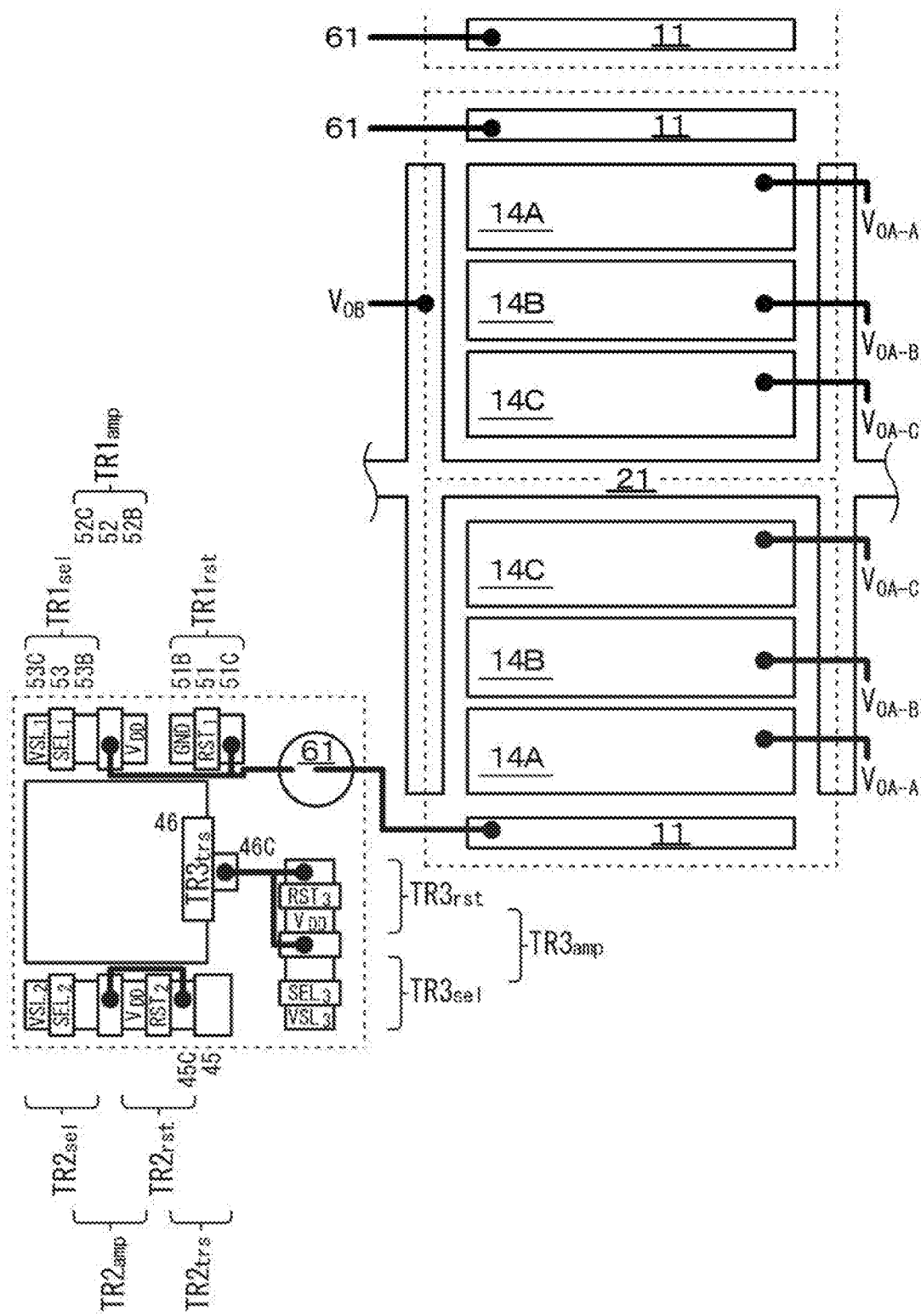
FIG. 60 is a schematic layout drawing of the first electrodes and the charge storage electrodes included in a modified example of the imaging elements of Embodiment 12.

As in FIG. 60 illustrating a schematic layout drawing of the first electrodes, the charge storage electrodes, and the transistors of the control units included in the modified example of the imaging elements of Embodiment 12, the other source/drain region 51B of the reset transistor $TR1_{rst}$ may be grounded, instead of connecting the other source/drain region 51B to the power source $V_{DD}$.

Embodiment 13

Embodiment 13 is a modification of Embodiments 1 to 12, and relates to the imaging elements of the first configuration and the sixth configuration.

Figure 61:
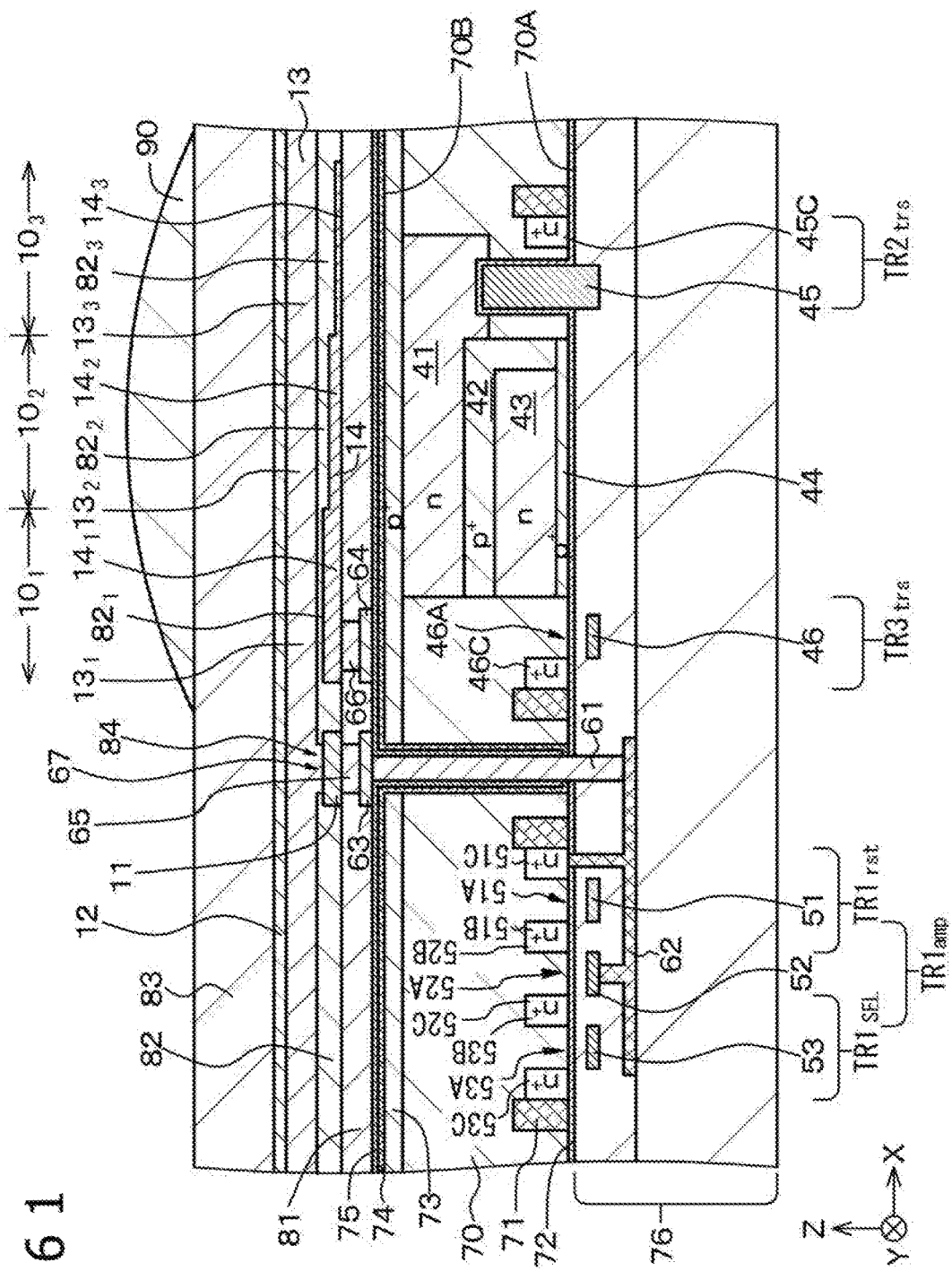
FIG. 61 is a schematic partial cross-sectional view of an imaging element and a stacked imaging element of Embodiment 13.
Figure 62:
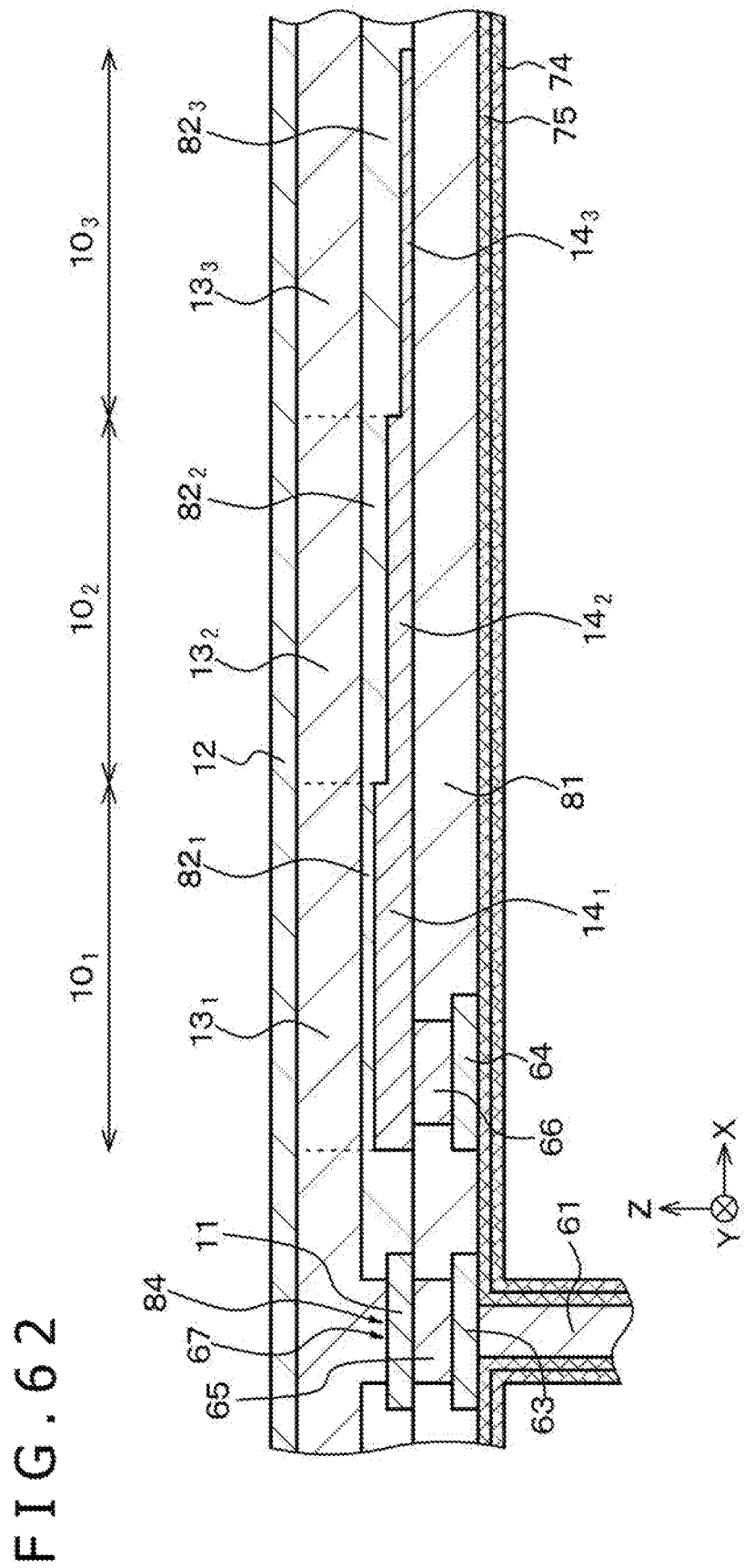
FIG. 62 is an enlarged schematic partial cross-sectional view of a part where the charge storage electrode, the photoelectric conversion layer, and a second electrode are stacked in the imaging element of Embodiment 13.

FIG. 61 illustrates a schematic partial cross-sectional view of the imaging element and the stacked imaging element of Embodiment 13. FIG. 62 illustrates an enlarged schematic partial cross-sectional view of the part where the charge storage electrode, the photoelectric conversion layer, and the second electrode are stacked. The equivalent circuit diagram of the imaging element and the stacked imaging element of Embodiment 13 is similar to the equivalent circuit diagram of the imaging element of Embodiment 1 described in FIGS. 3 and 4. The schematic layout drawing of the first electrodes, the charge storage electrodes, and the transistors of the control units included in the imaging elements of Embodiment 13 is similar to the imaging element of Embodiment 1 described in FIG. 5. Furthermore, the operation of the imaging element (first imaging element) of Embodiment 13 is substantially similar to the operation of the imaging element of Embodiment 1.

Here, in the imaging element of Embodiment 13 or imaging elements of Embodiments 14 to 18 described later, the photoelectric conversion unit includes N (where N≥2) photoelectric conversion unit segments (specifically, three photoelectric conversion unit segments $10_1$, $10_2$, and $10_3$), the photoelectric conversion layer 13 includes N photoelectric conversion layer segments (specifically, three photoelectric conversion layer segments $13_1$, $13_2$, and $13_3$), and the insulating layer 82 includes N insulating layer segments (specifically, three insulating layer segments $82_1$, $82_2$, and $82_3$).

In Embodiments 13 to 15, the charge storage electrode 14 includes N charge storage electrode segments (specifically, three charge storage electrode segments $14_1$, $14_2$, and $14_3$ in each Embodiment).

In Embodiments 16 and 17 and in Embodiment 15 depending on the case, the charge storage electrode 14 includes N charge storage electrode segments (specifically, three charge storage electrode segments $14_1$, $14_2$, and $14_3$) arranged apart from each other, an nth (where, n=1, 2, 3 . . . N) photoelectric conversion unit segment $10_n$ includes an nth charge storage electrode segment $14_n$, an nth insulating layer segment $82_n$, and an nth photoelectric conversion layer segment $13_n$, and the larger the value of n of the photoelectric conversion unit segment, the farther the position of the photoelectric conversion unit segment from the first electrode 11.

Alternatively, the imaging element of Embodiment 13 or the imaging elements of Embodiments 14 and 17 described later include a photoelectric conversion unit including the first electrode 11, the photoelectric conversion layer 13, and the second electrode 12 that are stacked, in which the photoelectric conversion unit further includes the charge storage electrode 14 arranged apart from the first electrode 11 and arranged to face the photoelectric conversion layer 13 through the insulating layer 82, and the cross-sectional area of the stacked part of the charge storage electrode 14, the insulating layer 82, and the photoelectric conversion layer 13 when the stacked part is cut in a YZ virtual plane changes in accordance with the distance from the first electrode, where a Z direction is the stacking direction of the charge storage electrode 14, the insulating layer 82, and the photoelectric conversion layer 13, and an X direction is a direction away from the first electrode 11.

Furthermore, in the imaging element of Embodiment 13, the thicknesses of the insulating layer segments gradually change from the first photoelectric conversion unit segment $10_1$ to an Nth photoelectric conversion unit segment ION. Specifically, the thicknesses of the insulating layer segments gradually increase. Alternatively, in the imaging element of Embodiment 13, the width of the cross section of the stacked part is constant, and the thickness of the cross section of the stacked part, specifically, the thickness of the insulating layer segment, gradually increases in accordance with the distance from the first electrode 11. Note that the thicknesses of the insulating layer segments increase step-wise. The thickness of the insulating layer segment $82_n$ in the nth photoelectric conversion unit segment $10_n$ is constant. Assuming that the thickness of the nth insulating layer segment $82n$ in the nth photoelectric conversion unit segment $10_n$ is "1," the thickness of an insulating layer segment $82_{(n+1)}$ in an (n+1)th photoelectric conversion unit segment $10_{(n+1)}$ can be 2 to 10. However, the values are not limited to these. In Embodiment 13, the thicknesses of the charge storage electrode segments $14_1$, $14_2$, and $14_3$ are gradually reduced to gradually increase the thicknesses of the insulating layer segments $82_1$, $82_2$, and $82_3$. The thicknesses of the photoelectric conversion layer segments $13_1$, $13_2$, and $13_3$ are constant.

Hereinafter, an operation of the imaging element of Embodiment 13 will be described.

In the charge storage period, the drive circuit applies the potential $V_{11}$ to the first electrode 11 and applies the potential $V_{12}$ to the charge storage electrode 14. The light incident on the photoelectric conversion layer 13 causes photoelectric conversion in the photoelectric conversion layer 13. The electron holes generated by the photoelectric conversion are sent from the second electrode 12 to the drive circuit through the wire $V_{OU}$. On the other hand, the potential of the first electrode 11 is higher than the potential of the second electrode 12. That is, for example, a positive potential is applied to the first electrode 11, and a negative potential is applied to the second electrode 12. Therefore, the potentials are set so that $V_{12} \geq V_{11}$, preferably, $V_{12} \geq V_{11}$, holds. As a result, the electrons generated by the photoelectric conversion are attracted to the charge storage electrode 14, and the electrons stop in the region of the photoelectric conversion layer 13 facing the charge storage electrode 14. That is, the charge is stored in the photoelectric conversion layer 13. $V_{12}$ is greater than $V_{11}$, and therefore, the electrons generated inside the photoelectric conversion layer 13 do not move toward the first electrode 11. In the time course of the photoelectric conversion, the potential in the region of the photoelectric conversion layer 13 facing the charge storage electrode 14 becomes a more negative value.

In the configuration adopted in the imaging element of Embodiment 13, the thicknesses of the insulating layer segments gradually increase. Therefore, when the state shifts to $V_{12} \geq V_{11}$ in the charge storage period, the nth photoelectric conversion unit segment $10_n$ can store more charge than the (n+1)th photoelectric conversion unit segment $10_{(n+1)}$. A strong electric field is applied, and the flow of charge from the first photoelectric conversion unit segment $10_1$ to the first electrode 11 can be certainly prevented.

The reset operation is performed later in the charge storage period. This resets the potential of the first floating diffusion layer $FD_1$, and the potential of the first floating diffusion layer $FD_1$ shifts to the potential $V_{DD}$ of the power source.

After the completion of the reset operation, the charge is read out. That is, in the charge transfer period, the drive circuit applies the potential $V_{21}$ to the first electrode 11 and applies the potential $V_{22}$ to the charge storage electrode 14. Here, the potentials are set so that $V_{21} > V_{22}$ holds. As a result, the electrons stopped in the region of the photoelectric conversion layer 13 facing the charge storage electrode 14 are read out to the first electrode 11 and further to the first floating diffusion layer $FD_1$. That is, the charge stored in the photoelectric conversion layer 13 is read out to the control unit.

More specifically, when the state shifts to $V_{21} > V_{22}$ in the charge transfer period, the flow of charge from the first photoelectric conversion unit segment 101 to the first electrode 11 and the flow of charge from the (n+1)th photoelectric conversion unit segment $10_{(n+1)}$ to the nth photoelectric conversion unit segment $10_n$ can be certainly secured.

This completes the series of operations including the charge storage, the reset operation, and the charge transfer.

In the imaging element of Embodiment 13, the thicknesses of the insulating layer segments gradually change from the first photoelectric conversion unit segment to the Nth photoelectric conversion unit segment. Alternatively, the cross-sectional area of the stacked part of the charge storage electrode, the insulating layer, and the photoelectric conversion layer when the stacked part is cut in the YZ virtual plane changes in accordance with the distance from the first electrode. Therefore, a kind of charge transfer gradient is formed, and the charge generated by the photoelectric conversion can be more easily and certainly transferred.

The imaging element and the stacked imaging element of Embodiment 13 can be produced by a method substantially similar to the imaging element of Embodiment 1, and the details will not be described.

Note that in forming the first electrode 11, the charge storage electrode 14, and the insulating layer 82 in the imaging element of Embodiment 13, a conductive material layer for forming the charge storage electrode $14_3$ is deposited on the interlayer insulating layer 81 first. The conductive material layer is patterned, and the conductive material layer is left in the region where the photoelectric conversion unit segments $10_1$, $10_2$, and $10_3$ and the first electrode 11 are to be formed. In this way, part of the first electrode 11 and the charge storage electrode $14_3$ can be obtained. Next, an insulating layer for forming the insulating layer segment $82_3$ is deposited on the entire surface. The insulating layer is patterned, and a planarization process is executed. In this way, the insulating layer segment $82_3$ can be obtained. Next, a conductive material layer for forming the charge storage electrode $14_2$ is deposited on the entire surface, and the conductive material layer is patterned. The conductive material layer is left in the region where the photoelectric conversion unit segments $10_1$ and $10_2$ and the first electrode 11 are to be formed. In this way, part of the first electrode 11 and the charge storage electrode $14_2$ can be obtained. Next, an insulating layer for forming the insulating layer segment $82_2$ is deposited on the entire surface. The insulating layer is patterned, and a planarization process is executed. In this way, the insulating layer segment $82_2$ can be obtained. Next, a conductive material layer for forming the charge storage electrode $14_1$ is deposited on the entire surface. The conductive material layer is patterned, and the conductive material layer is left in the region where the photoelectric conversion unit segment $10_1$ and the first electrode 11 are to be formed. In this way, the first electrode 11 and the charge storage electrode $14_1$ can be obtained. Next, an insulating layer is deposited on the entire surface, and a planarization process is executed. In this way, the insulating layer segment $82_1$ (insulating layer 82) can be obtained. Furthermore, the photoelectric conversion layer 13 is formed on the insulating layer 82. In this way, the photoelectric conversion unit segments $10_1$, $10_2$, and $10_3$ can be obtained.

Figure 63:
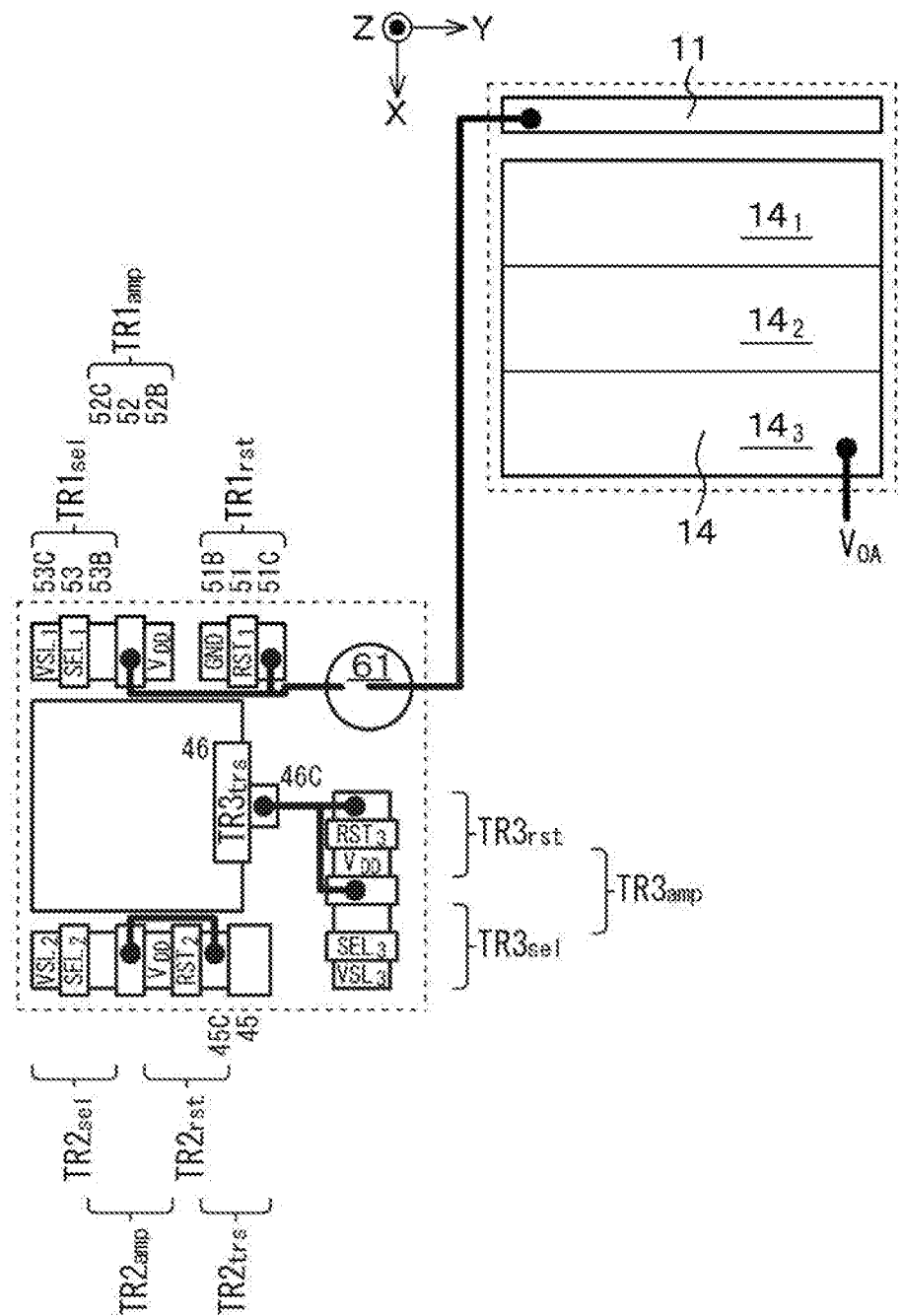
FIG. 63 is schematic layout drawing of the first electrodes, the charge storage electrodes, and the transistors of the control units included in a modified example of the imaging elements of Embodiment 13.

As in FIG. 63 illustrating a schematic layout drawing of the first electrodes, the charge storage electrodes, and the transistors of the control units included in the modified example of the imaging elements of Embodiment 13, the other source/drain region 51B of the reset transistor $TR1_{rst}$ may be grounded, instead of connecting the other source/drain region 51B to the power source $V_{DD}$.

Embodiment 14

Figure 64:
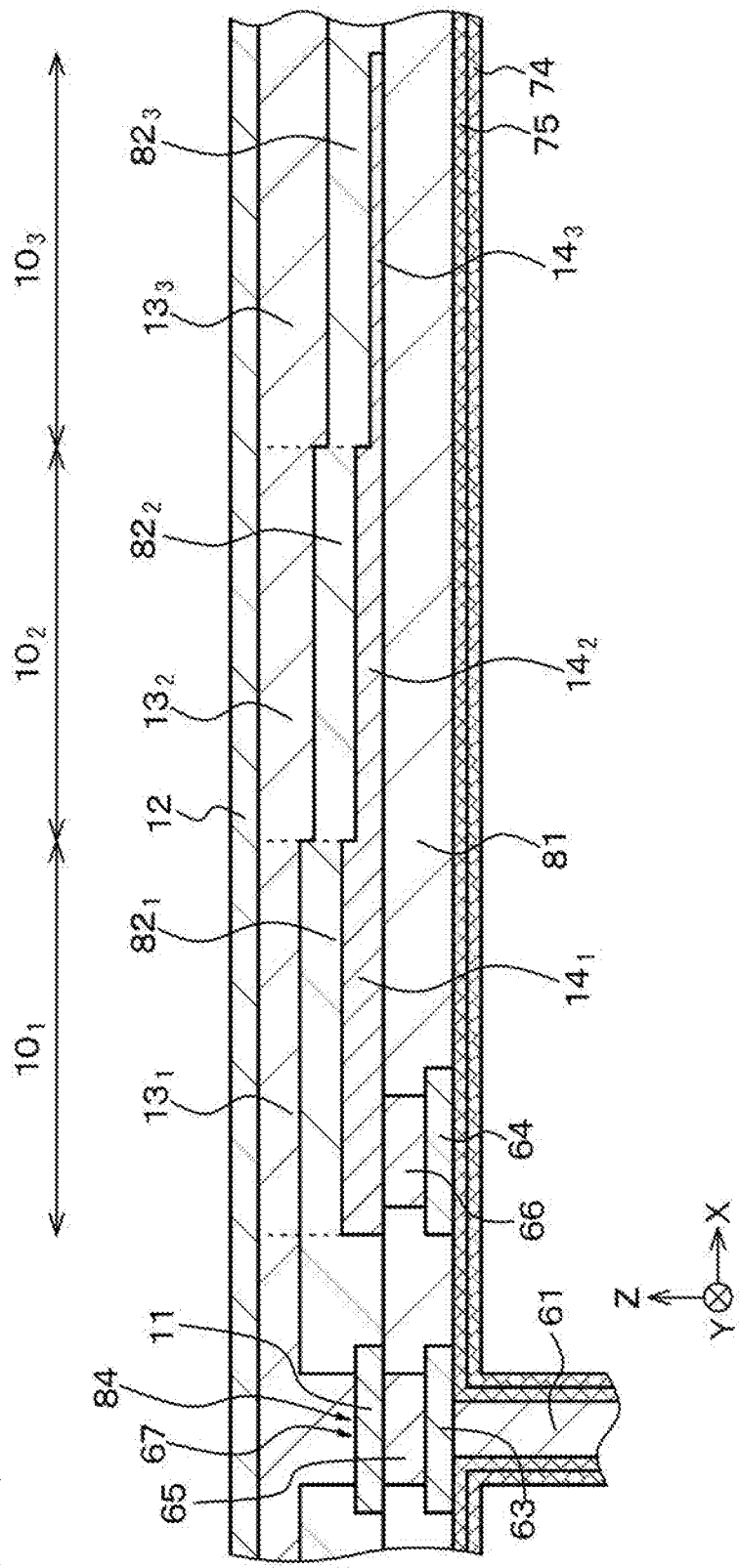
FIG. 64 is an enlarged schematic partial cross-sectional view of the part where the charge storage electrode, the photoelectric conversion layer, and the second electrode are stacked in the imaging element of Embodiment 14.

An imaging element of Embodiment 14 relates to the imaging elements of the second configuration and the sixth configuration of the present disclosure. As in FIG. 64 illustrating an enlarged schematic partial cross-sectional view of the part where the charge storage electrode, the photoelectric conversion layer, and the second electrode are stacked, the thicknesses of the photoelectric conversion layer segments gradually change from the first photoelectric conversion unit segment $10_1$ to the Nth photoelectric conversion unit segment $10_N$ in the imaging element of Embodiment 14. Alternatively, in the imaging element of Embodiment 14, the widths of the cross sections of the stacked parts are constant, and the thicknesses of the cross sections of the stacked parts, specifically, the thicknesses of the photoelectric conversion layer segments, gradually increase in accordance with the distance from the first electrode 11. More specifically, the thicknesses of the photoelectric conversion layer segments gradually increase. Note that the thicknesses of the photoelectric conversion layer segments increase step-wise. The thickness of the photoelectric conversion layer segment $13_n$ in the nth photoelectric conversion unit segment $10_n$ is constant. Assuming that the thickness of the photoelectric conversion layer segment $13_n$ in the nth photoelectric conversion unit segment $10_n$ is "1," the thickness of a photoelectric conversion layer segment $13_{(n+1)}$ in the (n+1)th photoelectric conversion unit segment $10_{(n+1)}$ can be 2 to 10. However, the values are not limited to these. In Embodiment 14, the thicknesses of the charge storage electrode segments $14_1$, $14_2$, and $14_3$ are gradually reduced to gradually increase the thicknesses of the photoelectric conversion layer segments $13_1$, $13_2$, and $13_3$. The thicknesses of the insulating layer segments $82_1$, $82_2$, and $82_3$ are constant.

In the imaging element of Embodiment 14, the thicknesses of the photoelectric conversion layer segments gradually increase. Therefore, when the state shifts to $V_{12} \geq V_{11}$ in the charge storage period, a stronger electric field is applied to the nth photoelectric conversion unit segment $10_n$ than to the (n+1)th photoelectric conversion unit segment $10_{(n+1)}$. This can certainly prevent the flow of charge from the first photoelectric conversion unit segment $10_1$ to the first electrode 11. Furthermore, when the state shifts to $V_{22} < V_{21}$ in the charge transfer period, the flow of charge from the first photoelectric conversion unit segment $10_1$ to the first electrode 11 and the flow of charge from the (n+1)th photoelectric conversion unit segment $10_{(n+1)}$ to the nth photoelectric conversion unit segment $10_n$ can be certainly secured.

In this way, in the imaging element of Embodiment 14, the thicknesses of the photoelectric conversion layer segments gradually change from the first photoelectric conversion unit segment to the Nth photoelectric conversion unit segment. Alternatively, the cross-sectional area of the stacked part of the charge storage electrode, the insulating layer, and the photoelectric conversion layer when the stacked part is cut in the YZ virtual plane changes in accordance with the distance from the first electrode. Therefore, a kind of charge transfer gradient is formed, and the charge generated by the photoelectric conversion can be more easily and certainly transferred.

In forming the first electrode 11, the charge storage electrode 14, the insulating layer 82, and the photoelectric conversion layer 13 in the imaging element of Embodiment 14, a conductive material layer for forming the charge storage electrode $14_3$ is deposited on the interlayer insulating layer 81 first. The conductive material layer is patterned, and the conductive material layer is left in the region where the photoelectric conversion unit segments $10_1$, $10_2$, and $10_3$ and the first electrode 11 are to be formed. In this way, part of the first electrode 11 and the charge storage electrode $14_3$ can be obtained. Next, a conductive material layer for forming the charge storage electrode $14_2$ is deposited on the entire surface, and the conductive material layer is patterned. The conductive material layer is left in the region where the photoelectric conversion unit segments $10_1$ and $10_2$ and the first electrode 11 are to be formed. In this way, part of the first electrode 11 and the charge storage electrode $14_2$ can be obtained. Next, a conductive material layer for forming the charge storage electrode $14_1$ is deposited on the entire surface, and the conductive material layer is patterned. The conductive material layer is left in the region where the photoelectric conversion unit segment 101 and the first electrode 11 are to be formed. In this way, the first electrode 11 and the charge storage electrode $14_1$ can be obtained. Next, the insulating layer 82 is conformally deposited on the entire surface. Furthermore, the photoelectric conversion layer 13 is formed on the insulating layer 82, and a planarization process is applied to the photoelectric conversion layer 13. In this way, the photoelectric conversion unit segments $10_1$, $10_2$, and $10_3$ can be obtained.

Embodiment 15

Figure 65:
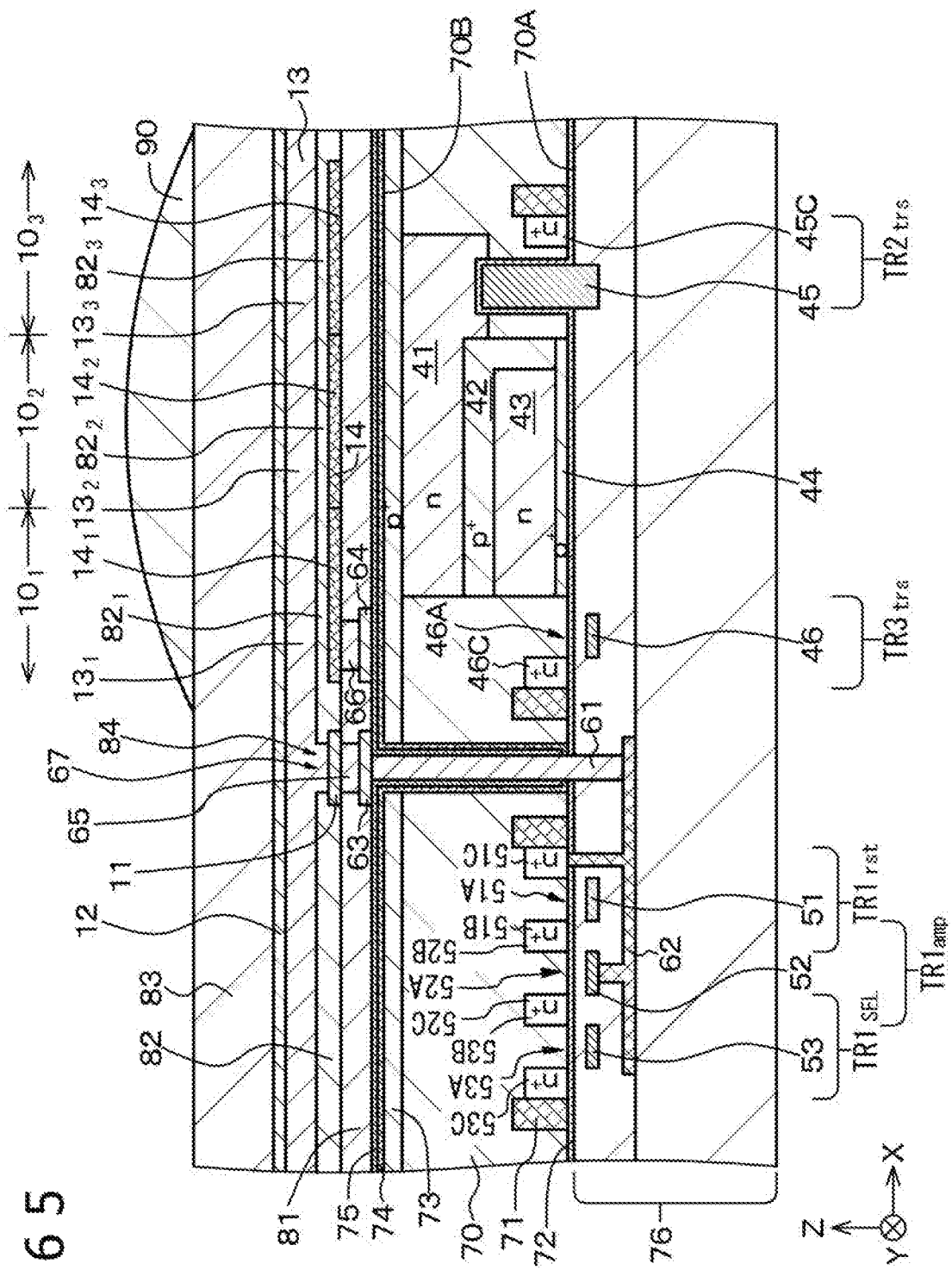
FIG. 65 is a schematic partial cross-sectional view of an imaging element and a stacked imaging element of Embodiment 15.

Embodiment 15 relates to the imaging element of the third configuration. FIG. 65 illustrates a schematic partial cross-sectional view of the imaging element and the stacked imaging element of Embodiment 15. In the imaging element of Embodiment 15, the materials included in the insulating layer segments vary between adjacent photoelectric conversion unit segments in the imaging element of Embodiment 15. Here, the values of dielectric constant of the materials included in the insulating layer segments gradually decrease from the first photoelectric conversion unit segment $10_1$ to the Nth photoelectric conversion unit segment ION. In the imaging element of Embodiment 15, the same potential may be applied to all of the N charge storage electrode segments, or a different potential may be applied to each of the N charge storage electrode segments. In the latter case, the charge storage electrode segments $14_1$, $14_2$, and $14_3$ arranged apart from each other can be connected to the vertical drive circuit 112 included in the drive circuit through pad portions $64_1$, $64_2$, and $64_3$ as described in Embodiment 16.

In addition, by adopting the configuration, a kind of charge transfer gradient is formed. When the state shifts to $V_{12} \geq V_{11}$ in the charge storage period, the nth photoelectric conversion unit segment can store more charge than the (n+1)th photoelectric conversion unit segment. Furthermore, when the state shifts to $V_{22} < V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

Embodiment 16

Figure 66:
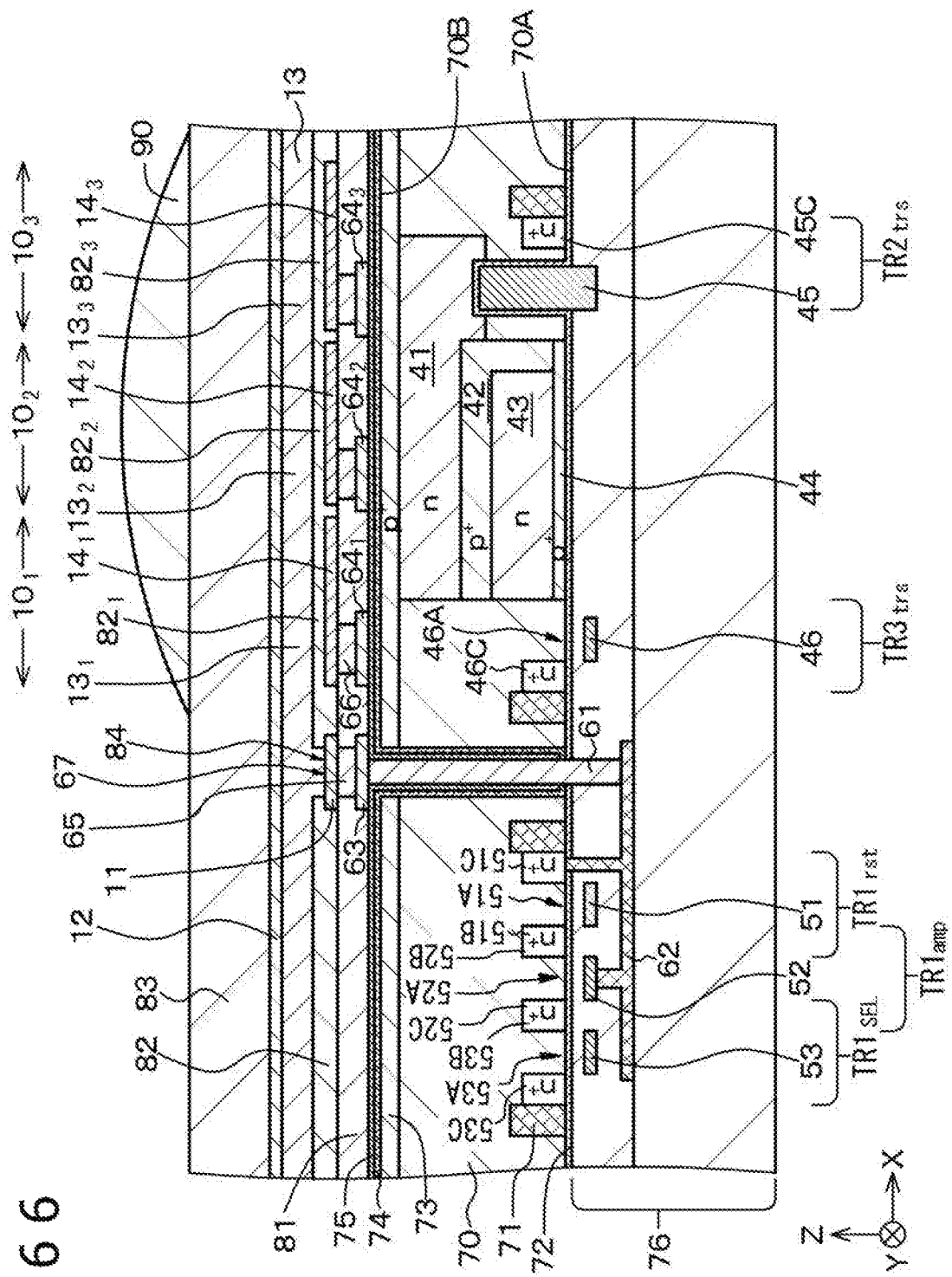
FIG. 66 is a schematic partial cross-sectional view of imaging elements and stacked imaging elements of Embodiments 16 and 17.
Figure 67A:
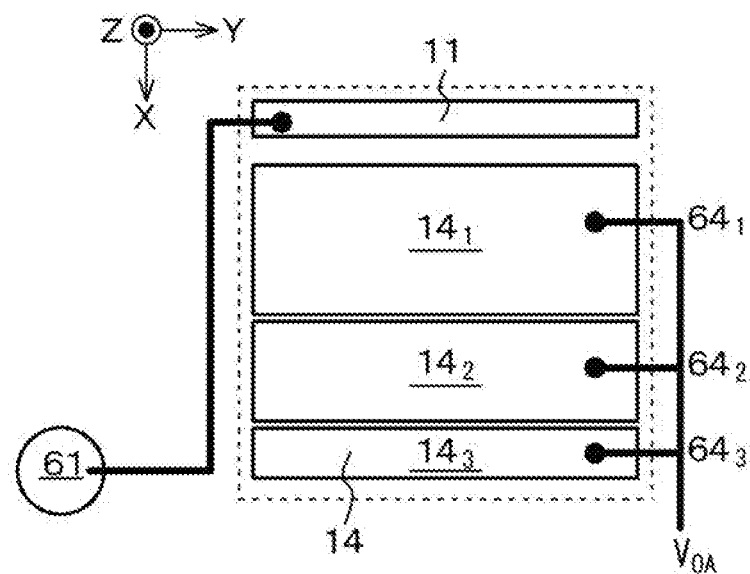
FIGS. 67A and 67B are schematic plan views of charge storage electrode segments in Embodiment 17.
Figure 67B:
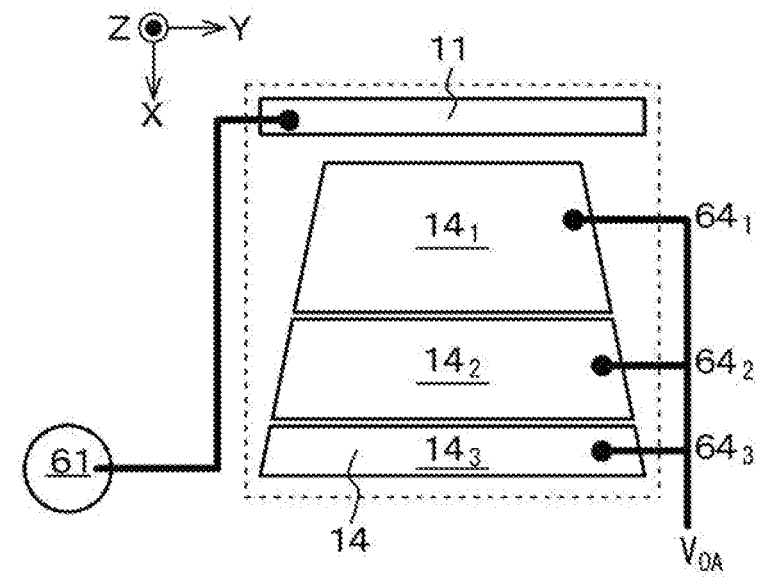
Figure 68A:
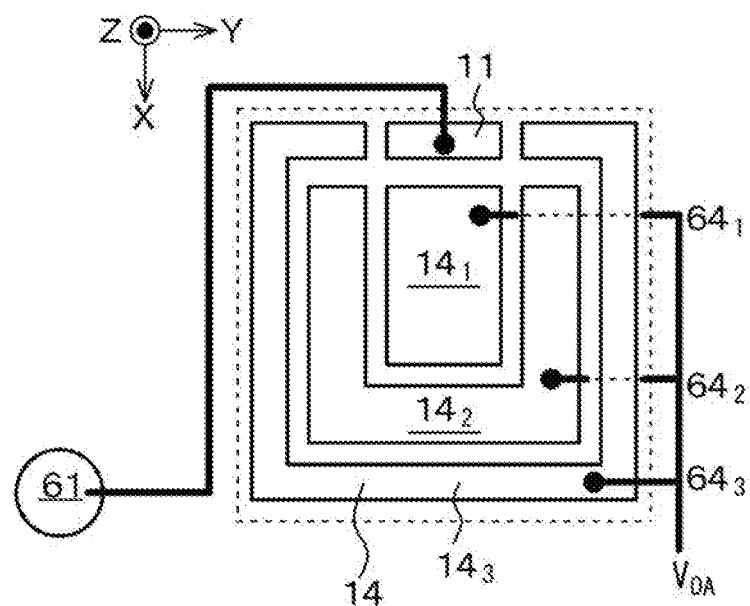
FIGS. 68A and 68B are schematic plan views of the charge storage electrode segments in Embodiment 17.
Figure 68B:
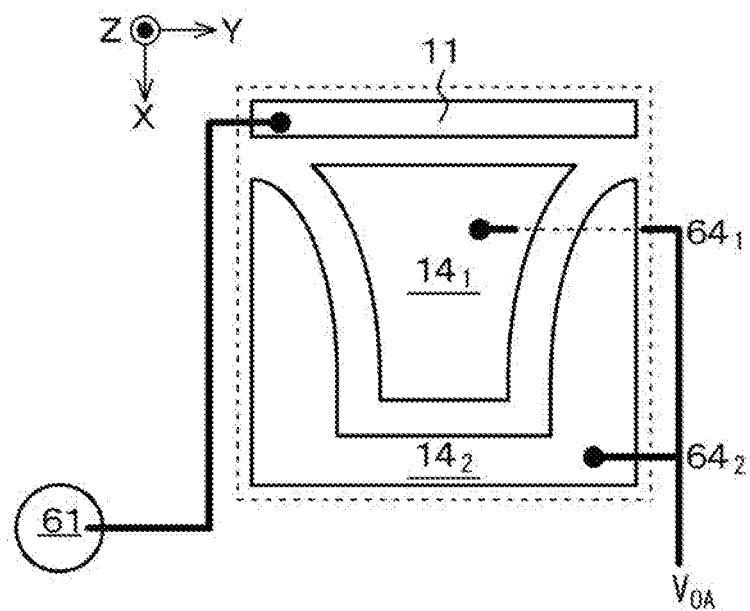

Embodiment 16 relates to the imaging element of the fourth configuration. FIG. 66 illustrates a schematic partial cross-sectional view of the imaging element and the stacked imaging element of Embodiment 16. In the imaging element of Embodiment 16, the materials included in the charge storage electrode segments vary between adjacent photoelectric conversion unit segments. Here, the values of work function of the materials included in the insulating layer segments gradually increase from the first photoelectric conversion unit segment $10_1$ to the Nth photoelectric conversion unit segment $10_N$. In the imaging element of Embodiment 16, the same potential may be applied to all of the N charge storage electrode segments, or a different potential may be applied to each of the N charge storage electrode segments. In the latter case, the charge storage electrode segments $14_1$, $14_2$, and $14_3$ are connected to the vertical drive circuit 112 included in the drive circuit through the pad portions $64_1$, $64_2$, and $64_3$.

Embodiment 17

Figure 69:
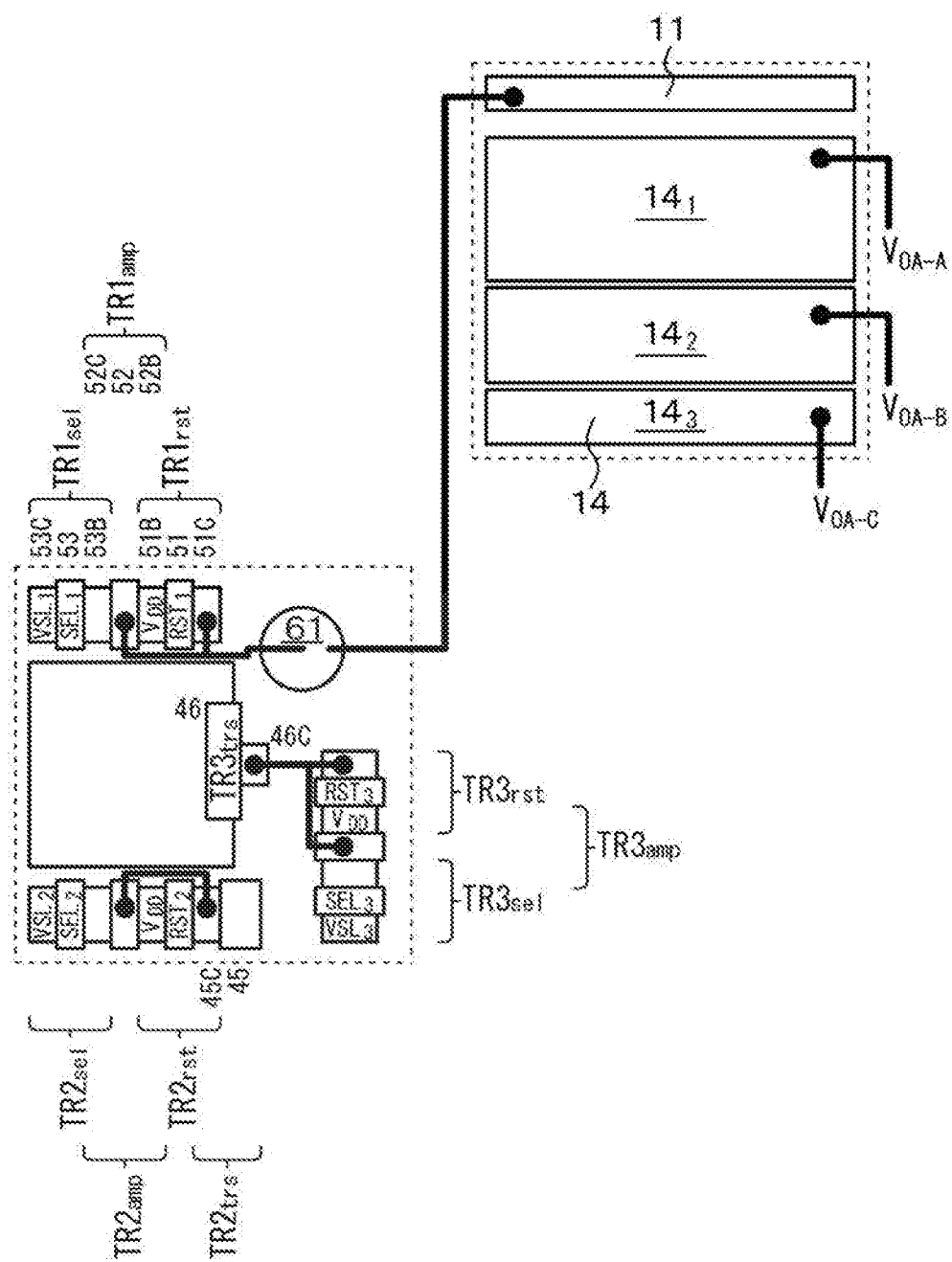
FIG. 69 is a schematic layout drawing of the first electrodes, the charge storage electrodes, and the transistors of the control units included in the imaging elements of Embodiment 17.

An imaging element of Embodiment 17 relates to the imaging element of the fifth configuration. FIGS. 67A, 67B, 68A, and 68B illustrate schematic plan views of the charge storage electrode segments in Embodiment 17. FIG. 69 illustrates a schematic layout drawing of the first electrodes, the charge storage electrodes, and the transistors of the control units included in the imaging elements of Embodiment 17. The schematic partial cross-sectional view of the imaging element and the stacked imaging element of Embodiment 17 is similar to the schematic partial cross-sectional view illustrated in FIG. 66 or 71. In the imaging element of Embodiment 17, the areas of the charge storage electrode segments gradually decrease from the first photoelectric conversion unit segment $10_1$ to the Nth photoelectric conversion unit segment $10_N$. In the imaging element of Embodiment 17, the same potential may be applied to all of the N charge storage electrode segments, or a different potential may be applied to each of the N charge storage electrode segments. Specifically, as described in Embodiment 16, the charge storage electrode segments $14_1$, $14_2$, and $14_3$ arranged apart from each other can be connected to the vertical drive circuit 112 included in the drive circuit through the pad portions $64_1$, $64_2$, and $64_3$.

In Embodiment 17, the charge storage electrode 14 includes the plurality of charge storage electrode segments $14_1$, $14_2$, and $14_3$. The number of charge storage electrode segments can be equal to or greater than 2, and the number is "3" in embodiment 17. In addition, the potential of the first electrode 11 is higher than the potential of the second electrode 12 in the imaging element and the stacked imaging element of Embodiment 17. That is, for example, a positive potential is applied to the first electrode 11, and a negative potential is applied to the second electrode 12. Therefore, in the charge transfer period, the potential applied to the charge storage electrode segment $14_1$ positioned at a place closest to the first electrode 11 is higher than the potential applied to the charge storage electrode segment $14_3$ positioned at a place farthest from the first electrode 11. In this way, a potential gradient is provided to the charge storage electrode 14. Therefore, the electrons stopped in the region of the photoelectric conversion layer 13 facing the charge storage electrode 14 are more certainly read out to the first electrode 11 and further to the first floating diffusion layer $FD_1$. That is, the charge stored in the photoelectric conversion layer 13 is read out to the control unit.

Furthermore, in the charge transfer period, the potential of the charge storage electrode segment $14_3$<the potential of the charge storage electrode segment $14_2$<the potential of the charge storage electrode segment $14_1$ holds. In this way, the electrons stopped in the region of the photoelectric conversion layer 13 can be read out to the first floating diffusion layer $FD_1$ all at once. Alternatively, in the charge transfer period, the potential of the charge storage electrode segment $14_3$, the potential of the charge storage electrode segment $14_2$, and the potential of the charge storage electrode segment $14_1$ are gradually changed (that is, changed step-wise or in a slope shape). In this way, the electrons stopped in the region of the photoelectric conversion layer 13 facing the charge storage electrode segment $14_3$ are moved to the region of the photoelectric conversion layer 13 facing the charge storage electrode segment $14_2$. Next, the electrons stopped in the region of the photoelectric conversion layer 13 facing the charge storage electrode segment $14_2$ are moved to the region of the photoelectric conversion layer 13 facing the charge storage electrode segment $14_1$. Next, the electros stopped in the region of the photoelectric conversion layer 13 facing the charge storage electrode segment $14_1$ can be certainly read out to the first floating diffusion layer $FD_1$.

Figure 70:
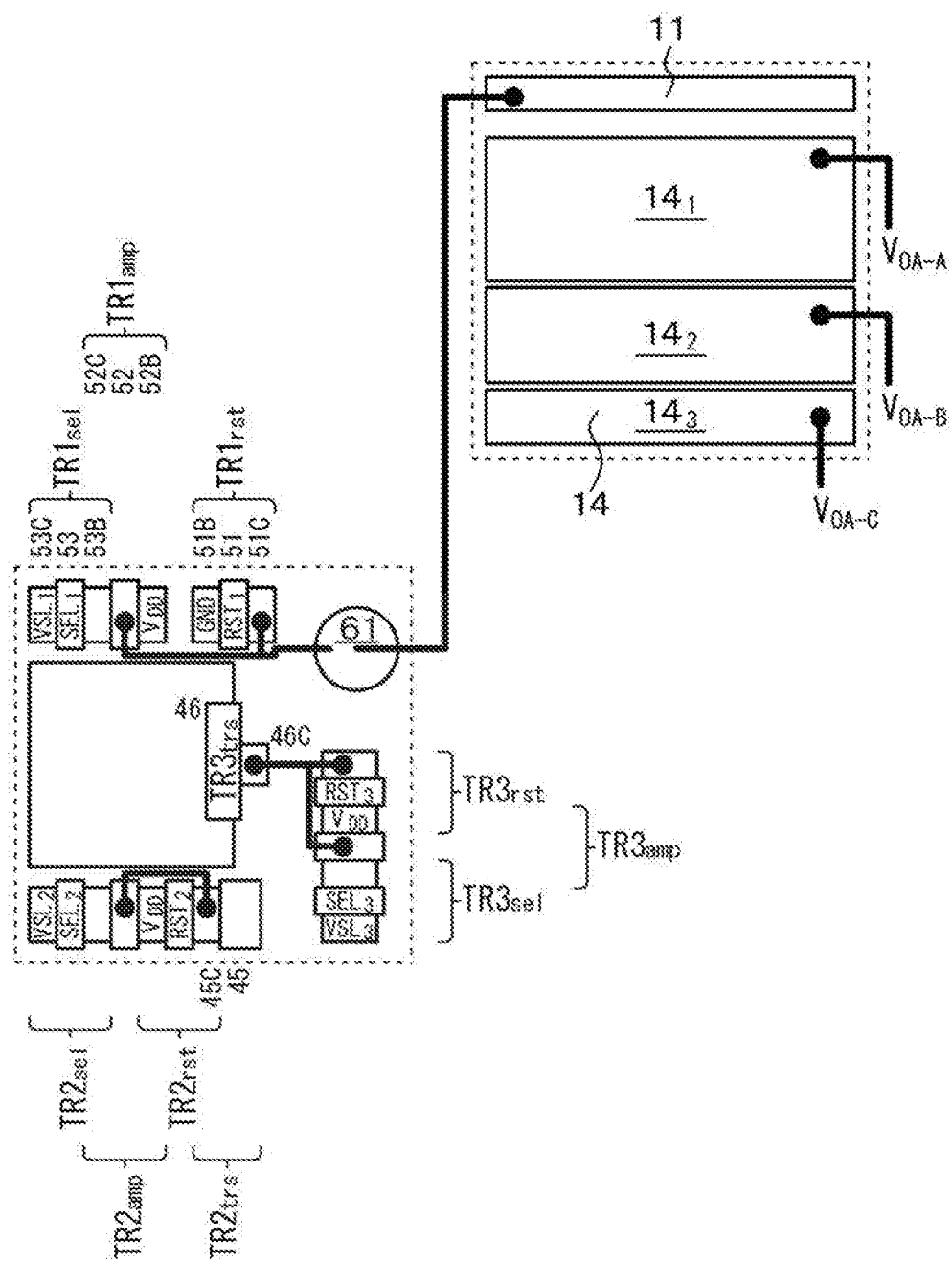
FIG. 70 is a schematic layout drawing of the first electrodes and the charge storage electrodes included in a modified example of the imaging elements of Embodiment 17.

As in FIG. 70 illustrating a schematic layout drawing of the first electrodes, the charge storage electrodes, and the transistors of the control units included in a modified example of the imaging elements of Embodiment 17, the other source/drain region 51B of the reset transistor $TR3_{rst}$ may be grounded, instead of connecting the other source/drain region 51B to the power source $V_{DD}$.

In the imaging element of Embodiment 17, a kind of charge transfer gradient is also formed by adopting the configuration. That is, the areas of the charge storage electrode segments gradually decrease from the first photoelectric conversion unit segment $10_1$ to the Nth photoelectric conversion unit segment ION. Therefore, when the state shifts to $V_{12} \geq V_{11}$ in the charge storage period, the nth photoelectric conversion unit segment can store more charge than the (n+1)th photoelectric conversion unit segment. Furthermore, when the state shifts to $V_{22}<V_{21}$ in the charge transfer period, the flow of charge from the first photoelectric conversion unit segment to the first electrode and the flow of charge from the (n+1)th photoelectric conversion unit segment to the nth photoelectric conversion unit segment can be certainly secured.

Embodiment 18

Figure 71:
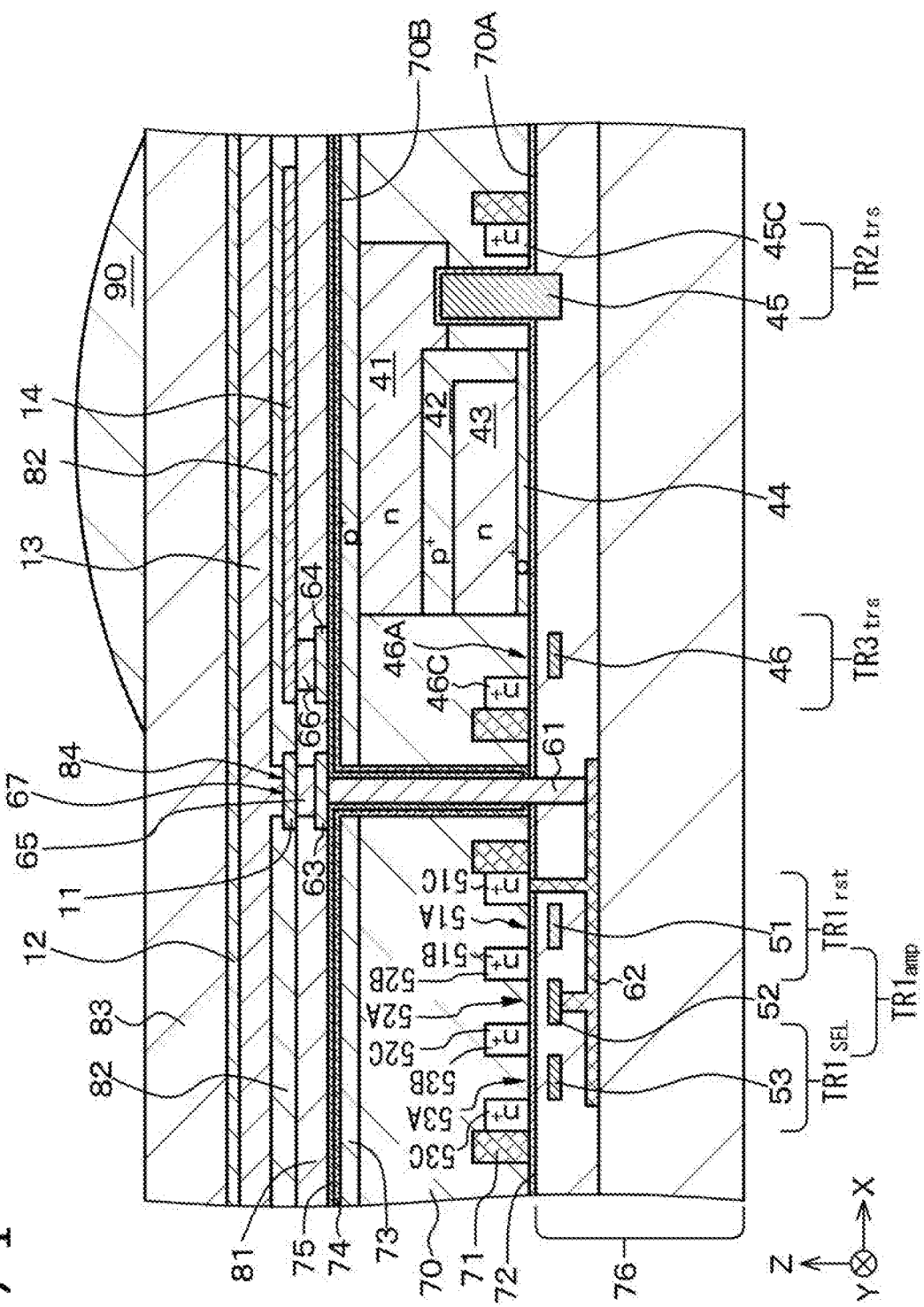
FIG. 71 is a schematic partial cross-sectional view of imaging elements and stacked imaging elements of Embodiments 18 and 17.
Figure 72A:
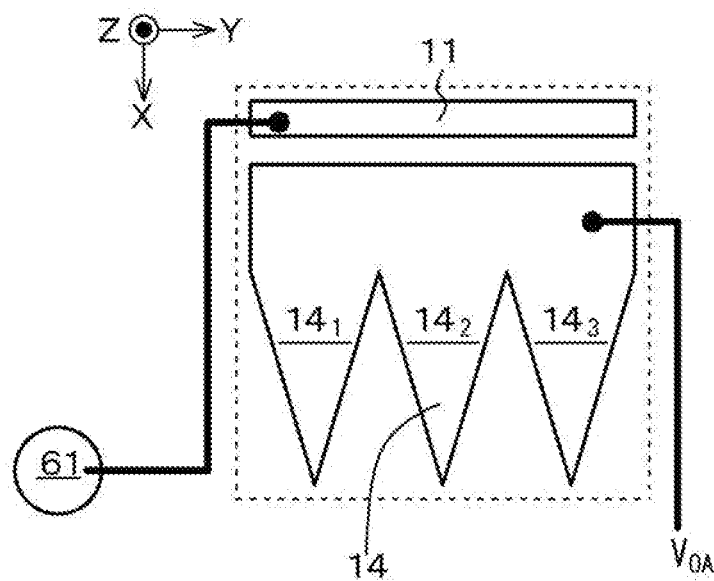
FIGS. 72A and 72B are schematic plan views of the charge storage electrode segments in Embodiment 18.
Figure 72B:
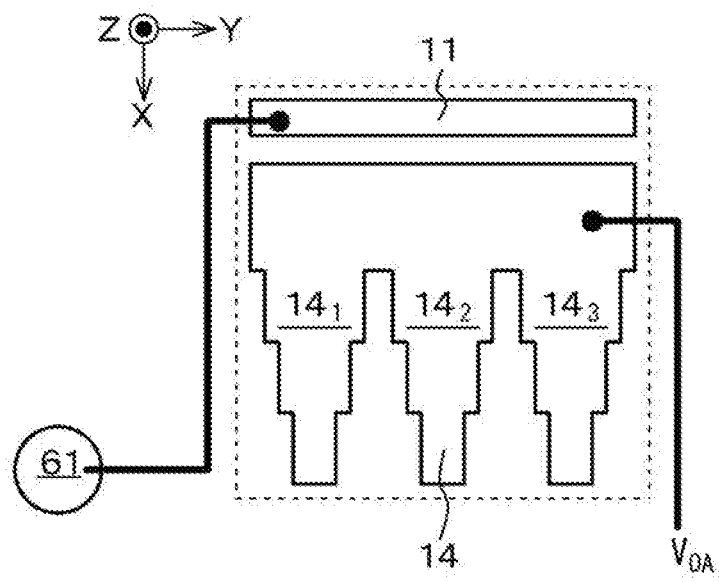

Embodiment 18 relates to the imaging element of the sixth configuration. FIG. 71 illustrates a schematic partial cross-sectional view of the imaging element and the stacked imaging element of Embodiment 18. In addition, FIGS. 72A and 72B illustrate schematic plan views of the charge storage electrode segments in Embodiment 18. The imaging element of Embodiment 18 includes the photoelectric conversion unit including the first electrode 11, the photoelectric conversion layer 13, and the second electrode 12 that are stacked. The photoelectric conversion unit further includes the charge storage electrode 14 arranged apart from the first electrode 11 and arranged to face the photoelectric conversion layer 13 through the insulating layer 82. In addition, the cross-sectional area of the stacked part of the charge storage electrode 14, the insulating layer 82, and the photoelectric conversion layer 13 when the stacked part is cut in the YZ virtual plane changes in accordance with the distance from the first electrode 11, where the Z direction is the stacking direction of the charge storage electrode 14, the insulating layer 82, and the photoelectric conversion layer 13, and the X direction is the direction away from the first electrode 11.

Specifically, in the imaging element of Embodiment 18, the thickness of the cross section of the stacked part is constant, and the width of the cross section of the stacked part decreases with an increase in the distance from the first electrode 11. Note that the width may continuously decrease (see FIG. 72A) or may decrease step-wise (see FIG. 72B).

In this way, in the imaging element of Embodiment 17, the cross-sectional area of the stacked part of the charge storage electrode 14, the insulating layer 82, and the photoelectric conversion layer 13 when the stacked part is cut in the YZ virtual plane changes in accordance with the distance from the first electrode. Therefore, a kind of charge transfer gradient is formed, and the charge generated by the photoelectric conversion can be more easily and certainly transferred.

Embodiment 19

Embodiment 19 relates to the solid-state imaging apparatuses of the first configuration and the second configuration.

The solid-state imaging apparatus of Embodiment 19 includes a photoelectric conversion unit including the first electrode 11, the photoelectric conversion layer 13, and the second electrode 12 that are stacked, in which the photoelectric conversion unit further includes a plurality of imaging elements each including the charge storage electrode 14 arranged apart from the first electrode 11 and arranged to face the photoelectric conversion layer 13 through the insulating layer 82, a plurality of imaging elements are included in an imaging element block, and the first electrode 11 is shared by the plurality of imaging elements included in the imaging element block.

Alternatively, the solid-state imaging apparatus of Embodiment 19 includes a plurality of imaging elements described in Embodiments 1 to 18.

In Embodiment 19, one floating diffusion layer is provided for the plurality of imaging elements. In addition, the timing of the charge transfer period can be appropriately controlled to allow the plurality of imaging elements to share one floating diffusion layer. Furthermore, in this case, the plurality of imaging elements can share one contact hole portion.

Note that the solid-state imaging apparatus of Embodiment 19 has a configuration and a structure substantially similar to the solid-state imaging apparatuses described in Embodiments 1 to 18, except that the plurality of imaging elements included in the imaging element block share the first electrode 11.

Figure 73:
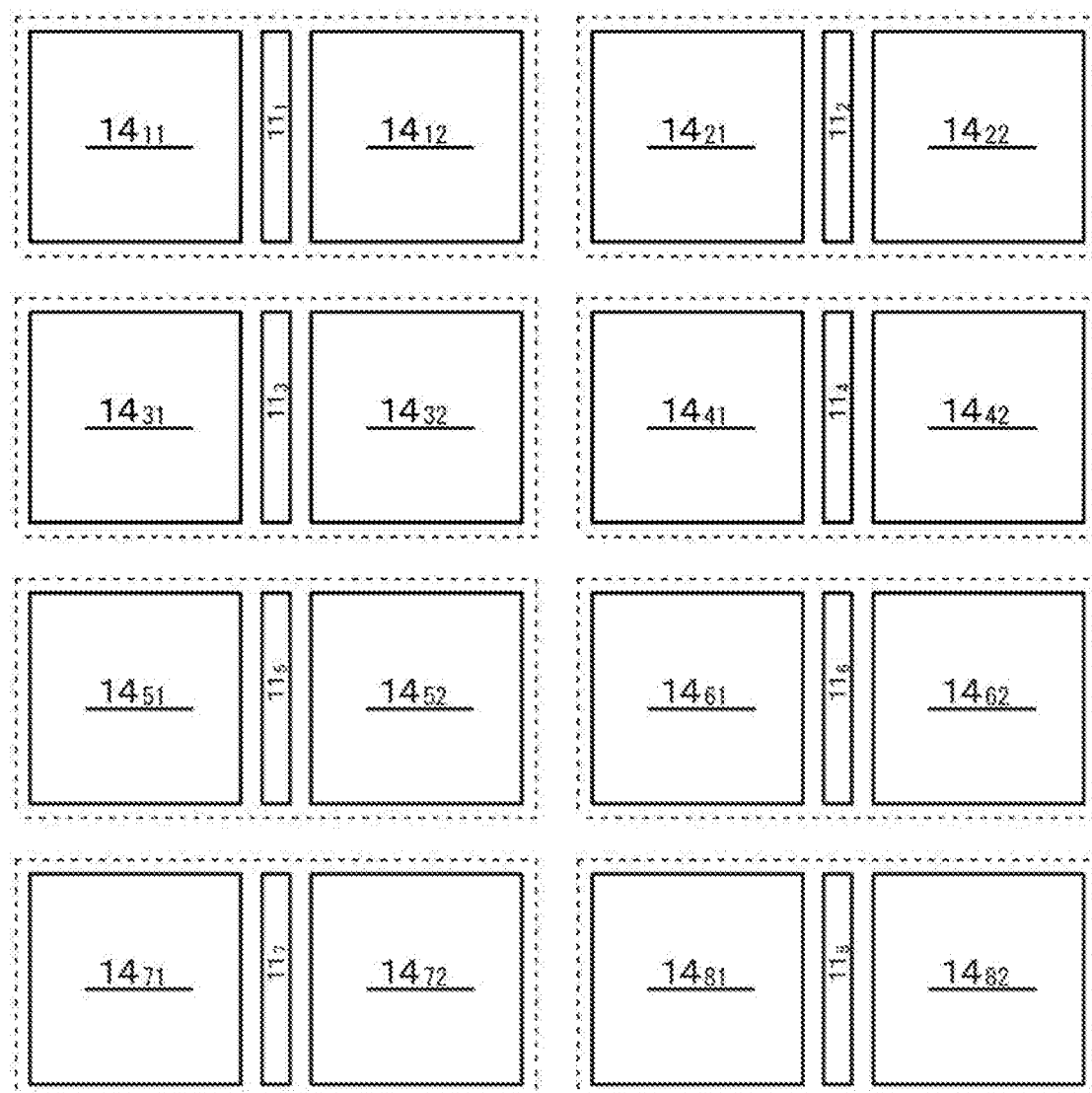
FIG. 73 is a schematic plan view of the first electrodes and the charge storage electrode segments in a solid-state imaging apparatus of Embodiment 19.
Figure 74:
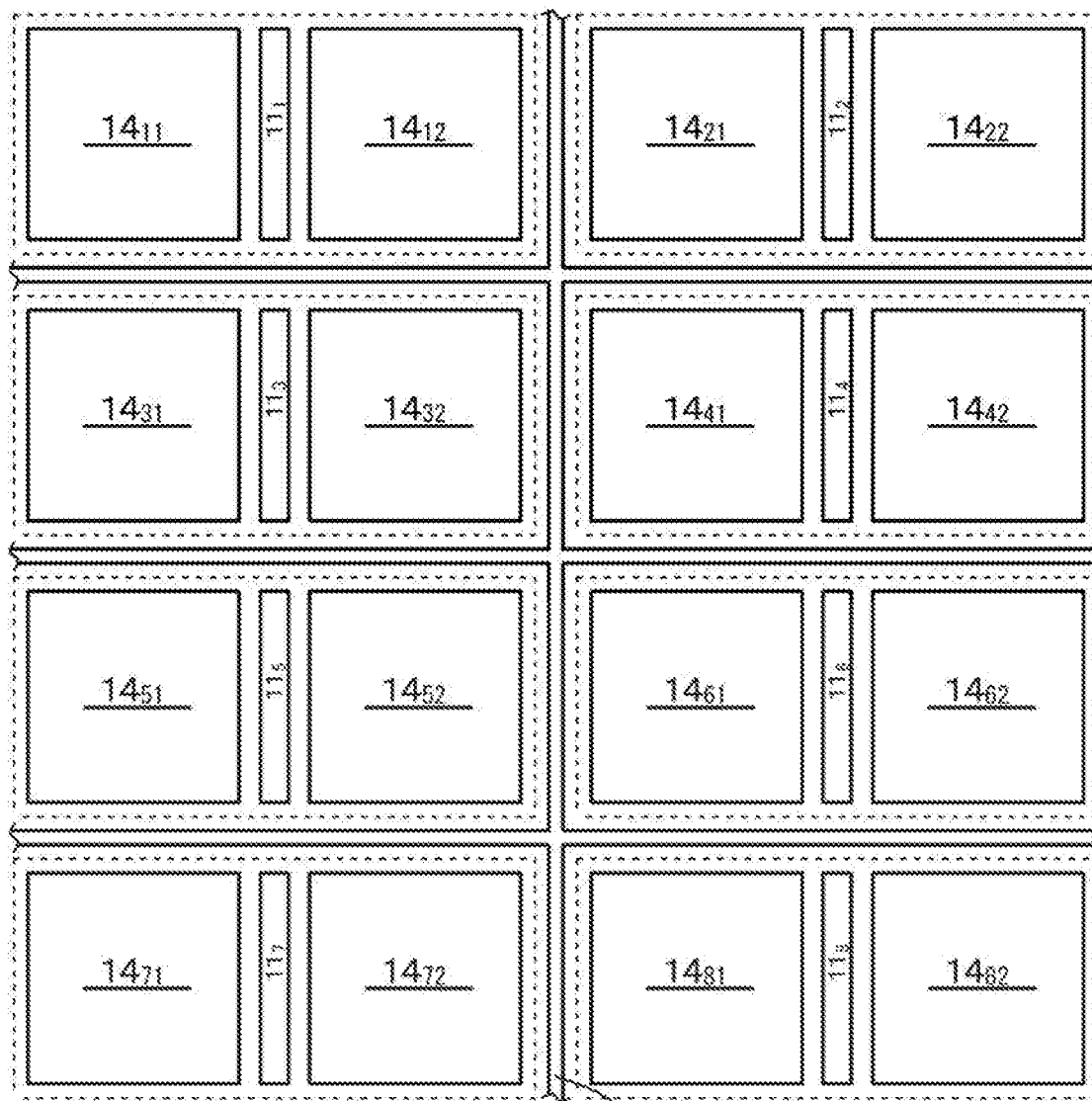
FIG. 74 is a schematic plan view of the first electrodes and the charge storage electrode segments in a first modified example of the solid-state imaging apparatus of Embodiment 19.
Figure 75:
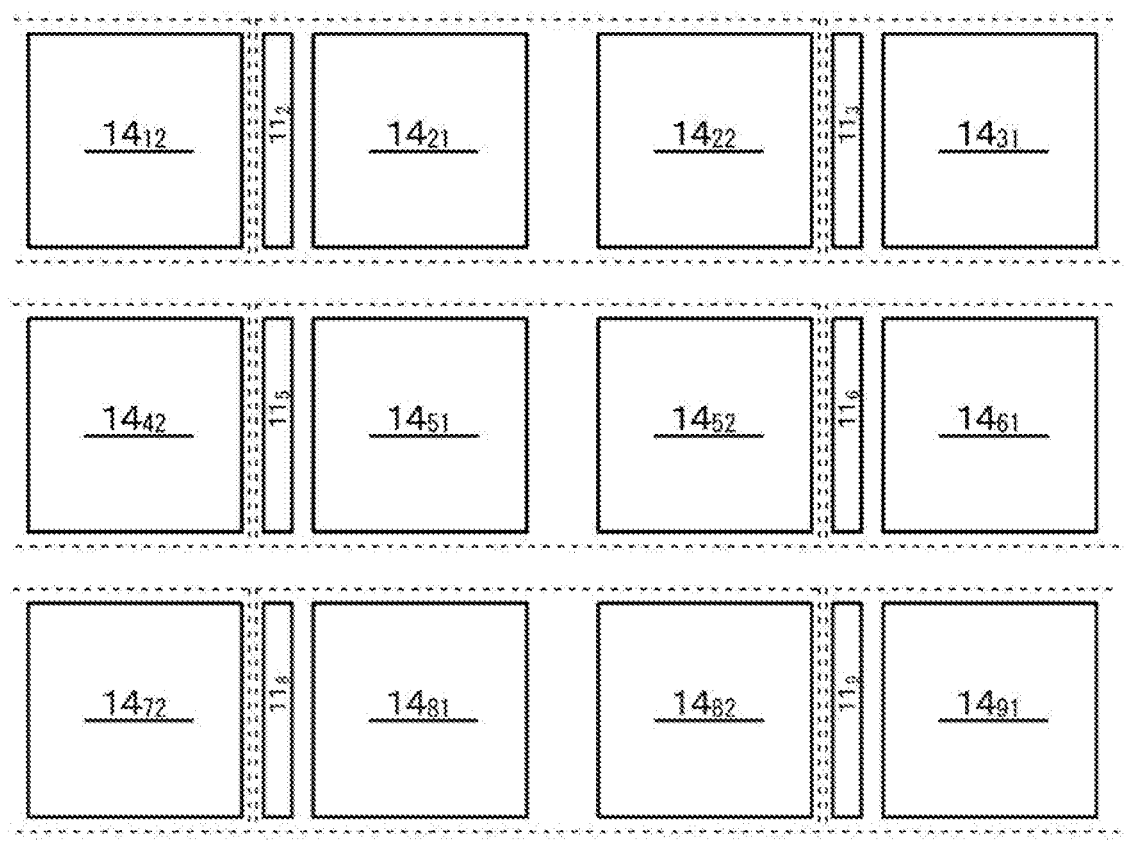
FIG. 75 is a schematic plan view of the first electrodes and the charge storage electrode segments in a second modified example of the solid-state imaging apparatus of Embodiment 19.
Figure 76:
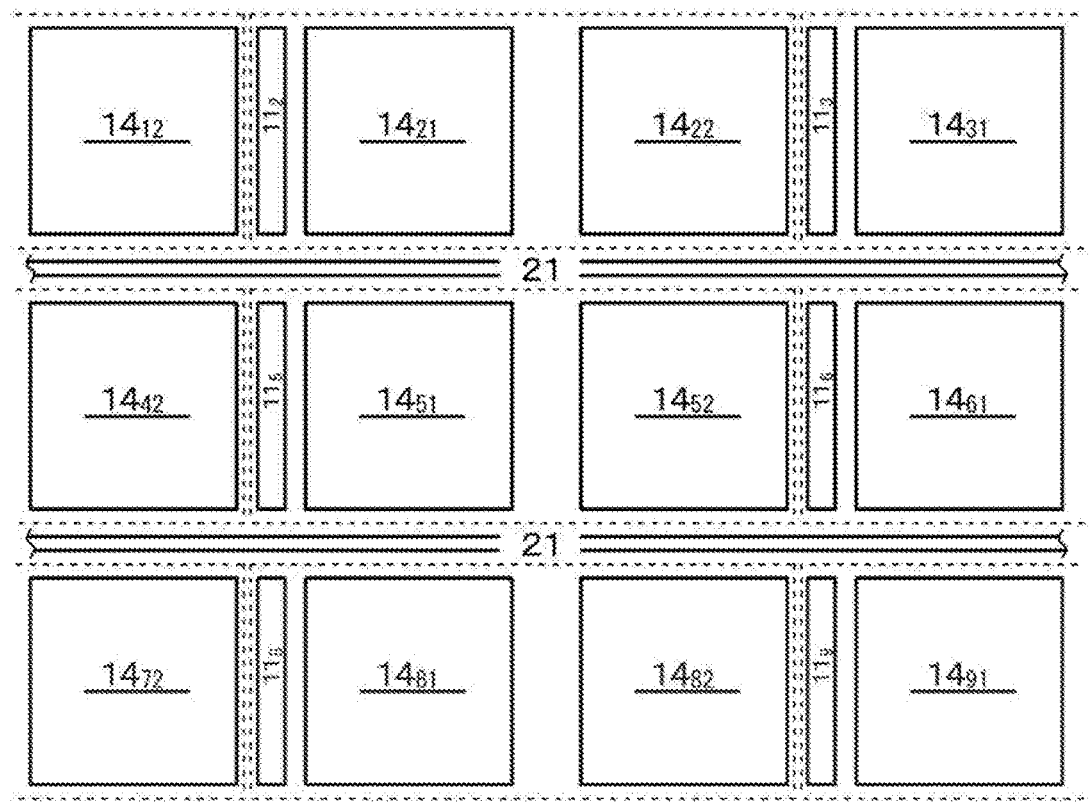
FIG. 76 is a schematic plan view of the first electrodes and the charge storage electrode segments in a third modified example of the solid-state imaging apparatus of Embodiment 19.
Figure 77:
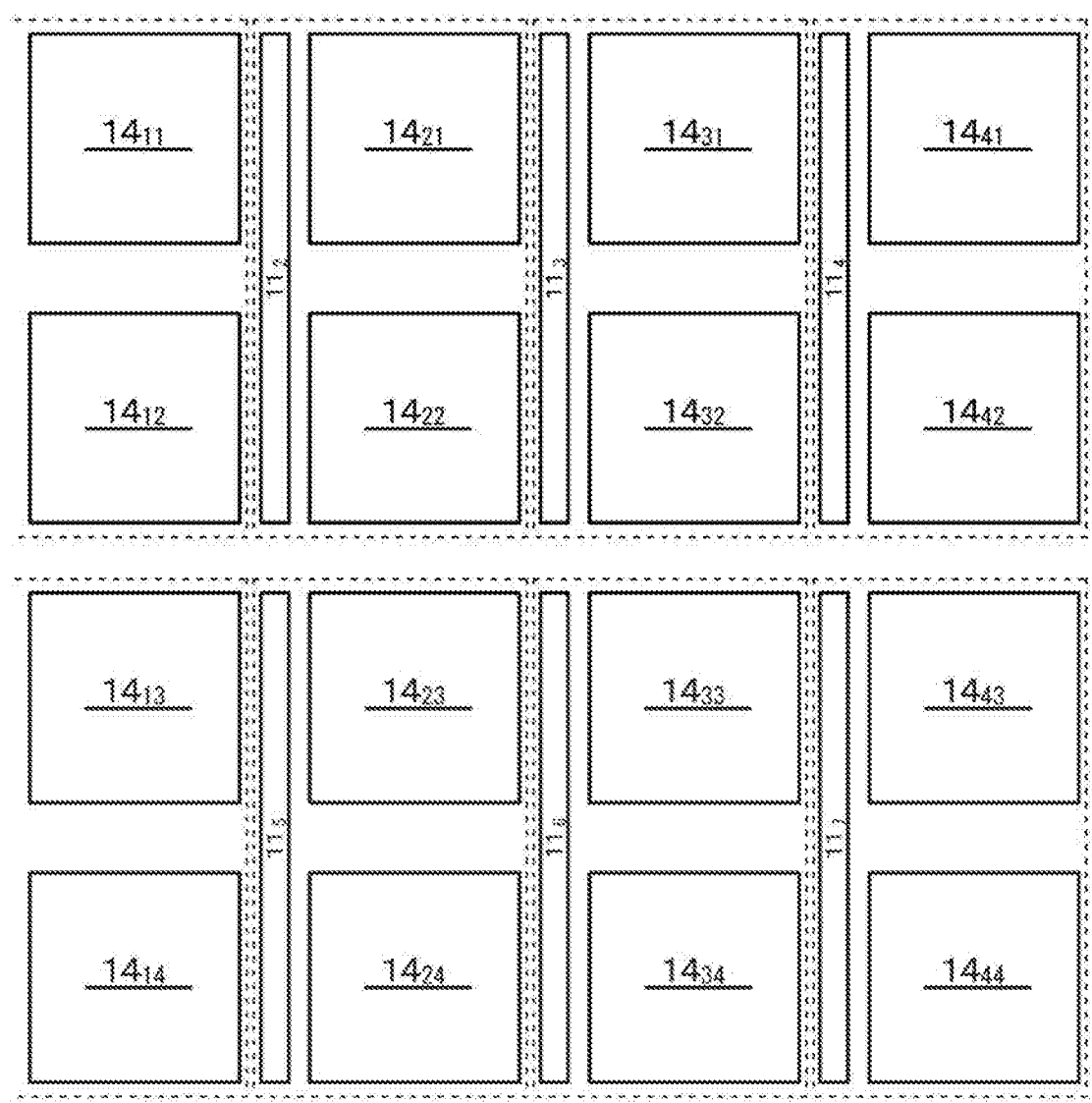
FIG. 77 is a schematic plan view of the first electrodes and the charge storage electrode segments in a fourth modified example of the solid-state imaging apparatus of Embodiment 19.
Figure 78:
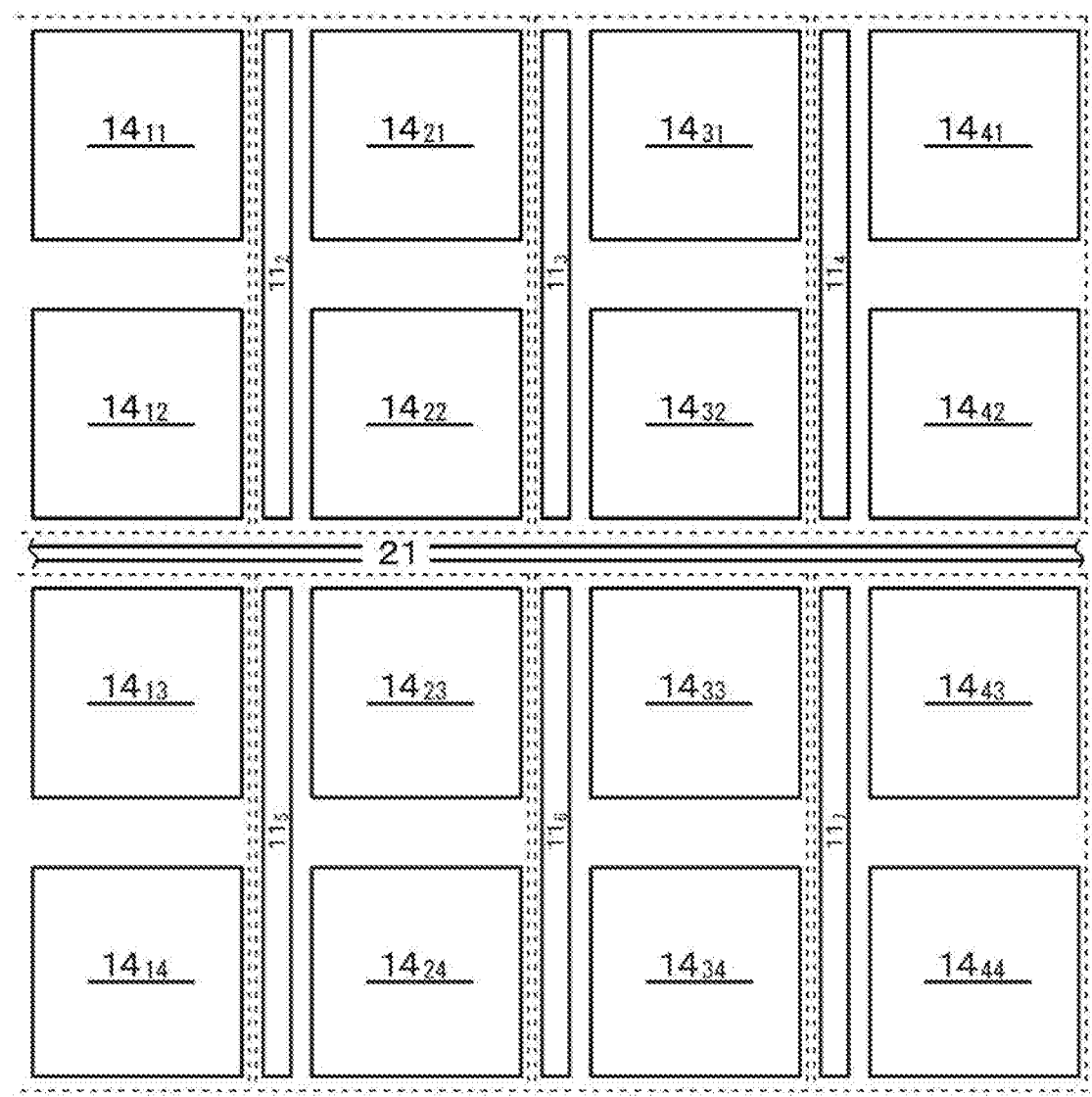
FIG. 78 is a schematic plan view of the first electrodes and the charge storage electrode segments in a fifth modified example of the solid-state imaging apparatus of Embodiment 19.

FIG. 73 (Embodiment 19), FIG. 74 (first modified example of Embodiment 19), FIG. 75 (second modified example of Embodiment 19), FIG. 76 (third modified example of Embodiment 19), and FIG. 77 (fourth modified example of Embodiment 19) schematically illustrate arrangement states of the first electrodes 11 and the charge storage electrodes 14 in the solid-state imaging apparatus of Embodiment 19. FIGS. 73, 74, 77, and 78 illustrate sixteen imaging elements, and FIGS. 75 and 76 illustrate twelve imaging elements. In addition, two imaging elements are included in the imaging element block. The imaging element blocks are surrounded and illustrated by dotted lines. Subscripts attached to the first electrodes 11 and the charge storage electrodes 14 are for the distinction of the first electrodes 11 and the charge storage electrodes 14. This similarly applies to the following description. Furthermore, one on-chip micro lens (not illustrated in FIGS. 73 to 82) is arranged on the upper side of one imaging element. Furthermore, in one imaging element block, two charge storage electrodes 14 are arranged across the first electrode 11 (see FIGS. 73 and 74). Alternatively, one first electrode 11 is arranged to face two charge storage electrodes 14 arranged side by side (see FIGS. 77 and 78). That is, the first electrode is arranged adjacent to the charge storage electrode of each imaging element. Alternatively, the first electrodes are arranged adjacent to the charge storage electrodes of part of the plurality of imaging elements and are not arranged adjacent to the charge storage electrodes of the rest of the plurality of imaging elements (see FIGS. 75 and 76). In this case, the movement of charge from the rest of the plurality of imaging elements to the first electrodes is movement through the part of the plurality of imaging elements. It is preferable that a distance A between the charge storage electrode included in the imaging element and the charge storage electrode included in the imaging element be longer than a distance B between the first electrode and the charge storage electrode in the imaging element adjacent to the first electrode in order to certainly move the charge from each imaging element to the first electrode. In addition, it is preferable that the farther the position of the imaging element from the first electrode, the larger the value of the distance A. Furthermore, in the examples illustrated in FIGS. 74, 76, and 78, the charge movement control electrodes 21 are arranged between the plurality of imaging elements included in the imaging element blocks. Arranging the charge movement control electrodes 21 can certainly suppress the movement of charge in the imaging element blocks positioned across the charge movement control electrodes 21. Note that the potentials can be set so that $V_{12}>V_{13}$ (for example, $V_{12\text{-}2}>V_{13}$) holds, where $V_{13}$ is the potential applied to the charge movement control electrodes 21.

The charge movement control electrode 21 may be formed in the same level as the first electrode 11 or the charge storage electrode 14 or may be formed in a different level (specifically, level on the lower side of the first electrode 11 or the charge storage electrode 14) on the first electrode side. In the former case, the distance between the charge movement control electrode 21 and the photoelectric conversion layer can be reduced, and the potential can be easily controlled. On the other hand, in the latter case, the distance between the charge movement control electrode 21 and the charge storage electrode 14 can be reduced, and this is advantageous for miniaturization.

Hereinafter, an operation of the imaging element block including the first electrode $11_2$ and two charge storage electrodes $14_{21}$ and $14_{22}$ will be described.

In the charge storage period, the drive circuit applies a potential $V_a$ to the first electrode $11_2$ and applies a potential $V_A$ to the charge storage electrodes $14_{21}$ and $14_{22}$. The light incident on the photoelectric conversion layer 13 causes photoelectric conversion in the photoelectric conversion layer 13. The electron holes generated by the photoelectric conversion are sent from the second electrode 22 to the drive circuit through the wire $V_{OU}$. On the other hand, the potential of the first electrode $11_2$ is higher than the potential of the second electrode 12. That is, for example, a positive potential is applied to the first electrode $11_2$, and a negative potential is applied to the second electrode 12. Therefore, the potentials are set so that $V_A \geq V_a$, preferably, $V_A > V_a$, holds. As a result, the electrons generated by the photoelectric conversion are attracted to the charge storage electrodes $14_{21}$ and $14_{22}$, and the electrons stop in the region of the photoelectric conversion layer 13 facing the charge storage electrodes $14_{21}$ and $14_{22}$. That is, the charge is stored in the photoelectric conversion layer 13. $V_A$ is equal to or greater than $V_a$, and therefore, the electrons generated inside the photoelectric conversion layer 13 do not move toward the first electrode $11_2$. In the time course of the photoelectric conversion, the potential in the region of the photoelectric conversion layer 13 facing the charge storage electrodes $14_{21}$ and $14_{22}$ becomes a more negative value.

The reset operation is performed later in the charge storage period. This resets the potential of the first floating diffusion layer, and the potential of the first floating diffusion layer shifts to the potential $V_{DD}$ of the power source.

After the completion of the reset operation, the charge is read out. That is, in the charge transfer period, the drive circuit applies a potential $V_b$ to the first electrode $11_2$, applies a potential $V_{21\text{-}B}$ to the charge storage electrode $14_{21}$, and applies a potential $V_{22\text{-}B}$ to the charge storage electrode $14_{22}$. Here, the potentials are set so that $V_{21\text{-}B}<V_b<V_{22\text{-}B}$ holds. As a result, the electrons stopped in the region of the photoelectric conversion layer 13 facing the charge storage electrode $14_{21}$ are read out to the first electrode $11_2$ and further to the first floating diffusion layer. That is, the charge stored in the region of the photoelectric conversion layer 13 facing the charge storage electrode $14_{21}$ is read out to the control unit. Once the reading is completed, the potentials are set so that $V_{22\text{-}B} \leq V_{21\text{-}B}<V_b$ holds. Note that in the examples illustrated in FIGS. 77 and 78, the potentials may be set so that $V_{22\text{-}B}<V_b<V_{21\text{-}B}$ holds. As a result, the electrons stopped in the region of the photoelectric conversion layer 13 facing the charge storage electrode $14_{22}$ are read out to the first electrode $11_2$ and further to the first floating diffusion layer. Furthermore, in the examples illustrated in FIGS. 75 and 76, the electrons stopped in the region of the photoelectric conversion layer 13 facing the charge storage electrode $14_{22}$ may be read out to the first floating diffusion layer through the first electrode $11_3$ adjacent to the charge storage electrode $14_{22}$. In this way, the charge stored in the region of the photoelectric conversion layer 13 facing the charge storage electrode $14_{22}$ is read out to the control unit. Note that when the readout of the charge stored in the region of the photoelectric conversion layer 13 facing the charge storage electrode $14_{21}$ to the control unit is completed, the potential of the first floating diffusion layer may be reset.

Figure 83A:
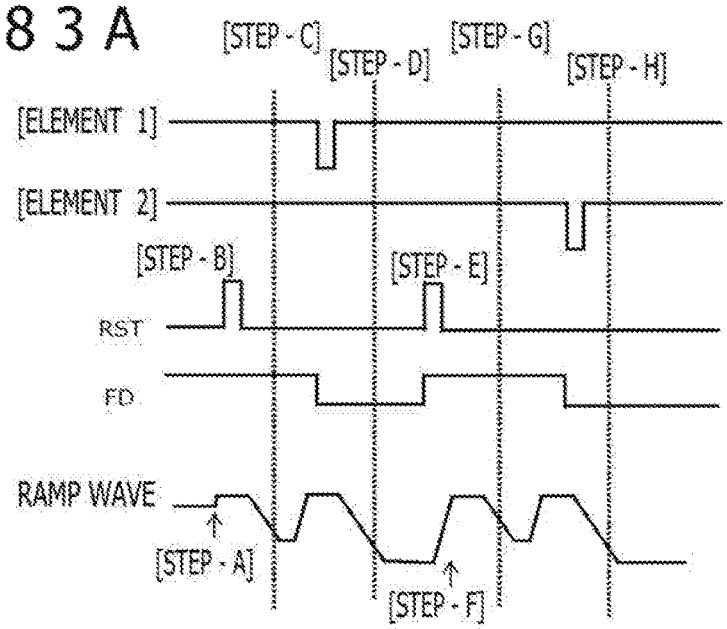
FIGS. 83A, 83B, and 83C are charts illustrating examples of reading and driving in an imaging element block of Embodiment 19.

FIG. 83A illustrates an example of reading and driving in the imaging element block of Embodiment 19.

[Step-A]

Input of auto zero signal into comparator

[Step-B]

Reset operation of one shared floating diffusion layer

[Step-C]

Reading of P phase in imaging element corresponding to charge storage electrode $14_{21}$ and movement of charge to first electrode $11_2$

[Step-D]

Reading of D phase in imaging element corresponding to charge storage electrode $14_{21}$ and movement of charge to first electrode $11_2$

[Step-E]

Reset operation of one shared floating diffusion layer

[Step-F]

Input of auto zero signal into comparator

[Step-G]

Reading of P phase in imaging element corresponding to charge storage electrode $14_{22}$ and movement of charge to first electrode $11_2$

[Step-H]

Reading of D phase in imaging element corresponding to charge storage electrode $14_{22}$ and movement of charge to first electrode $11_2$ The signals from two imaging elements corresponding to the charge storage electrode $14_{21}$ and the charge storage electrode $14_{22}$ are read in this flow. Based on the correlated double sampling (CDS) process, the difference between the reading of the P phase in [step-C] and the reading of the D phase in [step-D] is the signal from the imaging element corresponding to the charge storage electrode $14_{21}$. The difference between the reading of the P phase in [step-G] and the reading of the D phase in [step-H] is the signal from the imaging element corresponding to the charge storage electrode $14_{22}$.

Figure 83B:
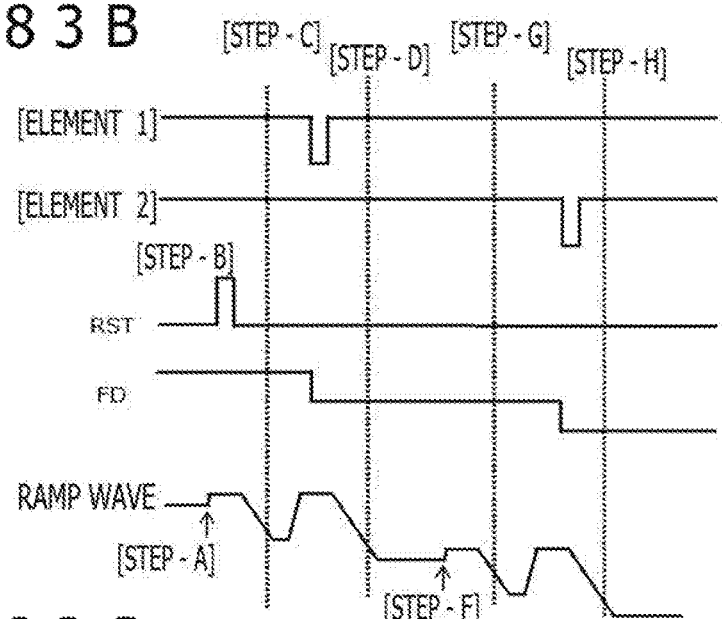
Figure 83C:
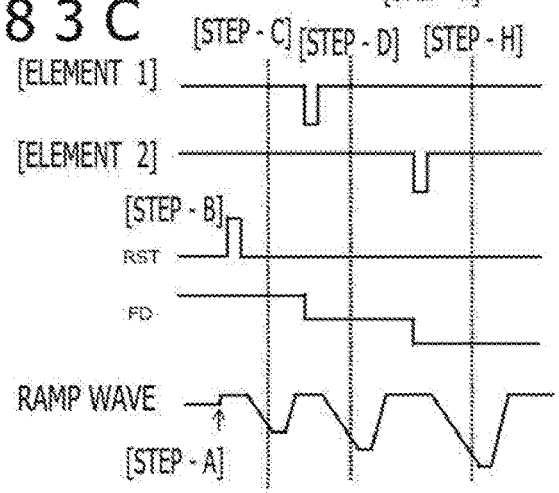
Figure 84:
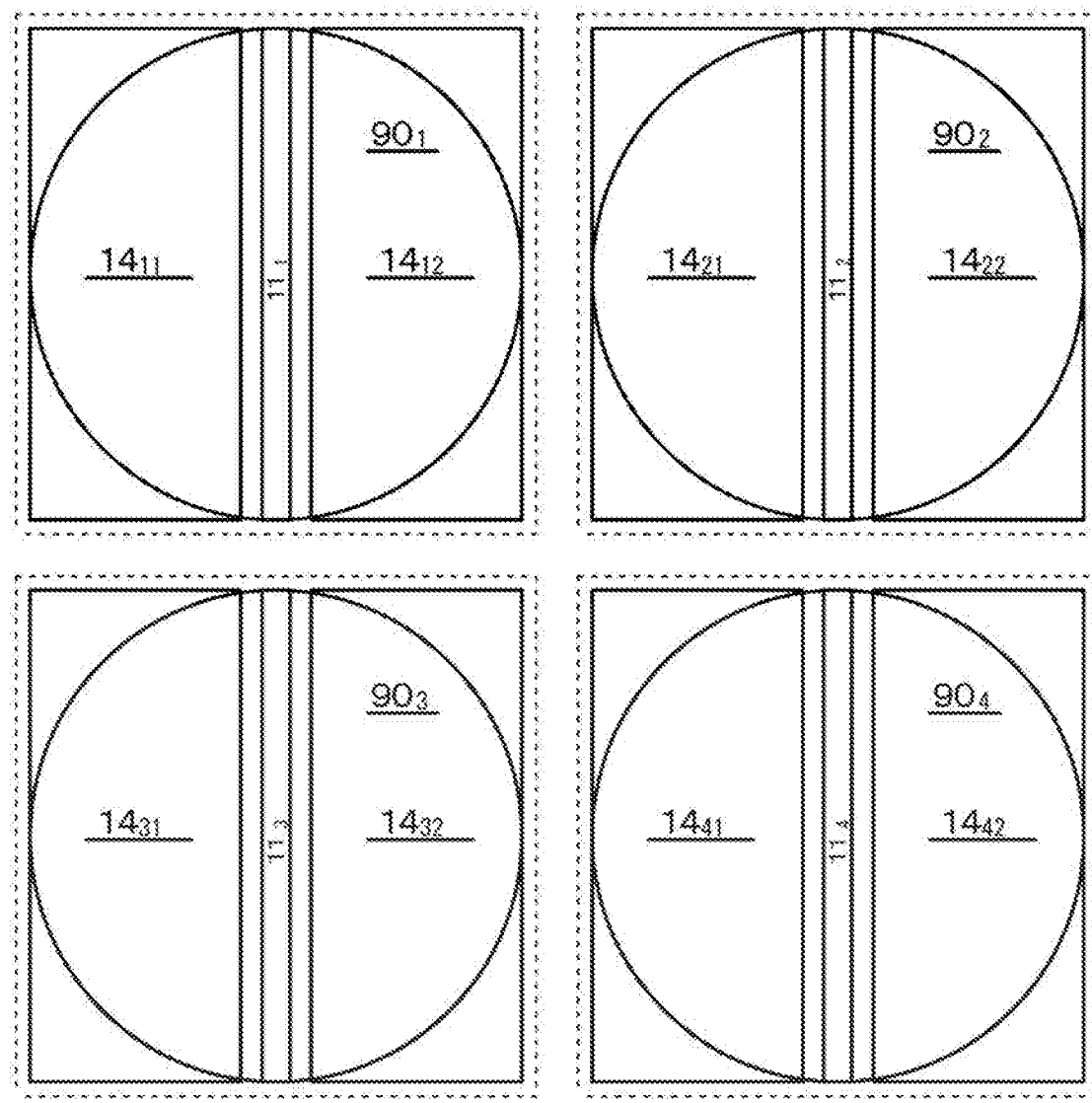
FIG. 84 is a schematic plan view of the first electrodes and the charge storage electrode segments in a solid-state imaging apparatus of Embodiment 20.
Figure 85:
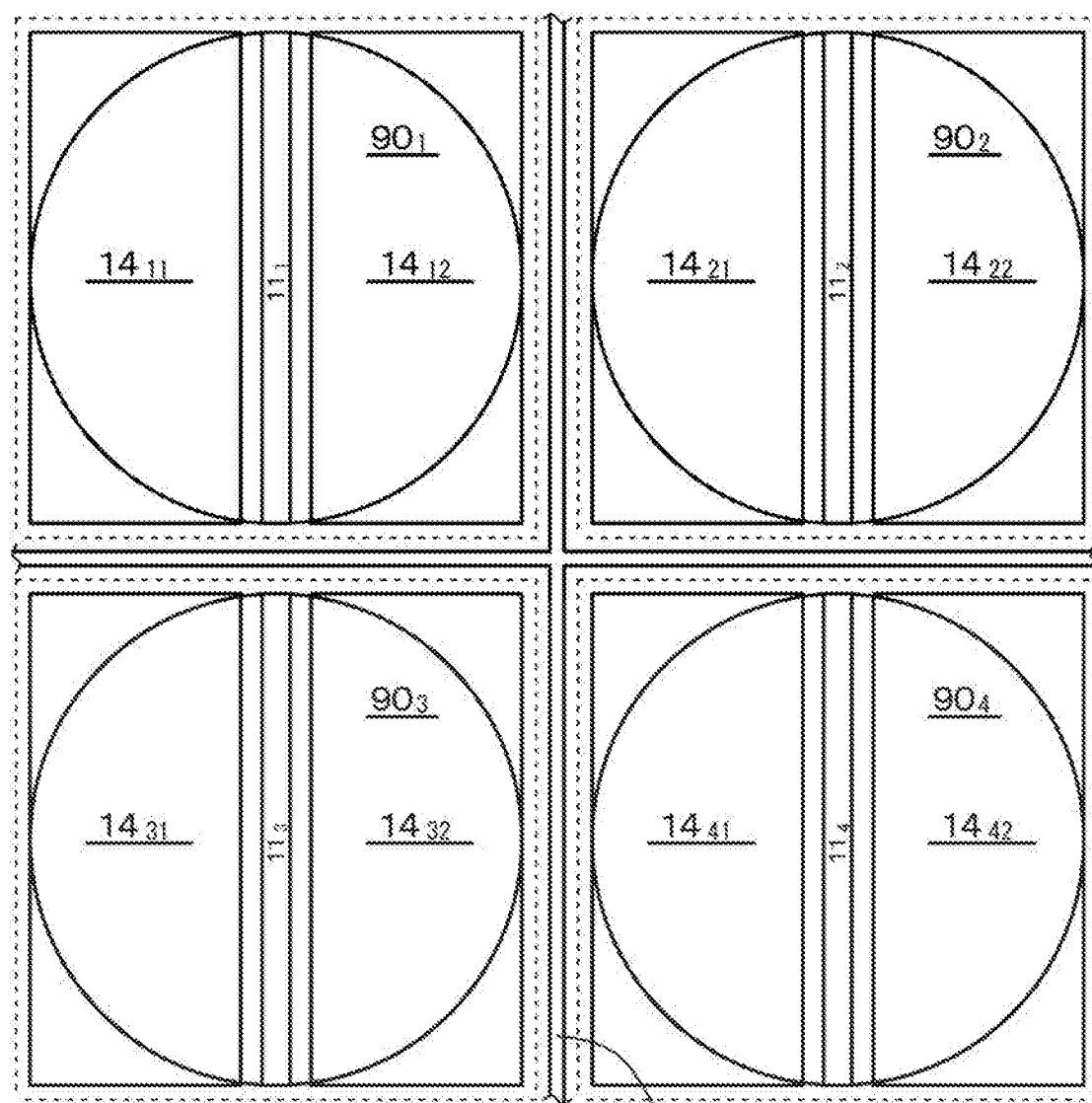
FIG. 85 is a schematic plan view of the first electrodes and the charge storage electrode segments in a modified example of the solid-state imaging apparatus of Embodiment 20.
Figure 86:
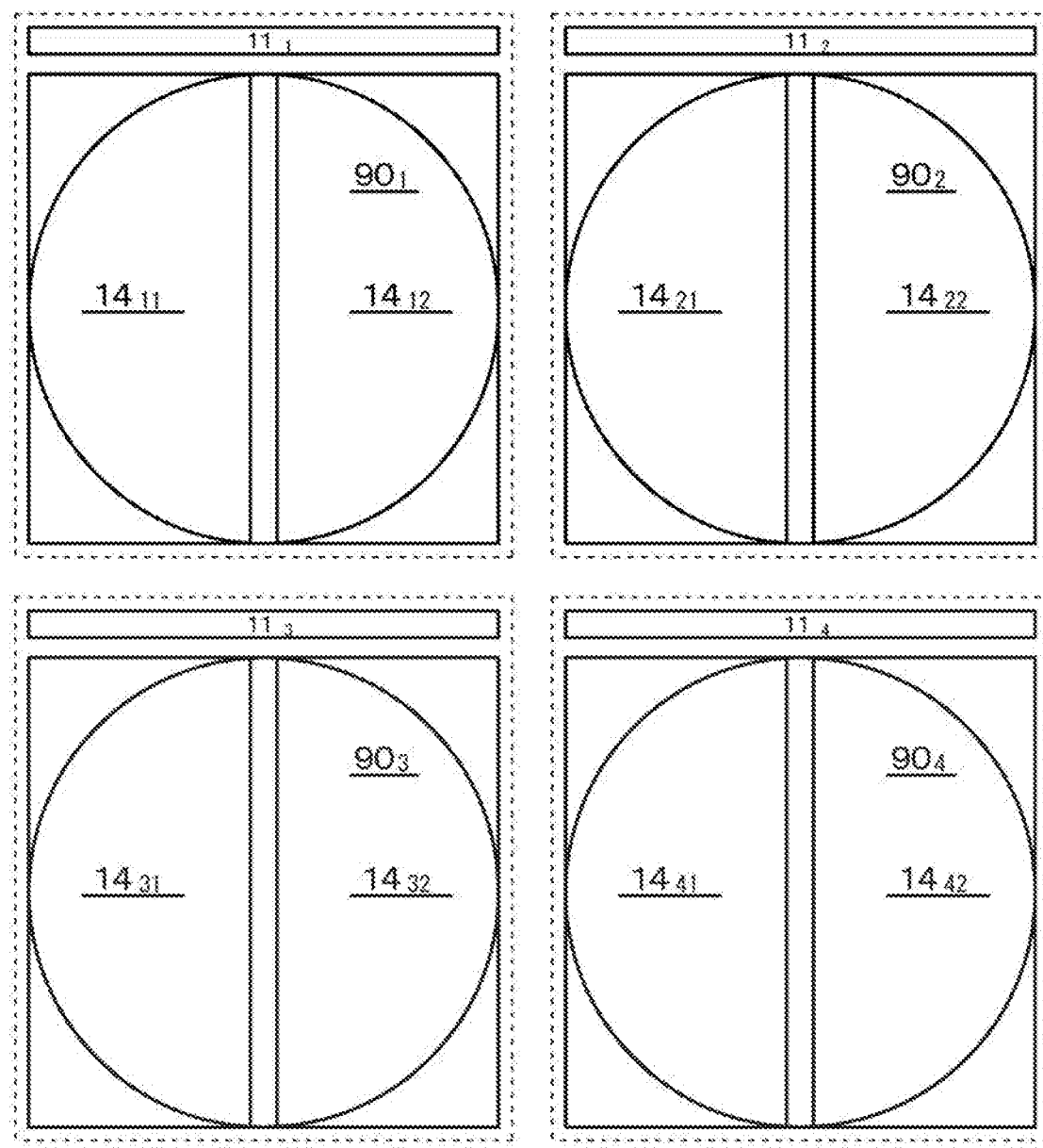
FIG. 86 is a schematic plan view of the first electrodes and the charge storage electrode segments in a modified example of the solid-state imaging apparatus of Embodiment 20.
Figure 87:
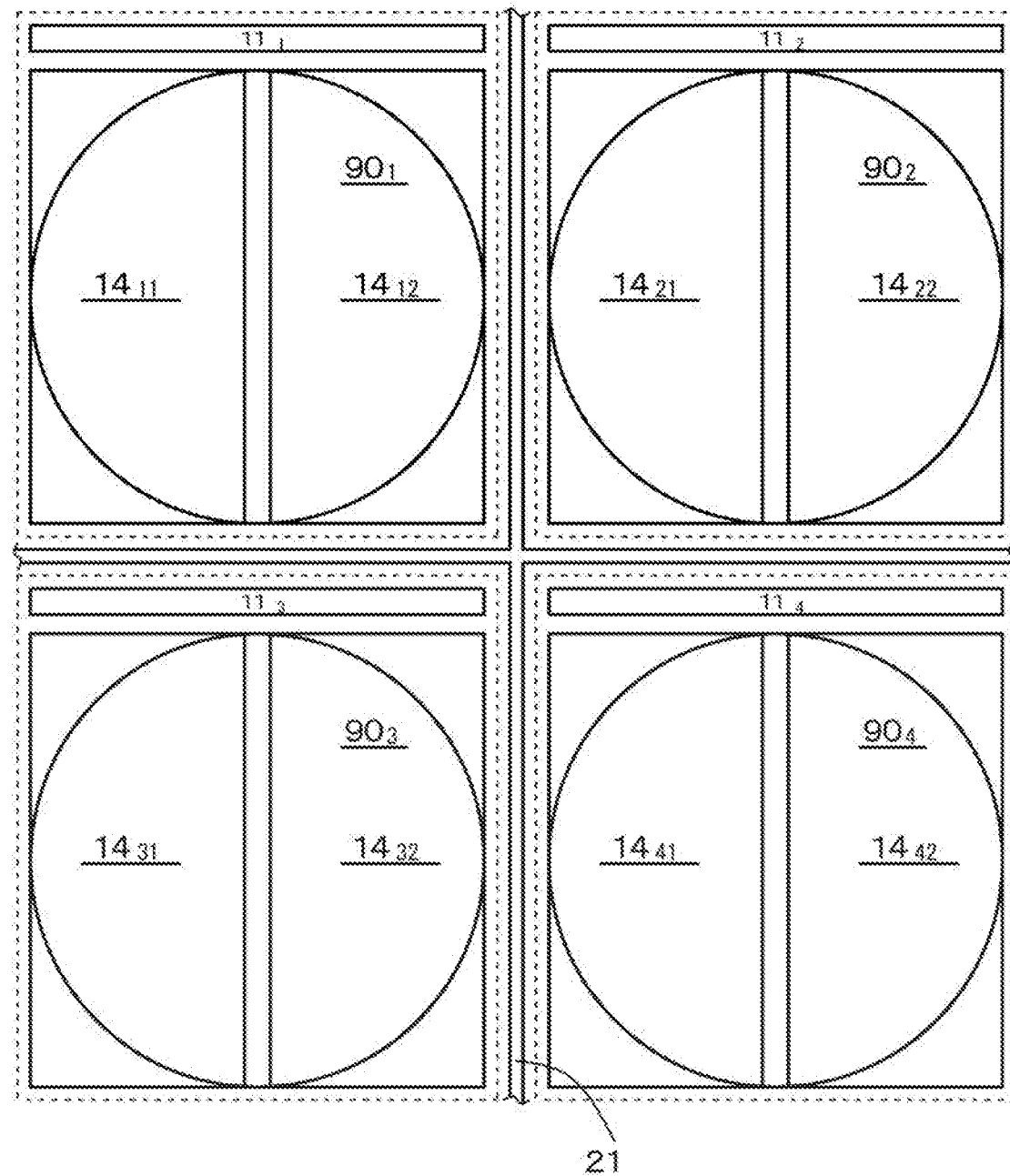
FIG. 87 is a schematic plan view of the first electrodes and the charge storage electrode segments in a modified example of the solid-state imaging apparatus of Embodiment 20.

Note that the operation of [step-E] may be skipped (see FIG. 83B). In addition, the operation of [step-F] may be skipped, and in this case, [step-G] can be further skipped (see FIG. 83C). The difference between the reading of the P phase in [step-C] and the reading of the D phase in [step-D] is the signal from the imaging element corresponding to the charge storage electrode $14_{21}$. The difference between the reading of the D phase in [step-D] and the reading of the D phase in [step-H] is the signal from the imaging element corresponding to the charge storage electrode $14_{22}$.

Figure 79:
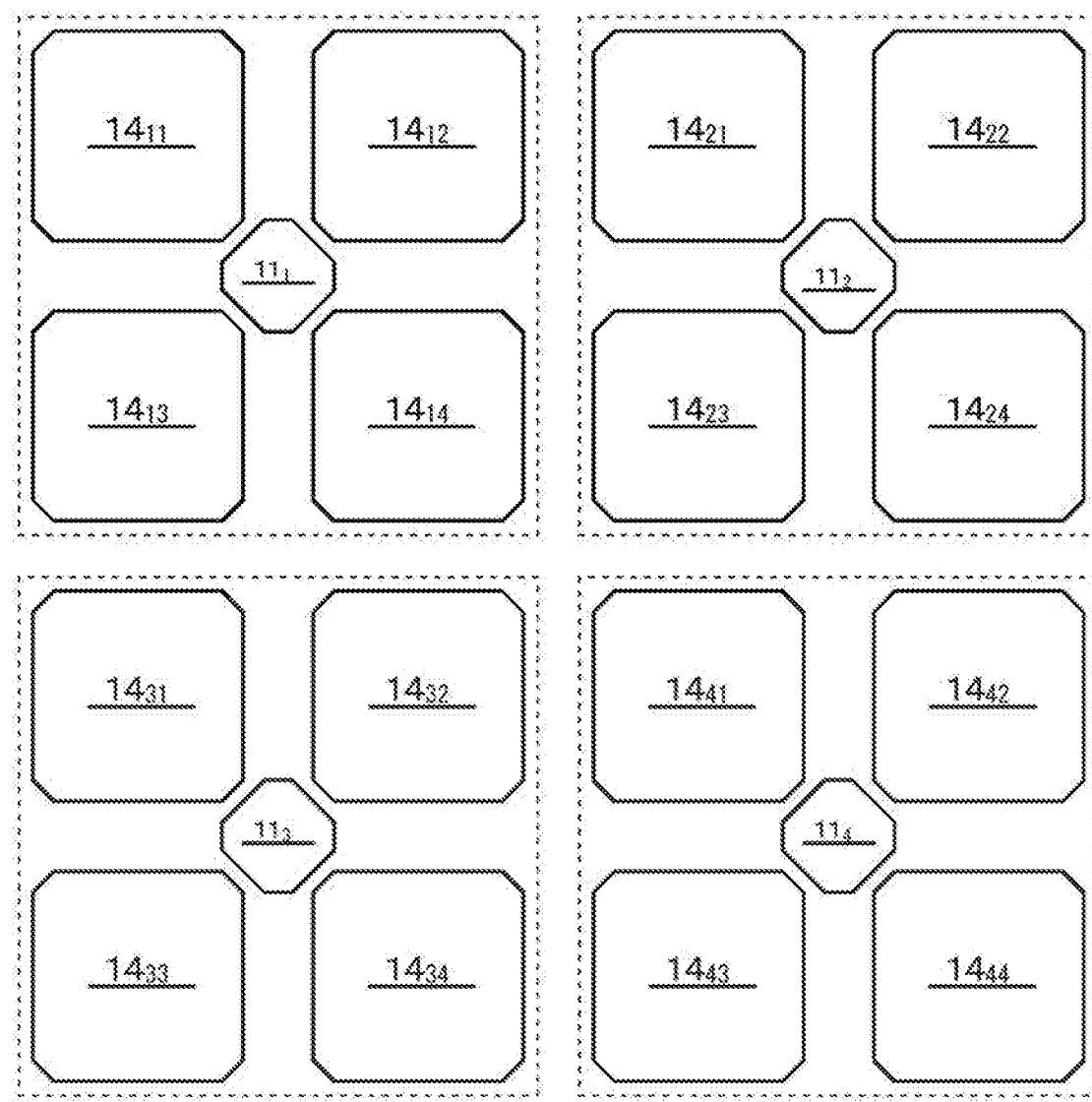
FIG. 79 is a schematic plan view of the first electrodes and the charge storage electrode segments in a sixth modified example of the solid-state imaging apparatus of Embodiment 19.
Figure 80:
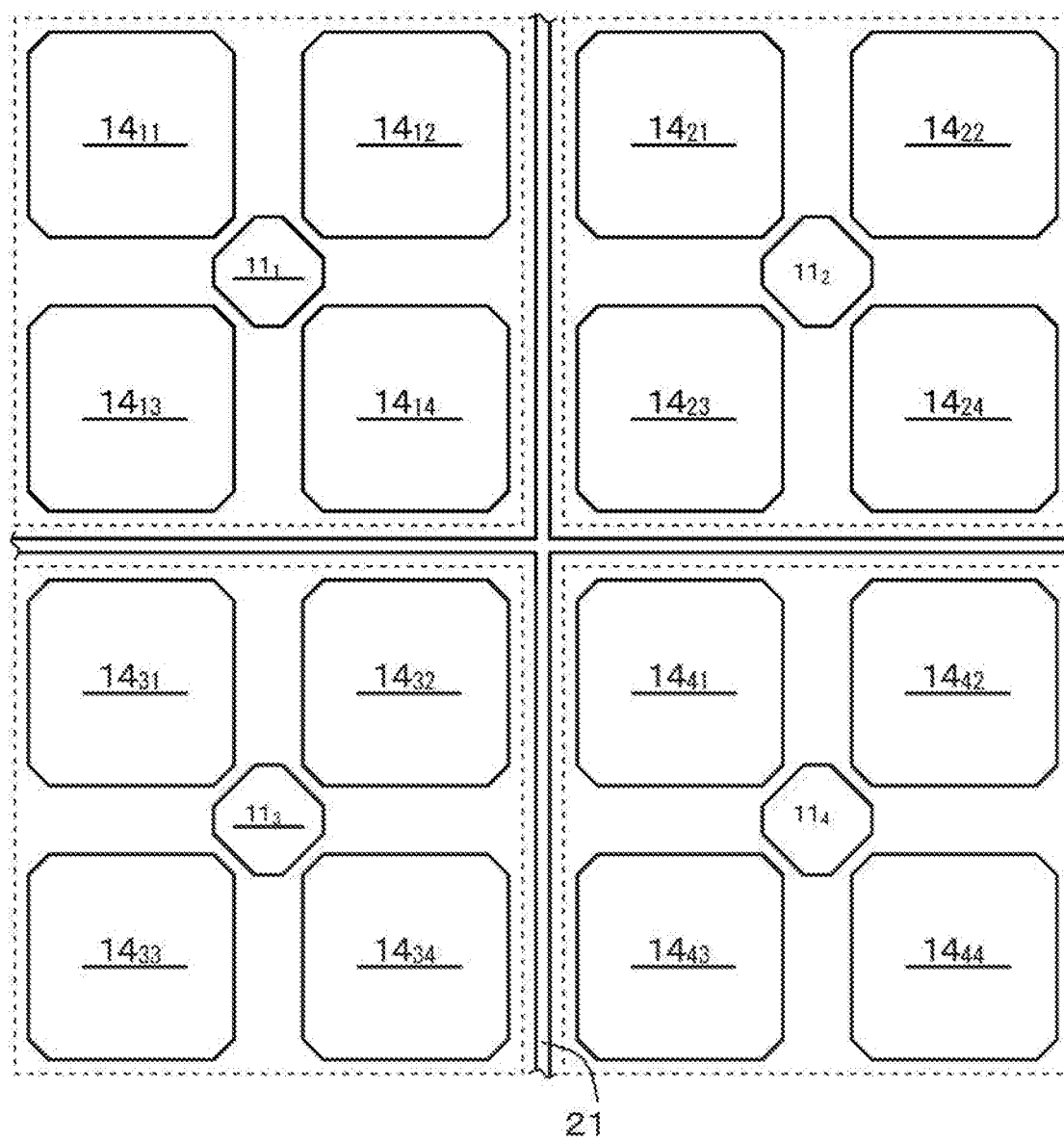
FIG. 80 is a schematic plan view of the first electrodes and the charge storage electrode segments in a seventh modified example of the solid-state imaging apparatus of Embodiment 19.

In modified examples of FIG. 79 (sixth modified example of Embodiment 19) and FIG. 80 (seventh modified example of Embodiment 19) schematically illustrating arrangement states of the first electrodes 11 and the charge storage electrodes 14, four imaging elements are included in the imaging element block. The operations of the solid-state imaging apparatuses can be substantially similar to the operations of the solid-state imaging apparatuses illustrated in FIGS. 73 to 78.

Figure 81:
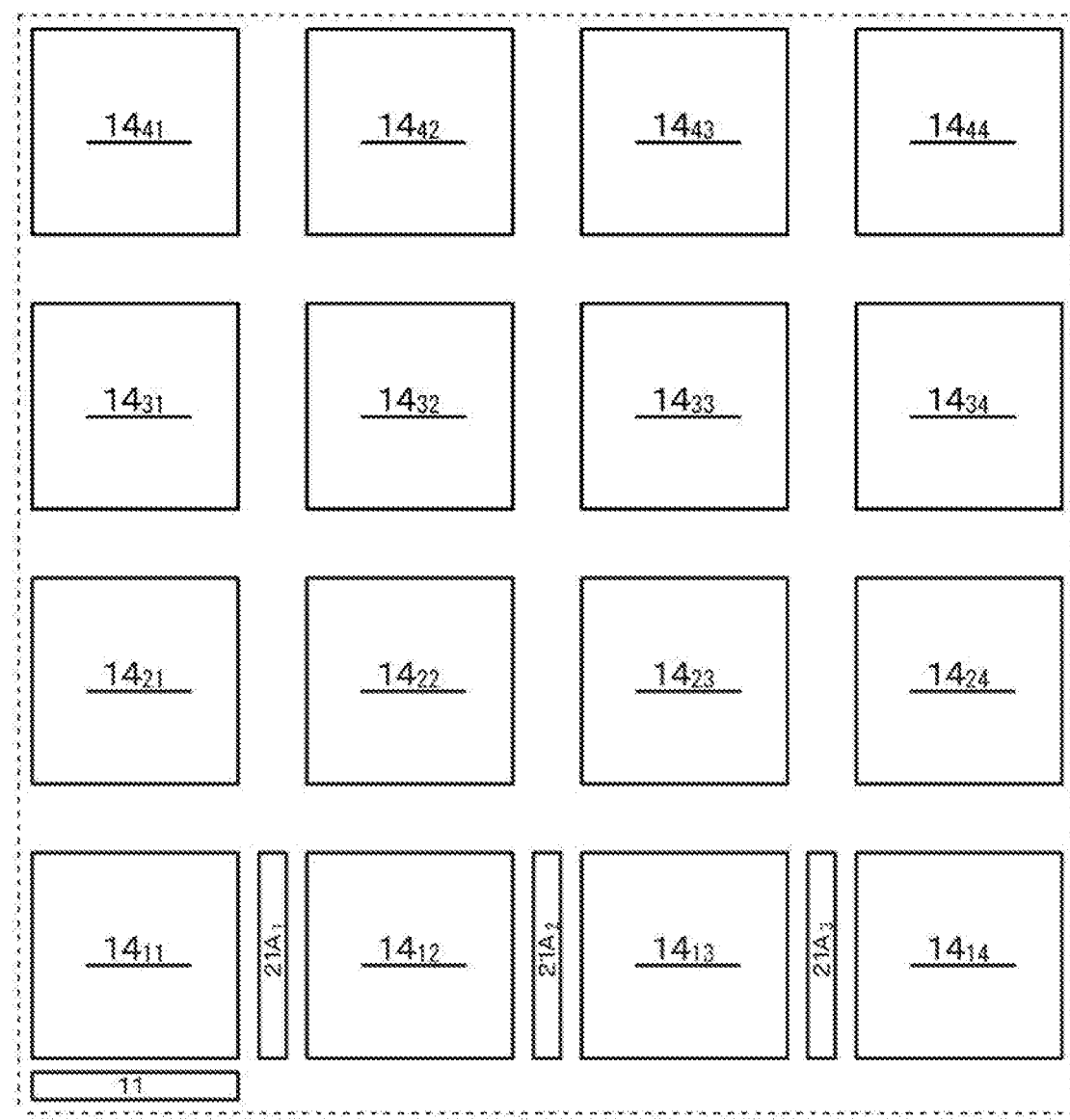
FIG. 81 is a schematic plan view of the first electrodes and the charge storage electrode segments in an eighth modified example of the solid-state imaging apparatus of Embodiment 19.
Figure 82:
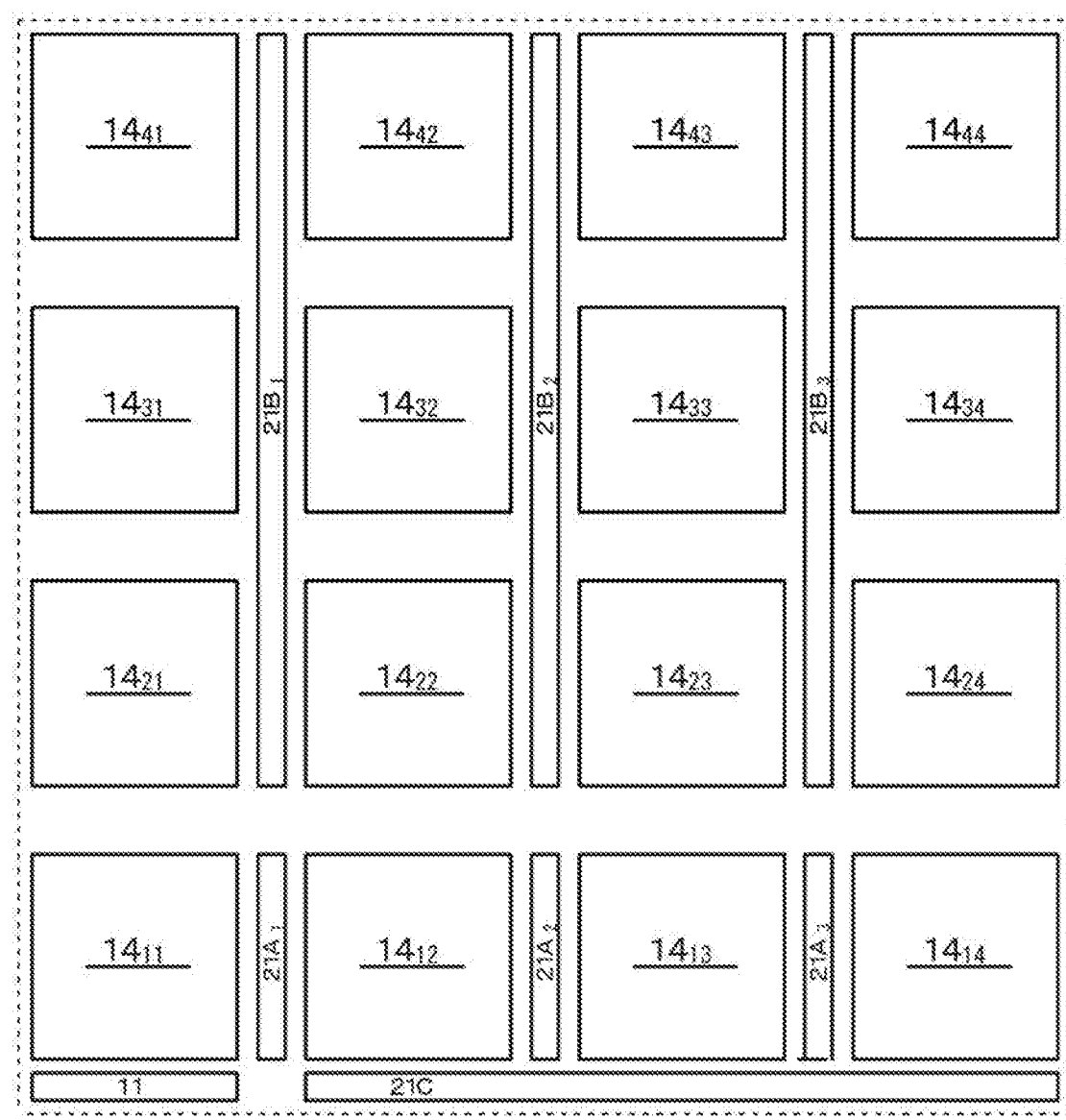
FIG. 82 is a schematic plan view of the first electrodes and the charge storage electrode segments in a ninth modified example of the solid-state imaging apparatus of Embodiment 19.

In an eighth modified example and a ninth modified example of FIGS. 81 and 82 schematically illustrating arrangement states of the first electrodes 11 and the charge storage electrodes 14, sixteen imaging elements are included in the imaging element block. As illustrated in FIGS. 81 and 82, charge movement control electrodes $21A_1$, $21A_2$, and $21A_3$ are arranged between the charge storage electrode $14_{11}$ and the charge storage electrode $14_{12}$, between the charge storage electrode $14_{12}$ and the charge storage electrode $14_{13}$, and between the charge storage electrode $14_{13}$ and the charge storage electrode $14_{14}$. In addition, as illustrated in FIG. 82, charge movement control electrodes $21B_1$, $21B_2$, and $21B_3$ are arranged between the charge storage electrodes $14_{21}$, $14_{31}$, and $14_{41}$ and the charge storage electrodes $14_{22}$, $14_{32}$, and $14_{42}$, between the charge storage electrodes $14_{22}$, $14_{32}$, and $14_{42}$ and the charge storage electrodes $14_{23}$, $14_{33}$, and $14_{43}$, and between the charge storage electrodes $14_{23}$, $14_{33}$, and $14_{43}$ and the charge storage electrodes $14_{24}$, $14_{34}$, and $14_{44}$. Furthermore, a charge movement control electrode 21C is arranged between the imaging element block and the imaging element block. Furthermore, in each of the solid-state imaging apparatuses, the sixteen charge storage electrodes 14 can be controlled to read the charge stored in the photoelectric conversion layer 13 from the first electrode 11.

[Step-10]

Specifically, the charge stored in the region of the photoelectric conversion layer 13 facing the charge storage electrode $14_{11}$ is read from the first electrode 11 first. Next, the charge stored in the region of the photoelectric conversion layer 13 facing the charge storage electrode $14_{12}$ is read from the first electrode 11 through the region of the photoelectric conversion layer 13 facing the charge storage electrode $14_{11}$. Next, the charge stored in the region of the photoelectric conversion layer 13 facing the charge storage electrode $14_{13}$ is read from the first electrode 11 through the region of the photoelectric conversion layer 13 facing the charge storage electrode $14_{12}$ and the charge storage electrode $14_{11}$.

[Step-20]

Subsequently, the charge stored in the region of the photoelectric conversion layer 13 facing the charge storage electrode $14_{21}$ is moved to the region of the photoelectric conversion layer 13 facing the charge storage electrode $14_{11}$. The charge stored in the region of the photoelectric conversion layer 13 facing the charge storage electrode $14_{22}$ is moved to the region of the photoelectric conversion layer 13 facing the charge storage electrode $14_{12}$. The charge stored in the region of the photoelectric conversion layer 13 facing the charge storage electrode $14_{23}$ is moved to the region of the photoelectric conversion layer 13 facing the charge storage electrode $14_{13}$. The charge stored in the region of the photoelectric conversion layer 13 facing the charge storage electrode $14_{24}$ is moved to the region of the photoelectric conversion layer 13 facing the charge storage electrode $14_{14}$.

[Step-21]

The charge stored in the region of the photoelectric conversion layer 13 facing the charge storage electrode $14_{31}$ is moved to the region of the photoelectric conversion layer 13 facing the charge storage electrode $14_{21}$. The charge stored in the region of the photoelectric conversion layer 13 facing the charge storage electrode $14_{32}$ is moved to the region of the photoelectric conversion layer 13 facing the charge storage electrode $14_{22}$. The charge stored in the region of the photoelectric conversion layer 13 facing the charge storage electrode $14_{33}$ is moved to the region of the photoelectric conversion layer 13 facing the charge storage electrode $14_{23}$. The charge stored in the region of the photoelectric conversion layer 13 facing the charge storage electrode $14_{34}$ is moved to the region of the photoelectric conversion layer 13 facing the charge storage electrode $14_{24}$.

[Step-22]

The charge stored in the region of the photoelectric conversion layer 13 facing the charge storage electrode $14_{41}$ is moved to the region of the photoelectric conversion layer 13 facing the charge storage electrode $14_{31}$. The charge stored in the region of the photoelectric conversion layer 13 facing the charge storage electrode $14_{42}$ is moved to the region of the photoelectric conversion layer 13 facing the charge storage electrode $14_{32}$. The charge stored in the region of the photoelectric conversion layer 13 facing the charge storage electrode $14_{43}$ is moved to the region of the photoelectric conversion layer 13 facing the charge storage electrode $14_{33}$. The charge stored in the region of the photoelectric conversion layer 13 facing the charge storage electrode $14_{44}$ is moved to the region of the photoelectric conversion layer 13 facing the charge storage electrode $14_{34}$.

[Step-30]

Furthermore, [step-10] can be executed again to read the charge stored in the region of the photoelectric conversion layer 13 facing the charge storage electrode $14_{21}$, the charge stored in the region of the photoelectric conversion layer 13 facing the charge storage electrode $14_{22}$, the charge stored in the region of the photoelectric conversion layer 13 facing the charge storage electrode $14_{23}$, and the charge stored in the region of the photoelectric conversion layer 13 facing the charge storage electrode $14_{24}$ through the first electrode 11.

[Step-40]

Subsequently, the charge stored in the region of the photoelectric conversion layer 13 facing the charge storage electrode $14_{21}$ is moved to the region of the photoelectric conversion layer 13 facing the charge storage electrode $14_{11}$. The charge stored in the region of the photoelectric conversion layer 13 facing the charge storage electrode $14_{22}$ is moved to the region of the photoelectric conversion layer 13 facing the charge storage electrode $14_{12}$. The charge stored in the region of the photoelectric conversion layer 13 facing the charge storage electrode $14_{23}$ is moved to the region of the photoelectric conversion layer 13 facing the charge storage electrode $14_{13}$. The charge stored in the region of the photoelectric conversion layer 13 facing the charge storage electrode $14_{24}$ is moved to the region of the photoelectric conversion layer 13 facing the charge storage electrode $14_{14}$.

[Step-41]

The charge stored in the region of the photoelectric conversion layer 13 facing the charge storage electrode $14_{31}$ is moved to the region of the photoelectric conversion layer 13 facing the charge storage electrode $14_{21}$. The charge stored in the region of the photoelectric conversion layer 13 facing the charge storage electrode $14_{32}$ is moved to the region of the photoelectric conversion layer 13 facing the charge storage electrode $14_{22}$. The charge stored in the region of the photoelectric conversion layer 13 facing the charge storage electrode $14_{33}$ is moved to the region of the photoelectric conversion layer 13 facing the charge storage electrode $14_{23}$. The charge stored in the region of the photoelectric conversion layer 13 facing the charge storage electrode $14_{34}$ is moved to the region of the photoelectric conversion layer 13 facing the charge storage electrode $14_{24}$.

[Step-50]

Furthermore, [step-10] can be executed again to read the charge stored in the region of the photoelectric conversion layer 13 facing the charge storage electrode $14_{31}$, the charge stored in the region of the photoelectric conversion layer 13 facing the charge storage electrode $14_{32}$, the charge stored in the region of the photoelectric conversion layer 13 facing the charge storage electrode $14_{33}$, and the charge stored in the region of the photoelectric conversion layer 13 facing the charge storage electrode $14_{34}$ through the first electrode 11.

[Step-60]

Subsequently, the charge stored in the region of the photoelectric conversion layer 13 facing the charge storage electrode $14_{21}$ is moved to the region of the photoelectric conversion layer 13 facing the charge storage electrode $14_{11}$. The charge stored in the region of the photoelectric conversion layer 13 facing the charge storage electrode $14_{22}$ is moved to the region of the photoelectric conversion layer 13 facing the charge storage electrode $14_{12}$. The charge stored in the region of the photoelectric conversion layer 13 facing the charge storage electrode $14_{23}$ is moved to the region of the photoelectric conversion layer 13 facing the charge storage electrode $14_{13}$. The charge stored in the region of the photoelectric conversion layer 13 facing the charge storage electrode $14_{24}$ is moved to the region of the photoelectric conversion layer 13 facing the charge storage electrode $14_{14}$.

[Step-70]

Furthermore, [step-10] can be executed again to read the charge stored in the region of the photoelectric conversion layer 13 facing the charge storage electrode $14_{41}$, the charge stored in the region of the photoelectric conversion layer 13 facing the charge storage electrode $14_{42}$, the charge stored in the region of the photoelectric conversion layer 13 facing the charge storage electrode $14_{43}$, and the charge stored in the region of the photoelectric conversion layer 13 facing the charge storage electrode $14_{44}$ through the first electrode 11.

In the solid-state imaging apparatus of Embodiment 19, the first electrode is shared by the plurality of imaging elements included in the imaging element block. This can simplify and miniaturize the configuration and the structure in the pixel region in which the plurality of imaging elements are arrayed. Note that the plurality of imaging elements provided for one floating diffusion layer may include a plurality of imaging elements of first type or may include at least one imaging element of first type or one or two or more imaging elements of second type.

Embodiment 20

Embodiment 20 is a modification of Embodiment 19. In a solid-state imaging apparatus of Embodiment 20 in FIGS. 84, 85, 86, and 87 schematically illustrating arrangement states of the first electrodes 11 and the charge storage electrodes 14, two imaging elements are included in the imaging element block. In addition, one on-chip micro lens 90 is arranged on the upper side of the imaging element block. Note that in the examples illustrated in FIGS. 85 and 87, the charge movement control electrode 21 is arranged between the plurality of imaging elements included in the imaging element block.

For example, the photoelectric conversion layers corresponding to the charge storage electrodes $14_{11}$, $14_{21}$, $14_{31}$, and $14_{41}$ included in the imaging element blocks are highly sensitive to the incident light from the upper right in the drawings. In addition, the photoelectric conversion layers corresponding to the charge storage electrodes $14_{12}$, $14_{22}$, $14_{32}$, and $14_{42}$ included in the imaging element blocks are highly sensitive to the incident light from the upper left in the drawings. Therefore, for example, the imaging element including the charge storage electrode $14_{11}$ and the imaging element including the charge storage electrode $14_{12}$ can be combined to acquire an image plane phase difference signal. In addition, the signal from the imaging element including the charge storage electrode $14_{11}$ and the signal from the imaging element including the charge storage electrode $14_{12}$ can be added, and the combination of the imaging elements can provide one imaging element. Although the first electrode $11_1$ is arranged between the charge storage electrode $14_{11}$ and the charge storage electrode $14_{12}$ in the example illustrated in FIG. 84, one first electrode $11_1$ can be arranged to face two charge storage electrodes $14_{11}$ and $14_{12}$ arranged side by side as in the example illustrated in FIG. 86 to thereby further improve the sensitivity.

Although the present disclosure has been described based on the preferred Embodiments, the present disclosure is not limited to these Embodiments. The structures, the configurations, the manufacturing conditions, the manufacturing methods, and the used materials of the imaging elements, the stacked imaging elements, and the solid-state imaging apparatuses described in Embodiments are illustrative and can be appropriately changed. The imaging elements of Embodiments can be appropriately combined. For example, the imaging element of Embodiment 13, the imaging element of Embodiment 14, the imaging element of Embodiment 15, the imaging element of Embodiment 16, and the imaging element of Embodiment 17 can be arbitrarily combined, and the imaging element of Embodiment 13, the imaging element of Embodiment 14, the imaging element of Embodiment 15, the imaging element of Embodiment 16, and the imaging element of Embodiment 18 can be arbitrarily combined.

The floating diffusion layers $FD_1$, $FD_{21}$, $FD_3$, 51C, 45C, and 46C can also be shared depending on the case.

Figure 88:
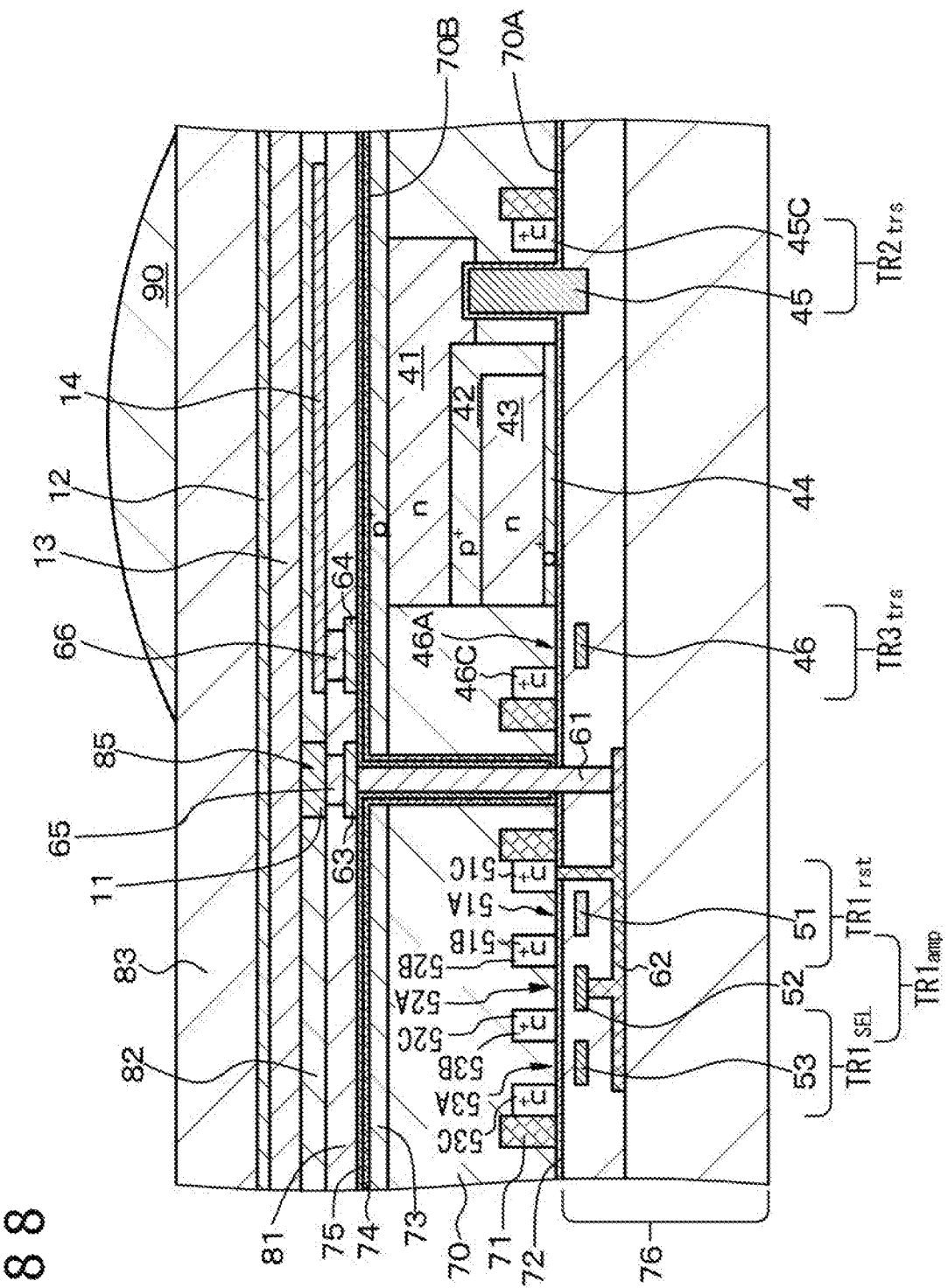
FIG. 88 is a schematic partial cross-sectional view of another modified example of the imaging element and the stacked imaging element of Embodiment 1.

As in a modified example of the imaging element and the stacked imaging element described in Embodiment 1 illustrated for example in FIG. 88, the first electrode 11 may extend in an opening portion 84A provided in the insulating layer 82, and the first electrode 11 may be connected to the photoelectric conversion layer 13.

Figure 89:
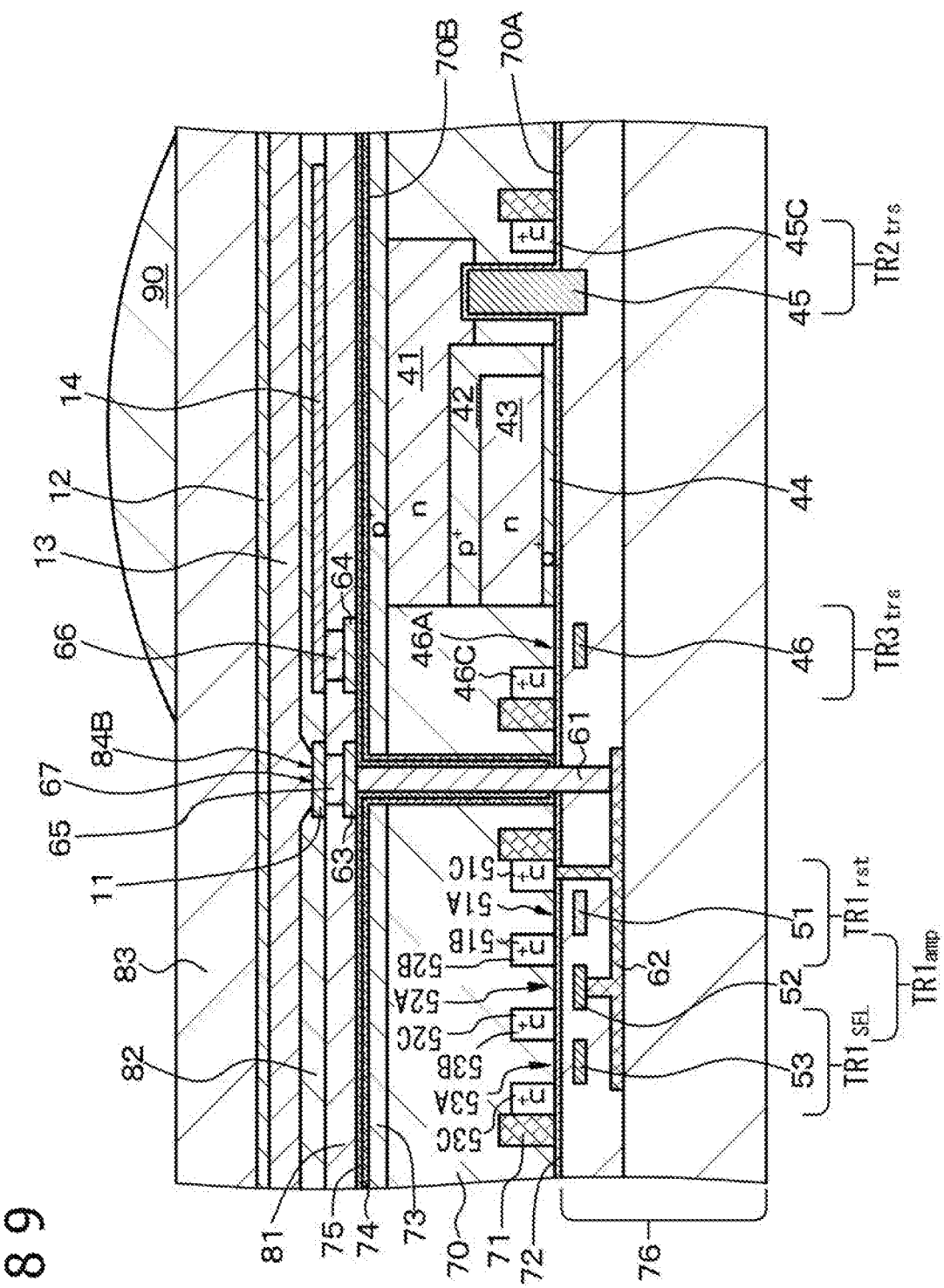
FIG. 89 is a schematic partial cross-sectional view of yet another modified example of the imaging element and the stacked imaging element of Embodiment 1.
Figure 90A:
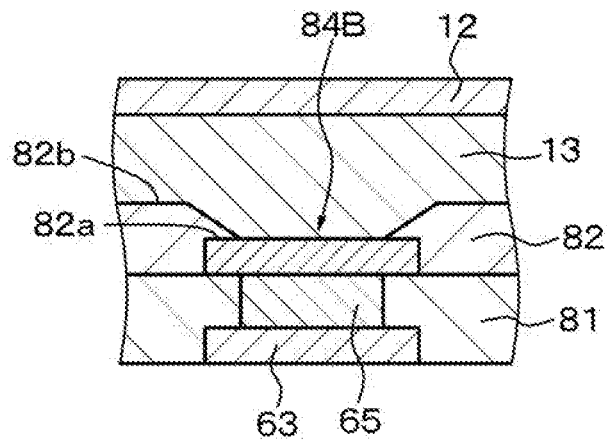
FIGS. 90A, 90B, and 90C are enlarged schematic partial cross-sectional views of the parts of the first electrodes and the like in yet another modified example of the imaging element and the stacked imaging element of Embodiment 1.
Figure 90B:
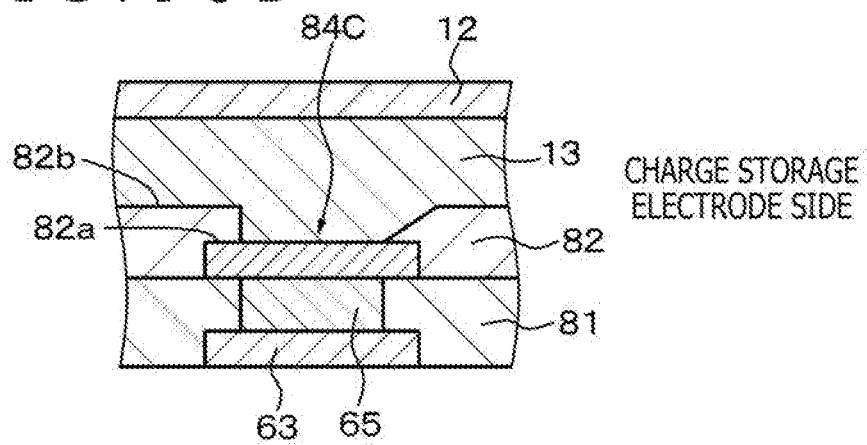
Figure 90C:
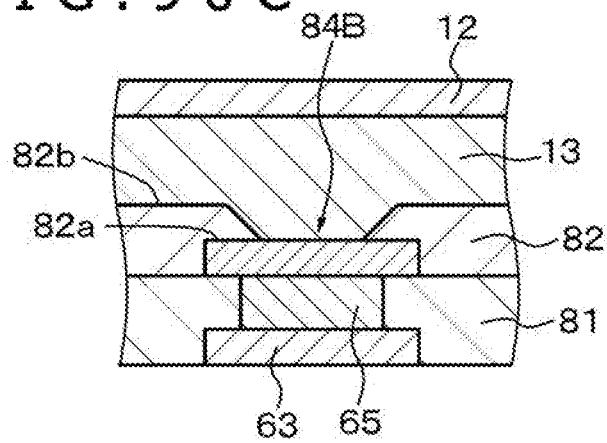

Alternatively, as in a modified example of the imaging element and the stacked imaging element described in Embodiment 1 illustrated for example in FIG. 89 and as in an enlarged schematic partial cross-sectional view of the part and the like of the first electrode illustrated in FIG. 90A, the edge portion of the top surface of the first electrode 11 is covered by the insulating layer 82, and the first electrode 11 is exposed on the bottom surface of an opening portion 84B. The side surface of the opening portion 84B has a slope extending from a first surface 82a toward a second surface 82b, in which the first surface 82a is a surface of the insulating layer 82 in contact with the top surface of the first electrode 11, and the second surface 82b is a surface of the insulating layer 82 in contact with the part of the photoelectric conversion layer 13 facing the charge storage electrode 14. In this way, the side surface of the opening portion 84B is sloped, and the charge more smoothly moves from the photoelectric conversion layer 13 to the first electrode 11. Note that although the side surface of the opening portion 84B has rotational symmetry with respect to the axis of the opening portion 84B in the example illustrated in FIG. 90A, an opening portion 84C may be provided such that the side surface of the opening portion 84C sloped to extend from the first surface 82a toward the second surface 82b is positioned closer to the charge storage electrode 14 as illustrated in FIG. 90B. This makes the movement of charge difficult from the part of the photoelectric conversion layer 13 on the opposite side of the charge storage electrode 14 with respect to the opening portion 84C. In addition, although the side surface of the opening portion 84B is sloped to extend from the first surface 82a toward the second surface 82b, the edge portion of the side surface of the opening portion 84B in the second surface 82b may be positioned outside the edge portion of the first electrode 11 as illustrated in FIG. 90A or may be positioned inside the edge portion of the first electrode 11 as illustrated in FIG. 90C. The former configuration can be adopted to more easily transfer the charge, and the latter configuration can be adopted to reduce the variations in the shape during the formation of the opening portions.

A reflow of an etching mask including a resist material formed to form the opening portion in the insulating layer based on an etching method can slope the opening side surface of the etching mask, and the etching mask can be used to etch the insulating layer 82 to form the opening portions 84B and 84C.

Figure 91:
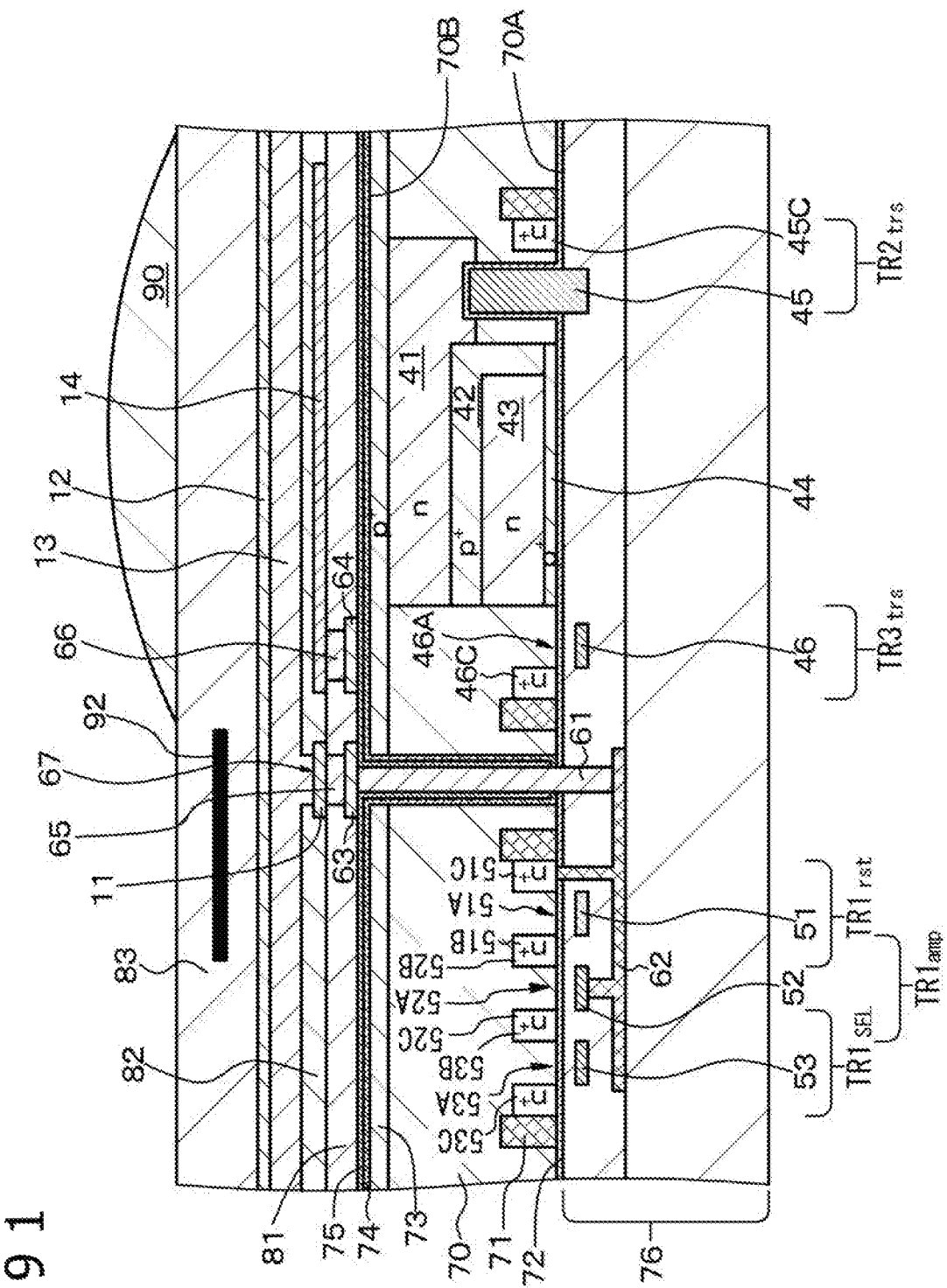
FIG. 91 is a schematic partial cross-sectional view of yet another modified example of the imaging element and the stacked imaging element of Embodiment 1.

In addition, as in a modified example of the imaging element and the stacked imaging element described in Embodiment 1 illustrated for example in FIG. 91, the light may be incident from the second electrode 12 side, and a light shielding layer 92 may be formed on the light incident side closer to the second electrode 12. Note that various wires provided on the light incident side with respect to the photoelectric conversion layer may also function as a light shielding layer.

Figure 92:
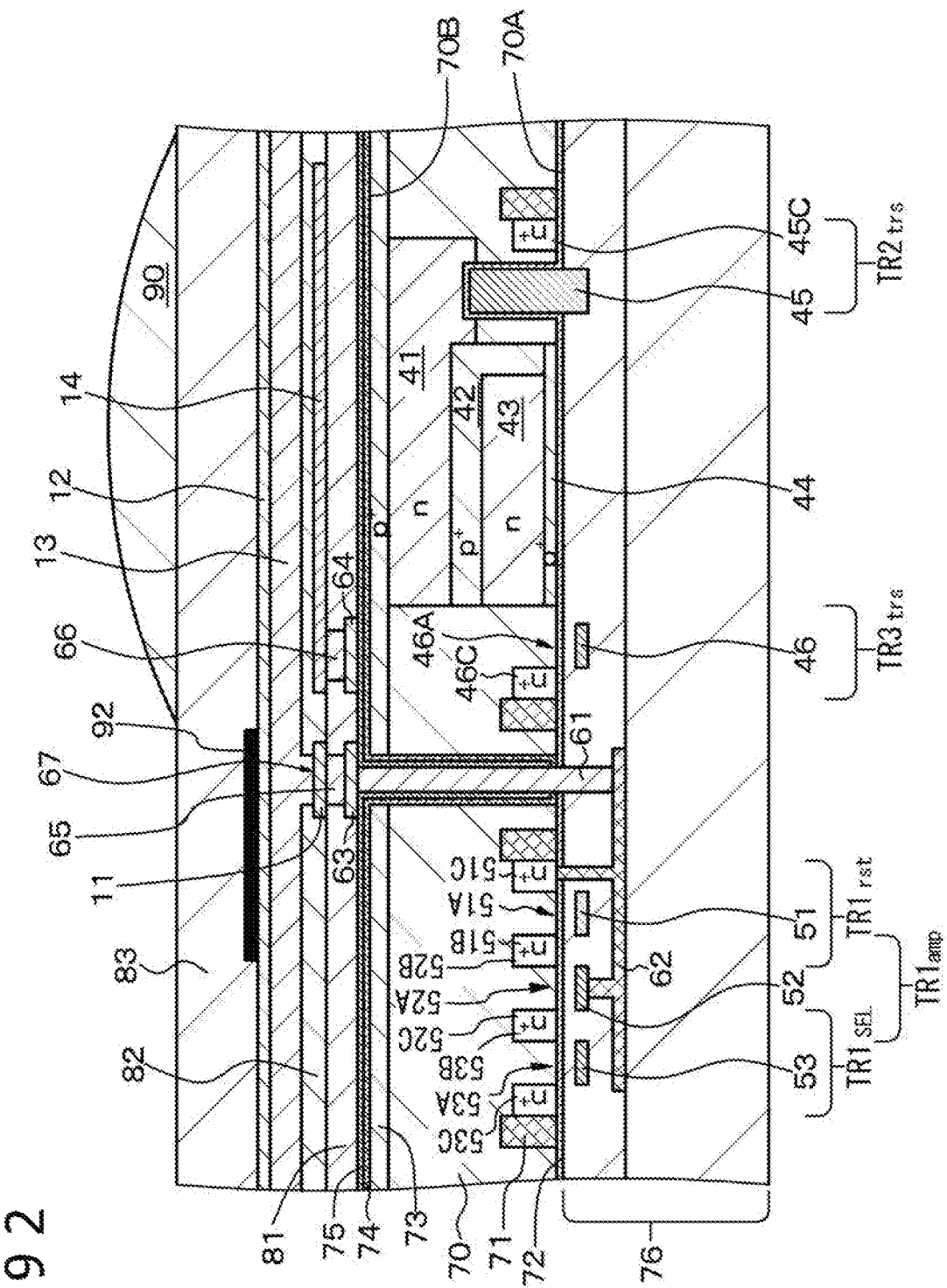
FIG. 92 is a schematic partial cross-sectional view of yet another modified example of the imaging element and the stacked imaging element of Embodiment 1.
Figure 93:
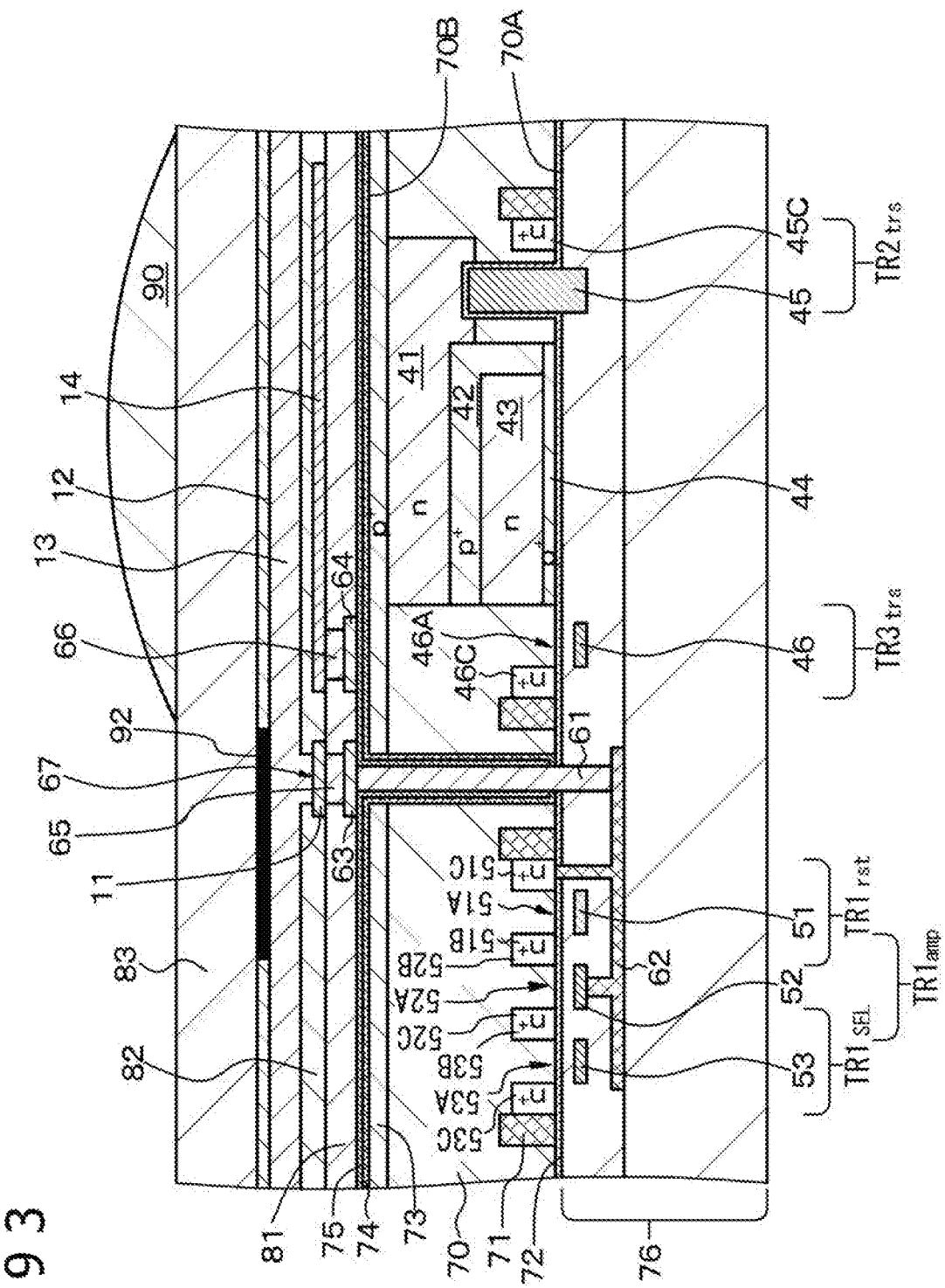
FIG. 93 is a schematic partial cross-sectional view of yet another modified example of the imaging element and the stacked imaging element of Embodiment 1.

Note that although the light shielding layer 92 is formed on the upper side of the second electrode 12 in the example illustrated in FIG. 91, that is, although the light shielding layer 92 is formed on the light incident side closer to the second electrode 12 and on the upper side of the first electrode 11, the light shielding layer 92 may be arranged on the surface on the light incident side of the second electrode 12 as illustrated in FIG. 92. In addition, the light shielding layer 92 may be formed on the second electrode 12 as illustrated in FIG. 93 depending on the case.

Figure 94:
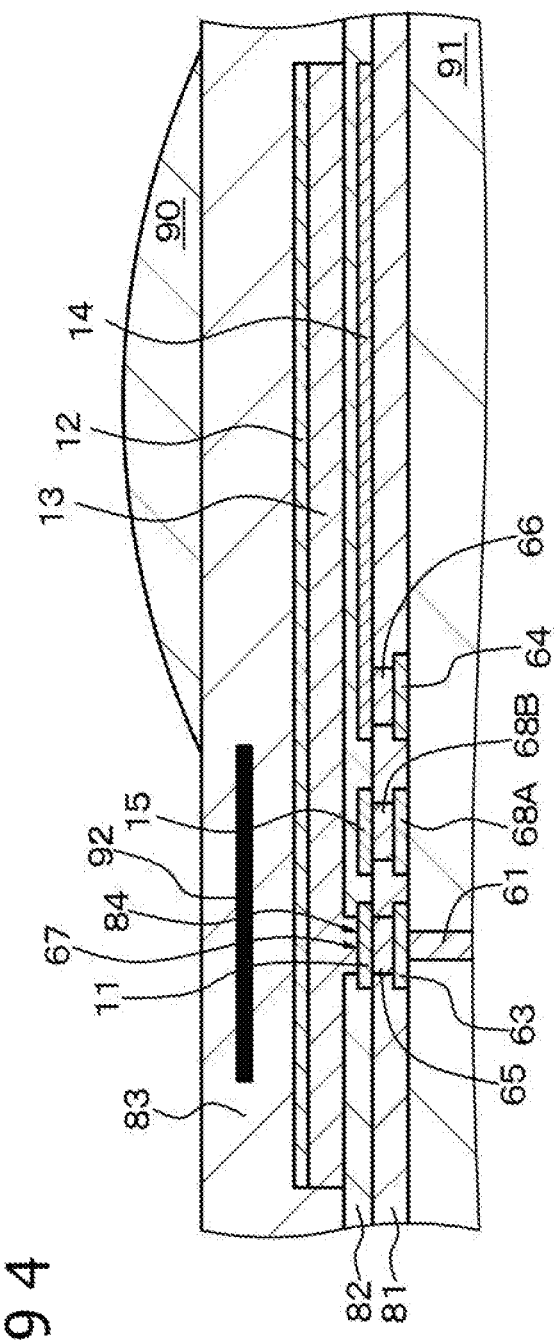
FIG. 94 is a schematic partial cross-sectional view of another modified example of the imaging element and the stacked imaging element of Embodiment 11.
Figure 95:
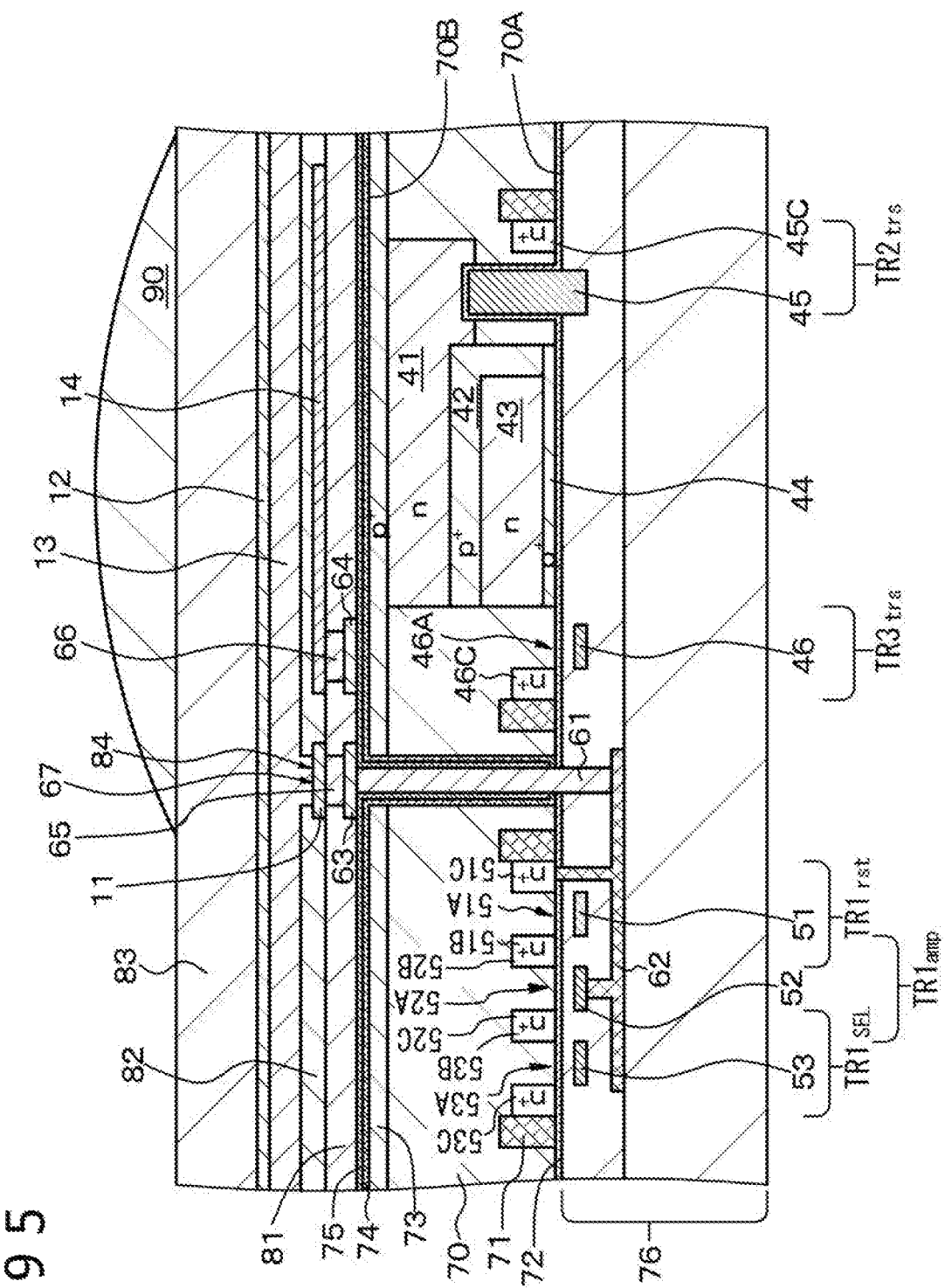
FIG. 95 is a schematic partial cross-sectional view of yet another modified example of the imaging element and the stacked imaging element of Embodiment 1.

Alternatively, the light may be incident from the second electrode 12 side, and the light may not be incident on the first electrode 11. Specifically, as illustrated in FIG. 91, the light shielding layer 92 is formed on the light incident side closer to the second electrode 12 and on the upper side of the first electrode 11. Alternatively, as illustrated in FIG. 95, the on-chip micro lens 90 may be provided on the upper side of the charge storage electrode 14 and the second electrode 12. The light incident on the on-chip micro lens 90 may be collected by the charge storage electrode 14, and the light may not reach the first electrode 11. Note that in the case where the transfer control electrode 15 is provided as described in Embodiment 11, the light may not be incident on the first electrode 11 and the transfer control electrode 15. Specifically, as illustrated in FIG. 94, the light shielding layer 92 may be formed on the upper side of the first electrode 11 and the transfer control electrode 15. Alternatively, the light incident on the on-chip micro lens 90 may not reach the first electrode 11 or may not reach the first electrode 11 and the transfer control electrode 15.

These configurations and the structures can be adopted. Alternatively, the light shielding layer 92 can be provided so that the light is incident on only the part of the photoelectric conversion layer 13 positioned on the upper side of the charge storage electrode 14. Alternatively, the on-chip micro lens 90 can be designed. In this way, the part of the photoelectric conversion layer 13 positioned on the upper side of the first electrode 11 (or the upper side of the first electrode 11 and the transfer control electrode 15) does not contribute to the photoelectric conversion. Therefore, all of the pixels can be more certainly reset all at once, and the global shutter function can be more easily realized. That is, in a driving method of the solid-state imaging apparatus including a plurality of imaging elements with the configurations and the structures, the following steps are repeated:

releasing the charge in the first electrodes 11 all at once to the outside the system while storing the charge in the photoelectric conversion layer 13 in all of the imaging elements; and subsequently, transferring the charge stored in the photoelectric conversion layer 13 all at once to the first electrodes 11 in all of the imaging elements, and after the completion of the transfer, the imaging elements sequentially read the charge transferred to the first electrodes 11.

In the driving method of the solid-state imaging apparatus, the light incident from the second electrode side is not incident on the first electrode in each imaging element. The charge in the first electrodes is released all at once to the outside the system while the charge is stored in the photoelectric conversion layer in all of the imaging elements. Therefore, the first electrodes can be certainly reset at the same time in all of the imaging elements. In addition, subsequently, the charge stored in the photoelectric conversion layer is transferred to the first electrodes all at once in all of the imaging elements. After the completion of the transfer, the imaging elements sequentially read the charge transferred to the first electrodes. Therefore, the so-called global shutter function can be easily realized.

Figure 96:
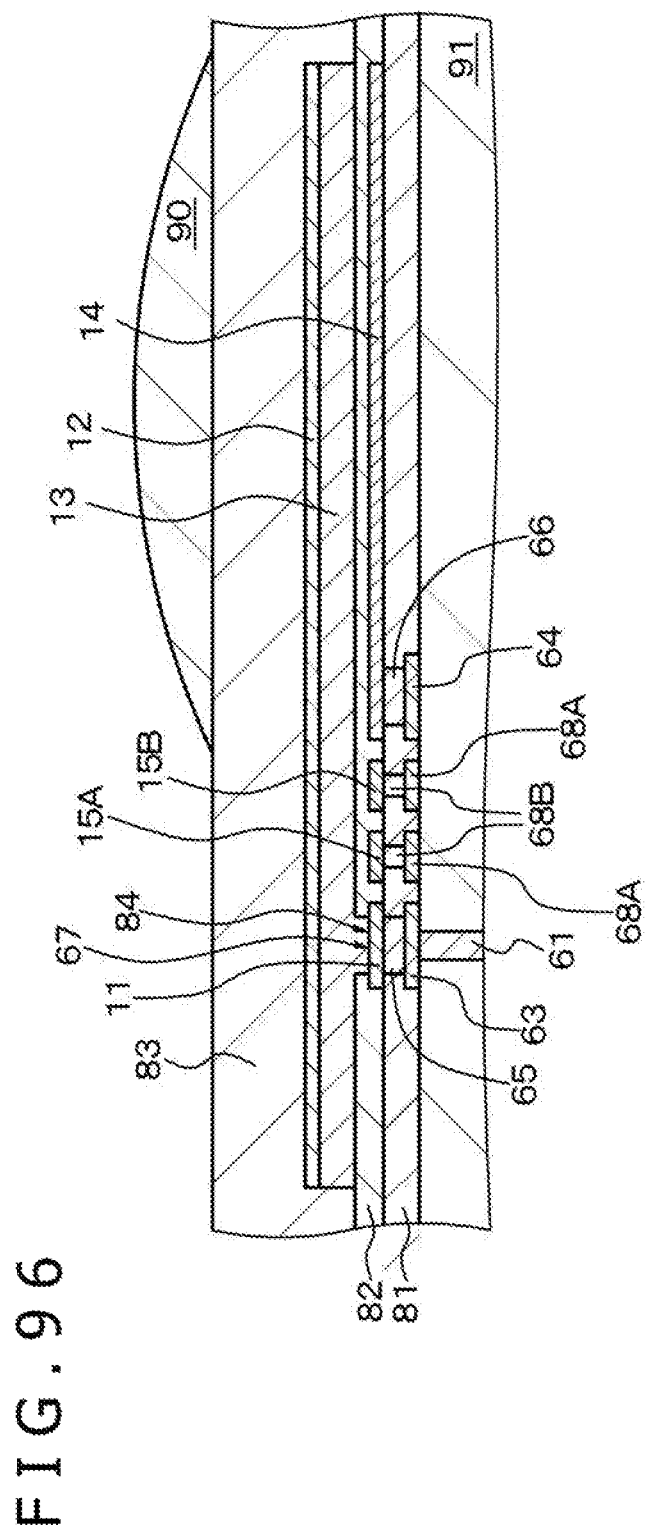
FIG. 96 is a schematic partial cross-sectional view of yet another modified example of the imaging element and the stacked imaging element of Embodiment 1.

Furthermore, in a modified example of Embodiment 11, a plurality of transfer control electrodes may be provided from positions closest to the first electrode 11 toward the charge storage electrode 14 as illustrated in FIG. 95. Note that FIG. 96 illustrates an example of providing two transfer control electrodes 15A and 15B. Furthermore, the on-chip micro lens 90 may be provided on the upper side of the charge storage electrode 14 and the second electrode 12. The light incident on the on-chip micro lens 90 may be collected by the charge storage electrode 14, and the light may not reach the first electrode 11 and the transfer control electrodes 15A and 15B.

Figure 97:
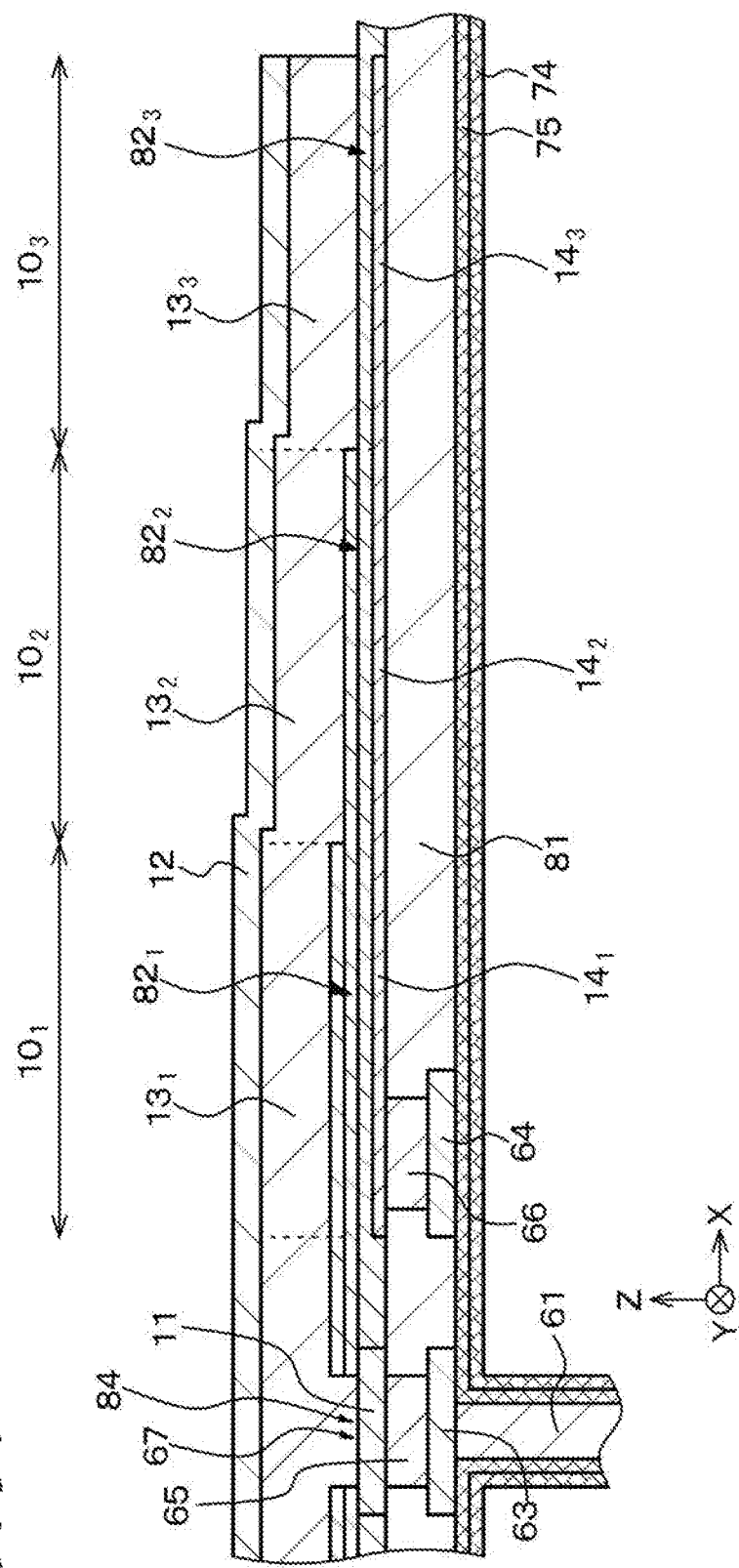
FIG. 97 is an enlarged schematic partial cross-sectional view of the part where the charge storage electrode, the photoelectric conversion layer, and the second electrode are stacked in a modified example of the imaging element of Embodiment 13.

In Embodiment 13 illustrated in FIGS. 61 and 62, the thicknesses of the charge storage electrode segments $14_1$, $14_2$, and $14_3$ are gradually reduced to gradually increase the thicknesses of the insulating layer segments $82_1$, $82_2$, and $82_3$. On the other hand, as in FIG. 97 illustrating an enlarged schematic partial cross-sectional view of the stacked part of the charge storage electrode, the photoelectric conversion layer, and the second electrode in a modified example of Embodiment 13, the thicknesses of the charge storage electrode segments $14_1$, $14_2$, and $14_3$ may be constant, and the thicknesses of the insulating layer segments $82_1$, $82_2$, and $82_3$ may be gradually increased. Note that the thicknesses of the photoelectric conversion layer segments $13_1$, $13_2$, and $13_3$ are constant.

Figure 98:
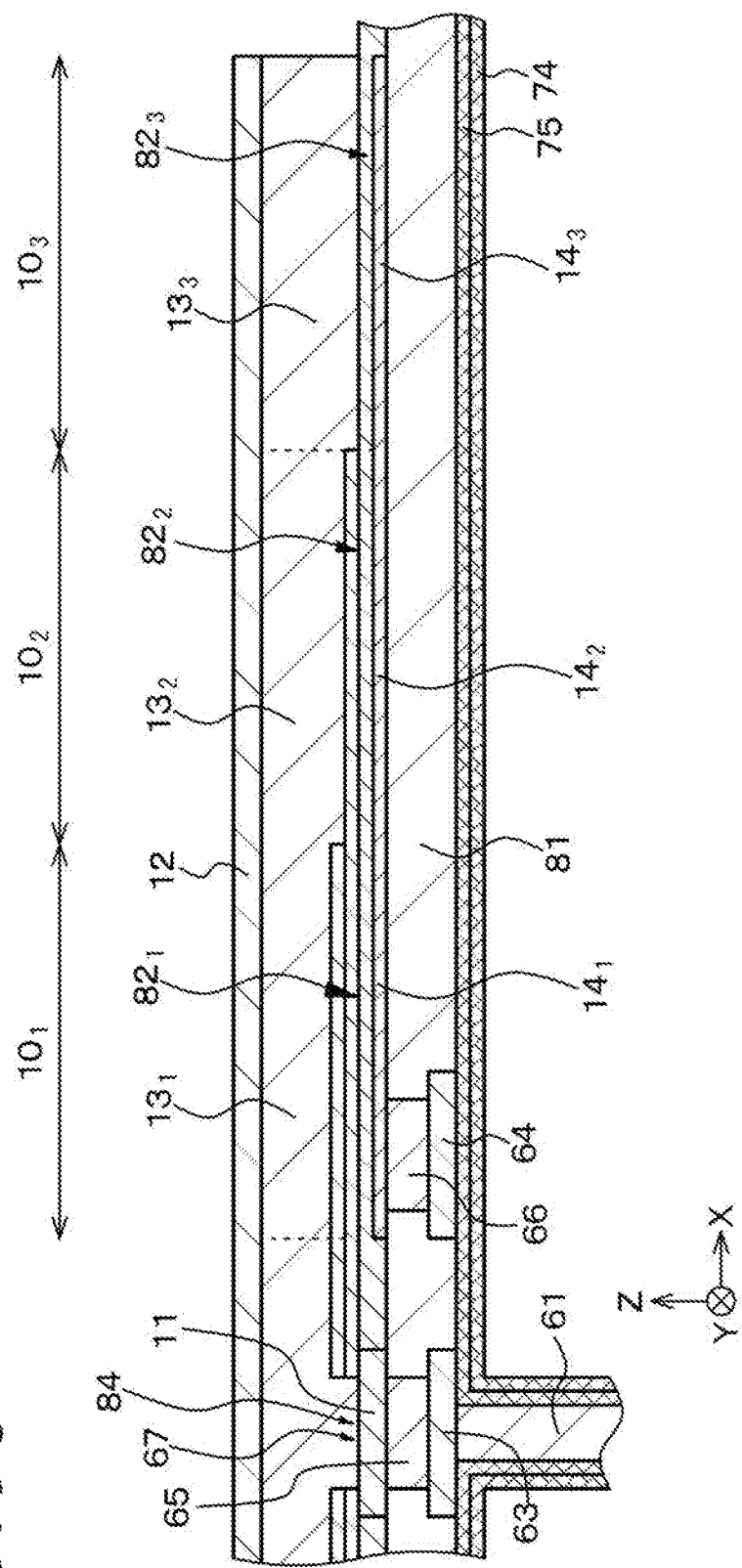
FIG. 98 is an enlarged schematic partial cross-sectional view of the part where the charge storage electrode, the photoelectric conversion layer, and the second electrode are stacked in a modified example of the imaging element of Embodiment 14.

Furthermore, in Embodiment 14 illustrated in FIG. 64, the thicknesses of the charge storage electrode segments $14_1$, $14_2$, and $14_3$ are gradually reduced to gradually increase the thicknesses of the photoelectric conversion layer segments $13_1$, $13_2$, and $13_3$. On the other hand, as in FIG. 98 illustrating an enlarged schematic partial cross-sectional view of the stacked part of the charge storage electrode, the photoelectric conversion layer, and the second electrode in a modified example of Embodiment 14, the thicknesses of the charge storage electrode segments $14_1$, $14_2$, and $14_3$ may be constant, and the thicknesses of the insulating layer segments $82_1$, $82_2$, and $82_3$ may be gradually reduced to gradually increase the thicknesses of the photoelectric conversion layer segments $13_1$, $13_2$, and $13_3$.

It is obvious that various modified examples described above can also be applied to Embodiments other than Embodiment 1.

Although the electrons are the signal charge, and the conductivity type of the photoelectric conversion layer formed on the semiconductor substrate is the n-type in Embodiments, Embodiments can also be applied to a solid-state imaging apparatus in which the electron holes are the signal charge. In this case, each semiconductor region can be a semiconductor region of the opposite conductivity type, and the conductivity type of the photoelectric conversion layer formed on the semiconductor substrate can be the p-type.

Furthermore, in the examples described above, Embodiments are applied to the CMOS solid-state imaging apparatus, in which the unit pixels that detect the signal charge as a physical quantity according to the incident light amount are arranged in a matrix. However, Embodiments are not limited to the application to the CMOS solid-state imaging apparatus, and Embodiments can also be applied to the CCD solid-state imaging apparatus. In the latter case, a vertical transfer register of CCD structure transfers the signal charge in the vertical direction, and a horizontal transfer register transfers the signal charge in the horizontal direction. The charge is amplified, and a pixel signal (image signal) is output. In addition, Embodiments are not limited to the column-type solid-state imaging apparatuses in general, in which the pixels are formed in a two-dimensional matrix, and a column signal processing circuit is arranged for each pixel column. Furthermore, the selection transistor may not be included depending on the case.

Furthermore, the imaging element and the stacked imaging element of the present disclosure are not limited to the application to the solid-state imaging apparatus that detects the distribution of the incident light amount of visible light to obtain an image of the distribution. The imaging element and the stacked imaging element can also be applied to a solid-state imaging apparatus that takes an image of the distribution of the incident amount of infrared rays, X rays, particles, or the like. Furthermore, in a broad sense, the imaging element and the stacked imaging element can be applied to solid-state imaging apparatuses (physical quantity distribution detection apparatuses) in general, such as a fingerprint detection sensor, that detects the distribution of another physical quantity, such as pressure and capacitance, to obtain an image of the distribution.

Furthermore, the imaging element and the stacked imaging element are not limited to the solid-state imaging apparatus that sequentially scans the unit pixels of the imaging region row-by-row to read the pixel signals from the unit pixels. The imaging element and the stacked imaging element can also be applied to an X-Y address type solid-state imaging apparatus that selects arbitrary pixels pixel-by-pixel and that reads the pixel signals pixel-by-pixel from the selected pixels. The solid-state imaging apparatus may be formed as one chip or may be in a form of a module with an imaging function in which the imaging region and the drive circuit or the optical system are packaged together.

In addition, the imaging element and the stacked imaging element are not limited to the application to the solid-state imaging apparatus, and the imaging element and the stacked imaging element can also be applied to an imaging apparatus. Here, the imaging apparatus denotes a camera system, such as a digital still camera and a video camera, or an electronic device with an imaging function, such as a cell phone. The imaging apparatus is in a form of a module mounted on the electronic device, that is, a camera module, in some cases.

Figure 99A:
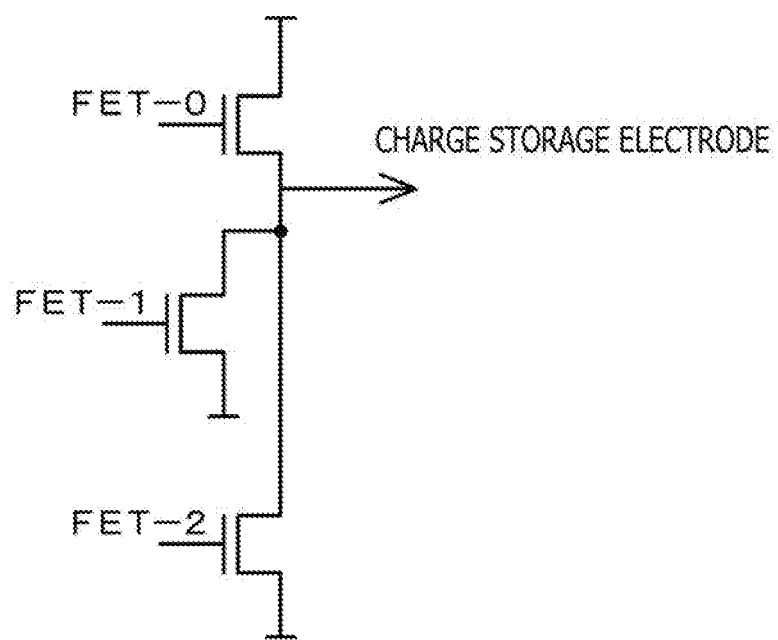
FIGS. 99A and 99B are equivalent circuit diagrams of modified examples of the transistors that drive the charge storage electrodes.
Figure 99B:
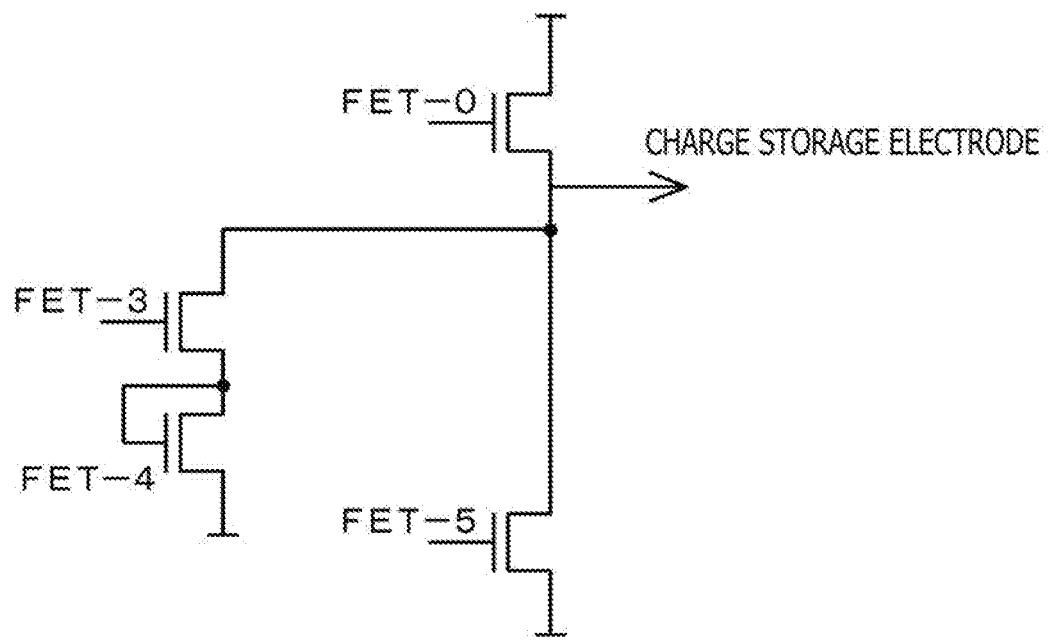
Figure 100A:
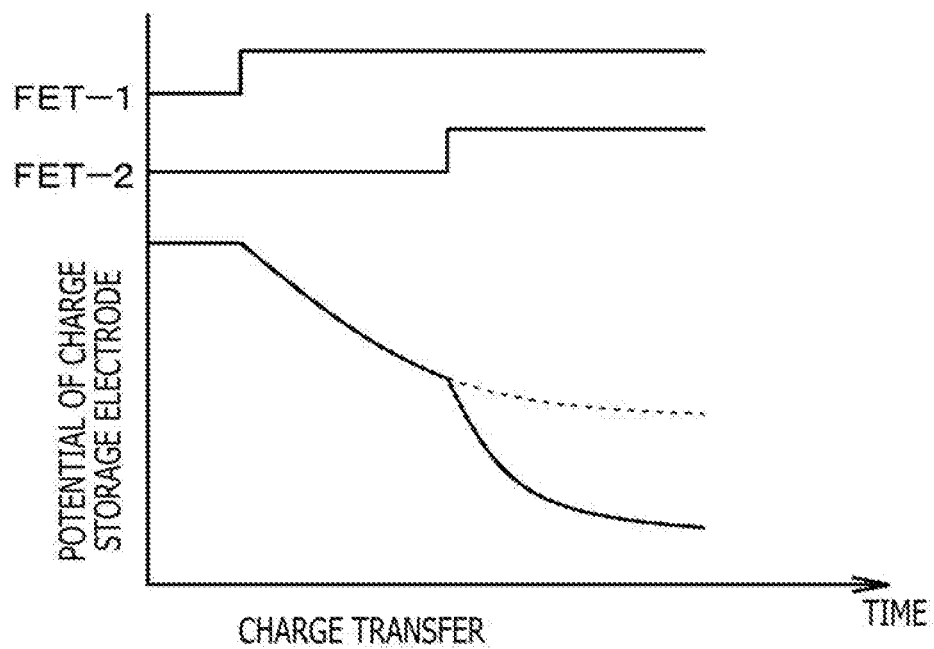
FIGS. 100A and 100B are diagrams schematically illustrating waveforms of pulses that drive the transistors in the equivalent circuits illustrated in FIGS. 99A and 99B.
Figure 100B:
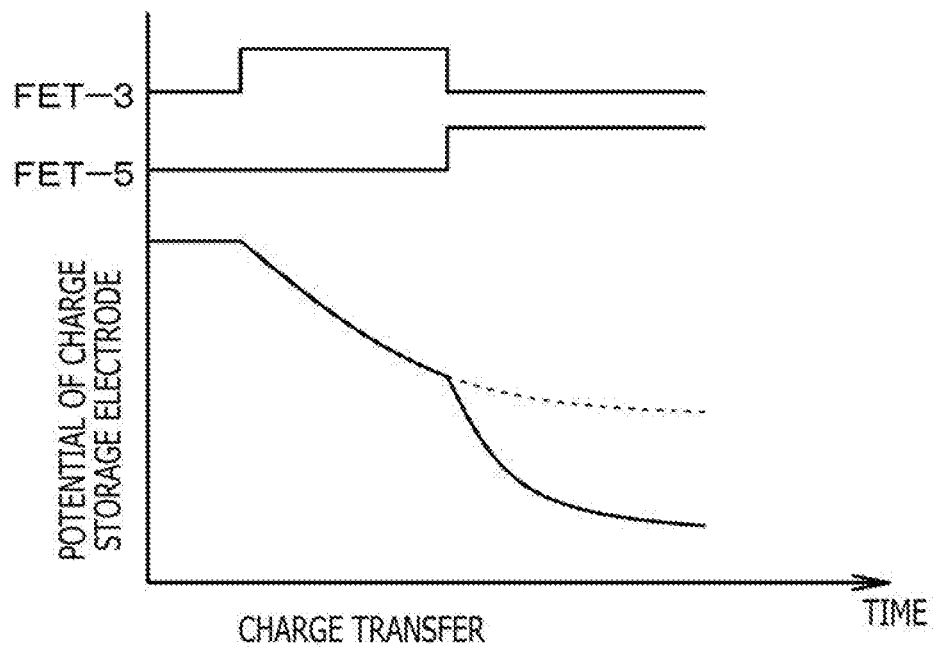

FIGS. 99A and 99B illustrate equivalent circuit diagrams of modified examples of the transistors that drive the charge storage electrodes. FIGS. 100A and 100B schematically illustrate waveforms of pulses for driving the transistors in the equivalent circuits illustrated in FIGS. 99A and 99B. The horizontal axis of FIGS. 100A and 100B indicates the time, and the vertical axis indicates the potential of the charge storage electrode 14. One transistor usually applies the potential to the charge storage electrode 14. Note that the operation of the transistor applying the potential to the charge storage electrode 14 will be expressed as "the charge storage electrode 14 is driven by the transistor." On the other hand, in the example illustrated in FIGS. 99A and 100A, two transistors (FET-1, FET-2) drive the charge storage electrode 14. Furthermore, in the initial stage of the charge transfer period, the charge storage electrode 14 is driven by one transistor (FET-1), and in the later stage of the charge transfer period, the charge storage electrode 14 is driven by two transistors (FET-1, FET-2) at the same time. Note that reference sign "FET-0" denotes a transistor for control. In the example illustrated in FIGS. 99B and 100B, the charge storage electrode 14 is driven by a transistor with large driving capability (FET-5) and a transistor with small driving capability (FET-3). Specifically, the charge storage electrode 14 is driven by the transistor with small driving capability (FET-3) in the initial stage of the charge transfer period, and the charge storage electrode 14 is driven by the transistor with large driving capability (FET-5) in the later stage of the charge transfer period. Note that reference sign "FET-4" denotes a MOS diode. The magnitude of the driving capability of the transistor is defined by, for example, the channel width of the transistor. Based on the configuration, the charge storage electrode 14 can be driven by one transistor or by a transistor with small driving capability when there is a large amount of charge to be transferred. In this way, the generation of blooming can be suppressed. When there is no more concern for the generation of blooming, the charge storage electrode 14 can be driven by two transistors or by a transistor with large driving capability (or by a transistor with large driving capability and a transistor with small driving capability). This can increase the charge transfer speed (reduce the charge transfer time).

Figure 101:
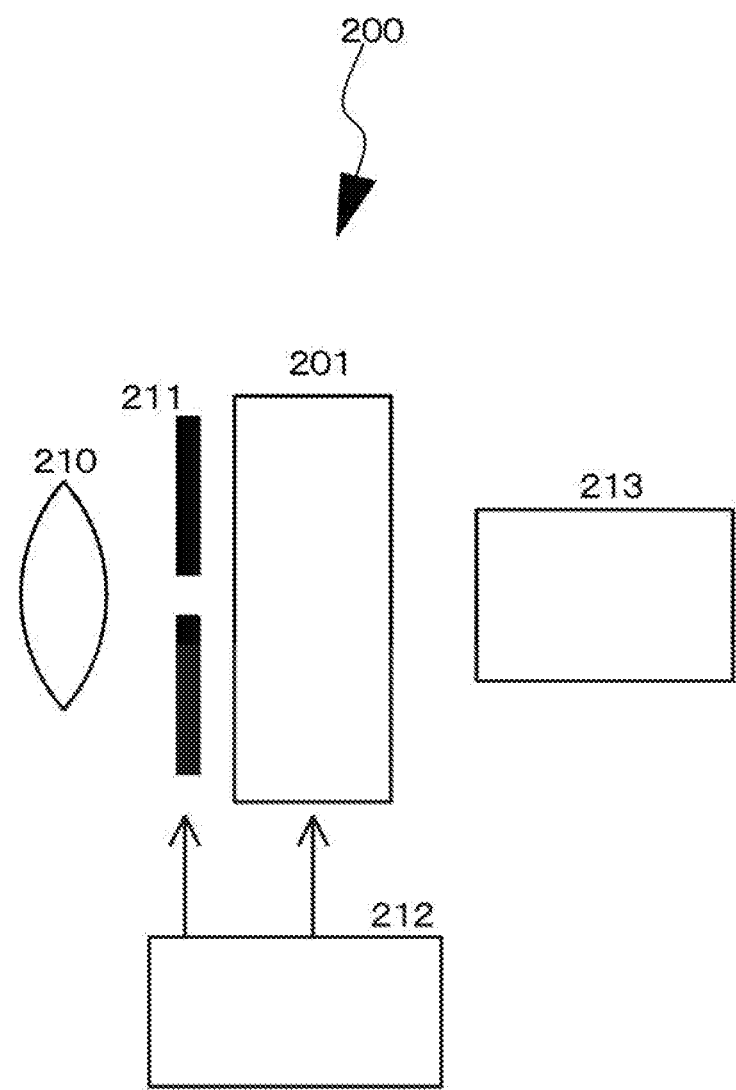
FIG. 101 is a conceptual diagram of an example in which the solid-state imaging apparatus including the imaging elements and the stacked imaging elements of the present disclosure is used in an electronic device (camera).
Figure 102:
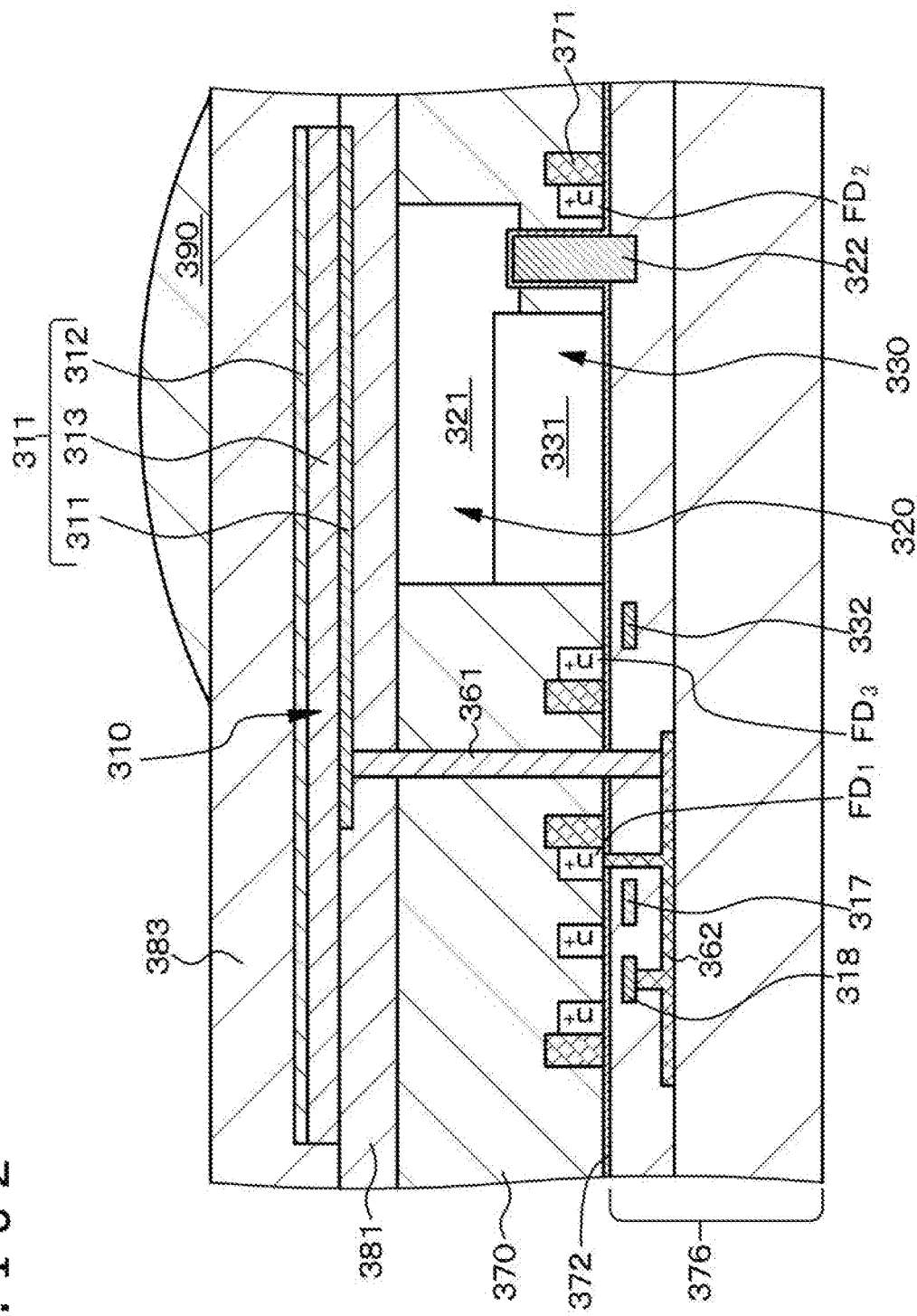
FIG. 102 is a conceptual diagram of a conventional stacked imaging element (stacked solid-state imaging apparatus).

FIG. 101 illustrates a conceptual diagram of an example in which a solid-state imaging apparatus 201 including the imaging element and the stacked imaging element of the present disclosure is used in an electronic device (camera) 200. The electronic device 200 includes the solid-state imaging apparatus 201, an optical lens 210, a shutter apparatus 211, a drive circuit 212, and a signal processing circuit 213. The optical lens 210 uses image light (incident light) from an object to form an image on the imaging surface of the solid-state imaging apparatus 201. As a result, signal charge is stored in the solid-state imaging apparatus 201 for a certain period. The shutter apparatus 211 controls a light application period and a light shielding period for the solid-state imaging apparatus 201. The drive circuit 212 supplies drive signals for controlling a transfer operation and the like of the solid-state imaging apparatus 201 and a shutter operation of the shutter apparatus 211. The signal of the solid-state imaging apparatus 201 is transferred based on the drive signal (timing signal) supplied from the drive circuit 212. The signal processing circuit 213 executes various types of signal processing. The video signal after the signal processing is stored in a storage medium, such as a memory, or output to a monitor. In the electronic device 200, the pixel size in the solid-state imaging apparatus 201 can be miniaturized, and the transfer efficiency can be improved. Therefore, the pixel characteristics can be improved in the electronic device 200. The electronic device 200 to which the solid-state imaging apparatus 201 can be applied is not limited to the camera. The solid-state imaging apparatus 201 can be applied to a digital still camera, a camera module for mobile device, such as a cell phone, and other imaging apparatuses.

Note that the present disclosure can also be configured as follows.

[A01] <<Imaging Element: First Aspect>

An imaging element including:

a photoelectric conversion unit including a first electrode, a photoelectric conversion layer, and a second electrode that are stacked, in which the photoelectric conversion unit further includes a charge storage electrode arranged apart from the first electrode and arranged to face the photoelectric conversion layer through an insulating layer, and when photoelectric conversion occurs in the photoelectric conversion layer after light enters the photoelectric conversion layer, an absolute value of a potential applied to a part of the photoelectric conversion layer facing the charge storage electrode is a value larger than an absolute value of a potential applied to a region of the photoelectric conversion layer positioned between the imaging element and an adjacent imaging element.

[A02] <<Imaging Element: Second Aspect>>

An imaging element including:

a photoelectric conversion unit including a first electrode, a photoelectric conversion layer, and a second electrode that are stacked, in which the photoelectric conversion unit further includes a charge storage electrode arranged apart from the first electrode and arranged to face the photoelectric conversion layer through an insulating layer, and a width of a region of the photoelectric conversion layer positioned between the first electrode and the charge storage electrode is narrower than a width of a region of the photoelectric conversion layer positioned between the imaging element and an adjacent imaging element.

[A03] <<Imaging Element: Third Aspect>>

An imaging element including:

a photoelectric conversion unit including a first electrode, a photoelectric conversion layer, and a second electrode that are stacked, in which the photoelectric conversion unit further includes a charge storage electrode arranged apart from the first electrode and arranged to face the photoelectric conversion layer through an insulating layer, and a charge movement control electrode is formed in a region facing, through the insulating layer, a region of the photoelectric conversion layer positioned between the imaging element and an adjacent imaging element.

[A04] <<Imaging Element: Fourth Aspect>>

An imaging element including:

a photoelectric conversion unit including a first electrode, a photoelectric conversion layer, and a second electrode that are stacked, in which the photoelectric conversion unit further includes a charge storage electrode arranged apart from the first electrode and arranged to face the photoelectric conversion layer through an insulating layer, and a charge movement control electrode is formed, in place of the second electrode, over a region of the photoelectric conversion layer positioned between the imaging element and an adjacent imaging element.

[A05] <<Imaging Element: Fifth Aspect>>

An imaging element including:

a photoelectric conversion unit including a first electrode, a photoelectric conversion layer, and a second electrode that are stacked, in which the photoelectric conversion unit further includes a charge storage electrode arranged apart from the first electrode and arranged to face the photoelectric conversion layer through an insulating layer, and a value of a dielectric constant of an insulating material included in a region between the first electrode and the charge storage electrode is higher than a value of a dielectric constant of an insulating material included in a region between the imaging element and an adjacent imaging element.

[A06] <<Imaging Element: Sixth Aspect>>
An imaging element including:
a photoelectric conversion unit including a first electrode, a photoelectric conversion layer, and a second electrode that are stacked, in which
the photoelectric conversion unit further includes a charge storage electrode arranged apart from the first electrode and arranged to face the photoelectric conversion layer through an insulating layer, and
a thickness of a region of the insulating layer positioned between the first electrode and the charge storage electrode is thinner than a thickness of a region of the insulating layer positioned between the imaging element and an adjacent imaging element.

[A07] <<Imaging Element: Seventh Aspect>>
An imaging element including:
a photoelectric conversion unit including a first electrode, a photoelectric conversion layer, and a second electrode that are stacked, in which
the photoelectric conversion unit further includes a charge storage electrode arranged apart from the first electrode and arranged to face the photoelectric conversion layer through an insulating layer, and
a thickness of a region of the photoelectric conversion layer positioned between the first electrode and the charge storage electrode is thicker than a thickness of a region of the photoelectric conversion layer positioned between the imaging element and an adjacent imaging element.

[A08] <<Imaging Element: Eighth Aspect>>
An imaging element including:
a photoelectric conversion unit including a first electrode, a photoelectric conversion layer, and a second electrode that are stacked, in which
the photoelectric conversion unit further includes a charge storage electrode arranged apart from the first electrode and arranged to face the photoelectric conversion layer through an insulating layer, and
a fixed charge amount in a region of an interface between the photoelectric conversion layer and the insulating layer positioned between the first electrode and the charge storage electrode is less than a fixed charge amount in a region of an interface between the photoelectric conversion layer and the insulating layer positioned between the imaging element and an adjacent imaging element.

[A09] <<Imaging Element: Ninth Aspect>>
An imaging element including:
a photoelectric conversion unit including a first electrode, a photoelectric conversion layer, and a second electrode that are stacked, in which
the photoelectric conversion unit further includes a charge storage electrode arranged apart from the first electrode and arranged to face the photoelectric conversion layer through an insulating layer, and
a value of charge mobility in a region of the photoelectric conversion layer positioned between the first electrode and the charge storage electrode is larger than a value of charge mobility in a region of the photoelectric conversion layer positioned between the imaging element and an adjacent imaging element.

[A10]
The imaging element according to [A03], further including:
a control unit provided on a semiconductor substrate and including a drive circuit, in which
the first electrode, the second electrode, the charge storage electrode, and the charge movement control electrode are connected to the drive circuit,
in a charge storage period, the drive circuit applies a potential $V_{11}$ to the first electrode, applies a potential $V_{12}$ to the charge storage electrode, and applies a potential $V_{13}$ to the charge movement control electrode, and charge is stored in the photoelectric conversion layer, and
in a charge transfer period, the drive circuit applies a potential $V_{21}$ to the first electrode, applies a potential $V_{22}$ to the charge storage electrode, and applies a potential $V_{23}$ to the charge movement control electrode, and the charge stored in the photoelectric conversion layer is read out to the control unit through the first electrode, where
in a case where the potential of the first electrode is higher than the potential of the second electrode, $V_{12} > V_{11}, V_{12} > V_{13}$, and $V_{21} > V_{22} > V_{23}$ hold, and in a case where the potential of the first electrode is lower than the potential of the second electrode, $V_{12} < V_{11}, V_{12} < V_{13}$, and $V_{21} < V_{22} < V_{23}$ hold.

[A11]
The imaging element according to [A04], further including:
a control unit provided on a semiconductor substrate and including a drive circuit, in which
the first electrode, the second electrode, the charge storage electrode, and the charge movement control electrode are connected to the drive circuit,
in a charge storage period, the drive circuit applies a potential $V_2'$ to the second electrode and applies a potential $V_{13}'$ to the charge movement control electrode, and charge is stored in the photoelectric conversion layer, and
in a charge transfer period, the drive circuit applies a potential $V_2''$ to the second electrode and applies a potential $V_{23}''$ to the charge movement control electrode, and the charge stored in the photoelectric conversion layer is read out to the control unit through the first electrode, where
in a case where the potential of the first electrode is higher than the potential of the second electrode, $V_2' \geq V_{13}'$ and $V_2'' \geq V_{23}''$ hold, and in a case where the potential of the first electrode is lower than the potential of the second electrode, $V_2' \leq V_{13}'$ and $V_2'' \leq V_{23}''$ hold.

[A12]
The imaging element according to any one of [A01] to [A11], further including:
a semiconductor substrate, in which
the photoelectric conversion unit is arranged on an upper side of the semiconductor substrate.

[A13]
The imaging element according to any one of [A01] to [A12], further including:
a transfer control electrode arranged between the first electrode and the charge storage electrode, arranged apart from the first electrode and the charge storage electrode, and arranged to face the photoelectric conversion layer through the insulating layer.

[A14]
The imaging element according to any one of [A01] to [A13], in which
the charge storage electrode includes a plurality of charge storage electrode segments.

[A15]

The imaging element according to any one of [A01] to [A14], in which the size of the charge storage electrode is larger than the first electrode.

[A16]

The imaging element according to any one of [A01] to [A15], in which the first electrode extends in an opening portion provided in the insulating layer and is connected to the photoelectric conversion layer.

[A17]

The imaging element according to any one of [A01] to [A15], in which the photoelectric conversion layer extends in an opening portion provided in the insulating layer and is connected to the first electrode.

[A18]

The imaging element according to [A17], in which an edge portion of a top surface of the first electrode is covered by the insulating layer, the first electrode is exposed on a bottom surface of the opening portion, and a side surface of the opening portion is sloped to extend from a first surface toward a second surface, where the first surface is a surface of the insulating layer in contact with the top surface of the first electrode, and the second surface is a surface of the insulating layer in contact with a part of the photoelectric conversion layer facing the charge storage electrode.

[A19]

The imaging element according to [A18], in which the side surface of the opening portion sloped to extend from the first surface toward the second surface is positioned on a charge storage electrode side.

[A20] <<Control of Potentials of First Electrode and Charge Storage Electrode>>

The imaging element according to any one of [A01] to [A19], further including:

a control unit provided on the semiconductor substrate and including a drive circuit, in which the first electrode and the charge storage electrode are connected to the drive circuit, in the charge storage period, the drive circuit applies the potential $V_{11}$ to the first electrode and applies the potential $V_{12}$ to the charge storage electrode, and charge is stored in the photoelectric conversion layer, and in the charge transfer period, the drive circuit applies the potential $V_{21}$ to the first electrode and applies the potential $V_{22}$ to the charge storage electrode, and the charge stored in the photoelectric conversion layer is read out to the control unit through the first electrode, where in a case where the potential of the first electrode is higher than the potential of the second electrode, $V_{12} \geq V_{11}$ and $V_{22} < V_{21}$ hold, and in a case where the potential of the first electrode is lower than the potential of the second electrode, $$V_{12} \leq V_{11} \text{ and } V_{22} > V_{21} \text{ hold.}$$

[A21] <<Charge Storage Electrode Segment>>

The imaging element according to any one of [A01] to [A13], in which the charge storage electrode includes a plurality of charge storage electrode segments.

[A22]

The imaging element according to [A21], in which in a case where the potential of the first electrode is higher than the potential of the second electrode, a potential applied to a charge storage electrode segment positioned at a place closest to the first electrode is higher than a potential applied to a charge storage electrode segment positioned at a place farthest from the first electrode in the charge transfer period, and in a case where the potential of the first electrode is lower than the potential of the second electrode, the potential applied to the charge storage electrode segment positioned at the place closest to the first electrode is lower than the potential applied to the charge storage electrode segment positioned at the place farthest from the first electrode in the charge transfer period.

[A23]

The imaging element according to any one of [A01] to [A22], in which at least a floating diffusion layer and an amplification transistor included in the control unit are provided on the semiconductor substrate, and the first electrode is connected to the floating diffusion layer and a gate portion of the amplification transistor.

[A24]

The imaging element according to [A23], in which a reset transistor and a selection transistor included in the control unit are further provided on the semiconductor substrate, the floating diffusion layer is connected to one source/drain region of the reset transistor, one source/drain region of the amplification transistor is connected to one source/drain region of the selection transistor, and another source/drain region of the selection transistor is connected to a signal line.

[A25]

The imaging element according to any one of [A01] to [A24], in which light is incident from a second electrode side, and a light shielding layer is formed on a light incident side closer to the second electrode.

[A26]

The imaging element according to any one of [A01] to [A24], in which light is incident from a second electrode side, and the light is not incident on the first electrode.

[A27]

The imaging element according to [A26], in which a light shielding layer is formed on a light incident side closer to the second electrode, on an upper side of the first electrode.

[A28]

The imaging element according to [A26], in which an on-chip micro lens is provided on an upper side of the charge storage electrode and the second electrode, and light incident on the on-chip micro lens is collected by the charge storage electrode.

[A29]

The imaging element according to any one of [A01] to [A28], in which the charge storage electrode is driven by two transistors, the charge storage electrode is driven by one transistor in an initial stage of the charge transfer period, and the charge storage electrode is driven by two transistors at the same time in a later stage of the charge transfer period.

[A30]

The imaging element according to any one of [A01] to [A28], in which the charge storage electrode is driven by a transistor with large driving capability and a transistor with small driving capability, the charge storage electrode is driven by the transistor with small driving capability in an initial stage of the charge transfer period, and the charge storage electrode is driven by the transistor with large driving capability in a later stage of the charge transfer period.

[B01] <<Imaging Element: First Configuration

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments, an nth (where n=1, 2, 3, ... N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and the thicknesses of the insulating layer segments gradually change from the first photoelectric conversion unit segment to the Nth photoelectric conversion unit segment.

[B02] <<Imaging Element: Second Configuration

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments, an nth (where n=1, 2, 3, ... N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and the thicknesses of the photoelectric conversion layer segments gradually change from the first photoelectric conversion unit segment to the Nth photoelectric conversion unit segment.

[B03] <<Imaging Element: Third Configuration>>

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments, an nth (where n=1, 2, 3, ... N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and materials included in the insulating layer segments vary between adjacent photoelectric conversion unit segments.

[B04] <<Imaging Element: Fourth Configuration>>

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments arranged apart from each other, an nth (where n=1, 2, 3, ... N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and materials included in the charge storage electrode segments vary between adjacent photoelectric conversion unit segments.

[B05] <<Imaging Element: Fifth Configuration>>

The imaging element according to any one of [A01] to [A30], in which the photoelectric conversion unit includes N (where N≥2) photoelectric conversion unit segments, the photoelectric conversion layer includes N photoelectric conversion layer segments, the insulating layer includes N insulating layer segments, the charge storage electrode includes N charge storage electrode segments arranged apart from each other, an nth (where n=1, 2, 3, ... N) photoelectric conversion unit segment includes an nth charge storage electrode segment, an nth insulating layer segment, and an nth photoelectric conversion layer segment, the larger the value of n of the photoelectric conversion unit segment, the farther the position of the photoelectric conversion unit segment from the first electrode, and the areas of the charge storage electrode segments gradually decrease from the first photoelectric conversion unit segment to the Nth photoelectric conversion unit segment.

[B06] <<Imaging Element: Sixth Configuration>>

The imaging element according to any one of [A01] to [A30], in which a cross-sectional area of a stacked part of the charge storage electrode, the insulating layer, and the photoelectric conversion layer when the stacked part is cut in a YZ virtual plane changes in accordance with the distance from the first electrode, where a Z direction is a stacking direction of the charge storage electrode, the insulating layer, and the photoelectric conversion layer, and an X direction is a direction away from the first electrode.

[C01] <<Stacked Imaging Element>>

A stacked imaging element including at least one imaging element according to any one of [A01] to [B06].

[D01] <<Solid-State Imaging Apparatus: First Aspect>>

A solid-state imaging apparatus including a plurality of imaging elements according to any one of [A01] to [B06].

[D02] <<Solid-State Imaging Apparatus: Second Aspect>>

A solid-state imaging apparatus including a plurality of stacked imaging elements according to [D01].

[D03] Solid-State Imaging Apparatus: First Configuration>>

A solid-state imaging apparatus including a plurality of imaging elements according to any one of [A01] to [B06], in which a plurality of imaging elements are included in an imaging element block, and the first electrode is shared by the plurality of imaging elements included in the imaging element block.

[D04] <<Solid-State Imaging Apparatus: Second Configuration>>

A solid-state imaging apparatus including a plurality of stacked imaging elements each including at least one imaging element according to any one of [A01] to [B06], in which a plurality of stacked imaging elements are included in an imaging element block, and the first electrode is shared by the plurality of stacked imaging elements included in the imaging element block.

[D05]

The solid-state imaging apparatus according to any one of [D01] to [D04], in which one on-chip micro lens is arranged on an upper side of one imaging element.

[D06]

The solid-state imaging apparatus according to any one of [D01] to [D04], in which two imaging elements are included in the imaging element block, and one on-chip micro lens is arranged on an upper side of the imaging element block.

[D07]

The solid-state imaging element according to any one of [D01] to [D06], in which one floating diffusion layer is provided for a plurality of imaging elements.

[D08]

The solid-state imaging apparatus according to any one of [D01] to [D07], in which the first electrode is arranged adjacent to the charge storage electrode of each imaging element.

[D09]

The solid-state imaging apparatus according to any one of [D01] to [D08], in which the first electrode is arranged adjacent to the charge storage electrodes of part of the plurality of imaging elements and is not arranged adjacent to the charge storage electrodes of the rest of the plurality of imaging elements.

[D10]

The solid-state imaging apparatus according to [D09], in which the distance between the charge storage electrode included in the imaging element and the charge storage electrode included in the imaging element is longer than the distance between the first electrode and the charge storage electrode in the imaging element adjacent to the first electrode.

[E01] <<Driving Method of Solid-State Imaging Apparatus>>

A driving method of a solid-state imaging apparatus including a plurality of imaging elements, each of the plurality of imaging elements including:

a photoelectric conversion unit including a first electrode, a photoelectric conversion layer, and a second electrode that are stacked, in which the photoelectric conversion unit further includes a charge storage electrode arranged apart from the first electrode and arranged to face the photoelectric conversion layer through an insulating layer, light is incident from a second electrode side, and the light is not incident on the first electrode, the driving method of the solid-state imaging apparatus repeating the steps of:

releasing charge in the first electrodes all at once to the outside of a system while storing the charge in the photoelectric conversion layers in all of the imaging elements; and subsequently, transferring the charge stored in the photoelectric conversion layers all at once to the first electrodes in all of the imaging elements, and after the completion of the transfer, sequentially reading the charge transferred to the first electrodes in the imaging elements.

REFERENCE SIGNS LIST $10_1$, $10_2$, $10_3$ . . . Photoelectric conversion unit segment, 11 . . . First electrode, 12 . . . Second electrode, 13 . . . Photoelectric conversion layer, $13_A$ . . . Region of photoelectric conversion layer (region-A of photoelectric conversion layer) positioned between first electrode and charge storage electrode, $13_B$ . . . Region of photoelectric conversion layer (region-B of photoelectric conversion layer) positioned between imaging element and adjacent imaging element, $13_C$ . . . Part of photoelectric conversion layer facing charge storage electrode, $13_{DN}$, $13_{DN}'$ . . . Lower layer of photoelectric conversion layer, $13_{UP}$, $13_{UP}'$ . . . Upper layer of photoelectric conversion layer, 14 . . . Charge storage electrode, 14A, 14B, 14C . . . Charge storage electrode segment, 15, 15A, 15B . . . Transfer control electrode (charge transfer electrode), 21 . . . Charge movement control electrode, 22 . . . Pad portion, 23 . . . Connection hole, 24, $24_1$, $24_2$ . . . Charge movement control electrode, 25 . . . Discharge electrode, 41 . . . n-type semiconductor region included in second imaging element, 43 . . . n-type semiconductor region included in third imaging element, 42, 44, 73 . . . p$^+$ layer, $FD_1$, $FD_2$, $FD_3$, $FD_3$, 45C, 46C . . . Floating diffusion layer, $TR1_{amp}$ . . . Amplification transistor, $TR1_{rst}$ . . . Reset transistor, $TR1_{sel}$ . . . Selection transistor, 51 . . . Gate portion of reset transistor $TR1_{rst}$, 51A . . . Channel formation region of reset transistor $TR1_{rst}$, 51B, 51C . . . Source/drain region of reset transistor $TR1_{rst}$, 52 . . . Gate portion of amplification transistor $TR1_{amp}$, 52A . . . Channel formation region of amplification transistor $TR1_{amp}$, 52B, 52C . . . Source/drain region of amplification transistor $TR1_{amp}$, 53 . . . Gate portion of selection transistor $TR1_{sel}$, 53A . . . Channel formation region of selection transistor $TR1_{sel}$, 53B, 53C . . . Source/drain region of selection transistor $TR1_{sel}$, $TR2_{trs}$ . . . Transfer transistor, 45 . . . Gate portion of transfer transistor, $TR2_{rst}$ . . . Reset transistor, $TR2_{amp}$ . . . Amplification transistor, $TR2_{sel}$ . . . Selection transistor, $TR3_{trs}$ . . . Transfer transistor, 46 . . . Gate portion of transfer transistor, $TR3_{rst}$ . . . Reset transistor, $TR3_{amp}$ . . . Amplification transistor, $TR3_{sel}$ . . . Selection transistor, $V_{DD}$ . . . Power source, $RST_1$, $RST_2$, $RST_3$ . . . Reset line, $SEL_1$, $SEL_2$, $SEL_3$ . . . Selection line, 117, $VSL_1$, $VSL_2$, $VSL_3$ . . . Signal line, $TG_2$, $TG_3$ . . . Transfer gate line, $V_{OA}$, $V_{OB}$, $V_{OT}$, $V_{OU}$ . . . Wire, 61 . . . Contact hole portion, 62 . . . Wiring layer, 63, 64, 68A . . . Pad portion, 65, 68B . . . Connection hole, 66, 67, 69 . . . Connection portion, 70 . . . Semiconductor substrate, 70A . . . First surface (front surface) of semiconductor substrate, 70B . . . Second surface (back surface) of semiconductor substrate, 71 . . . Element separation region, 72 . . . Oxide film, 74 . . . $HfO_2$ film, 75 . . . Insulating film, 76 . . . Interlayer insulating layer, 77, 78, 81 . . . Interlayer insulating layer, 82 . . . Insulating layer, $82_A$ . . . Region (region-a) of first electrode and charge storage electrode, $82_B$ . . . Region (region-b) between imaging element and adjacent imaging element, $82_A'$ . . . Insulating material-A, $82_B'$ . . . Insulating material-B, 82a . . . First surface of insulating layer, 82b . . . Second surface of insulating layer, 82c . . . Third surface of insulating layer, 83 . . . Protective layer, 84, 84A, 84B, 84C . . . Opening portion, 85, 85A . . . Second opening portion, 90 . . . On-chip micro lens, 91 . . . Various imaging element constituent elements positioned on lower side of interlayer insulating layer, 92 . . . Light shielding layer, 100 . . . Solid-state imaging apparatus, 101 . . . Stacked imaging element, 111 . . . Imaging region, 112 . . . Vertical drive circuit, 113 . . . Column signal processing circuit, 114 . . . Horizontal drive circuit, 115 . . . Output circuit, 116 . . . Drive control circuit, 118 . . . Horizontal signal line, 200 . . . Electronic device (camera), 201 . . . Solid-state imaging apparatus, 210 . . . Optical lens, 211 . . . Shutter apparatus, 212 . . . Drive circuit, 213 . . . Signal processing circuit

The invention claimed is:

1. An imaging element comprising:
a photoelectric conversion unit including a first electrode, a photoelectric conversion layer, and a second electrode that are stacked; and
a semiconductor substrate, wherein
the photoelectric conversion unit is arranged on an upper side of the semiconductor substrate, the photoelectric conversion unit further includes a charge storage electrode arranged apart from the first electrode, arranged to face the photoelectric conversion layer through an insulating layer, and arranged between the second electrode and the semiconductor substrate in a depth direction of the semiconductor substrate, and wherein a top of the charge storage electrode is arranged at same level as a top of the first electrode in the depth direction of the semiconductor substrate,
when photoelectric conversion occurs in the photoelectric conversion layer after light enters the photoelectric conversion layer, an absolute value of a potential applied to a part of the photoelectric conversion layer facing the charge storage electrode is a value larger than an absolute value of a potential applied to a region of the photoelectric conversion layer positioned between the imaging element and an adjacent imaging element.

2. The imaging element according to claim 1, further comprising
a transfer control electrode arranged between the first electrode and the charge storage electrode, arranged apart from the first electrode and the charge storage electrode, and arranged to face the photoelectric conversion layer through the insulating layer.

3. The imaging element according to claim 1, wherein the charge storage electrode includes a plurality of charge storage electrode segments.

4. The imaging element according to claim 1, wherein the size of the charge storage electrode is larger than the first electrode.

5. A stacked imaging element comprising at least one imaging element according to claim 1.

6. A solid-state imaging apparatus comprising a plurality of imaging elements according to claim 1.

7. A solid-state imaging apparatus comprising a plurality of stacked imaging elements according to claim 5.

* * * * *